US012573682B2

(12) United States Patent
Linsmeier et al.

(10) Patent No.: US 12,573,682 B2
(45) Date of Patent: Mar. 10, 2026

(54) SYSTEMS AND METHODS FOR BATTERY THERMAL MANAGEMENT ON A VEHICLE

(71) Applicant: Oshkosh Corporation, Oshkosh, WI (US)

(72) Inventors: Eric Linsmeier, Oshkosh, WI (US); Jeff Verhagen, Oshkosh, WI (US); Nicholas Vertz, Oshkosh, WI (US)

(73) Assignee: Oshkosh, Corporation, Oshkosh, WI (US)

( * ) Notice: Subject to any disclaimer, the term of this patent is extended or adjusted under 35 U.S.C. 154(b) by 281 days.

(21) Appl. No.: 18/453,155

(22) Filed: Aug. 21, 2023

(65) Prior Publication Data

US 2024/0059136 A1      Feb. 22, 2024

Related U.S. Application Data

(60) Provisional application No. 63/399,816, filed on Aug. 22, 2022, provisional application No. 63/399,773, (Continued)

(51) Int. Cl.
H01M 10/625          (2014.01)
A62C 3/16          (2006.01)
(Continued)

(52) U.S. Cl.
CPC ............. H01M 10/625 (2015.04); A62C 3/16 (2013.01); B60H 1/00278 (2013.01); (Continued)

(58) Field of Classification Search
CPC ............. H01M 50/249; H01M 50/262; H01M 2200/20; B60L 50/66; B60L 50/64
See application file for complete search history.

(56) References Cited

U.S. PATENT DOCUMENTS 2,176,699 A      10/1939   Anderson
7,433,794 B1    10/2008   Berdichevsky et al.
(Continued)

FOREIGN PATENT DOCUMENTS

DE      10 2013 221 137 B3    10/2014
DE      10 2021 132 499 A1    6/2023
(Continued)

OTHER PUBLICATIONS

International Search Report and Written Opinion issued in connection with PCT Appl. No. PCT/US2023/072594 dated Feb. 22, 2024.

*Primary Examiner* — Huan Le
(74) *Attorney, Agent, or Firm* — Foley & Lardner LLP

(57)          ABSTRACT

An electrified vehicle includes a chassis, an energy storage system supported by or coupled to the chassis and including a battery arranged within a battery housing. The battery housing is coupled to the chassis by a first removable coupling coupled between the battery housing and the chassis, and a second removable coupling coupled between the battery housing and the chassis. The first removable coupling includes a first pin that is selectively removable to decouple the battery housing from the chassis. The second removable coupling includes a second pin that is selectively removable to decouple the battery housing from the chassis.

19 Claims, 74 Drawing Sheets

Related U.S. Application Data filed on Aug. 22, 2022, provisional application No. 63/399,819, filed on Aug. 22, 2022, provisional application No. 63/399,810, filed on Aug. 22, 2022, provisional application No. 63/399,809, filed on Aug. 22, 2022, provisional application No. 63/399,769, filed on Aug. 22, 2022.

(51) Int. Cl.

| | |
|---|---|
| *A62C 27/00* | (2006.01) |
| *B60H 1/00* | (2006.01) |
| *B60K 1/04* | (2019.01) |
| *B60K 6/28* | (2007.10) |
| *B60K 6/46* | (2007.10) |
| *B60L 1/00* | (2006.01) |
| *B60L 3/00* | (2019.01) |
| *B60L 3/04* | (2006.01) |
| *B60L 50/60* | (2019.01) |
| *B60L 50/64* | (2019.01) |
| *B60L 58/26* | (2019.01) |
| *G01R 31/392* | (2019.01) |
| *H01M 10/613* | (2014.01) |
| *H01M 10/63* | (2014.01) |
| *H01M 10/6568* | (2014.01) |
| *H01M 50/249* | (2021.01) |
| *H01M 50/262* | (2021.01) |
| *H02J 7/00* | (2006.01) |

(52) U.S. Cl.

CPC ........... *B60H 1/00885* (2013.01); *B60K 1/04* (2013.01); *B60K 6/28* (2013.01); *B60K 6/46* (2013.01); *B60L 1/003* (2013.01); *B60L 3/0046* (2013.01); *B60L 3/04* (2013.01); *B60L 50/64* (2019.02); *B60L 58/26* (2019.02); *G01R 31/392* (2019.01); *H01M 10/613* (2015.04); *H01M 10/63* (2015.04); *H01M 10/6568* (2015.04); *H01M 50/249* (2021.01); *H01M 50/262* (2021.01); *H02J 7/0013* (2013.01); *H02J 7/00309* (2020.01); *H02J 7/0047* (2013.01); *H02J 7/007194* (2020.01); *A62C 27/00* (2013.01); *B60H 2001/00307* (2013.01); *B60L 50/60* (2019.02); *B60L 2200/40* (2013.01); *B60Y 2200/142* (2013.01); *B60Y 2200/92* (2013.01); *B60Y 2400/112* (2013.01); *H01M 2200/10* (2013.01); *H01M 2220/20* (2013.01)

(56) References Cited

U.S. PATENT DOCUMENTS

| | | | |
|---|---|---|---|
| 9,054,402 | B1 | 6/2015 | Rawlinson |
| 9,093,726 | B2 | 7/2015 | Prilutsky et al. |
| 9,293,792 | B2 | 3/2016 | Grace et al. |
| 9,899,652 | B2 | 2/2018 | Goldman et al. |
| 9,941,555 | B2 | 4/2018 | Hermann |
| 10,457,130 | B2 * | 10/2019 | Bengtsson .............. B60L 50/66 |
| 10,974,724 | B1 | 4/2021 | Shively et al. |
| 11,081,739 | B2 | 8/2021 | Hermann |
| 12,046,730 | B2 | 7/2024 | Gao |
| 2010/0270976 | A1 | 10/2010 | Tamura |
| 2012/0034501 | A1 | 2/2012 | Hermann et al. |
| 2015/0306974 | A1 | 10/2015 | Mardall et al. |
| 2016/0144211 | A1 | 5/2016 | Betz et al. |
| 2017/0110770 | A1 | 4/2017 | Marcicki et al. |
| 2017/0373359 | A1 | 12/2017 | Krull |
| 2020/0220237 | A1 | 7/2020 | Behlen et al. |
| 2021/0188126 | A1 | 6/2021 | Unneback et al. |
| 2022/0258649 | A1 | 8/2022 | Wedding et al. |
| 2022/0355138 | A1 | 11/2022 | Baeder et al. |
| 2022/0407176 | A1 | 12/2022 | Ryder et al. |
| 2023/0021121 | A1 | 1/2023 | Taniguchi et al. |
| 2023/0137717 | A1 | 5/2023 | Harvey |
| 2023/0166724 | A1 | 6/2023 | Wang et al. |

FOREIGN PATENT DOCUMENTS

| | | | |
|---|---|---|---|
| JP | 2006-216303 | A | 8/2006 |
| JP | 2012-252909 | A | 12/2012 |
| WO | WO-2021/192569 | A1 | 9/2021 |
| WO | WO-2023/007971 | A1 | 2/2023 |

* cited by examiner

1254

710

1250

1252

1254

1250        1250

1252        1252

710

1250        1250

1252        1252

1250        1250

1252        1252

Figures 53, 54:
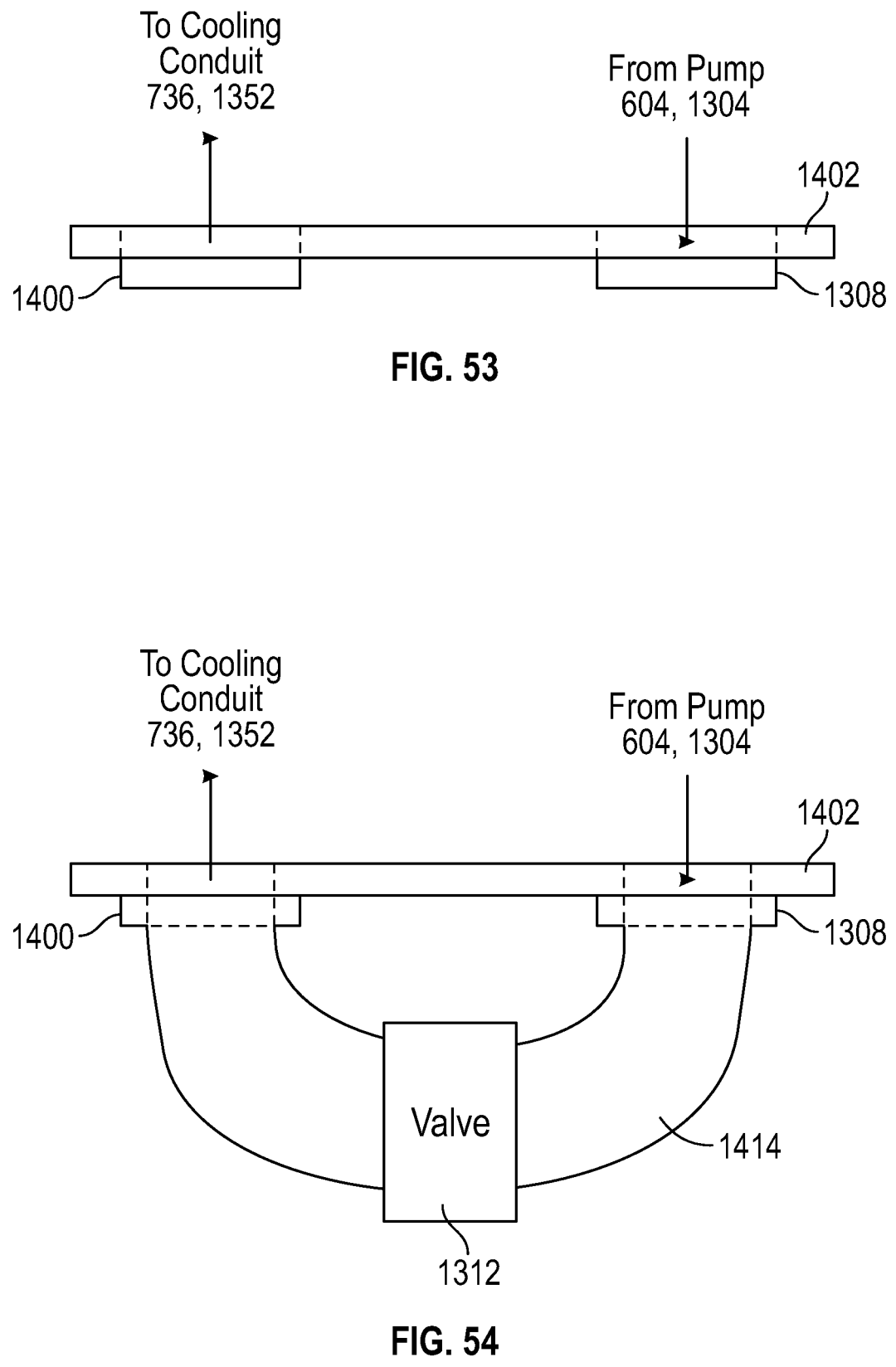

To Cooling
Conduit
736, 1352

From Pump
604, 1304

To Cooling
Conduit
736, 1352

From Pump
604, 1304

1402

1400

1308

1414

Valve

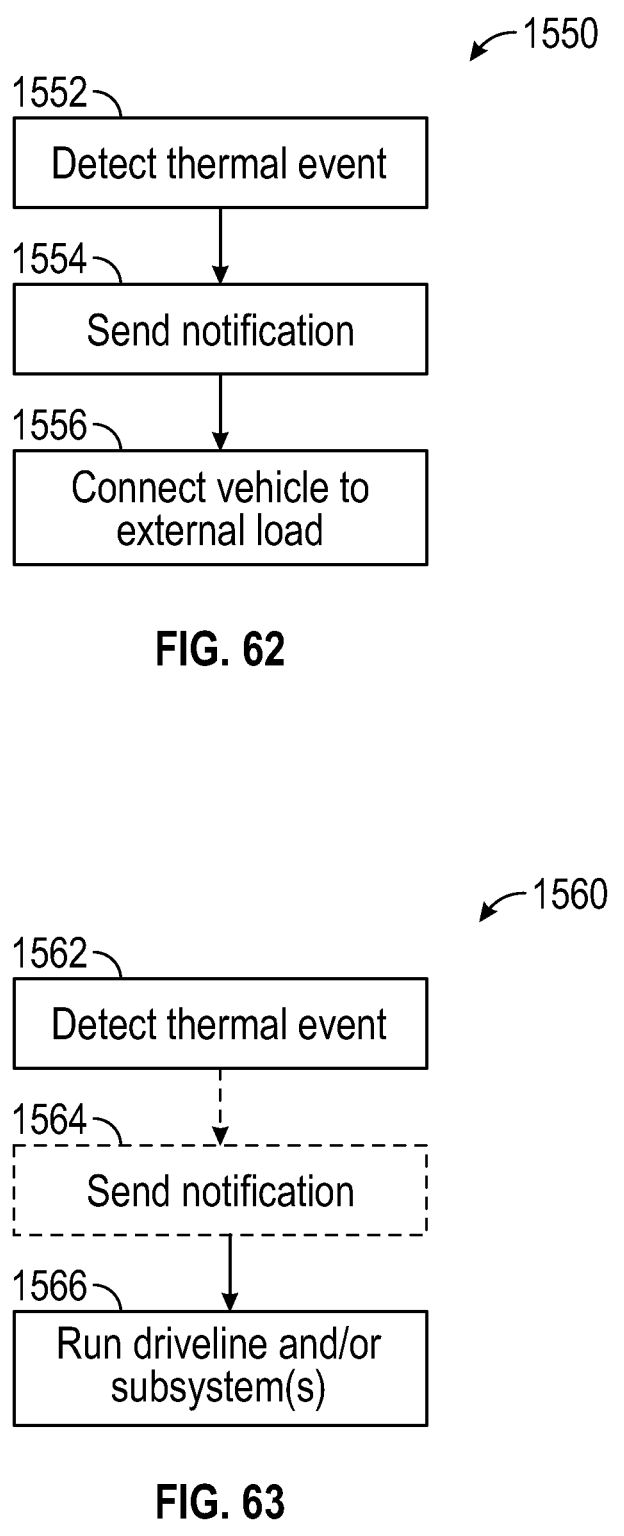

1552 — Detect thermal event

1554 — Send notification

1556 — Connect vehicle to external load

1562 — Detect thermal event

1564 — Send notification

1566 — Run driveline and/or subsystem(s)

FIG. 63

SYSTEMS AND METHODS FOR BATTERY THERMAL MANAGEMENT ON A VEHICLE

CROSS-REFERENCE TO RELATED PATENT APPLICATIONS

This application claims the benefit of and priority to (a) U.S. Provisional Patent Application No. 63/399,769, filed on Aug. 22, 2022, (b) U.S. Provisional Patent Application No. 63/399,773, filed on Aug. 22, 2022, (c) U.S. Provisional Patent Application No. 63/399,809, filed on Aug. 22, 2022, (d) U.S. Provisional Patent Application No. 63/399,810, filed on Aug. 22, 2022, (e) U.S. Provisional Patent Application No. 63/399,816, filed on Aug. 22, 2022, and (f) U.S. Provisional Patent Application No. 63/399,819, filed on Aug. 22, 2022, each of which is incorporated herein by reference in its entirety.

BACKGROUND

Some vehicles include one or more batteries that provide electrical power to a drive motor, on-board equipment or systems, one or more actuators, and/or external equipment or systems.

SUMMARY

One embodiment relates to an electrified vehicle that includes a chassis, an energy storage system supported by or coupled to the chassis and including a battery arranged within a battery housing. The battery housing is coupled to the chassis by a first removable coupling coupled between the battery housing and the chassis, and a second removable coupling coupled between the battery housing and the chassis. The first removable coupling includes a first pin that is selectively removable to decouple the battery housing from the chassis. The second removable coupling includes a second pin that is selectively removable to decouple the battery housing from the chassis.

Another embodiment relates to an electrified vehicle that includes a chassis having a first frame rail and a second frame rail, and an energy storage system supported by or coupled to the chassis. The energy storage system includes a battery arranged within a battery housing. The battery housing is coupled to the chassis by a first removable coupling coupled between the battery housing and the first frame rail, and a second removable coupling coupled between the battery housing and the second frame rail. The first removable coupling includes a first pin that is coupled to a first electric actuator. The first electric actuator is configured to actuate and selectively remove the first pin to decouple the battery housing from the first frame rail. The second removable coupling includes a second pin that is coupled to a second electric actuator. The second electric actuator is configured to actuate and selectively remove the second pin to decouple the battery housing from the second frame rail.

Still another embodiment relates to an electrified vehicle that includes a chassis having a first frame rail and a second frame rail, and an energy storage system supported by or coupled to the chassis. The energy storage system includes a battery arranged within a battery housing. The battery housing is coupled to the chassis by a first removable coupling coupled between the battery housing and the first frame rail, and a second removable coupling coupled between the battery housing and the second frame rail. The first removable coupling includes a first pin that is coupled to a first electric actuator, and the first electric actuator is configured to actuate and selectively remove the first pin to decouple the battery housing from the first frame rail. The second removable coupling includes a second pin that is configured to decouple the battery housing from the second frame rail in response to (a) an actuation force provided by an electric actuator or (b) a predetermined force that breaks the second pin.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE DRAWINGS

FIG. 53 is a schematic illustration of a top view of the external port and the pump outlet port on the vehicle of FIG. 52.

FIG. 54 is a schematic illustration of a supply valve connected between the external port and the pump outlet port on the vehicle of FIG. 51, according to an exemplary embodiment.

FIG. 62 is a flowchart illustrating the steps in a method for connecting a vehicle to one or more surrounding vehicles, according to an exemplary embodiment.

FIG. 63 is a flowchart illustrating the steps in a method for operating a vehicle having a battery, according to an exemplary embodiment.

DETAILED DESCRIPTION

Figure 1:
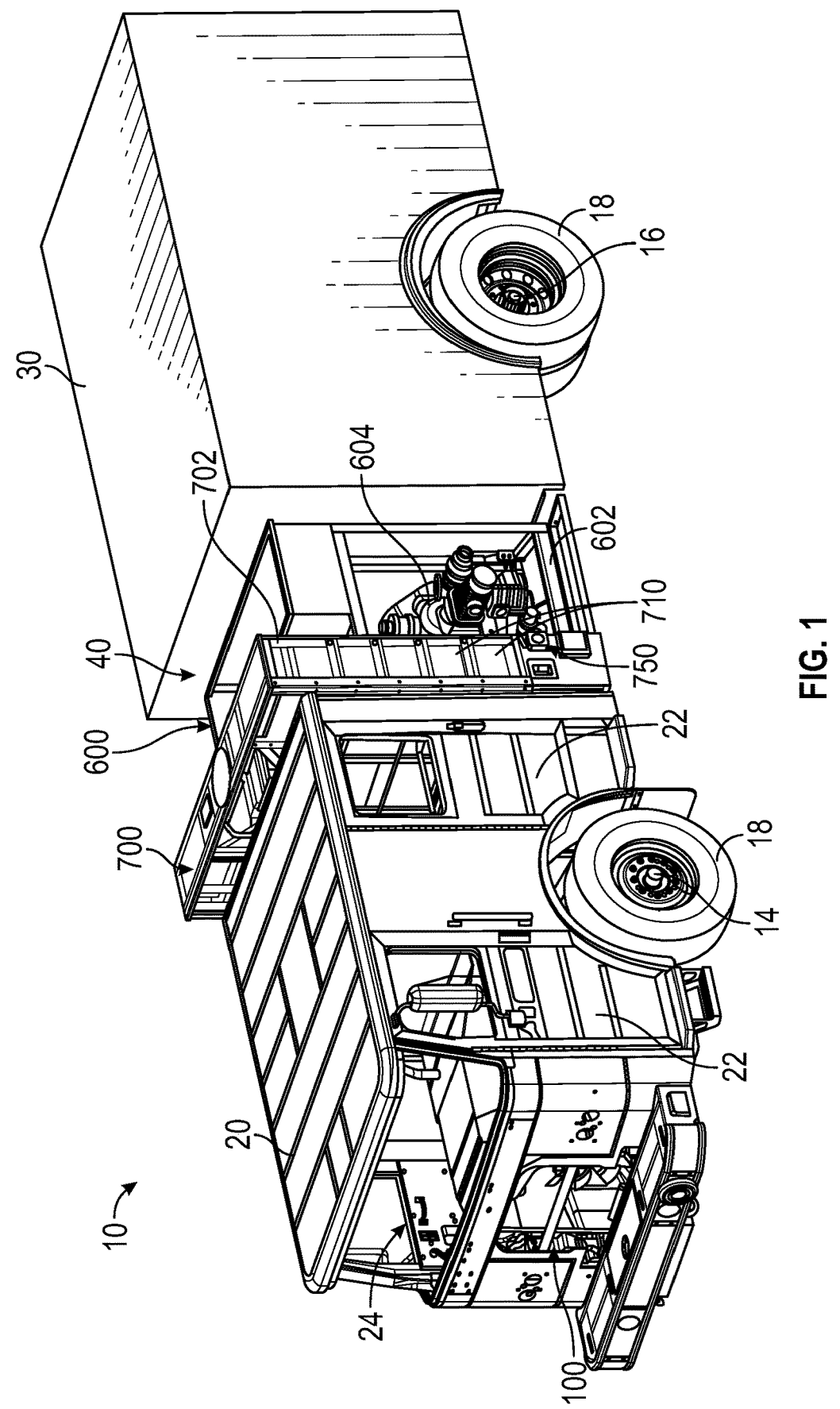
FIG. 1 is a front, left perspective view of a vehicle, according to an exemplary embodiment.
Figure 2:
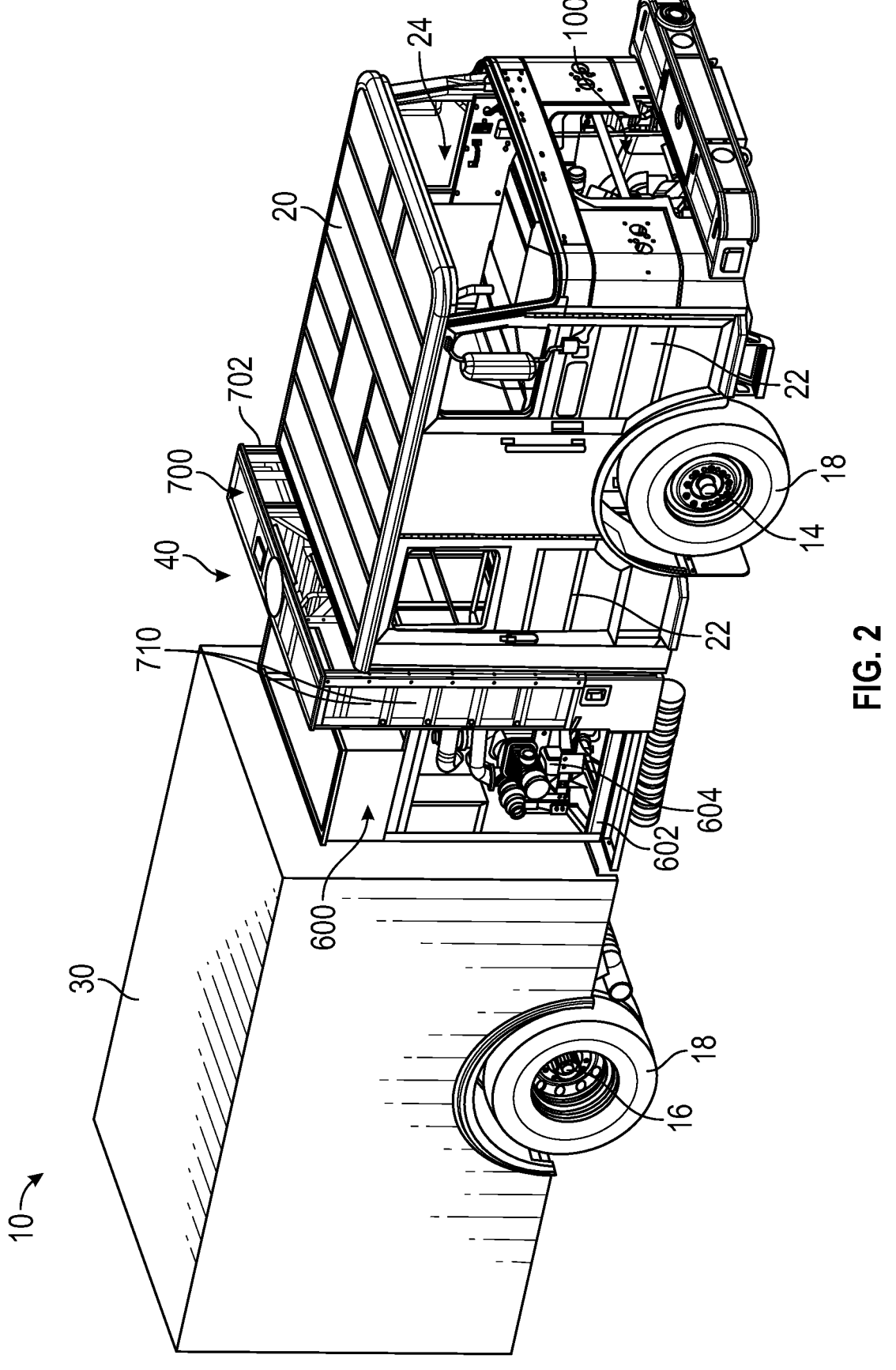
FIG. 2 is a front, right perspective view of the vehicle of FIG. 1, according to an exemplary embodiment.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

The use of the terms "downstream" and "upstream" herein are terms that indicate direction relative to the flow of a fluid. The term "downstream" corresponds to the direction of fluid flow, while the term "upstream" refers to the direction opposite or against the direction of fluid flow.

According to an exemplary embodiment, a vehicle (e.g., a fire fighting vehicle, a refuse vehicle, a concrete mixer, an on-road vehicle, a passenger vehicle, a truck, etc.) of the present disclosure includes a battery, or an array of batteries, that are configured to power on-board equipment (e.g., an electric motor, a transmission, a drive motor, a pump, on-board subsystems, etc.). In general, the incorporation of batteries (e.g., lithium-ion batteries, nickel-metal hydride batteries, lithium-ion polymer batteries, lead-acid batteries, nickel-cadmium batteries, etc.) into a vehicle brings about a potential for a battery thermal event to occur (e.g., thermal runaway). The present disclosure provides systems and methods for preventing, mitigating, and/or treating a battery thermal event.

In some embodiments, the vehicle includes a battery cooling system that is configured to actively provide cooling directly to or surrounding one or more batteries. In some embodiments, the cooling system includes a cooling conduit arranged adjacent to a battery or a battery housing, and a cooling valve or rupture point is arranged on the cooling conduit. The cooling valve or rupture point is configured to selectively provide cooling fluid to the battery housing so that cooling fluid flows into or around the battery housing to cool the battery. In some embodiments, the cooling conduit is a native or first cooling conduit. In some embodiments, the cooling conduit is a supplemental or second cooling conduit that is installed on the vehicle or with a battery system in addition to the native or first cooling conduit.

In some embodiments, a battery cooling system includes an external port that is positioned or arranged on an external surface, structure, or wall of the vehicle. The external port provides fluid communication to a cooling conduit that is arranged adjacent to a battery or a battery housing. In some embodiments, the cooling conduit includes a cooling valve or a rupture point that is configured to selectively provide cooling fluid to the battery housing so that cooling fluid flows into or around the battery housing to cool the battery. In some embodiments, the cooling conduit that is in fluid communication with the external port is a native or first cooling conduit. In some embodiments, the cooling conduit that is in fluid communication with the external port is a supplemental or second cooling conduit that is installed on the vehicle in addition to the native or first cooling conduit. In some embodiments, the external port is in fluid communication with an external pump that is arranged externally from the vehicle or an internal pump that is included with the vehicle. In some embodiments, the external port is in fluid communication with a turret nozzle of the vehicle.

In some embodiments, the vehicle includes a controller that is in communication with an on-board display and/or a remote device (e.g., a tablet, cellular device, PDA, etc.). The controller is configured to detect a battery thermal event (e.g., based on voltage, current, temperature, and/or cell expansion) and, in response, send a notification to the display and/or the remote device. In some embodiments, the notification includes instructions to connect a hand line, which is in fluid communication with an on-board pump, to an external port in fluid communication with a cooling conduit (e.g., any of the cooling conduits described herein). In some embodiments, the notification includes instructions to connect the vehicle to one or more surrounding vehicles to facilitate draining the battery, or batteries, for which the thermal event was detected. For example, the on-board equipment on the one or more surrounding vehicles (e.g., a pump, a hydraulic actuator, a motor, etc.) can operate to drain the battery, or batteries, on the vehicle with a detected thermal event. In some embodiments, the notification includes instructions to connect an external pump to an external port on the vehicle, which is in fluid communication with a cooling conduit (e.g., any of the cooling conduits described herein).

In some embodiments, the vehicle includes a controller that is in communication with a driveline and one or more subsystems on the vehicle. For example, the controller can be in communication with a drive motor of the driveline, a pump subsystem, one or more electric axle subsystems, a turret subsystem, a packing subsystem, an actuator subsystem, and/or a mixer drum subsystem, among other subsystems. The controller is configured to detect a battery thermal event (e.g., based on voltage, current, temperature, and/or cell expansion) and, in response, run on-board equipment to drain the battery, or batteries, experiencing a thermal event. For example, in some embodiments, the controller is configured to run a pump (e.g., on a fire fighting vehicle) to recirculate water and drain the battery, or batteries. In some embodiments, the controller is configured to run one or more actuators (e.g., electric actuators, hydraulic actuators driven by electric motors, etc.) that control a packing operation, a lifting operation, and/or a tailgate operation (e.g., on a refuse vehicle). In some embodiments, the controller is configured to run a motor that controls rotation of a mixing drum (e.g., on a concrete mixer). In some embodiments, the controller is configured to run a drive motor or a transmission component in a neutral gear. Regardless of the specific on-board equipment that is run in response to detecting the thermal event, the controller is configured to run on-board equipment in the driveline or subsystems that consume high amounts of energy to quickly drain a charge level of the battery, or batteries, having a thermal event.

In some embodiments, the vehicle includes a flood port mounted on or integrated into an external wall, structure, or surface of the vehicle. In some embodiments, the flood port is the same as the external port described herein, which is in communication with a cooling conduit. In some embodiments, the flood port is a universal port that is provided on any type of electrified vehicles to provide direct fluid communication between an exterior of the vehicle and an internal volume of a battery housing or enclosure. For example, the vehicle can include a global battery enclosure that includes a plurality of batteries or battery packs, each being arranged within individual battery housings. The flood port provides direct access to the internal volume of the global battery enclosure to provide cooling of the batteries and/or battery housings within the global battery enclosure (e.g., by flooding the internal volume with cooling fluid), upon connection of a fluid source to the flood port. In some embodiments, the flood port includes a plurality of nozzle holes arranged circumferentially around the port so that when a fluid source is connected to the flood port, the plurality of nozzle holes generate a water shield that sprays water radially outwardly and circumferentially around the flood port. In some embodiments, the flood port is configured to connect to a flood nozzle that includes a plurality of nozzle holes arranged circumferentially around the flood nozzle that generate a water shield for a user as the user approaches the vehicle and connects to the flood port.

Overall Vehicle

According to the exemplary embodiment shown in FIGS. 1-6, a machine, shown vehicle 10, is configured as a fire fighting vehicle. In the embodiment shown, the fire fighting vehicle is a pumper fire truck. In another embodiment, the fire fighting vehicle is an aerial ladder truck. The aerial ladder truck may include a rear-mount aerial ladder or a mid-mount aerial ladder. In some embodiments, the aerial ladder truck is a quint fire truck. In other embodiments, the aerial ladder truck is a tiller fire truck. In still another embodiment, the fire fighting vehicle is an airport rescue fire fighting ("ARFF") truck. In various embodiments, the fire fighting vehicle (e.g., a quint, a tanker, an ARFF, etc.) includes an on-board water storage tank, an on-board agent storage tank, and/or a pumping system. In other embodiments, the fire fighting vehicle is still another type of fire fighting vehicle. In an alternative embodiment, the vehicle 10 is another type of vehicle other than a fire fighting vehicle. For example, the vehicle 10 may be a refuse truck, a concrete mixer truck, a military vehicle, a tow truck, an ambulance, a farming machine or vehicle, a construction machine or vehicle, a passenger vehicle, a sedan, a pick-up truck, a semi-tractor, and/or still another vehicle.

As shown in FIGS. 1-20, the vehicle 10 includes a chassis, shown as a frame 12; a plurality of axles, shown as front axle 14 and rear axle 16, supported by the frame 12 and that couple a plurality of tractive elements, shown as wheels 18, to the frame 12; a cab, shown as front cabin 20, supported by the frame 12; a body assembly, shown as a rear section 30, supported by the frame 12 and positioned rearward of the front cabin 20; and a driveline (e.g., a powertrain, a drivetrain, an accessory drive, etc.), shown as driveline 100. While shown as including a single front axle 14 and a single rear axle 16, in other embodiments, the vehicle 10 includes two front axles 14 and/or two rear axles 16. In an alternative embodiment, the tractive elements are otherwise structured (e.g., tracks, etc.).

According to an exemplary embodiment, the front cabin 20 includes a plurality of body panels coupled to a support (e.g., a structural frame assembly, etc.). The body panels may define a plurality of openings through which an operator accesses an interior 24 of the front cabin 20 (e.g., for ingress, for egress, to retrieve components from within, etc.). As shown in FIGS. 1, 2, 4, and 5, the front cabin 20 includes a plurality of doors, shown as doors 22, positioned over the plurality of openings defined by the plurality of body panels. The doors 22 may provide access to the interior 24 of the front cabin 20 for a driver and/or passengers of the vehicle 10. The doors 22 may be hinged, sliding, or bus-style folding doors.

The front cabin 20 may include components arranged in various configurations. Such configurations may vary based on the particular application of the vehicle 10, customer requirements, or still other factors. The front cabin 20 may be configured to contain or otherwise support a number of occupants, storage units, and/or equipment. For example, the front cabin 20 may provide seating for an operator (e.g., a driver, etc.) and/or one or more passengers of the vehicle 10. The front cabin 20 may include one or more storage areas for providing compartmental storage for various articles (e.g., supplies, instrumentation, equipment, etc.). The interior 24 of the front cabin 20 may further include a user interface (e.g., user interface 820, etc.). The user interface may include a cabin display and various controls (e.g., buttons, switches, knobs, levers, joysticks, etc.). In some embodiments, the user interface within the interior 24 of the front cabin 20 further includes touchscreens, a steering wheel, an accelerator pedal, and/or a brake pedal, among other components. The user interface may provide the operator with control capabilities over the vehicle 10 (e.g., direction of travel, speed, etc.), one or more components of driveline 100, and/or still other components of the vehicle 10 from within the front cabin 20.

In some embodiments, the rear section 30 includes a plurality of compartments with corresponding doors positioned along one or more sides (e.g., a left side, right side, etc.) and/or a rear of the rear section 30. The plurality of compartments may facilitate storing various equipment such as oxygen tanks, hoses, axes, extinguishers, ladders, chains, ropes, straps, boots, jackets, blankets, first-aid kits, and/or still other equipment. One or more of the plurality of compartments may include various storage apparatuses (e.g., shelving, hooks, racks, etc.) for storing and organizing the equipment.

In some embodiments (e.g., when the vehicle 10 is an aerial ladder truck, etc.), the rear section 30 includes an aerial ladder assembly. The aerial ladder assembly may have a fixed length or may have one or more extensible ladder sections. The aerial ladder assembly may include a basket or implement (e.g., a water turret, etc.) coupled to a distal or free end thereof. The aerial ladder assembly may be positioned proximate a rear of the rear section 30 (e.g., a rear-mount fire truck) or proximate a front of the rear section 30 (e.g., a mid-mount fire truck).

In some embodiments (e.g., when the vehicle 10 is an ARFF truck, a tanker truck, a quint truck, etc.), the rear section 30 includes one or more fluid tanks. By way of example, the one or more fluid tanks may include a water tank and/or an agent tank. The water tank and/or the agent tank may be corrosion and UV resistant polypropylene tanks. In a municipal fire truck implementation (i.e., a non-ARFF truck implementation), the water tank may have a maximum water capacity ranging between 50 and 1000 gallons (e.g., 50, 100, 150, 200, 250, 300, 350, 400, 450, 500, 550, 600, 650, 700, 750, 800, 850, 900, 950, 1000, etc. gallons). In an ARRF truck implementation, the water tank may have a maximum water capacity ranging between 1,000 and 4,500 gallons (e.g., at least 1,250 gallons; between 2,500 gallons and 3,500 gallons; at most 4,500 gallons; at most 3,000 gallons; at most 1,500 gallons; etc.). The agent tank may have a maximum agent capacity ranging between 25 and 750 gallons (e.g., 25, 50, 75, 100, 150, 200, 250, 300, 350, 400, 450, 500, 550, 600, 650, 700, 750, etc. gallons). According to an exemplary embodiment, the agent is a foam fire suppressant, an aqueous film forming foam ("AFFF"). A low-expansion foam, a medium-expansion foam, a high-expansion foam, an alcohol-resistant foam, a synthetic foam, a protein-based foams, a fluorine-free foam, a film-forming fluoro protein ("FFFP") foam, an alcohol resistant aqueous film forming foam ("AR-AFFF"), and/or still another suitable foam or a foam yet to be developed. The capacity of the water tank and/or the agent tank may be specified by a customer. It should be understood that water tank and the agent tank configurations are highly customizable, and the scope of the present disclosure is not limited to a particular size or configuration of the water tank and the agent tank.

Driveline

As shown in FIGS. 1-20, the driveline 100 includes an engine assembly, shown as engine system 200, coupled to the frame 12; a clutched transmission accessory drive ("TAD") including a first component, shown as clutch 300, coupled to the engine system 200 and a second component (e.g., an accessory module, etc.), shown as TAD 400, coupled to the clutch 300; an electromechanical transmission or electromechanical transmission device ("ETD"), shown as ETD 500, coupled to the TAD 400; one or more subsystems including a first subsystem, shown as pump system 600, coupled to the frame 12 and the ETD 500; and an on-board energy storage system ("ESS"), shown as ESS 700, coupled to the frame 12 and electrically coupled to the ETD 500. According to an exemplary embodiment, the engine system 200, the clutch 300, the ETD 500, and/or the ESS 700 are controllable to drive the vehicle 10, the TAD 400, the pump system 600, and/or other accessories or components of the vehicle 10 (e.g., an aerial ladder assembly, etc.).

In one embodiment, the driveline 100 is configured or selectively operable as a non-hybrid or "dual drive" driveline where the ETD 500 is configured or controlled such that the ETD 500 does not generate electricity for storage in the ESS 700. By way of example, the driveline 100 may be operable in a pure electric mode where the engine system 200 is turned off and the ETD 500 uses stored energy from the ESS 700 to drive one or more component of the vehicle 10 (e.g., the front axle 14, the rear axle 16, the pump system 600, an aerial ladder assembly, the TAD 400, etc.). By way of another example, the driveline 100 may be operable in a pure engine mode where the ETD 500 functions as a mechanical conduit or power divider between the engine system 200 and one or more components of the vehicle 10 (e.g., the front axle 14, the rear axle 16, the pump system 600, an aerial ladder assembly, etc.) when the engine system 200 is in operation. By way of yet another example, the driveline 100 may be operable in an electric generation drive mode where the engine system 200 drives the ETD 500 to generate electricity and the ETD 500 uses the generated electricity to drive one or more component of the vehicle 10

(e.g., the front axle 14, the rear axle 16, the pump system 600, an aerial ladder assembly, etc.). By way of yet another example, the driveline 100 may be operable in a boost mode that is similar to the electric generation drive mode, but the ETD 500 draws additional power from the ESS 700 to supplement the generated electricity. By way of still yet another example, the driveline 100 may be operable in distributed drive mode where both the engine system 200 and the ETD 500 are simultaneously operable to drive one or more components of the vehicle 10 (i.e., the engine system 200 consumes fuel in a fuel tank and the ETD 500 consumes stored energy in the ESS 700). For example, the engine system 200 may drive the TAD 400 and the ETD 500 may drive the front axle 14, the rear axle 16, the pump system 600, and/or an aerial ladder assembly. In such operation, the ETD 500 may include an ETD clutch that facilitates decoupling the ETD 500 from the TAD 400. In another embodiment, the driveline 100 is configured or selectively operable as a "hybrid" driveline where the ETD 500 is configured or controlled such that the ETD 500 generates electricity for storage in the ESS 700. By way of example, the driveline 100 may be operable in a charging mode where the engine system 200 drives the ETD 500 to generate electricity for storage in the ESS 700 and, optionally, to power one or more electrically-operated accessories or components of the vehicle 10 and/or for use by the ETD 500 to drive one or more component of the vehicle 10 (e.g., the front axle 14, the rear axle 16, the pump system 600, an aerial ladder assembly, etc.).

Engine System

As shown in FIGS. 3 and 8-12, the engine system 200 is coupled to the frame 12 and positioned beneath the front cabin 20. In another embodiment, the engine system 200 is otherwise positioned (e.g., beneath or within the rear section 30, etc.). As shown in FIGS. 13-16, the engine system 200 includes a prime mover, shown as engine 202, and a first cooling assembly, shown as engine cooling system 210. According to an exemplary embodiment, the engine 202 is a compression-ignition internal combustion engine that utilizes diesel fuel. In alternative embodiments, the engine 202 is a spark-ignition engine that utilizes one of a variety of fuel types (e.g., gasoline, compressed natural gas, propane, etc.).

The engine 202 includes a first interface (e.g., a first output, etc.), shown as clutch interface 204, coupled to the clutch 300 (e.g., an input shaft thereof, etc.) and a second interface (e.g., a second output, etc.), shown as cooling system interface 206, coupled to the engine cooling system 210. According to an exemplary embodiment, the clutch 300 is controllable (e.g., engaged, disengaged, etc.) to facilitate selectively mechanically coupling the engine 202 to and selectively mechanically decoupling the engine 202 from the TAD 400. Accordingly, the engine 202 may be operated to drive the TAD 400 when the clutch 300 is engaged to couple the engine 202 to the TAD 400. According to an exemplary embodiment, the engine cooling system 210 includes various components such as a fan, a pulley assembly, a radiator, conduits, etc. to provide cooling to the engine 202. The fan may be coupled to the cooling system interface 206 of the engine 202 (e.g., directly, indirectly via a pulley assembly, etc.) and driven thereby.

Electromechanical Transmission Device

As shown in FIGS. 4, 5, 7, 8, 9, 11, and 12, the ETD 500 is coupled to the frame 12 and positioned beneath the front cabin 20, rearward of the engine 202, the clutch 300, and the TAD 400. In another embodiment, the ETD 500 is otherwise positioned (e.g., beneath or within the rear section 30, etc.). The ETD 500 includes a first interface (e.g., a first input/ output, etc.), shown as accessory drive interface 502, coupled to the drive pulley 410 of the TAD 400 (e.g., via an accessory drive shaft, etc.); a second interface (e.g., a second output, etc.), shown as axle interface 504, coupled (e.g., directly, indirectly, etc.) to the front axle 14 (e.g., a front differential thereof via a front drive shaft, etc.) and/or the rear axle 16 (e.g., a rear differential thereof via a rear drive shaft, etc.); and a third interface (e.g., a third output, a power-take-off ("PTO"), etc.), shown as subsystem interface 506, coupled to the pump system 600 (e.g., via a subsystem drive shaft, etc.) and/or a second subsystem 610.

Figure 7:
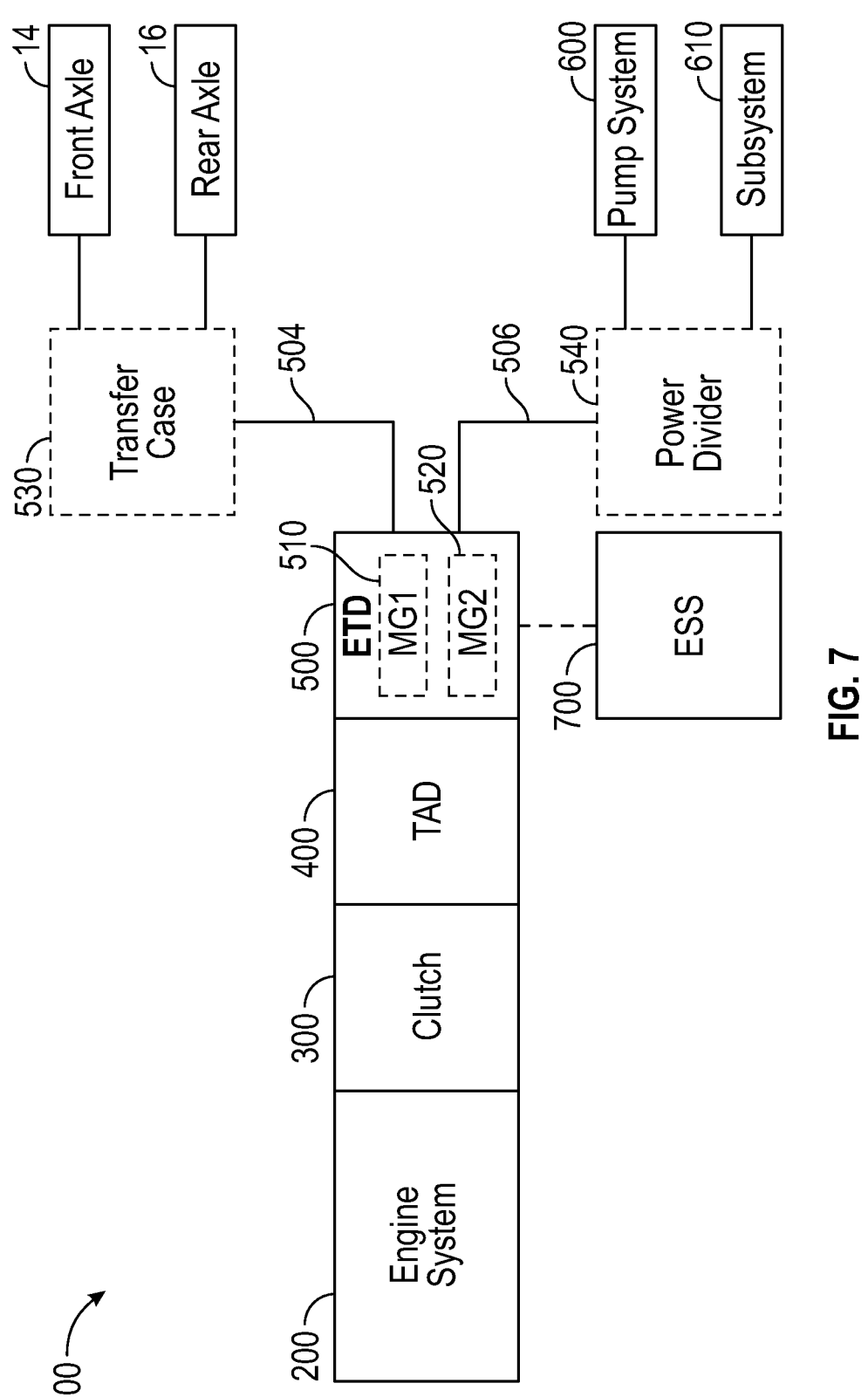
FIG. 7 is a schematic diagram of a driveline of the vehicle of FIG. 1 including an engine system, a clutch, an accessory drive, an electromechanical transmission, a pump system, an energy storage system, and one or more driven axles, according to an exemplary embodiment.
Figure 8:
FIG. 8 is a front, left perspective view of a component layout of the driveline of FIG. 7, according to an exemplary embodiment.
Figure 9:
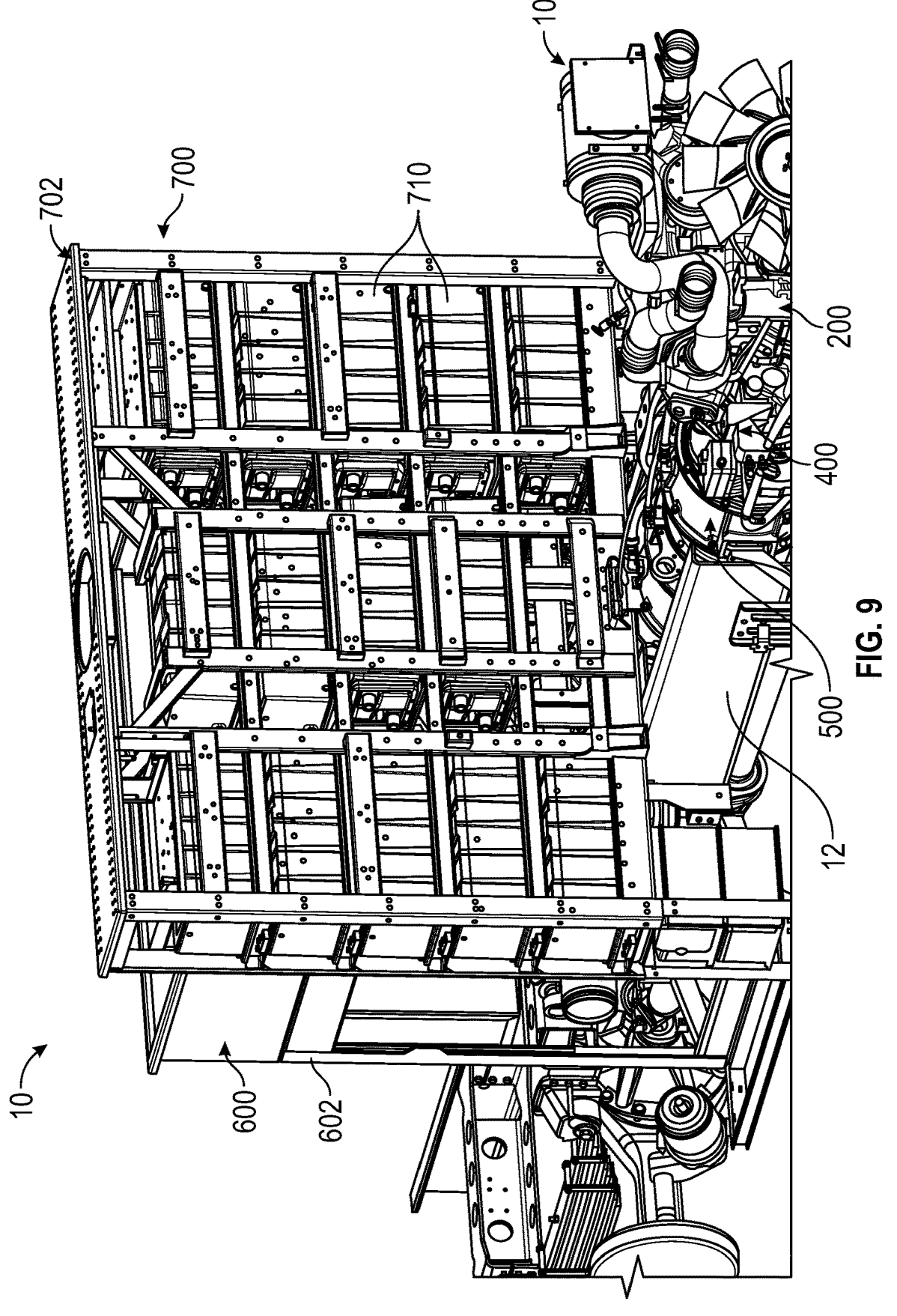
FIG. 9 is a front, right perspective view of the component layout of the driveline of FIG. 7, according to an exemplary embodiment.
Figure 10:
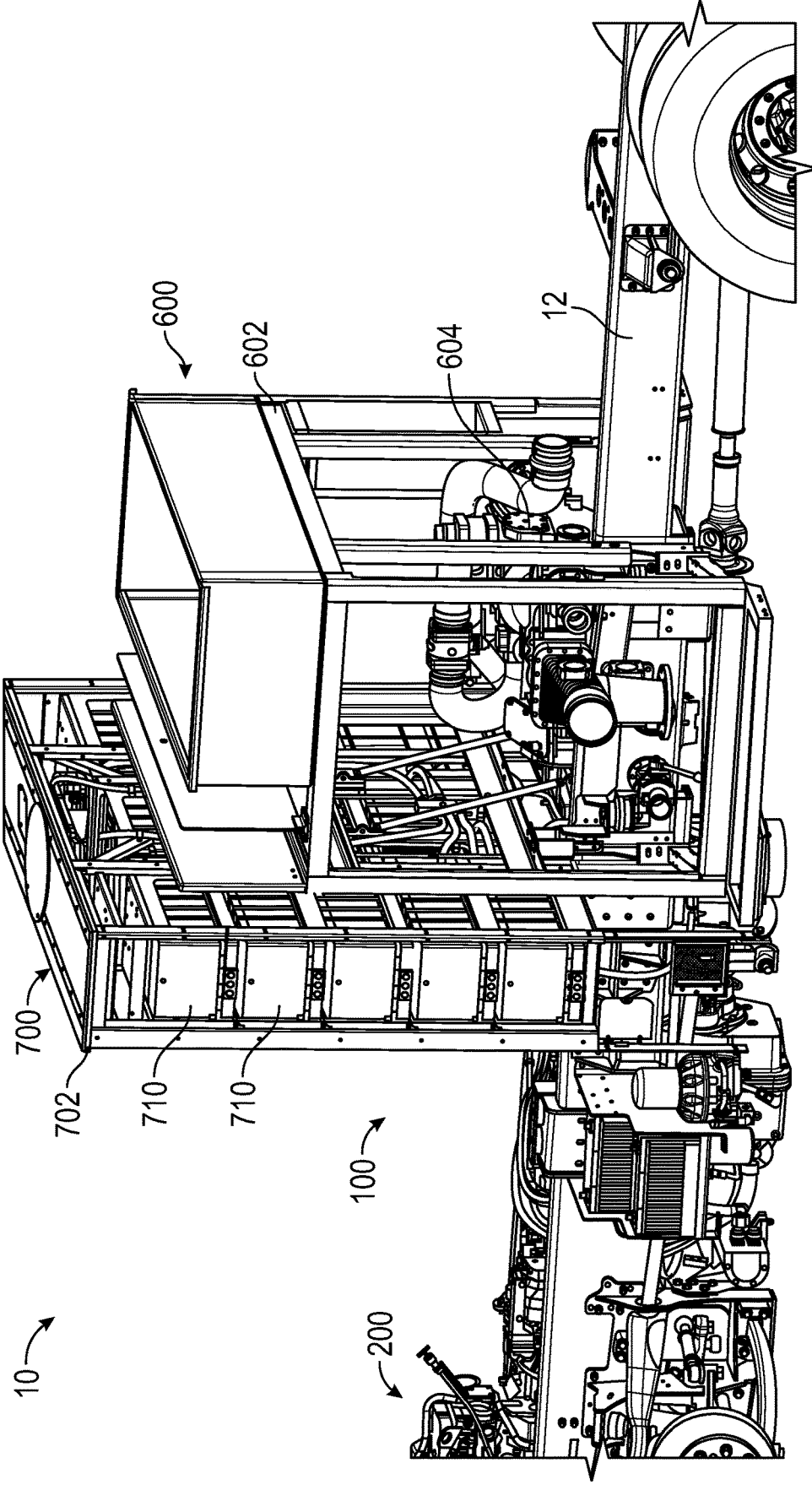
FIG. 10 is a side perspective view of the component layout of the driveline of FIG. 7, according to an exemplary embodiment.
Figure 11:
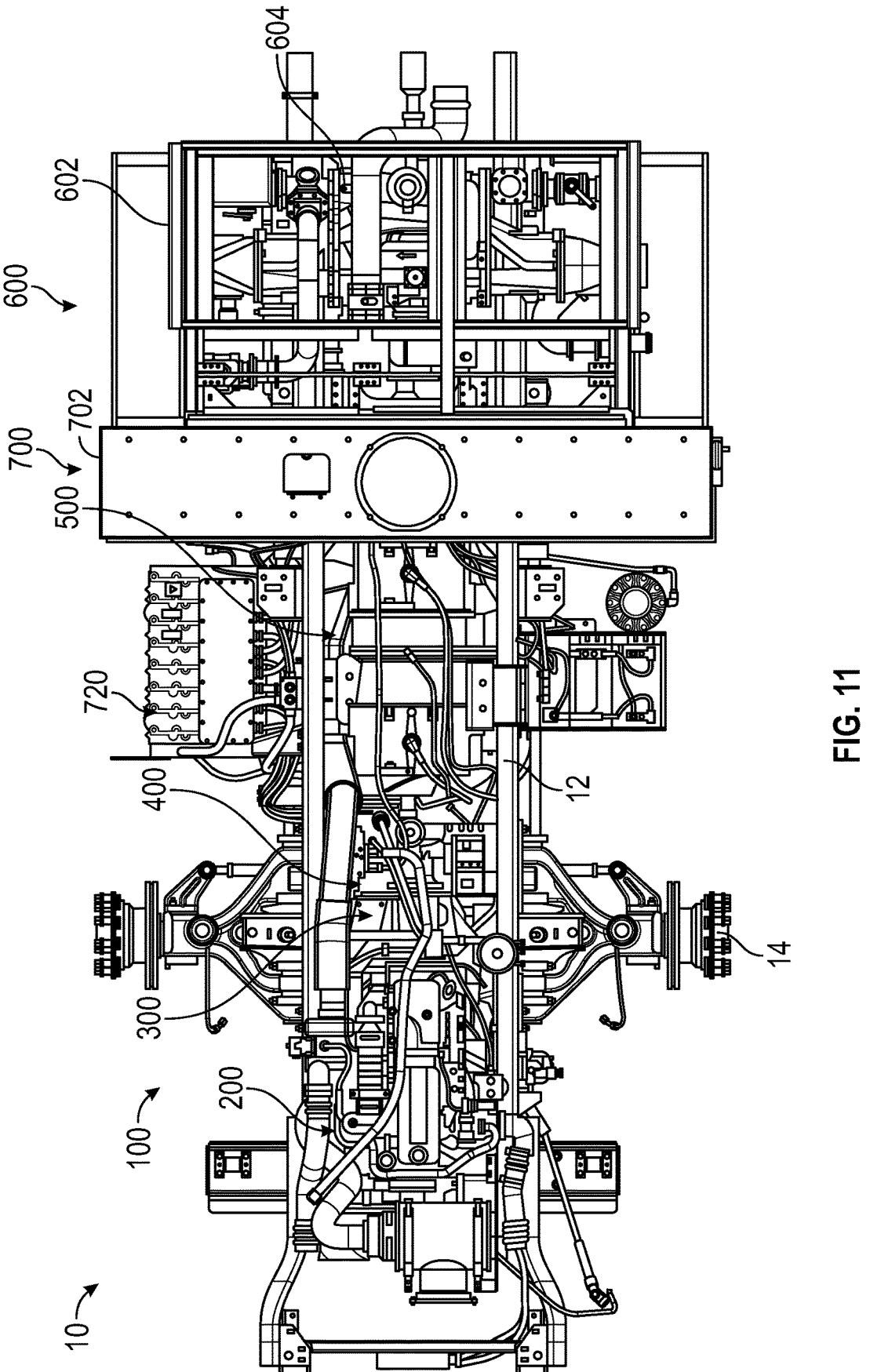
FIG. 11 is a top view of the component layout of the driveline of FIG. 7, according to an exemplary embodiment.
Figure 12:
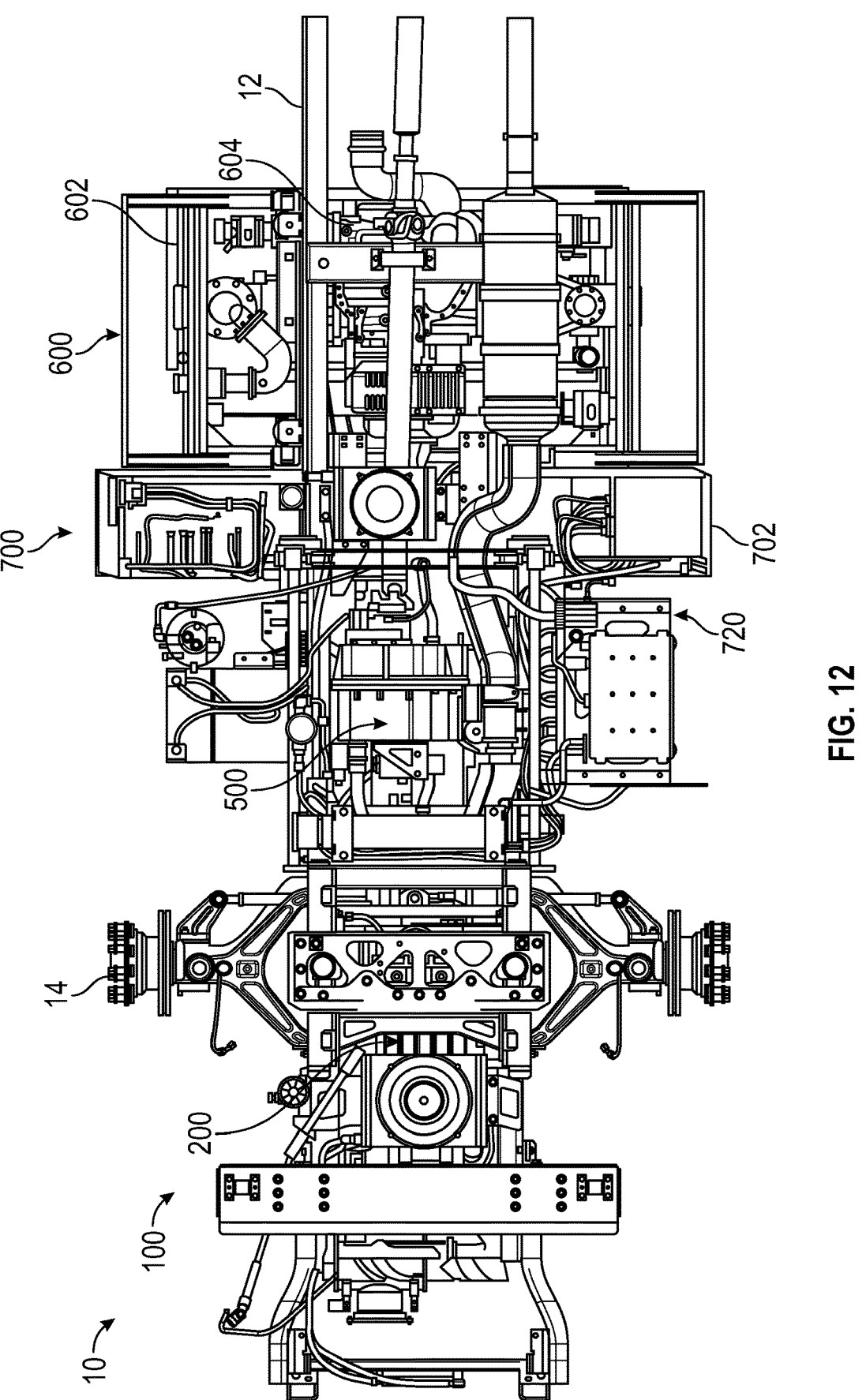
FIG. 12 is a bottom view of the component layout of the driveline of FIG. 7, according to an exemplary embodiment.
Figure 13:
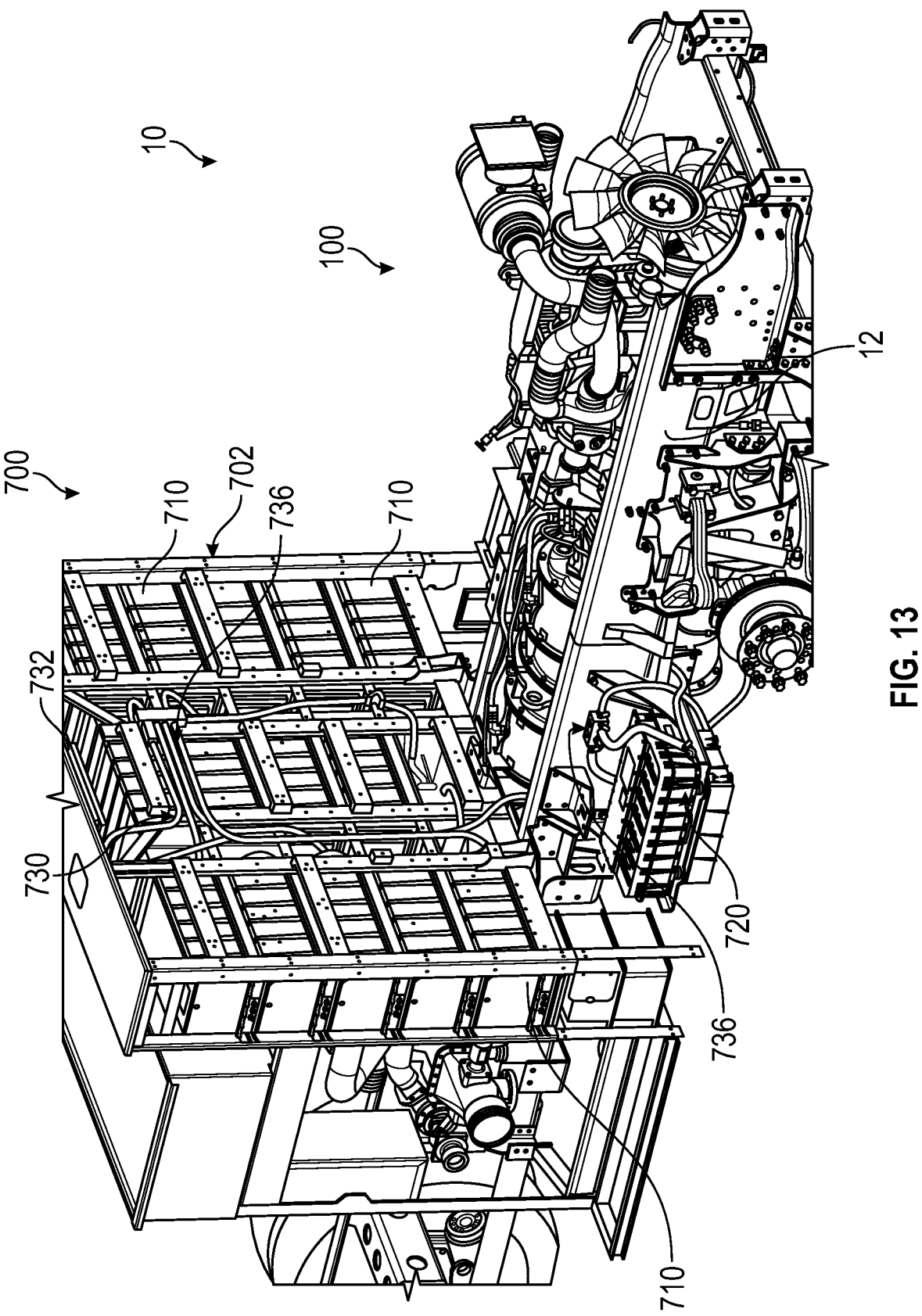
FIG. 13 is a front, right perspective view of the energy storage system of the driveline of FIG. 7, according to an exemplary embodiment.

In one embodiment, the axle interface 504 includes a single output directly coupled to the front axle 14 or the rear axle 16 such that only one of the front axle 14 or the rear axle 16 is driven. In another embodiment, the axle interface 504 includes two separate outputs, one directly coupled to each of the front axle 14 and the rear axle 16 such that both the front axle 14 and the rear axle 16 are driven. In some embodiments, as shown in FIG. 7, the driveline 100 includes a first power divider, shown as transfer case 530, and the axle interface 504 includes a single output coupled to an input of the transfer case 530. The transfer case 530 may include a first output coupled to the front axle 14 and a second output coupled to the rear axle 16 to facilitate driving the first axle 14 and the rear axle 16 with the ETD 500. In some embodiments, as shown in FIG. 7, the driveline 100 includes a second power divider, show as power divider 540, and the subsystem interface 506 is coupled to an input of the power divider 540. The power divider 540 may include a plurality of outputs coupled to a plurality of subsystems (e.g., the pump system 600, an aerial ladder assembly, the second subsystem 610, etc.) to facilitate selectively driving each of the plurality of subsystems with the ETD 500. According to an exemplary embodiment, the ETD 500 is configured such that the subsystem interface 506 and the axle interface 504 are speed independent. Therefore, the subsystems (e.g., the pump system 600, the aerial ladder assembly, the second subsystem 610, etc.) can be driven with the ETD 500 at a speed independent of the ground speed of the vehicle 10.

As shown in FIG. 7, the ETD 500 is electrically coupled to the ESS 700. According to an exemplary embodiment, such electrical connection facilitates electrically operating the ETD 500 using stored energy in the ESS 700 to drive the front axle 14, the rear axle 16, the TAD 400, the pump system 600, and/or another subsystem (e.g., the second subsystem 610). In some embodiments (e.g., in embodiments where the driveline 100 is a hybrid driveline or is selectively operable as a hybrid driveline), such electrical coupling facilitates charging the ESS 700 with the ETD 500. The ETD 500 is selectively coupled to the engine 202 by the clutch 300 and through the TAD 400. Accordingly, the ETD 500 may be selectively driven by the engine 202 when the clutch 300 is engaged. On the other hand, the ETD 500 may be operated using stored energy of the ESS 700 to back-drive the TAD 400 via the accessory drive interface 502 when the clutch 300 is disengaged.

In some embodiments, the ETD 500 functions as a mechanical conduit or power divider, and transmits the mechanical input received from the engine 202 to the pump system 600 (or other subsystem(s)), the front axle 14, and/or the rear axle 16. In some embodiments, the ETD 500 uses the mechanical input to generate electricity for use by the ETD 500 to drive the pump system 600, the front axle 14, and/or the rear axle 16. In some embodiments, the ETD 500 supplements the mechanical input using the stored energy in the ESS 700 to provide an output greater than the input received from the engine 202. In some embodiments, the ETD 500 uses the mechanical input to generate electricity for storage in the ESS 700. In some embodiments, the ETD 500 in not configured to generate electricity for storage in the ESS 700 or is prevented from doing so (e.g., for emissions compliance, a dual drive embodiment, etc.) and, instead, the ESS 700 is otherwise charged (e.g., through a charging station, an external input, regenerative braking, etc.).

According to the exemplary embodiment shown in FIG. 7, the ETD 500 is configured as an electromechanical infinitely variable transmission ("EMIVT") that includes a first electromagnetic device, shown as a first motor/generator 510, and a second electromagnetic device, shown as second motor/generator 520. The first motor/generator 510 and the second motor/generator 520 may be coupled to each other via a plurality of gear sets (e.g., planetary gear sets, etc.). The EMIVT also includes one or more brakes and one or more clutches to facilitate operation of the EMIVT in various modes (e.g., a drive mode, a battery charging mode, a low-range speed mode, a high-range speed mode, a reverse mode, an ultra-low mode, etc.). In some implementations, all of such components may be efficiently packaged in a single housing with only the inputs/outputs thereof exposed.

By way of example, the first motor/generator 510 may be driven by the engine 202 to generate electricity. The electricity generated by the first motor/generator 510 may be used (i) to charge the ESS 700 and/or (ii) to power the second motor/generator 520 to drive the front axle 14, the rear axle 16, the pump system 600, and/or another subsystem coupled thereto. By way of another example, the second motor/generator 520 may be driven by the engine 202 to generate electricity. The electricity generated by the second motor/generator 520 may be used (i) to charge the ESS 700 and/or (ii) to power the first motor/generator 510 to drive the front axle 14, the rear axle 16, the pump system 600, and/or another subsystem coupled thereto. By way of another example, the first motor/generator 510 and/or the second motor/generator 520 may be powered by the ESS 700 to (i) back-start the engine 202 (e.g., such that an engine starter is not necessary, etc.), (ii) drive the TAD 400 (e.g., when the engine 202 is off, when the clutch 300 is disengaged, etc.), and/or (iii) drive the front axle 14, the rear axle 16, the pump system 600, and/or another subsystem coupled thereto. By way of yet another example, the first motor/generator 510 may be driven by the engine 202 to generate electricity and the second motor/generator 520 may receive both the generated electricity from the first motor/generator 510 and the stored energy in the ESS 700 to drive the front axle 14, the rear axle 16, the pump system 600, and/or another subsystem coupled thereto. By way of yet still another example, the second motor/generator 520 may be driven by the engine 202 to generate electricity and the first motor/generator 510 may receive both the generated electricity from the second motor/generator 520 and the stored energy in the ESS 700 to drive the front axle 14, the rear axle 16, the pump system 600, and/or another subsystem coupled thereto. By way of yet still another example, the first motor/generator 510, the second motor/generator 520, the plurality of gear sets, the one or more brakes, and/or the one or more clutches may be controlled such that no electricity is generated or consumed by the ETD 500, but rather the ETD 500 functions as a mechanical conduit or power divider that provides the mechanical input received from the engine 202 to the front axle 14, the rear axle 16, the pump system 600, and/or another subsystem coupled thereto. By way of yet still another example, the ETD 500 may be selectively decoupled from the TAD 400 (e.g., via a clutch of the ETD 500) such that the engine 202 drives the TAD 400 while the ETD 500 simultaneously uses the stored energy in the ESS 700 to drive the front axle 14, the rear axle 16, the pump system 600, and/or another subsystem coupled thereto.

In some embodiments, the first motor/generator 510 and/or the second motor/generator 520 are controlled to provide regenerative braking capabilities. By way of example, the first motor/generator 510 and/or the second motor/generator 520 may be back-driven by the front axle 14 and/or the rear axle 16 though the axle interface 504 during a braking event. The first motor/generator 510 and/or the second motor/generator 520 may, therefore, operate as a generator that generates electricity during the braking event for storage in the ESS 700 and/or to power electronic components of the vehicle 10. In other embodiments, the ETD 500 does not provide regenerative braking capabilities.

Further details regarding the components of the EMIVT and the structure, arrangement, and functionality thereof may be found in (i) U.S. Pat. No. 8,337,352, filed Jun. 22, 2010, (ii) U.S. Pat. No. 9,651,120, filed Feb. 17, 2015, (iii) U.S. Pat. No. 10,421,350, filed Oct. 20, 2015, (iv) U.S. Pat. No. 10,584,775, filed Aug. 31, 2017, (v) U.S. Patent Publication No. 2017/0370446, filed Sep. 7, 2017, (vi) U.S. Pat. No. 10,578,195, filed Oct. 4, 2017, (vii) U.S. Pat. No. 10,982,736, filed Feb. 17, 2019, and (viii) U.S. Pat. No. 11,137,053, filed Jul. 14, 2020, all of which are incorporated herein by reference in their entireties. In other embodiments, the ETD 500 includes a device or devices different than the EMIVT (e.g., an electronic transmission, a motor and/or generator, a motor and/or generator coupled to a transfer case, an electronic axle, etc.).

Pump System

As shown in FIGS. 1, 2, 4-6, and 8-12, the pump system 600 is coupled to the frame 12 and positioned in a space, shown as gap 40, between the front cabin 20 and the rear section 30. In another embodiment, the pump system 600 is otherwise positioned (e.g., within the rear section 30, etc.). The pump system 600 includes a frame assembly, shown as pump house 602, coupled to the frame 12 and a pump assembly, shown as pump 604, disposed within and supported by the pump house 602. In some embodiments, the pump 604 includes an interface (e.g., an input, etc.) that engages (directly or indirectly) with subsystem interface 506 of the ETD 500. The ETD 500 may thereby drive the pump 604 to pump a fluid from a source (e.g., an on-vehicle fluid source, an off-vehicle fluid source, an on-board water tank, an on-board agent tank, a fire hydrant, an open body of water, a tanker truck, etc.) to one or more fluid outlets on the vehicle 10 (e.g., a structural discharge, a hose reel, a turret, a high reach extendible turret ("HRET"), etc.). In some embodiments, the pump 604 can be coupled to a motor (e.g., an electric motor) that is powered by the ESS and configured to drive the pump 604 to pump fluid from the fluid source.

Energy Storage System

As shown in FIGS. 1-20, the ESS 700 includes a housing, shown as support rack 702, coupled to the frame 12 and positioned in the gap 40 between the front cabin 20 and the rear section 30, forward of the pump house 602; a plurality of battery cells, shown as battery packs 710, supported by the support rack 702; an inverter system, shown as inverter assembly 720, coupled to the frame 12 separate from the support rack 702 and positioned beneath the front cabin 20; a second cooling assembly, shown as ESS cooling system 730; a wiring assembly, shown as high voltage wiring assembly 740; and a charging assembly, shown as high voltage charging system 750, disposed along a side of the support rack 702. The high voltage charging system 750 may include a high voltage charging port 752 (see, e.g., FIG. 21). In another embodiment, the support rack 702 and/or the battery packs 710 are otherwise positioned (e.g., behind the pump house 602; within the rear section 30; between frame rails of the frame 12; to achieve a desired packaging, weight balance, or cost performance of the driveline 100 and the vehicle 10; etc.).

Figure 14:
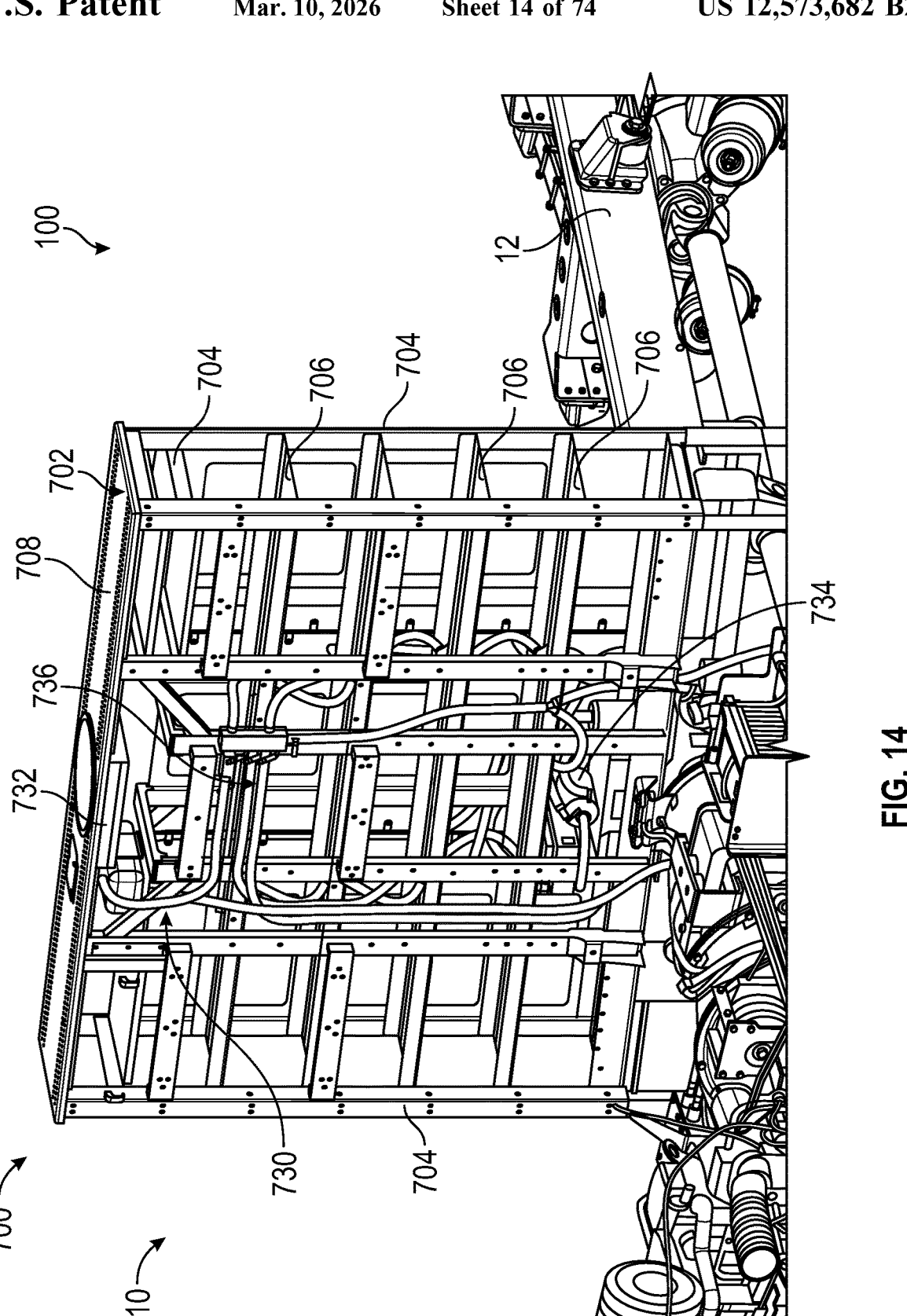
FIG. 14 is a front, left perspective view of the energy storage system of the driveline of FIG. 7 with the batteries hidden, according to an exemplary embodiment.
Figure 15:
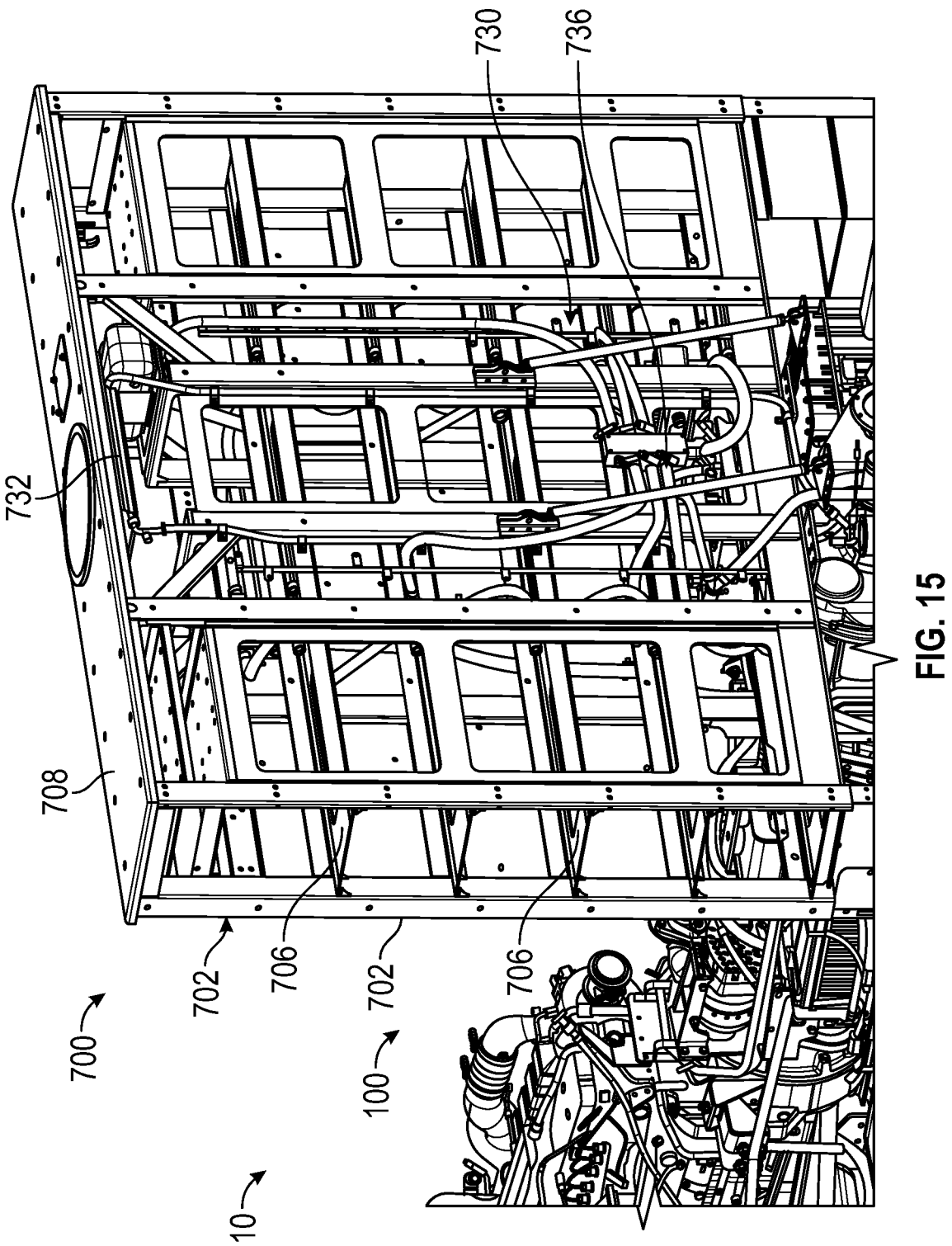
FIG. 15 is a back, left perspective view of the energy storage system of the driveline of FIG. 7 with the batteries hidden, according to an exemplary embodiment.
Figure 16:
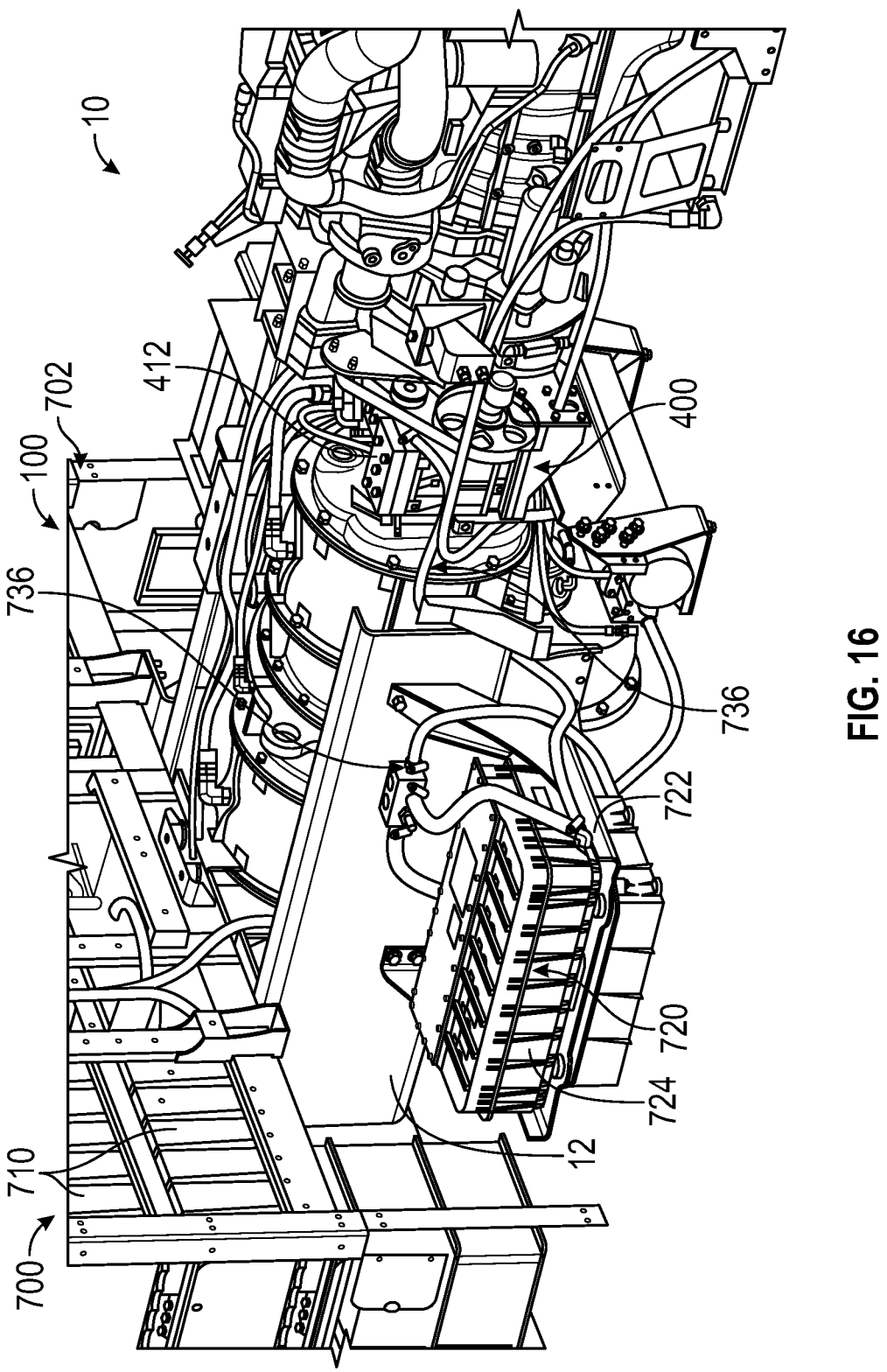
FIG. 16 is a front, right perspective view of a portion the energy storage system of the driveline of FIG. 7 including an inverter, according to an exemplary embodiment.
Figure 17:
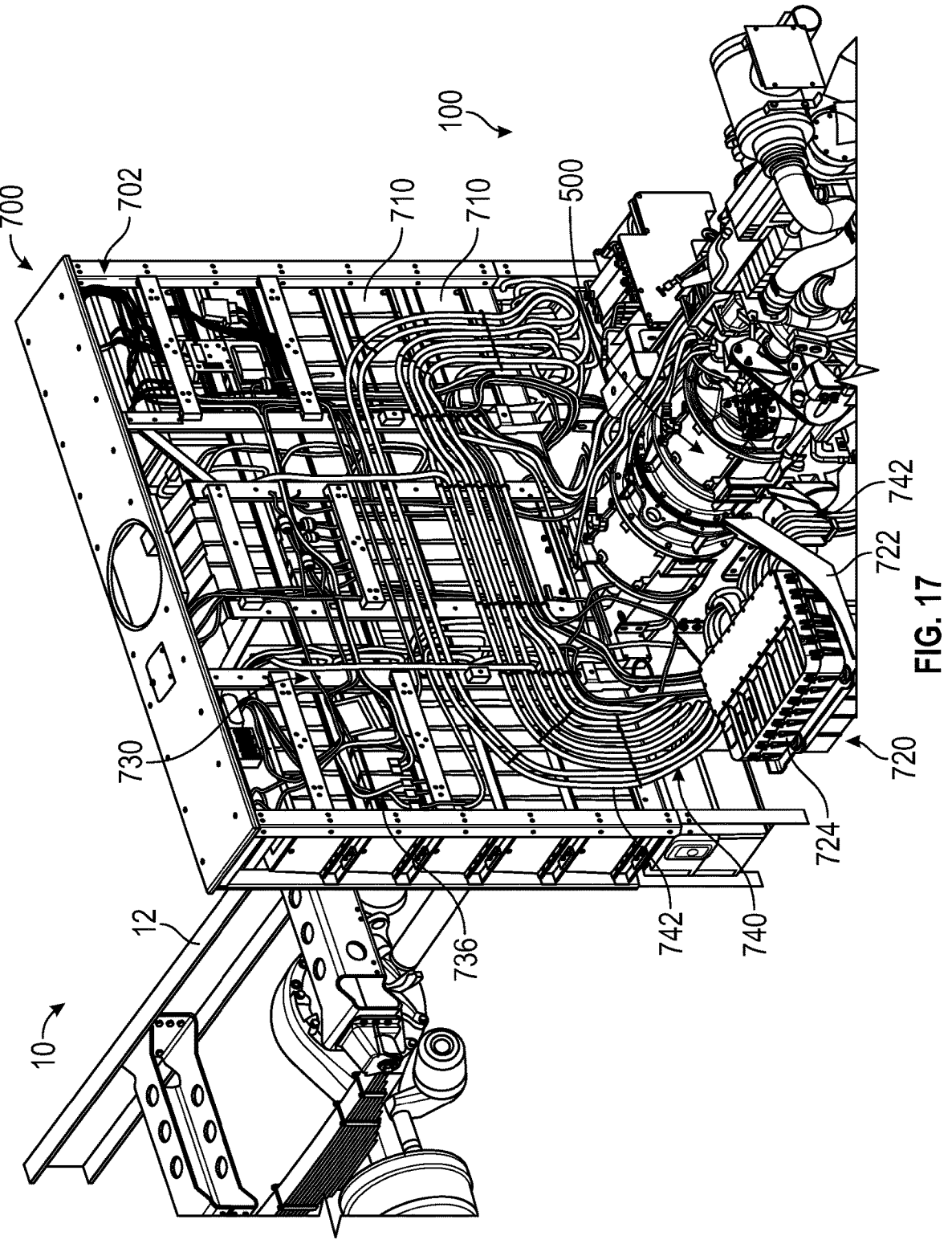
FIG. 17 is a front, right perspective view of the energy storage system of the driveline of FIG. 7 with a wiring assembly, according to an exemplary embodiment.
Figure 18:
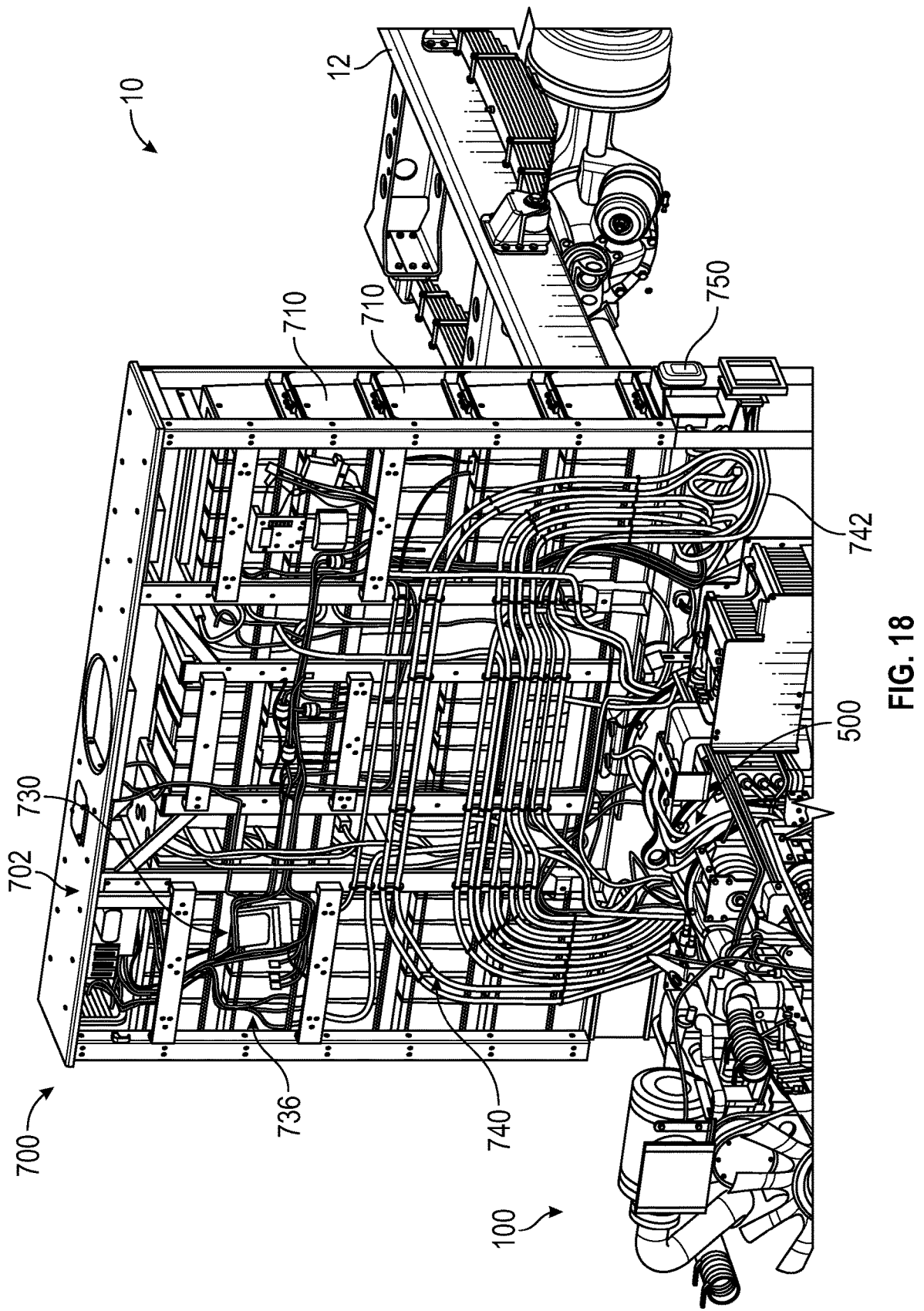
FIG. 18 is a front, left perspective view of the energy storage system of the driveline of FIG. 7, according to an exemplary embodiment.
Figure 19:
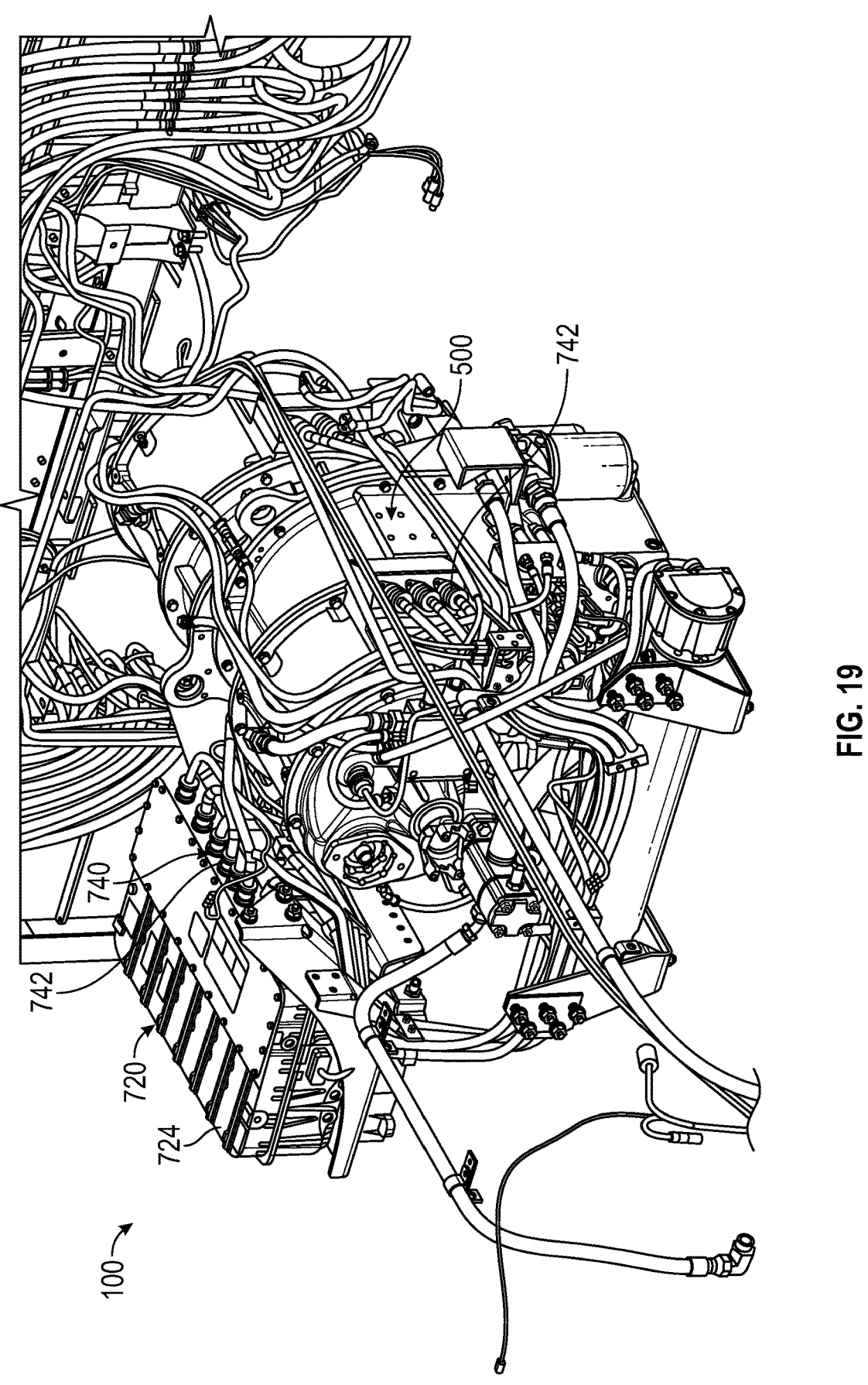
FIG. 19 is a front, left perspective view of a portion of the energy storage system and a transmission device of the driveline of FIG. 7, according to an exemplary embodiment.
Figure 20:
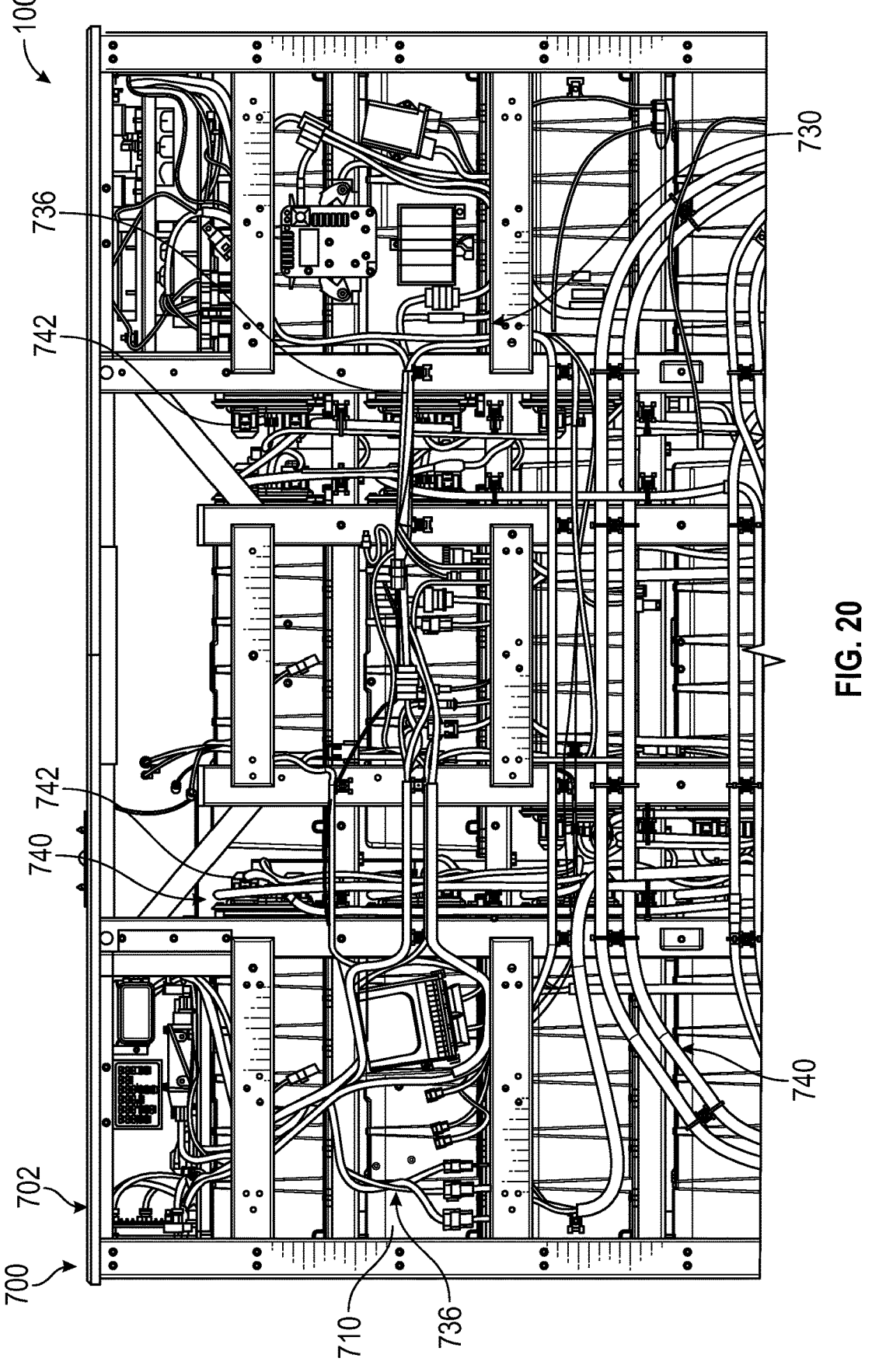
FIG. 20 is a front view the energy storage system of the driveline of FIG. 7, according to an exemplary embodiment.

As shown in FIGS. 14 and 15, the support rack 702 includes a plurality of vertical supports, shown as frame members 704; a plurality of horizontal supports, shown as shelving 706, coupled to the frame members 704 at various heights along the frame members 704 and that support the battery packs 710; and a top support, shown as top panel 708, extending horizontally across a top end of the support rack 702. As shown in FIGS. 16 and 17, the inverter assembly 720 includes a bracket, shown as inverter bracket 722, coupled to one the frame rails of the frame 12 and positioned proximate the support rack 702 (e.g., a front side thereof, etc.) and an inverter, shown as inverter 724, coupled to and supported by the inverter bracket 722. In another embodiment, the inverter 724 is located on or coupled directly to the support rack 702.

As shown in FIGS. 3, and 13-20, the ESS cooling system 730 includes a heat exchanger, shown as cooling radiator 732, coupled to an underside of the top panel 708; a driver, shown as cooling compressor 734, supported by the shelving 706; and a plurality of fluid conduits, shown as cooling conduits 736, fluidly coupling the cooling radiator 732 and the cooling compressor 734 to various components of the driveline 100 including the ETD 500, the battery packs 710, the inverter 724, and/or one or more of the accessories 412. The ESS cooling system 730 may, therefore, facilitate thermally regulating (i.e., cooling) not only components of the ESS 700, but also other components of the vehicle 10 (e.g., the ETD 500, the accessories 412, etc.).

Figure 3:
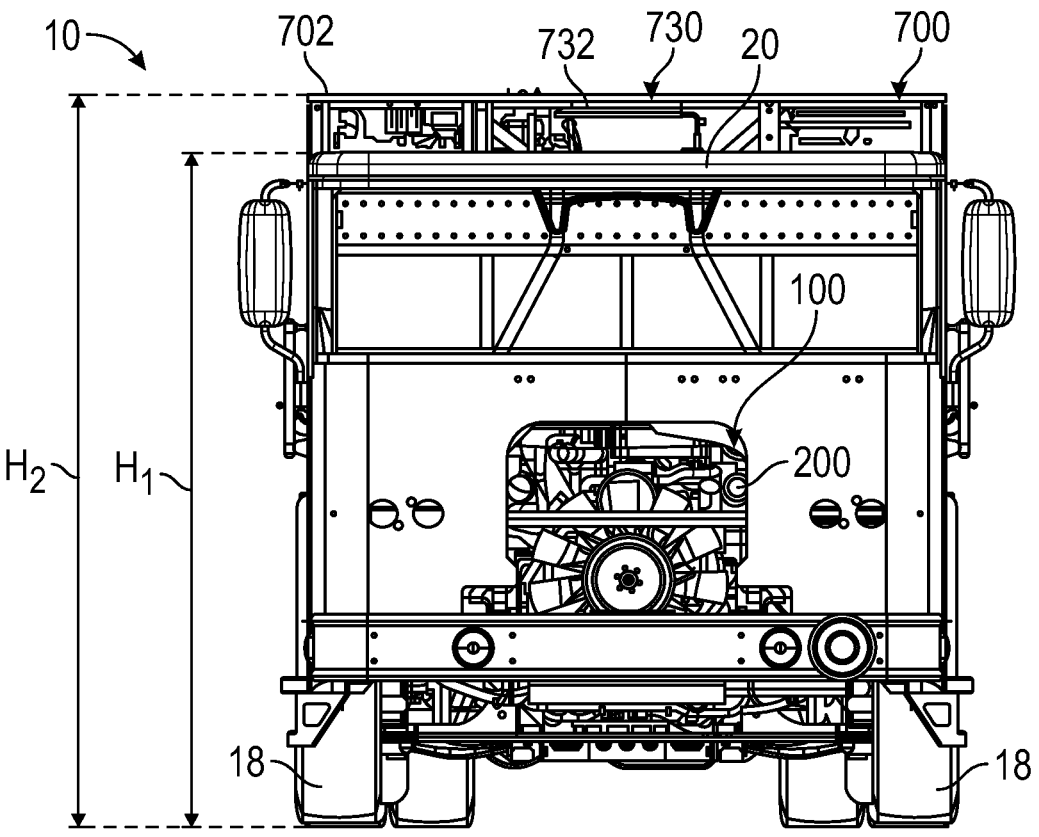
FIG. 3 is a front view of the vehicle of FIG. 1, according to an exemplary embodiment.
Figure 4:
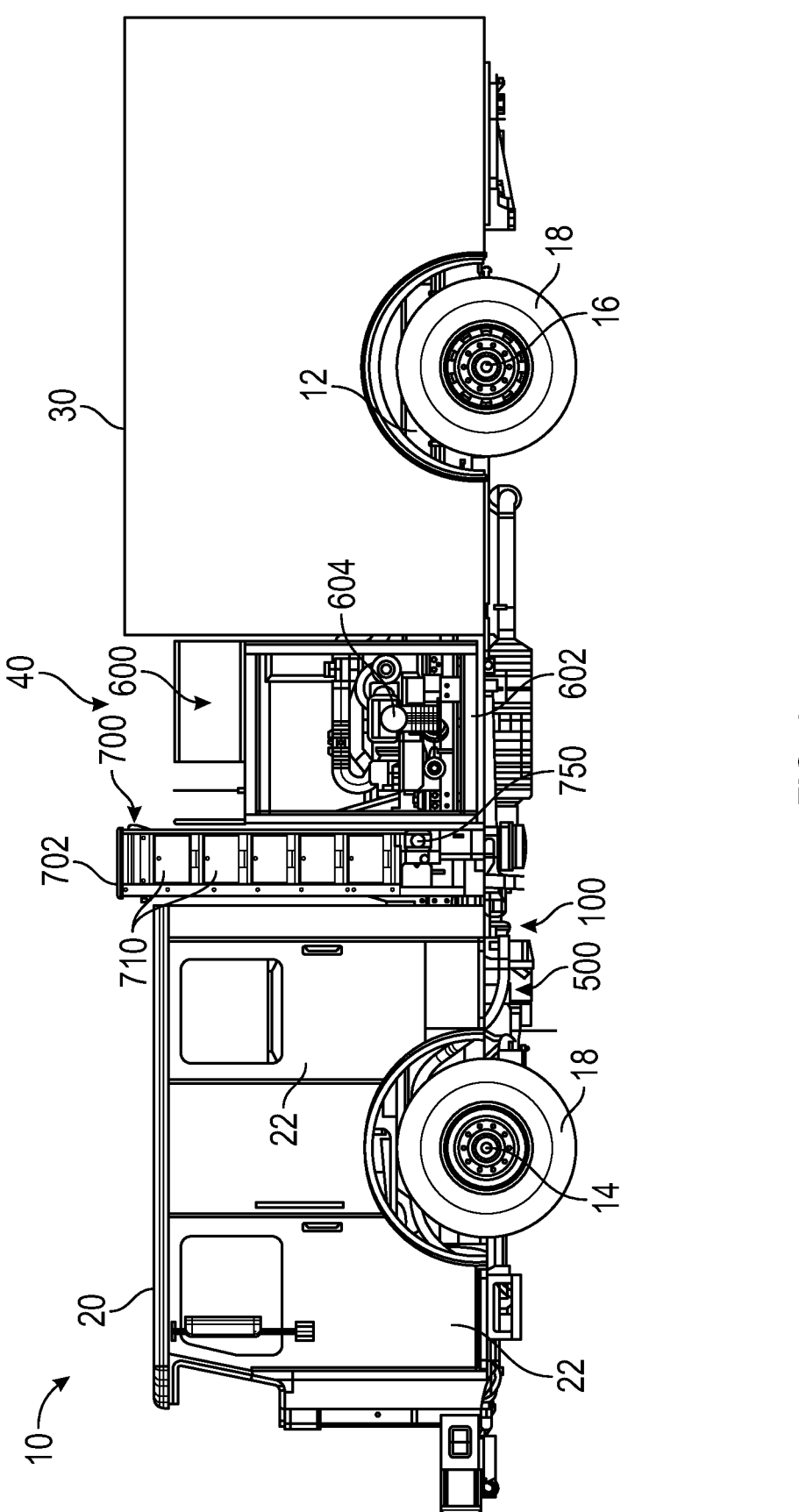
FIG. 4 is a left side view of the vehicle of FIG. 1, according to an exemplary embodiment.
Figure 5:
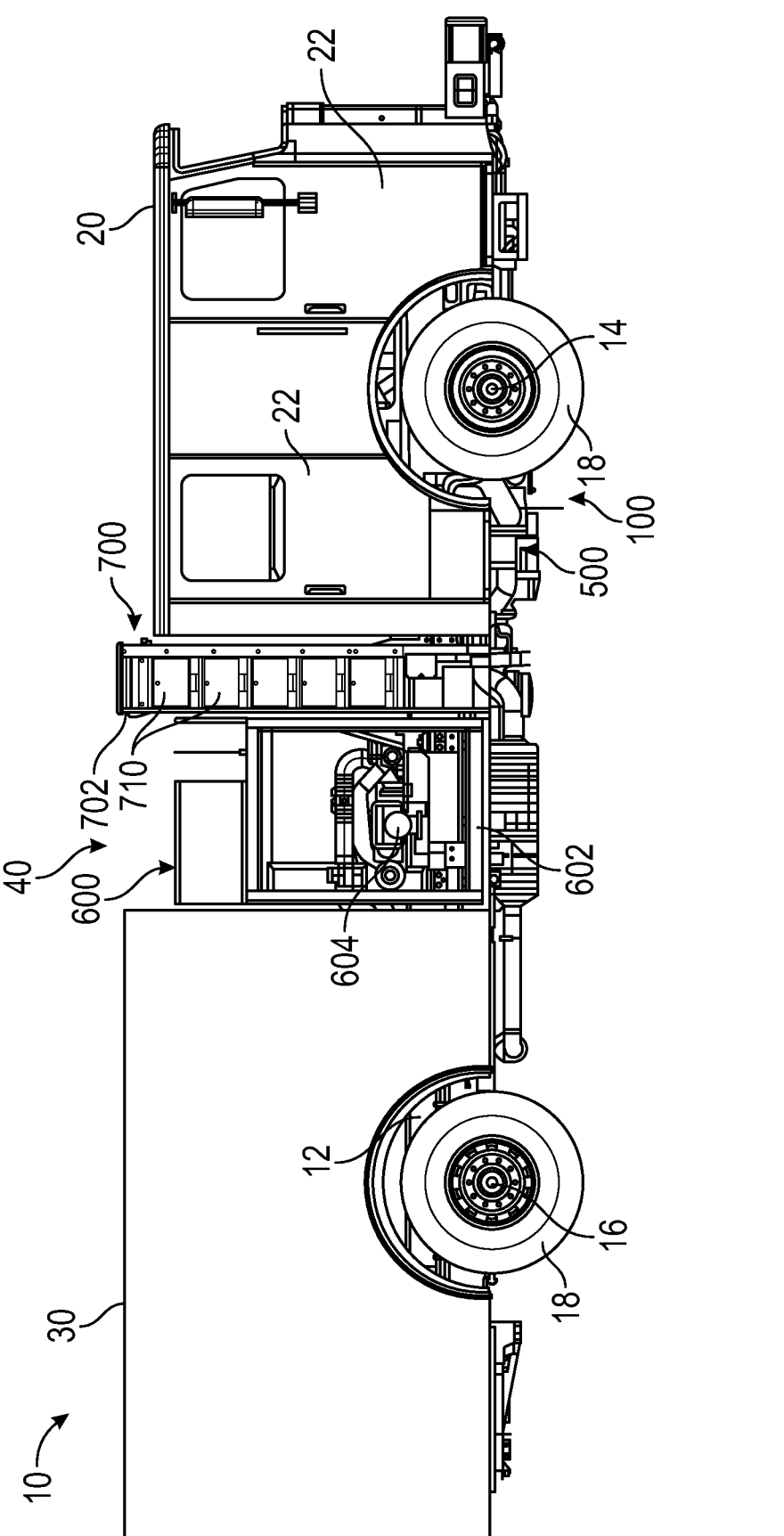
FIG. 5 is a right side view of the vehicle of FIG. 1, according to an exemplary embodiment.
Figure 6:
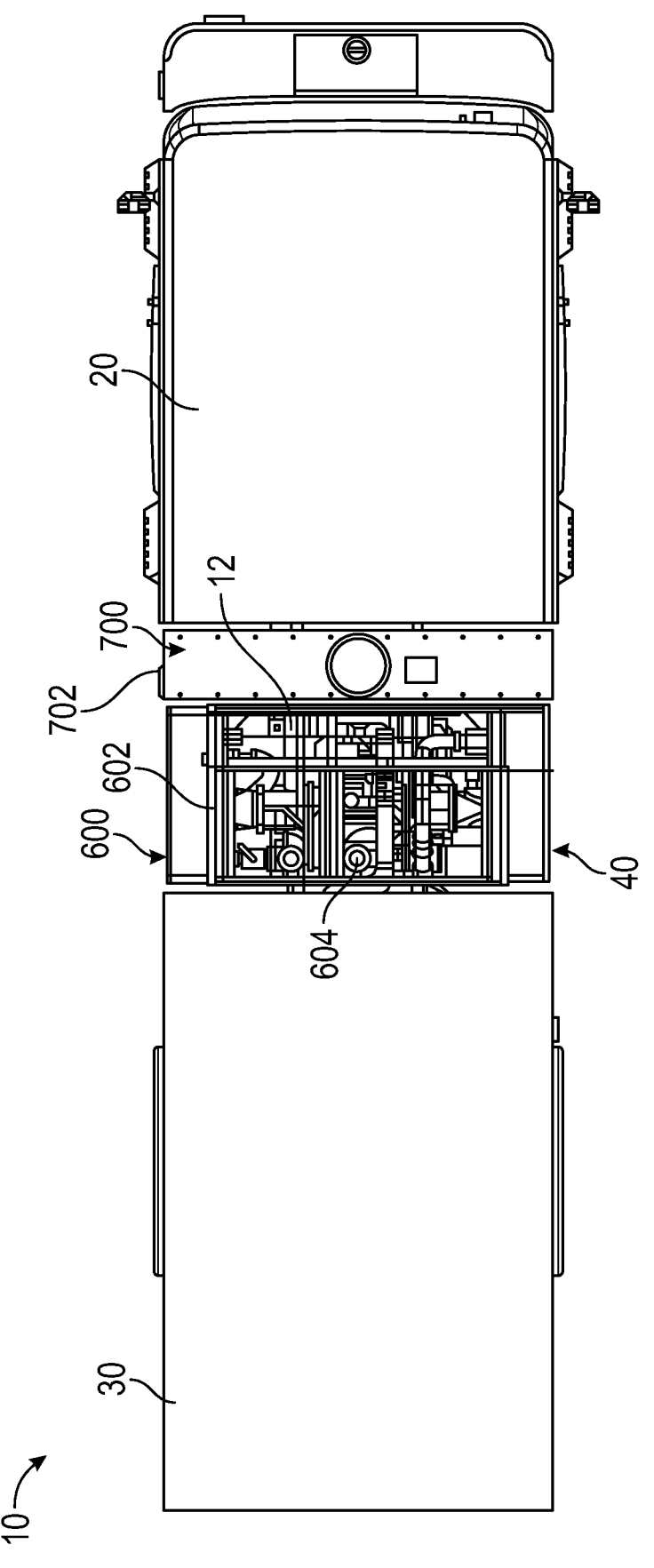
FIG. 6 is a top view of the vehicle of FIG. 1, according to an exemplary embodiment.

As shown in FIG. 3, the vehicle 10 has an overall height $H_1$ and the support rack 702 has an overall height $H_2$ that is greater than $H_1$ such that at least a portion of the support rack 702 (e.g., the top panel 708) extends above the front cabin 20. Such an arrangement causes airflow above the front cabin 20 to flow directly to the cooling radiator 732 to allow for maximum performance of the ESS cooling system 730. In other embodiments (e.g., embodiments where the battery packs 710 are otherwise located or arranged, etc.), the cooling radiator 732 is otherwise positioned. According to an exemplary embodiment, the ESS cooling system 730 is positioned separate and independent from the engine cooling system 210. In other embodiments, at least a portion of the ESS cooling system 730 (e.g., the cooling radiator 732, etc.) is co-located with the engine cooling system 210. In still other embodiments, one or more components of the ESS cooling system 730 and the engine cooling system 210 are shared (e.g., the engine radiator and the cooling radiator 732 are one in the same, etc.).

Figures 22, 23:
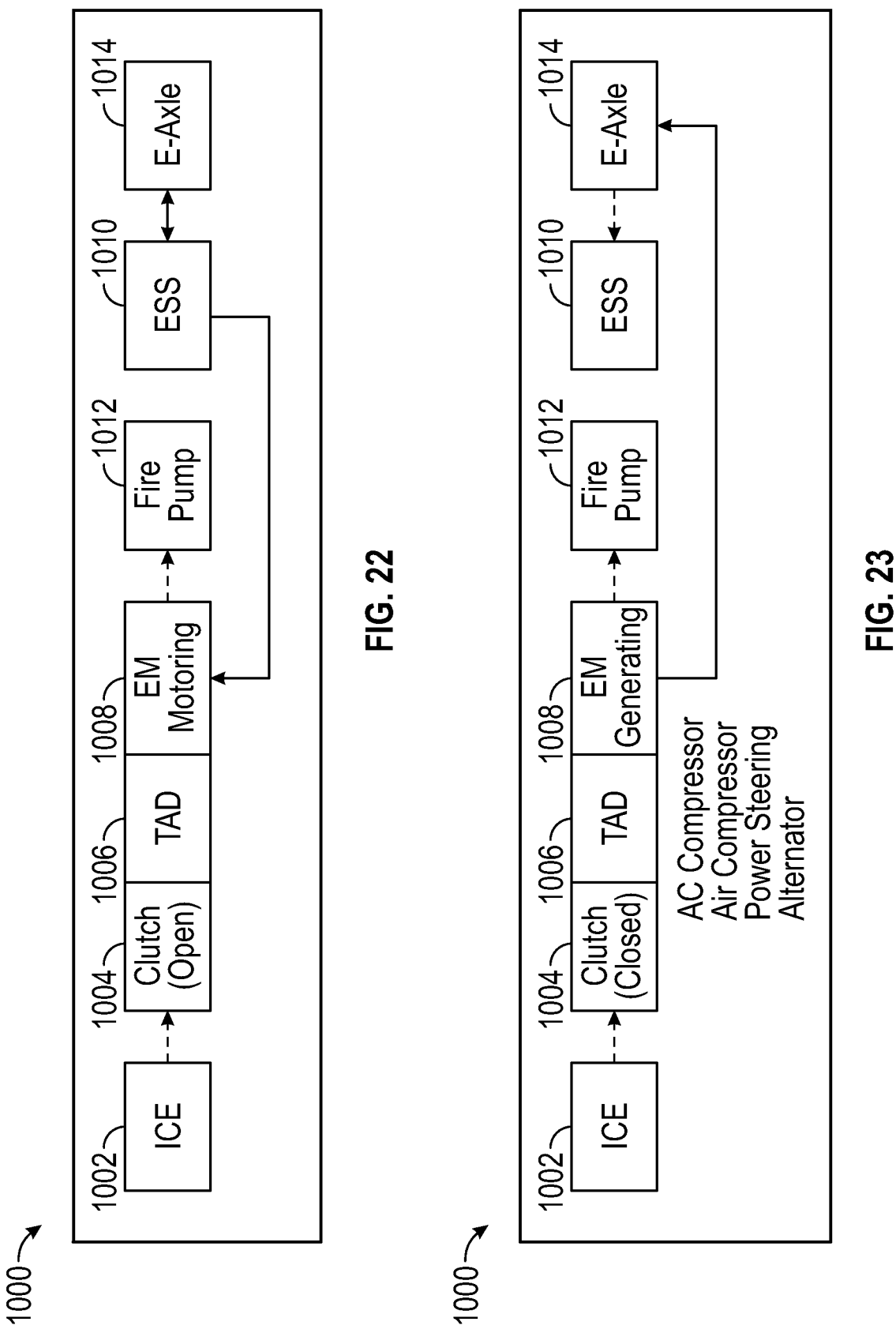
FIG. 22 is a schematic illustration of an E-axle driveline in a first mode, according to an exemplary embodiment.
FIG. 23 is a schematic illustration of the E-axle of FIG. 22 in a second mode.
Figure 24:
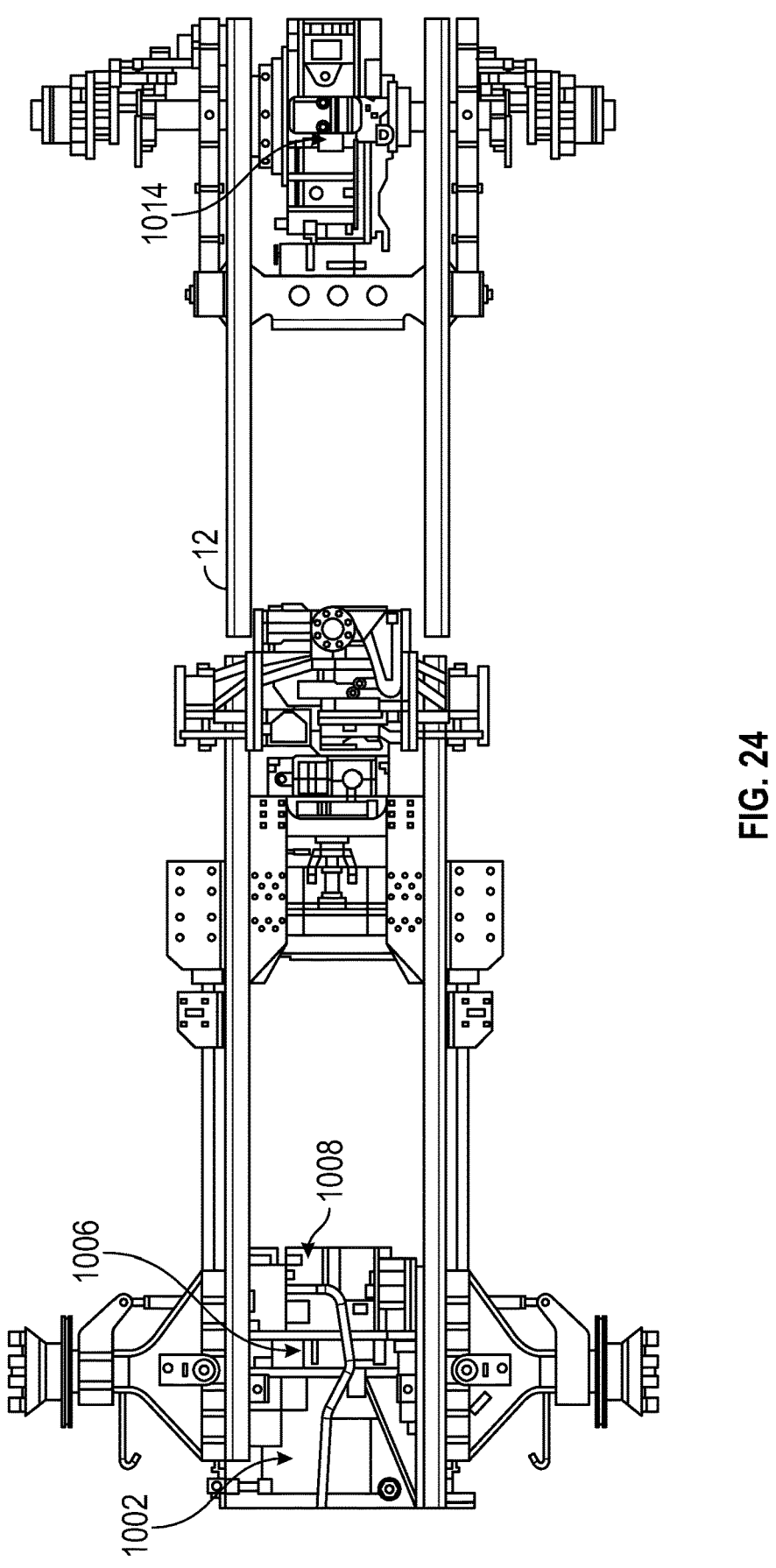
FIG. 24 is a top view of the E-axle of FIG. 22 implemented in the vehicle of FIG. 1, according to an exemplary embodiment.
Figures 25, 26:
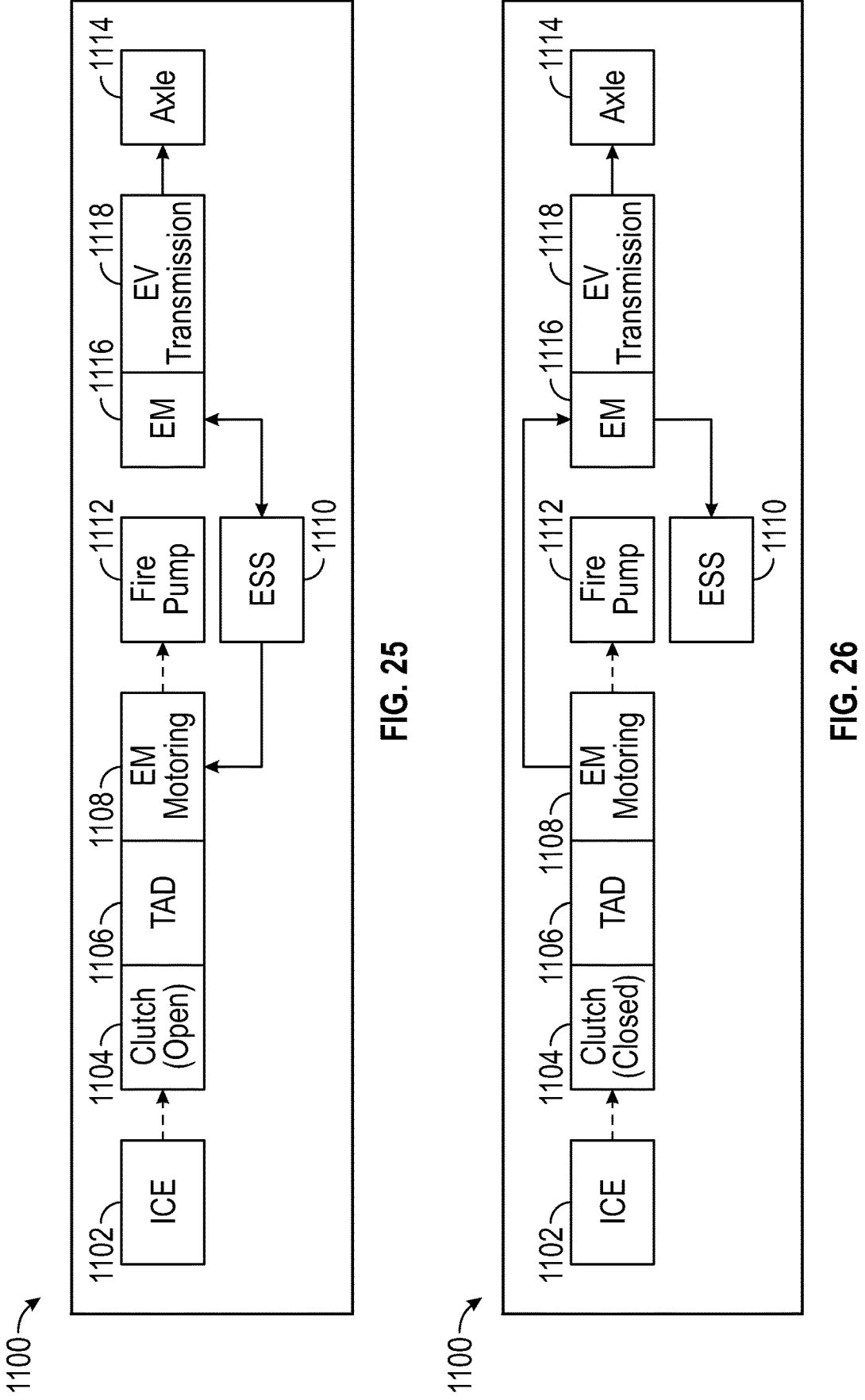
FIG. 25 is a schematic illustration of an EV transmission driveline in a first mode, according to an exemplary embodiment.
FIG. 26 is a schematic illustration of the EV transmission driveline of FIG. 25 in a second mode.

As shown in FIGS. 17-20, the high voltage wiring assembly 740 includes a plurality of high voltage wires, shown as high voltage wires 742, electrically connecting various electrically-operated components of the vehicle 10 to the battery packs 710. Specifically, as shown in FIGS. 23-25, the battery packs 710 are electrically connected to the ETD 500, the inverter 724, and the high voltage charging system 750 by the high voltage wires 742. The battery packs 710 may be charged by an external source (e.g., a high voltage power source, etc.) via the high voltage charging system 750 (e.g., via a port thereof, etc.). According to an exemplary embodiment, the ETD 500 draws stored energy in the battery packs

710 via the high voltage wires 742 to facilitate operation thereof. In some embodiments, the ETD 500 does not charge the battery packs 710 with energy generated thereby. In other embodiments, the ETD 500 is operable to charge the battery packs 710 with the energy generated thereby. It should be understood that the battery packs 710 may power additional components of the vehicle 10 (e.g., lights, sirens, communication systems, displays, electric accessories, electric motors, etc.).

Control System

Figure 21:
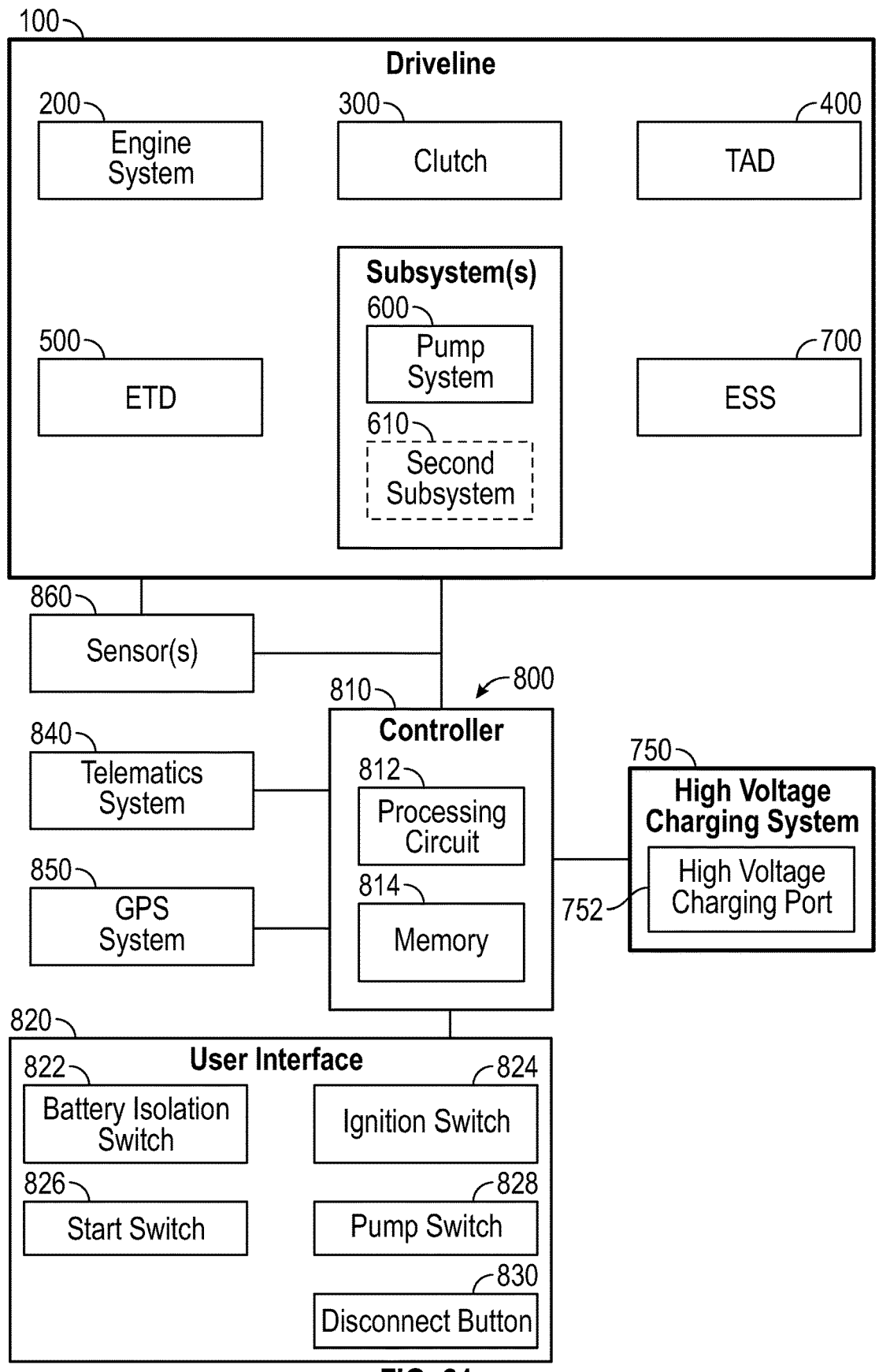
FIG. 21 is a schematic illustration of a control system of the vehicle of FIG. 1, according to an exemplary embodiment.

According to the exemplary embodiment shown in FIG. 21, a control system 800 for the vehicle 10 includes a controller 810. In one embodiment, the controller 810 is configured to selectively engage, selectively disengage, control, or otherwise communicate with components of the vehicle 10. As shown in FIG. 21, the controller 810 is coupled to (e.g., communicably coupled to) components of the driveline 100 (e.g., the engine system 200; the clutch 300; the ETD 500; subsystems including the pump system 600 and/or the second subsystem 610 such as, for example, an aerial ladder assembly or another subsystem; the ESS 700; etc.), the high voltage charging system 750, the user interface 820, a first external system, shown as telematics system 840, a second external system, shown as global positioning system ("GPS") 850, and one or more sensors, shown as sensors 860. By way of example, the controller 810 may send and receive signals (e.g., control signals) with the components of the driveline 100, the high voltage charging system 750, the user interface 820, the telematics system 840, the GPS system 850, and/or the sensors 860.

The controller 810 may be implemented as a general-purpose processor, an application specific integrated circuit ("ASIC"), one or more field programmable gate arrays ("FPGAs"), a digital-signal-processor ("DSP"), circuits containing one or more processing components, circuitry for supporting a microprocessor, a group of processing components, or other suitable electronic processing components. According to the exemplary embodiment shown in FIG. 21, the controller 810 includes a processing circuit 812 and a memory 814. The processing circuit 812 may include an ASIC, one or more FPGAs, a DSP, circuits containing one or more processing components, circuitry for supporting a microprocessor, a group of processing components, or other suitable electronic processing components. In some embodiments, the processing circuit 812 is configured to execute computer code stored in the memory 814 to facilitate the activities described herein. The memory 814 may be any volatile or non-volatile computer-readable storage medium capable of storing data or computer code relating to the activities described herein. According to an exemplary embodiment, the memory 814 includes computer code modules (e.g., executable code, object code, source code, script code, machine code, etc.) configured for execution by the processing circuit 812. In some embodiments, the controller 810 may represent a collection of processing devices. In such cases, the processing circuit 812 represents the collective processors of the devices, and the memory 814 represents the collective storage devices of the devices.

The user interface 820 includes a display and an operator input, according to one embodiment. The display may be configured to display a graphical user interface, an image, an icon, or still other information. In one embodiment, the display includes a graphical user interface configured to provide general information about the vehicle 10 (e.g., vehicle speed, fuel level, battery level, pump performance/status, aerial ladder information, warning lights, agent levels, water levels, etc.). The graphical user interface may also be configured to display a current mode of operation, various potential modes of operation, or still other information relating to the vehicle 10, the driveline 100, and/or the high voltage charging system 750. By way of example, the graphical user interface may be configured to provide specific information regarding the operation of the driveline 100 (e.g., whether the clutch 300 is engaged, whether the engine 202 is on, whether the pump 604 is in operation, etc.).

Figure 30:
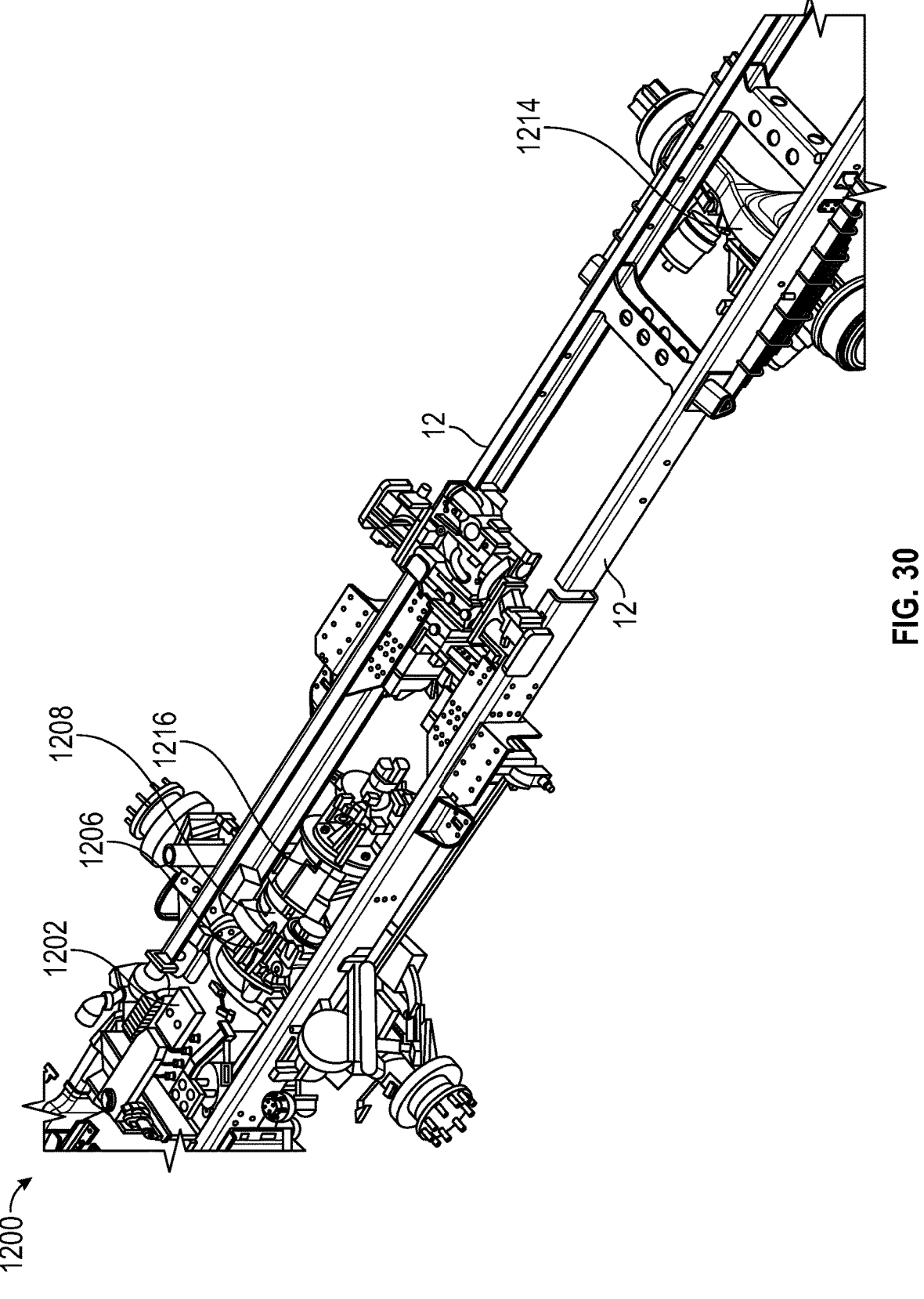
FIG. 30 is a top view of the integrated generator/motor driveline of FIG. 28 implemented in the vehicle of FIG. 1, according to an exemplary embodiment.

The operator input may be used by an operator to provide commands to the components of the vehicle 10, the driveline 100, the high voltage charging system 750, and/or still other components or systems of the vehicle 10. As shown in FIG. 30, the operator input includes the battery isolation switch 822, the ignition switch 824, the start switch 826, the pump switch 828, and a fifth input (e.g., a button, a switch, a soft key, etc.), shown as disconnect button 830. The disconnect button 830 may be positioned within the front cabin 20 and/or external to the front cabin 20 (e.g., on or proximate the high voltage charging system 750). Therefore, the vehicle 10 may include multiple disconnect buttons 830. The operator input may include one or more additional buttons, knobs, touchscreens, switches, levers, joysticks, pedals, or handles. In some instances, an operator may be able to press a button and/or otherwise interface with the operator input to command the controller 810 to change a mode of operation for the driveline 100. The operator may be able to manually control some or all aspects of the operation of the driveline 100, the high voltage charging system 750, and/or other components of the vehicle 10 using the display and the operator input. It should be understood that any type of display or input controls may be implemented with the systems and methods described herein.

The telematics system 840 may be a server-based system that monitors various telematics information and provides telematics data based on the telematics information to the controller 810 of the vehicle 10. The GPS system 850 may similarly be a server-based system that monitors various GPS information and provides GPS data based on the GPS information to the controller 810 of the vehicle 10. The telematics data may include an indication that the vehicle 10 is being dispatched to a scene. The telematics data may additionally or alternatively include details regarding the scene such as the location of the scene, characteristics of the scene (e.g., the type of fire, the current situation, etc.), and the like. The GPS data may include an indication of a current location of the vehicle 10. The GPS data and/or the telematics data may additionally or alternatively include route details between the current location of the vehicle 10 and the location of the scene such as route directions, emissions regulations along the route, noise restrictions along the route, a proximity of the vehicle 10 to a predetermined geofence (e.g., a roll-out geofence, a roll-in geofence, a noise restriction geofence, an emissions limiting geofence, etc.), and the like. Such telematics data and/or GPS data may be utilized by the controller 810 to perform one or more functions described herein.

In some embodiments, the telematics system 840 and the GPS system 850 are integrated into a single system. In some embodiments, the controller 810 is configured to function as an intermediary between the telematics system 840 and the GPS system 850. By way of example, the controller 810 may receive the telematics data from the telematics system 840 when the vehicle 10 is assigned to be dispatched to a scene and, then, the controller 810 may use the telematics data to acquire the GPS data from the GPS system 850. In some embodiments, the telematics system 840 and the GPS system 850 are configured to communicate directly with each other (e.g., the GPS system 850 may acquire scene location information from the telematics system 840 to provide the GPS data to the controller 810, etc.) such that the controller 810 does not need to function as an intermediary. The controller 810 may receive or acquire the telematics data and/or the GPS data from the telematics system 840 and/or GPS system 850 on a periodic basis, automatically, upon request, and/or in another suitable way.

The sensors 860 may include one or more sensors that are configured to acquire sensor data to facilitate monitoring operational parameters/characteristics of the components of the driveline 100 with the controller 810. By way of example, the sensors 860 may include one or more engine sensors (e.g., a speed sensor, an exhaust gas sensor, a $NO_x$ sensor, an $O_2$ sensor, etc.) that are configured to facilitate monitoring operational parameters/characteristics of the engine system 200 (e.g., engine speed, exhaust gas composition, $NO_x$ levels, $O_2$ levels, etc.). By way of another example, the sensors 860 may additionally or alternatively include one or more ETD sensors (e.g., speed sensors, voltage sensors, current sensors, etc.) that are configured to facilitate monitoring operational parameters/characteristics of the ETD 500 (e.g., input speed; output speed; voltage, current, and/or power of incoming power from the ESS 700; voltage, current, and/or power generated by the ETD 500; etc.). By way of still another example, the sensors 860 may additionally or alternatively include one or more subsystem sensors (e.g., speed sensors, flow rate sensors, pressure sensors, water level sensors, agent level sensors, position sensors, etc.) that are configured to facilitate monitoring operational parameters/characteristics of the pump system 600 (e.g., pump speed, output fluid flow rate, output fluid pressure, water level, agent level, etc.) and/or the second subsystem 610 (e.g., aerial ladder rotational position, aerial ladder horizontal length, aerial ladder vertical height, etc.). By way of still another example, the sensors 860 may additionally or alternatively include one or more ESS sensors (e.g., voltage sensors, current sensors, state of charge ("SoC") sensors, temperature sensors etc.) that are configured to facilitate monitoring operational parameters/characteristics of the ESS 700 (e.g., voltage, current, and/or power of incoming power from the ETD 500; voltage, current, and/or power being output to the electrically-operated components of the vehicle 10; a SoC of the ESS 700; etc.). In some embodiments, the controller 810 is configured to automatically change a mode of operation for the driveline 100 and/or recommend to an operator via the user interface 820 to approve a change to the mode of operation of the driveline 100 based on the telematics data, the GPS data, and/or the sensor data.

Alternative Drivelines

Referring to FIGS. 22-30, alternatives to the driveline 100 are shown, according to various embodiments. Any of the drivelines shown in FIGS. 22-30 can be implemented in the vehicle 10 in place of the driveline 100. The drivelines shown in FIGS. 22-30, may be similar to the driveline 100 (e.g., including front and rear axles, etc.) and can be configured to transfer mechanical energy from a source (e.g., an electric motor, an internal combustion engine, etc.) to one or more wheels, axles, systems (e.g., a pump system), ESS, etc. of the vehicle 10. In some embodiments, any of the drivelines shown in FIGS. 22-30 include an internal combustion engine configured to provide mechanical energy.

Any of the drivelines shown in FIGS. 22-30 can include a clutched TAD for providing power or mechanical energy to any of an air conditioning ("AC") compressor, an air compressor, a power steering system or pump, an alternator, etc. Any of the drivelines shown in FIGS. 22-30 can be integrated with a battery (e.g., a 155 kW battery at a 2 Coulomb max discharge). Any of the drivelines shown in FIGS. 22-30 can be integrated with an electrical or controller area network ("CAN") of the vehicle 10. Any of the drivelines of FIGS. 22-30 can be integrated with pump operation or controls of the vehicle 10, operator interface controls of the vehicle 10, or power management controls of the vehicle 10.

Alternative 1—E-Axle Driveline

Referring to FIGS. 22-24, an E-axle driveline 1000 includes an internal combustion engine ("ICE") 1002, a TAD 1006 including a clutch 1004, an electric motor 1008, a fire pump 1012, an ESS 1010, and an E-axle 1014, according to an exemplary embodiment. The ICE 1002 may be the same as or similar to the engine 202 as described in greater detail above. The clutch 1004 and the TAD 1006 may be the same as or similar to the TAD 400 as described in greater detail above. The fire pump 1012 may be the same as or similar to the pump 604 as described in greater detail above. The ESS 1010 may be the same as or similar to the ESS 700 as described in greater detail above. The E-axle driveline 1000 is configured to transition between an electric vehicle (EV) mode (shown in FIG. 22) and an ICE mode (shown in FIG. 23). The E-axle 1014 may be between a 200 to a 400 kilowatt (kW) E-axle. In some embodiments, the E-axle 1014 is a Meritor or an Allison E-axle. For example, the E-axle 1014 may be an Allison AXE100D E-axle (e.g., a 310 kW E-axle). In some embodiments, the electric motor 1008 is an Avid AF240 electric motor.

Referring particularly to FIG. 22, the E-axle driveline 1000 is shown in the EV mode, according to an exemplary embodiment. The E-axle driveline 1000 can be transitioned into the EV mode by transitioning the clutch 1004 into an open position or mode (e.g., a disengaged mode). When the E-axle driveline 1000 is in the EV mode, the ESS 1010 is configured to provide electrical power to the electric motor 1008. The electric motor 1008 consumes the electrical energy and can drive the fire pump 1012 when the E-axle driveline 1000 is in the EV mode. The electric motor 1008 can also drive one or more accessories (e.g., through a power take-off) such as an AC compressor, an air compressor, a power steering system, an alternator, etc. When the E-axle driveline 1000 is in the EV mode, the E-axle 1014 receives electrical energy from the ESS 1010 and uses the electrical energy to drive the wheels 18 of the vehicle 10 (e.g., for transportation). In this way, the vehicle 10 can operate using electrical energy for transportation, accessories, the fire pump 1012, etc.

Referring particularly to FIG. 23, the E-axle driveline 1000 is shown in the ICE mode, according to an exemplary embodiment. The clutch 1004 can be transitioned into the closed mode or position (e.g., an engaged mode or position) to transition the E-axle driveline 1000 into the ICE mode. When the E-axle driveline 1000 is in the ICE mode, the ICE 1002 is configured to drive the electric motor 1008 through the clutch 1004 and the TAD 1006 so that the electric motor 1008 generates electrical energy. The ICE 1002 can also drive one or more accessories of the vehicle 10 (e.g., the air conditioner compressor, the air compressor, the power steering system, the alternator, etc.) through a power take-off. The E-axle 1014 can use electrical energy generated by the electric motor 1008 to drive the wheels 18 of the vehicle 10. The E-axle 1014 can also provide electrical energy to the ESS 1010 for storage and later use (e.g., for use when the E-axle driveline 1000 is transitioned into the EV mode shown in FIG. 22).

Advantageously, the E-axle driveline 1000 as shown in FIGS. 22-24 can have a reduced size or a smaller footprint compared to other drivelines. In some embodiments, the E-axle driveline 1000 facilitates in-frame battery packaging of various battery cells of the ESS 1010. The E-axle driveline 1000 can also facilitate pump and roll operations.

Alternative 2—EV Transmission

Figure 27:
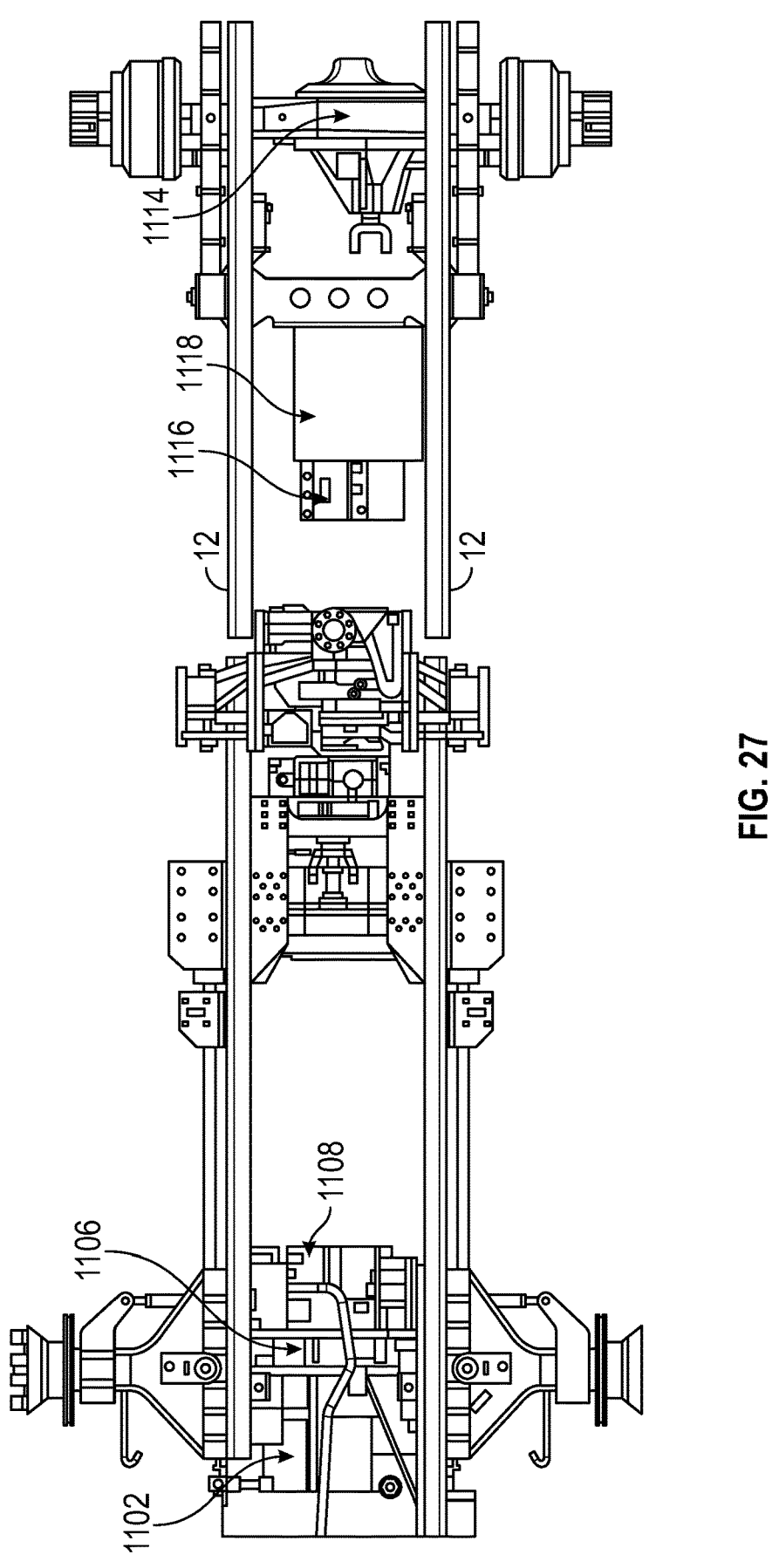
FIG. 27 is a top view of the EV transmission driveline of FIG. 25 implemented in the vehicle of FIG. 1, according to an exemplary embodiment.

Referring to FIGS. 25-27, an EV transmission driveline 1100 includes an ICE 1102, a TAD 1106 including a clutch 1104, a first electric motor 1108, a fire pump 1112, an ESS 1110, a second electric motor 1116, an EV transmission 1118, and an axle 1114. The ICE 1102 can be the same as or similar to the engine 202 and/or the ICE 1002. The TAD 1106 can be the same as or similar to the TAD 400 and/or TAD 1006. The first electric motor 1108 can be the same as or similar to the electric motor 1008. The fire pump 1112 and the ESS 1110 can be the same as or similar to the pump 604 and/or the fire pump 1012 and the ESS 700 and/or the ESS 1010.

FIG. 25 shows the EV transmission driveline 1100 operating in an EV mode. FIG. 26 shows the EV transmission driveline 1100 operating in an ICE mode. The EV transmission driveline 1100 is transitionable between the EV mode and the ICE mode by operation of the clutch 1104. For example, the clutch 1104 can be transitioned into an open mode or configuration in order to transition the EV transmission driveline 1100 into the EV mode or into a closed mode or configured in order to transition the EV transmission driveline 1100 into the ICE mode. When the EV transmission driveline 1100 is in the EV mode, the first electric motor 1108 can draw electrical energy from the ESS 1110 and use the electrical energy to drive the fire pump 1112 (e.g., the pump system 600, a pump system for pumping water, etc.). When the EV transmission driveline 1100 is in the EV mode, the second electric motor 1116 can also draw energy from the ESS 1110 and use the energy to drive the EV transmission 1118. The EV transmission 1118 can receive mechanical energy output from the electric motor 1116 and output mechanical energy having a different speed or torque than the received mechanical input. The EV transmission 1118 provides a mechanical output to the axle 1114 for driving the tractive elements or the wheels 18 of the vehicle 10. In some embodiments, the second electric motor 1116 can be back-driven in an opposite direction (e.g., when the axle 1114 drives the electric motor 1116 through the EV transmission 1118 when the vehicle 10 rolls down a grade or due to regenerative braking) so that the second electric motor 1116 function as a generator, and generates electrical energy that is stored in the ESS 1110.

When the EV transmission driveline 1100 is in the ICE mode, the clutch 1104 is transitioned into the closed mode or configuration. The ICE 1102 is configured to drive the TAD 1106 through the closed clutch 1104 (e.g., while consuming fuel). The TAD 1106 is driven by the ICE 1102 and drives the first electric motor 1108. The first electric motor 1108 can drive the fire pump 1112 and/or can generate electrical energy (e.g., functioning as a generator) when driven by the TAD 1106 and the ICE 1102. The electrical energy generated by the first electric motor 1108 can be provided to the second electric motor 1116. The second electric motor 1116 can use some of the electrical energy to drive the EV transmission 1118 and the axle 1114. In some embodiments, some of the electrical energy generated by the first electric motor 1108 is provided to the ESS 1110 when the EV transmission driveline 1100 operates in the ICE mode to charge the ESS 1110 and store electrical energy for later use (e.g., when the EV transmission driveline 1100 is in the EV mode).

The EV transmission 1118 can be a four gear EV transmission that is configured to operate with the electric motor 1116 based on peak electrical energy or continuous electrical energy (e.g., different power thresholds). The EV transmission 1118 can be transitioned between different gears to provide a different gear ratio between the electric motor and the axle 1114.

Advantageously, the EV transmission driveline 1100 can retrofit existing electric motors with a 4 speed EV transmission. In some embodiments, the EV transmission driveline 1100 can use a non-powered (e.g., a non-electric) axle. For example, the axle 1114 may be the same as used on a driveline that is powered by an internal combustion engine only. Advantageously, the EV transmission driveline 1100 facilitates pump and roll as an option. The EV transmission driveline 1100 can also facilitate scalable performance.

Alternative 3—Integrated Generator/Motor

Figures 28, 29:
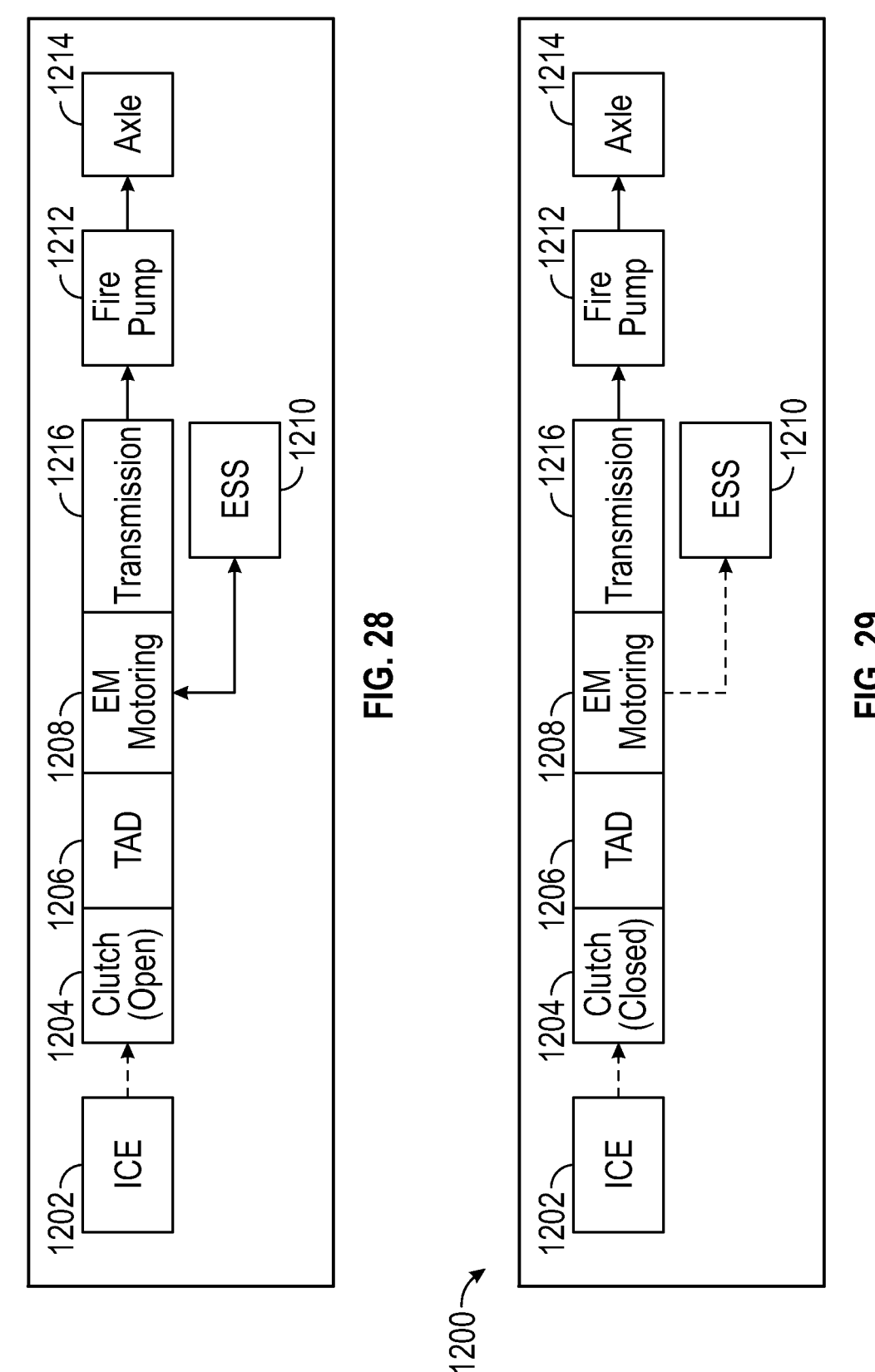
FIG. 28 is a schematic illustration of an integrated generator/motor driveline in a first mode, according to an exemplary embodiment.
FIG. 29 is a schematic diagram of the integrated generator/motor driveline of FIG. 28 in a second mode.

Referring to FIGS. 28-30, an integrated generator/motor driveline 1200 includes an ICE 1202, a clutch 1204, a TAD 1206, an electric motor 1208, a transmission 1216, a fire pump 1212, an ESS 1210, and an axle 1214. The ICE 1202 may be the same as or similar to the engine 202, the ICE 1002, and/or the ICE 1102. The clutch 1204 can be the same as or similar to the clutch 300, the clutch 1004, and/or the clutch 1104. The TAD 1206 can be the same as or similar to the TAD 400, the TAD 1006, and/or the TAD 1106. The electric motor 1208 can be the same as or similar to the electric motor 1008 and/or the electric motor 1108. The fire pump 1212 can be the same as or similar to the pump 604, the fire pump 1012, and/or the fire pump 1112. The ESS 1210 and the axle 1214 can also be the same as or similar to the ESS 700, the ESS 1010, and/or ESS 1110 and the axle 1114.

FIG. 28 shows the integrated generator/motor driveline 1200 operating in an EV mode. FIG. 29 shows the integrated generator/motor driveline 1200 operating in an ICE mode. The integrated generator/motor driveline 1200 can be transitioned between the EV mode shown in FIG. 46 and the ICE mode shown in FIG. 47 by operation of the clutch 1204 (e.g., transitioning the clutch 1204 into an open position, state, or mode to transition the integrated generator/motor driveline 1200 into the EV mode and transitioning the clutch 1204 into a closed position, state, or mode to transition the integrated generator/motor driveline 1200 into the ICE mode).

When the integrated generator/motor driveline 1200 is transitioned into the EV mode, the clutch 1204 is transitioned into the open position. When the integrated generator/motor driveline 1200 operates in the EV mode, the axle 1214 is driven electrically (e.g., using an electric motor). The electric motor 1208 draws electrical energy from the ESS 1210 and drives the fire pump 1212 and the axle 1214 through the transmission 1216. The electric motor 1208 can be back-driven (e.g., as a form of regenerative braking, when the vehicle 10 rolls down a hill, etc.) through the axle 1214 and the transmission 1216. When the electric motor 1208 is back-driven, the electric motor 1208 generates electrical energy and provides the electrical energy to the ESS 1210 for storage and later use.

When the integrated generator/motor driveline 1200 is transitioned into the ICE mode, the clutch 1204 is transitioned into the closed position. The ICE 1202 can consume fuel and operate to drive the TAD 1206 through the clutch 1204. The TAD 1206 can drive the electric motor 1208 so that the electric motor 1208 operates to generate electricity. Electrical energy generated by the electric motor 1208 is provided to the ESS 1210 where the electrical energy can be stored and discharged at a later time (e.g., for use by the electric motor 1208 when operating in the EV mode). The TAD 1206 can also transfer mechanical energy to the transmission 1216. The transmission 1216 receives the mechanical energy from the TAD 1206 or the electric motor 1208 and provides mechanical energy to both the fire pump 1212 and the axle 1214 (e.g., at a reduced or increased speed, and/or a reduced or increased torque). The transmission 1216 can transition between multiple different gears or modes to adjust a gear ratio across the transmission 1216. In some embodiments, the transmission 1216 is an Allison 3000 series transmission. Operating the integrated generator/motor driveline 1200 in the ICE mode facilitates driving the axle 1214 using energy generated by the ICE 1202 (rather than by the electric motor 1208 as when the integrated generator/motor driveline 1200 operates in the EV mode).

Advantageously, the integrated generator/motor driveline 1200 facilitates retaining transmission and direct drive in case of electrical failure (e.g., failure of the electric motor 1208). For example, even if the electric motor 1208 fails, the ICE 1202 can still be operated to drive the fire pump 1212 and the axle 1214. The integrated generator/motor driveline 1200 may also use a non-electric axle 1214 (e.g., a mechanical axle, a same axle as used on a vehicle that only uses an internal combustion engine to drive the axle, etc.).

Battery Thermal Management

Figure 31:
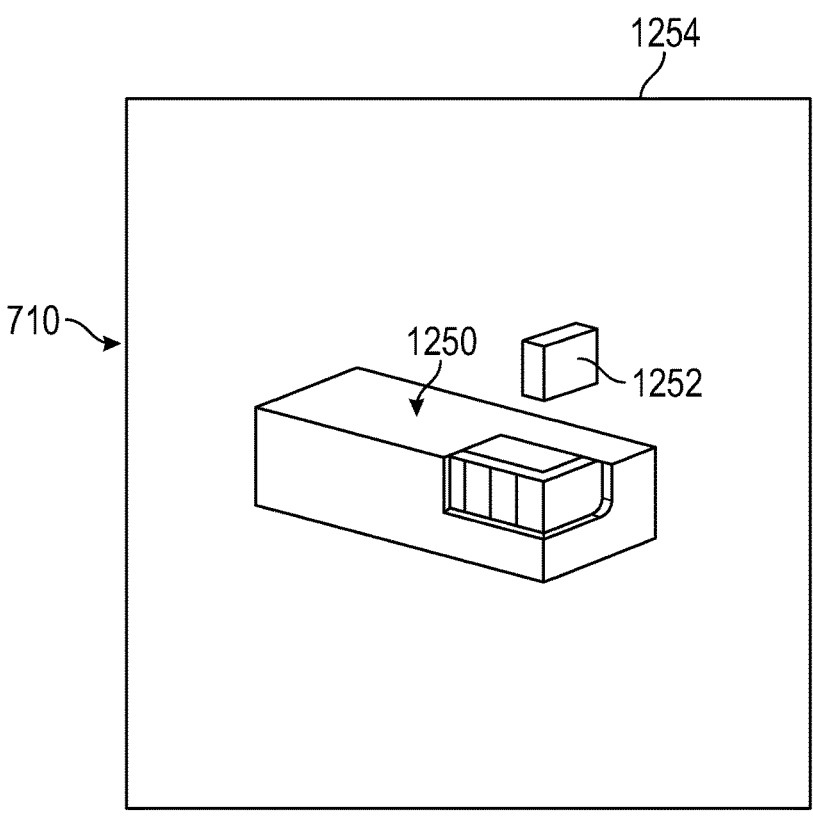
FIG. 31 is a schematic illustration of a battery pack of the vehicle of FIG. 1 including a battery, according to an exemplary embodiment.
Figure 32:
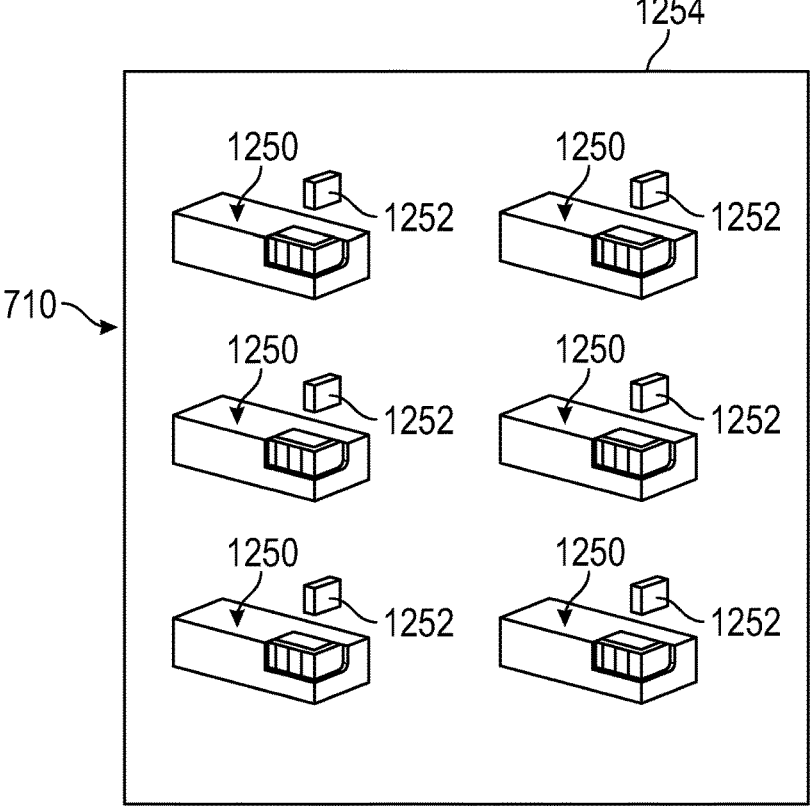
FIG. 32 is a schematic illustration of a battery pack of the vehicle of FIG. 1 including a plurality of battery, according to an exemplary embodiment.
Figure 33:
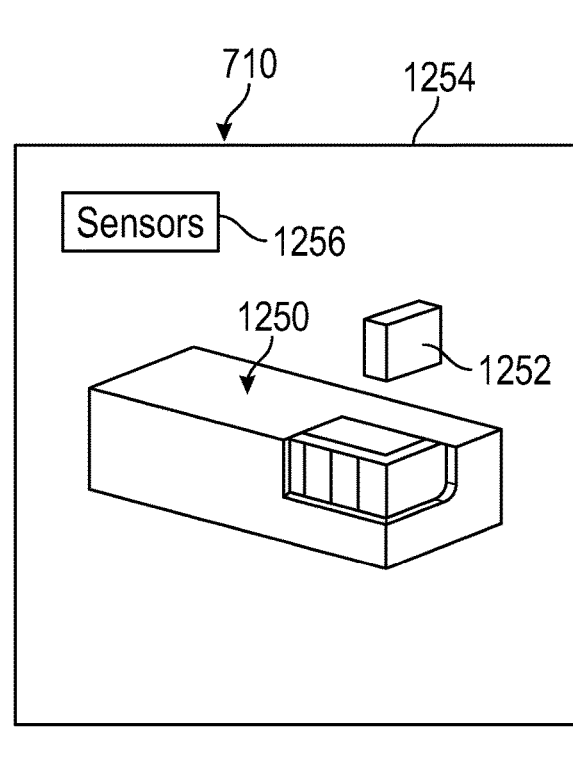
FIG. 33 is a schematic illustration of a battery pack including one or more health sensors mounted within a battery housing, according to an exemplary embodiment.
Figure 34:
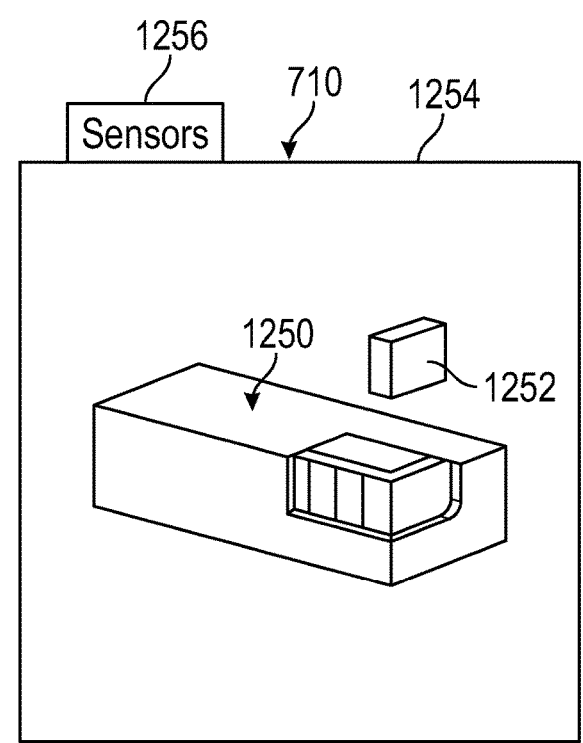
FIG. 34 is a schematic illustration of a battery pack including one or more health sensors mounted on a battery housing, according to an exemplary embodiment.
Figure 35:
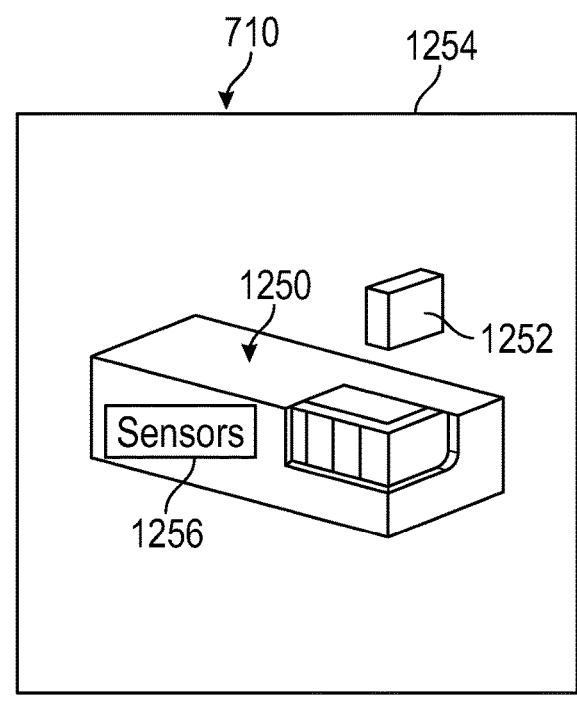
FIG. 35 is a schematic illustration of a battery pack including one or more health sensors mounted on a battery, according to an exemplary embodiment.
Figure 36:
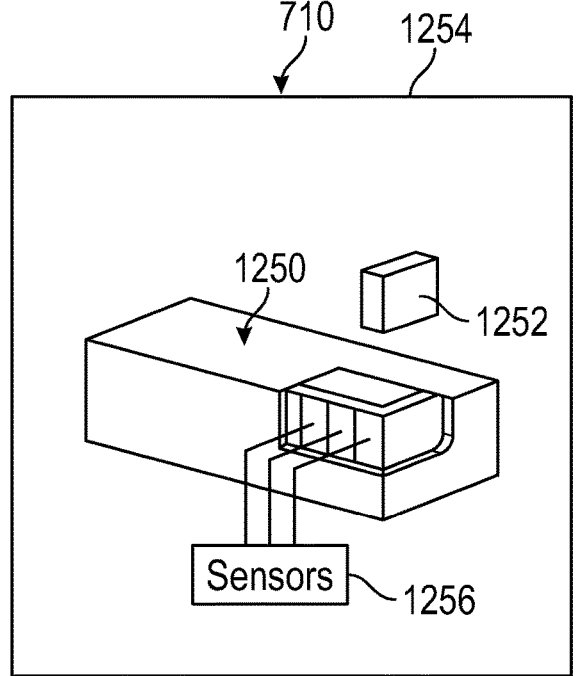
FIG. 36 is a schematic illustration of a battery pack including one or more health sensors coupled to cells, according to an exemplary embodiment.

As described herein, the vehicle 10 includes the ESS 700 (or the ESS 1010, the ESS 1110, or the ESS 1210) to power on-board equipment (e.g., the driveline 100, the pump 604, the second subsystem 610, electrified accessories, etc.). The ESS 700 includes the plurality of battery packs 710. Referring generally to FIGS. 31 and 32, the battery packs 710 each include a battery 1250 having one or more cells 1252. In some embodiments, the battery packs 710 each include a battery housing 1254 that encloses a single battery 1250 having one or more cells 1252 (see, e.g., FIG. 31). In some embodiments, the battery packs 710 each include a battery housing 1254 that encloses a plurality of batteries 1250, each having one or more cells 1252 (see, e.g., FIG. 32). In some embodiments, the battery packs 710 may vary in the amount of batteries 1250 and cells 1252 arranged within the battery housing 1254, for example, depending on the configuration of the vehicle 10 and/or the equipment or accessory being powered by the battery pack 710.

In general, the incorporation of high capacity batteries into vehicles (e.g., hybrid-electric vehicles, electric vehicles, etc.) presents the possibility for a thermal event to occur (e.g., thermal runoff). The present disclosure utilizes on-board system of a vehicle (e.g., the vehicle 10) or systems of proximate vehicles to cool, discharge, and/or disconnect a battery, or batteries, for which a thermal event is detected. In this way, for example, the thermal event can be prevented, mitigated, and/or treated using the systems and methods described herein.

Turning to FIGS. 33-36, in some embodiments, a battery thermal event is detected by one or more health sensors 1256 that are configured to monitor a health of each of the battery packs 710, each of the batteries 1250, and/or each of the cells 1252. In some embodiments, the health sensors 1256 include one or more of a temperature sensor, a voltage sensor, a current sensor, a gas sensor (e.g., a $CO_2$ sensor), or a deflection sensor (e.g., a strain gauge). In some embodiments, at least one of the health sensors 1256 is arranged/ positioned within the battery housing 1254 of each battery pack 710 (see, e.g., FIG. 33). In some embodiments, at least one of the health sensors 1256 is arranged/positioned externally from the battery housing 1254. In some embodiments, at least one of the health sensors 1256 is coupled to the battery housing 1254 (see, e.g., FIG. 34). For example, a deflection sensor may be coupled to each of the battery housings 1254 and configured to measure a deflection of the battery housing 1254 to detect thermal expansion. In some embodiments, at least one of the health sensors 1256 is coupled to the battery 1250, or at least one of the batteries 1250, within each of the battery housings 1254 (see, e.g., FIG. 35). In this way, for example, the health sensors 1256 may be configured to monitor a health of each of the batteries 1250 with the battery packs 710. In some embodiments, at least one of the health sensors 1256 is coupled to each of the cells 1252 within each of the battery housings 1254 (see, e.g., FIG. 36). In this way, for example, the health sensors may be configured to monitor a health of each of the cells 1252 within the battery packs 710. It should be understood that one or more of the sensor arrangements shown in FIGS. 33-36 may be used in combination with one another.

In some embodiments, the health sensors 1256 are arranged in a variety of configurations throughout the ESS 700. For example, each of the battery housings 1254 may include a gas sensor arranged therein or a deflection sensor coupled thereto (or coupled to the battery, or batteries, 1250 within the battery housings 1254), and each of the batteries 1250 or each of the cells 1252 may include a voltage sensor, a current sensor, and/or a temperature sensor. In some embodiments, the onset of a battery thermal event is detected when a temperature of a battery 1250, a cell 1252, and/or ambient air within a battery housing 1254 increased beyond a predetermined temperature threshold. In some embodiments, the onset of a battery thermal event is detected based on a combination of data from the health sensors 1256, for example, any combination of voltage data, current data, temperature data, gas concentration data, or deflection data. In some embodiments, the health sensors 1256 are connected to a battery management system that is configured to monitor a health of each of the battery packs 710, the batteries 1250, and/or the cells 1252 on the vehicle 10.

In some embodiments, the housing 702 and/or the battery housing 1254 may be fabricated from a heat resistant material that is designed to withstand high temperatures of a thermal event for a predetermined amount of time. For example, the housing 702 and/or the battery housing 1254 may be fabricated from a metal or composite material with a melting point above 2000° F. In some embodiments, the housing 702 and/or the battery housing 1254 may be fabricated from a metal material (e.g., tungsten, molybdenum, titanium, chromium, tantalum, iron, steel, nickel, stainless steel, etc.). In some embodiments, the housing 702 and/or the battery housing 1254 may be fabricated from a material that is designed to withstand 2000° F. for at least 10 minutes (e.g., 10 minutes, at least 30 minutes, at least 60 minutes, etc.). In some embodiments, the housing 702 and/or the battery housing 1254 may be fabricated from a material that is designed to withstand 2100° F. for at least 10 minutes (e.g., 10 minutes, at least 30 minutes, at least 60 minutes, etc.). In some embodiments, the housing 702 and/or the battery housing 1254 may be fabricated from a material that is designed to withstand 2200° F. for at least 10 minutes (e.g., 10 minutes, at least 30 minutes, at least 60 minutes, etc.). In some embodiments, the housing 702 and/or the battery housing 1254 may be fabricated from a material that is designed to withstand 2300° F. for at least 10 minutes (e.g., 10 minutes, at least 30 minutes, at least 60 minutes, etc.). In some embodiments, the housing 702 and/or the battery housing 1254 may be fabricated from a material that is designed to withstand 2400° F. for at least 10 minutes (e.g., 10 minutes, at least 30 minutes, at least 60 minutes, etc.). In some embodiments, the housing 702 and/or the battery housing 1254 may be fabricated from a material that is designed to withstand 2500° F. for at least 10 minutes (e.g., 10 minutes, at least 30 minutes, at least 60 minutes, etc.).

Battery Cooling System

FIGS. 37-56 illustrate exemplary embodiments of a cooling system on the vehicle 10 that is configured to selectively supply a cooling fluid to the batteries 1250 and/or the cells 1252 within the battery housings 1254 or to the areas surrounding the battery housings 1254. In some embodiments, the cooling system is integrated into the native/existing cooling system (e.g., the ESS cooling system 730 and the cooling conduits 736) on the vehicle 10. In some embodiments, the cooling system includes a dedicated cooling circuit that is provided in addition to the native/existing cooling system (e.g., the ESS cooling system 730 and the cooling conduits 736) on the vehicle 10. In some embodiments, the cooling system includes an external port that is mounted on an external portion, surface, or structure of the vehicle 10 so that a user, or a valve, can selectively connect a fluid source to the external port and initiate the flow of cooling fluid.

Existing Cooling Conduit

FIGS. 37-42 illustrate exemplary embodiments of a battery cooling system 1300 being integrated into the ESS cooling system 730 and connected to one of the cooling conduits 736. In some embodiments, the battery cooling system 1300 includes one or more rupture points/joints or one or more cooling valves arranged on or along the cooling conduit 736 that are configured to selectively provide fluid communication between the cooling conduits 736 and the battery housing 1254 so that cooling fluid flows into and/or around the battery housing 1254.

Figure 37:
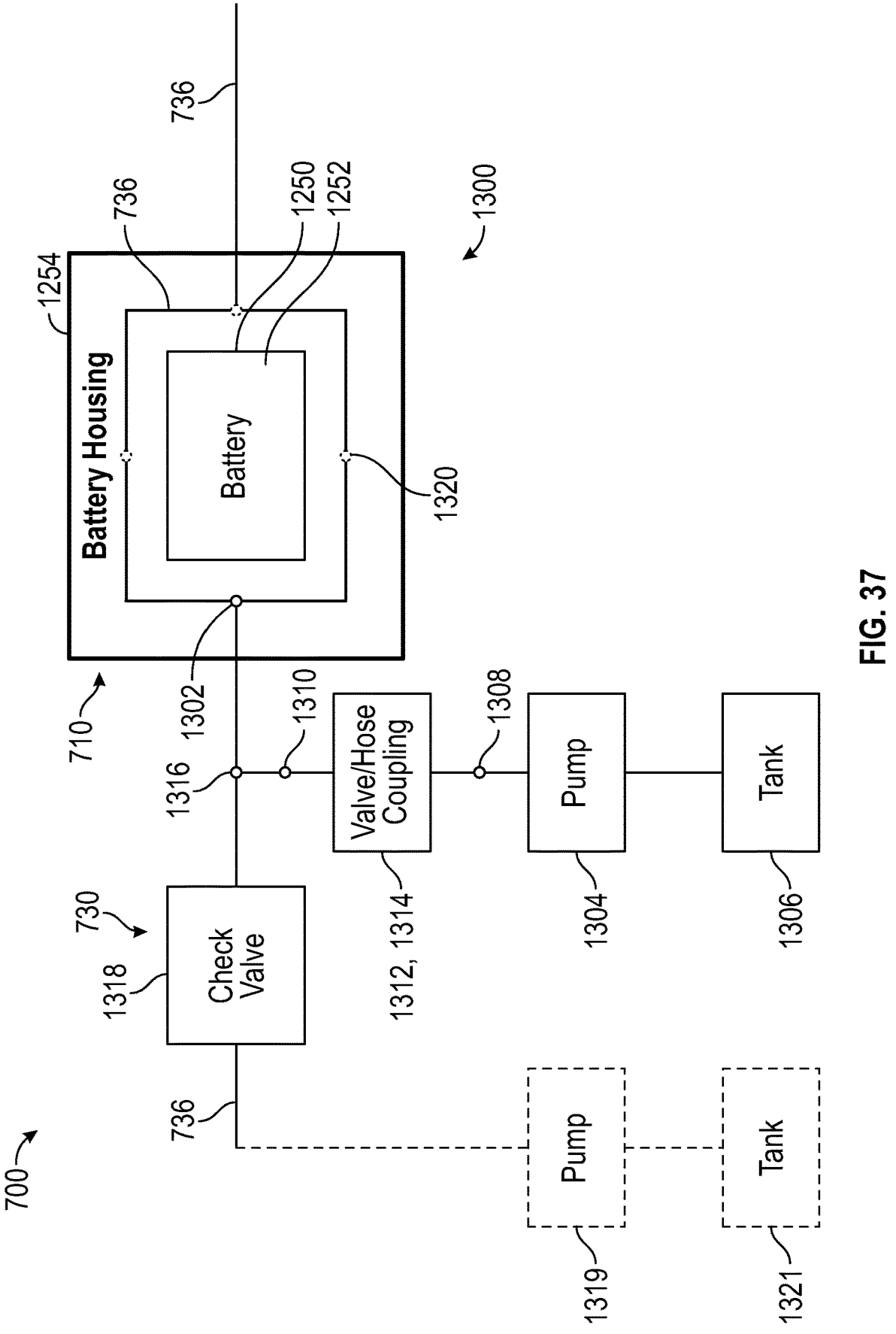
FIG. 37 is a schematic illustration of a battery cooling system including a rupture point arranged within a battery housing, according to an exemplary embodiment.

With specific reference to FIG. 37, the battery cooling system 1300 includes a first type of fluid diverter, shown as rupture point 1302, arranged on or positioned along the cooling conduit 736 within the battery housing 1254. That is, in the illustrated embodiment, the cooling conduit 736 extends into the battery housing 1254 and around the battery 1250, or batteries 1250, arranged within the battery housing 1254. The cooling conduit 736 is configured to receive pressurized cooling fluid from a pump 1304. In some embodiments, the pump 1304 is an existing on-board pump of the vehicle 10 (e.g., the pump 604). In some embodiments, the pump 1304 is an on-board pump (e.g., supported either directly or indirectly by the frame 12) that is provided on the vehicle 10 in addition to the pump 604 and dedicated to the battery cooling system 1300. In some embodiments, the pump 1304 is arranged remotely from (e.g., doesn't form part of) the vehicle 10. For example, the pump 1304 may be in the form of a fire hydrant that is connected to a hose and coupled to the cooling conduit 736. Alternatively or additionally, the pump 1304 may be a pump arranged on an adjacent vehicle (e.g., a fire truck parked next to the vehicle 10).

In some embodiments, the pump 1304 is configured to draw cooling fluid from a reservoir or tank 1306 and furnish the cooling fluid under increased pressure at a pump outlet port 1308. In some embodiments, the tank 1306 is arranged or positioned on the vehicle 10. For example, the tank 1306 may be the water tank arranged on the vehicle 10 and supported by the frame 12, which supplies water to the pump 604. In some embodiments, the tank 1306 is arranged on the vehicle 10 and is provided in addition to the water tank that supplies the pump 604. For example, the tank 1306 may be an on-board tank that is dedicated to the battery cooling system 1300. In some embodiments, the tank 1306 is arranged remotely from the vehicle 10. For example, the tank 1306 may be a water tank on an adjacent vehicle or a supply line connected to a fire hydrant.

The cooling fluid supplied to the pump 1304 from the tank 1306 is configured to provide a cooling effect. In some embodiments, the cooling fluid is water, salt water, or a heavy saline solution. In some embodiments, the cooling fluid is a water ethylene glycol mixture, an electrically non-conductive liquid, or a dielectric liquid.

Regardless of the specific configuration of the pump 1304 and the tank 1306, the cooling fluid supplied by the pump 1304 to the pump outlet port 1308 is configured to be selectively communicated to a supply port 1310 arranged downstream of the pump outlet port 1308. In general, a supply valve 1312 or a hose coupling 1314 is arranged between the pump outlet port 1308 and the supply port 1310 to selectively provide or inhibit fluid communication between the pump 1304 and the cooling conduit 736. For example, in some embodiments, the supply valve 1312 is provided between the pump outlet port 1308 and the supply port 1310 (e.g., a fixed, hardline connection). The supply valve 1312 is movable between a closed position where fluid communication is inhibited between the pump 1304 and the cooling conduit 736 and an open position where fluid communication is provided between the pump 1304 and the cooling conduit 736. In some embodiments, the supply valve 1312 is a manually-movable valve (e.g., a gate valve, a ball valve, etc.) that is configured to be moved by a user in response to a notification that a battery thermal event is detected. In some embodiments, the supply valve 1312 is an electronically-movable valve (e.g., a solenoid-operated control valve, a solenoid-operated on-off valve, an electronic ball valve, an electronic gate valve, a solenoid-operated spool valve, or an equivalent valve) that is in communication with a controller (e.g., the controller 810 or a controller dedicated to the battery cooling system 1300) and configured to be selectively moved from the closed position to the open position in response to the detection of a battery thermal event.

In some embodiments, the hose coupling 1314 is provided between the pump outlet port 1308 and the supply port 1310. The hose coupling 1314 can be a hand-line connection that is configured to be manipulated by a user to directly connect the pump outlet port 1308 and the supply port 1310 to provide fluid communication between the pump 1304 and the cooling conduit 736. The hose coupling 1314 is initially arranged in a disconnected state where a first end of the hose coupling 1314 is connected to the pump outlet port 1308 and a second, opposing end of the hose coupling 1314 is disconnected from the supply port 1310. The second end of the hose coupling 1314 may be configured to inhibit fluid flow through the hose coupling 1314, unless the second end is connected to a port (e.g., a quick disconnect). As such, upon detection of a battery thermal event, a user is supplied with a notification and instructed to connect the hose coupling 1314 to the supply port 1310. Once the second end of the hose coupling 1314 is manually connected to the supply port 1310, the hose coupling 1314 is transitioned to a connected state where fluid communication is provided between the pump 1304 and the cooling conduit 736.

In the illustrated embodiment, the supply port 1310 is in fluid communication with the cooling conduit 736 at a connection point 1316. In some embodiments, the connection point 1316 is a fluid manifold. The battery cooling system 1300 includes a check valve 1318 arranged upstream of the connection point 1316 to prevent fluid from flowing in a direction from the pump 1304 and upstream of the check valve 1318. In other words, the check valve 1318 ensures that fluid flow in the cooling conduit 736 supplied by the pump 1304 is only allowed to flow in a direction toward the rupture point 1302. As such, when the supply valve 1312 or the hose coupling 1314 selectively provide fluid communication between the pump 1304 and the cooling conduit 736, the cooling fluid supplied by the pump 1304 flows in a direction toward the rupture point 1302.

In some embodiments, the rupture point 1302 is configured to rupture or burst at a predetermined threshold pressure. In general, the predetermined threshold pressure is greater than a normal or nominal operating pressure of the ESS cooling system 730 (e.g., a predefined tolerance above the operating pressure of the ESS cooling system 730). In this way, for example, the rupture point 1302 does not rupture or burst during normal operation of the ESS cooling system 730, and the added pressure selectively provided by the pump 1304 supplying cooling fluid into the cooling conduit 736 is configured to selectively rupture or burst the rupture point 1302 after the predetermined threshold pressure is exceeded. When the rupture point 1302 ruptures or bursts, the cooling fluid is provided into and floods the battery housing 1254 to cool the battery housing 1254 and/or the battery, or batteries, 1250 arranged therein.

As described herein, the connection between the pump 1304 and the cooling conduit 736 (i.e., when cooling fluid is supplied into the cooling conduit 736) is controlled by the detection of a battery thermal event. The rupturing of the rupture point 1302 and resulting cooling of the battery housing 1254 and/or the battery 1250 is selectively controlled by the connection of the pump 1304 to the cooling conduit 736 (e.g., by the supply valve 1310 or the hose coupling 1314). In some embodiments, where the supply valve 1312 is manually moved between the closed position and the open position, and when the hose coupling 1314 is arranged between the pump outlet port 1308 and the supply port 1310, a notification is provided to a user in response to detection of an onset of a battery thermal event. For example, during operation, the controller (e.g., the controller 810 or a controller dedicated to the battery cooling system 1300) detects the onset of a battery thermal event (e.g., based on data from the health sensors 1256) and, in response, the controller provides a notification (e.g., an audio notification and/or a visual notification on the user interface 820 and/or a remote device (e.g., a tablet, a cellular device, etc.) in communication with the controller). A user receives the notification and in response manually transitions the hose coupling 1314 from the disconnected state to the connected state, which provides cooling fluid into the cooling conduit 736 at an increased pressure (e.g., a pressured above the predetermined pressure threshold of the rupture point 1302) and ruptures the rupture point 1302 to provide cooling fluid into the battery housing 1254. In some embodiments, during operation, the controller (e.g., the controller 810 or a controller dedicated to the battery cooling system 1300) detects the onset of a battery thermal event (e.g., based on data from the health sensors 1256) and, in response, the controller provides a notification (e.g., an audio notification and/or a visual notification on the user interface 820 and/or a remote device (e.g., a tablet, a cellular device, etc.) in communication with the controller. A user receives the notification and in response manually transitions the supply valve 1312 from the closed position to the open position, which provides cooling fluid into the cooling conduit 736 at an increased pressure (e.g., a pressured above the predetermined pressure threshold of the rupture point 1302) and ruptures the rupture point 1302 to provide cooling fluid into the battery housing 1254.

In some embodiments, where the supply valve 1312 is electronically moved between the closed position and the open position, the supply valve 1312 is automatically moved to the open position upon detection of the onset of a battery thermal event. For example, during operation, the controller (e.g., the controller 810 or a controller dedicated to the battery cooling system 1300) detects the onset of a battery thermal event (e.g., based on data from the health sensors 1256). In response, the controller sends a control signal to the supply valve 1312 to electronically transition the supply valve 1312 from the closed position to the open position, which provides cooling fluid into the cooling conduit 736 at an increased pressure (e.g., a pressured above the predetermined pressure threshold of the rupture point 1302) and ruptures the rupture point 1302 to provide cooling fluid into the battery housing 1254. In these embodiments, a notification (e.g., an audio notification and/or a visual notification on the user interface 820 and/or a remote device (e.g., a tablet, a cellular device, etc.) in communication with the controller) still may be provided to a user to provide an indication that the battery cooling is initiating. In some embodiments, the notification provided to a user may include a failsafe passcode that is required to be input by a user prior to the cooling of the battery pack 710. For example, the controller may be prevented from opening the supply valve 1312 until the passcode is typed in by a user (e.g., via the user interface 820, via a remote device, etc.) to prevent inadvertent cooling of the battery pack 710.

In some embodiments, the battery cooling system 1300 includes additional rupture points 1320 (optionally included and shown using dashed lines) arranged on or positioned along the cooling conduit 736 downstream of the rupture point 1302. The additional rupture points 1320 may define sequentially decreasing predetermined threshold pressures as they extend further downstream along the cooling conduit 736. This may ensure that any remaining fluid that passes the rupture point 1302 bursts one or more of the additional rupture points 1320 and supplies additional cooling fluid to the battery housing 1254 and/or the battery 1250. Alternatively or additionally, the additional rupture points 1320 may serve as a failsafe in the event that the rupture point 1302 malfunctions and does not rupture or burst.

In some embodiments, the pump 1304 is a supplemental pump for the battery cooling system 1300 that is provided in addition to a dedicated coolant pump 1319. The coolant pump 1319 draws fluid (e.g., coolant) from a coolant reservoir or tank 1321 and pumps the coolant to the cooling conduit 736. In some embodiments (e.g., that do not include the pump 1304 or that the pump 1304 is not coupled to the cooling conduit 736), during a thermal event, the coolant pump 1319 is configured to pump the coolant at a pressure above the predetermined pressure threshold of the rupture point 1302 and the additional rupture points 1320 so that the fluid (e.g., coolant) flows out of the cooling conduit 736 and into the battery housing 1254. In some embodiments (e.g., that include the pump 1304 and the pump 1304 is coupled to the cooling conduit 736), during a thermal event, the pump 1304 is a water pump and is configured to provide the water at a first pressure that is (a) higher than a second pressure of the coolant provided by the coolant pump 1319 and (b) above the predetermined pressure threshold of the rupture point 1302 and the rupture points 1320 such that the water flows and/or coolant out of the cooling conduit 736 and into the battery housing 1254.

Figure 38:
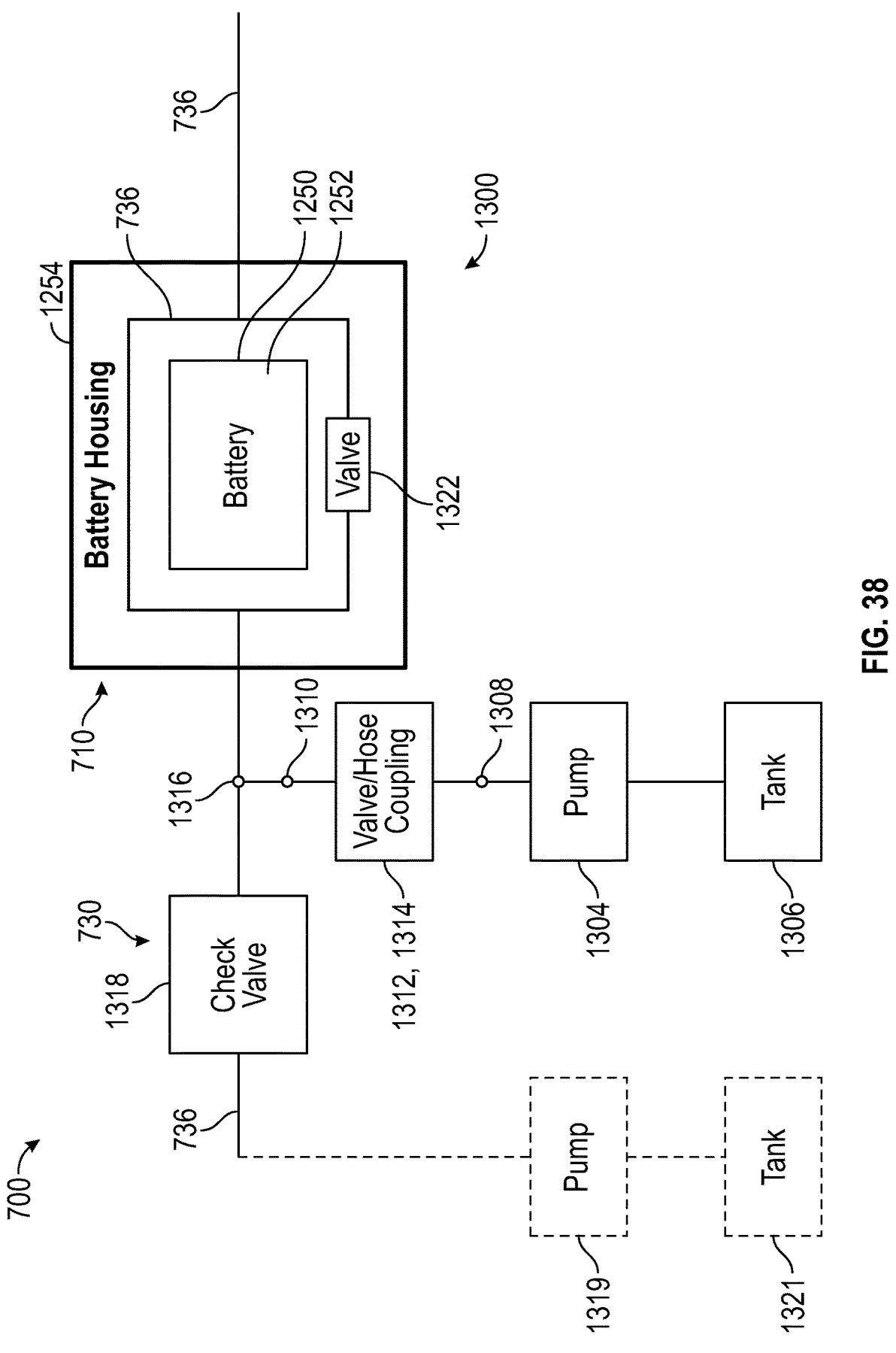
FIG. 38 is a schematic illustration of a battery cooling system including a release valve arranged within a battery housing, according to an exemplary embodiment.

FIG. 38 illustrates an exemplary embodiment of the battery cooling system 1300 that includes a second type of fluid diverter, shown as release valve 1322, rather than the rupture point 1302 (or the additional rupture points 1320). The release valve 1322 is arranged on the cooling conduit 736 within the battery housing 1254. In some embodiments, the release valve 1322 is in the form of a check valve that is designed to crack, open, or release (i.e., open and provide cooling fluid into the battery housing 1254) at a predetermined threshold pressure. For example, the check valve may be a spring-biased check valve where the spring load and flow area of the check valve define the predetermined threshold pressure. During operation, the controller (e.g., the controller 810 or a controller dedicated to the battery cooling system 1300) detects the onset of a battery thermal event (e.g., based on data from the health sensors 1256) and, in response, the supply valve 1312 is moved to the open position (either manually or electronically) or the hose coupling 1314 is manually moved to the connected state. Regardless of the specific implementation, once fluid communication is provided from the pump 1304 to the cooling conduit 736, the increased pressure provided by the pump 1304 forces the release valve 1322 to crack, open, or release and provide cooling fluid into the battery housing 1254 to cool the battery housing 1254 and/or the battery 1250, or batteries 1250, therein.

In some embodiments, the release valve 1322 is in the form of an electrically-operated control valve (e.g., a solenoid-operated control valve, a solenoid-operated on-off valve, an electronic ball valve, an electronic gate valve, a solenoid-operated spool valve, or an equivalent valve). For example, the release valve 1322 may include a solenoid or an electric actuator that is configured to selectively move the release valve 1322 between a closed position where fluid flows through the release valve 1322 and along the cooling conduit 736 and an open position where fluid flows from the cooling conduit 736 and into the battery housing 1254 to cool the battery housing 1254 and/or the battery 1250, or batteries 1250, arranged therein. In some embodiments, the release valve 1322 is in communication with a controller (e.g., the controller 810 or a controller dedicated to the battery cooling system 1300) and configured to be selectively moved from the closed position to the open position in response to the detection of a battery thermal event (e.g., via the health sensor 1256). In some embodiments, during operation, the controller (e.g., the controller 810 or a controller dedicated to the battery cooling system 1300) detects the onset of a battery thermal event (e.g., based on data from the health sensors 1256) and, in response, the controller sends a signal to the release valve 1322 that moves the release valve 1322 from the closed position to the open position. Once fluid communication is provided between the pump 1304 and the cooling conduit 736 (e.g., by manually or electronically moving the supply valve 1312 or manually moving the hose coupling 1314), cooling fluid is provided into the battery housing 1254 to cool the battery housing 1254 and/or the battery 1250, or batteries 1250, therein. In some embodiments, the battery cooling system 1300 includes the release valve 1322, but the controller does not open the release valve 1322 to permit the cooling fluid to cycle through the battery cooling system 1300 (e.g., for cooling purposes, to drain the state of charge of the ESS 700, etc.).

In some embodiments, during a thermal event, the coolant pump 1319 is configured to pump the coolant at a pressure above the predetermined pressure threshold of the release valve 1322 so that the fluid (e.g., coolant) flows out of the cooling conduit 736 and into the battery housing 1254. In some embodiments, during a thermal event, the pump 1304 is a water pump and is configured to provide the water at a first pressure that is (a) higher than a second pressure of the coolant provided by the coolant pump 1319 and (b) above the predetermined pressure threshold of the release vale 1322 such that the water and/or coolant flows out of the cooling conduit 736 and into the battery housing 1254.

Figure 39:
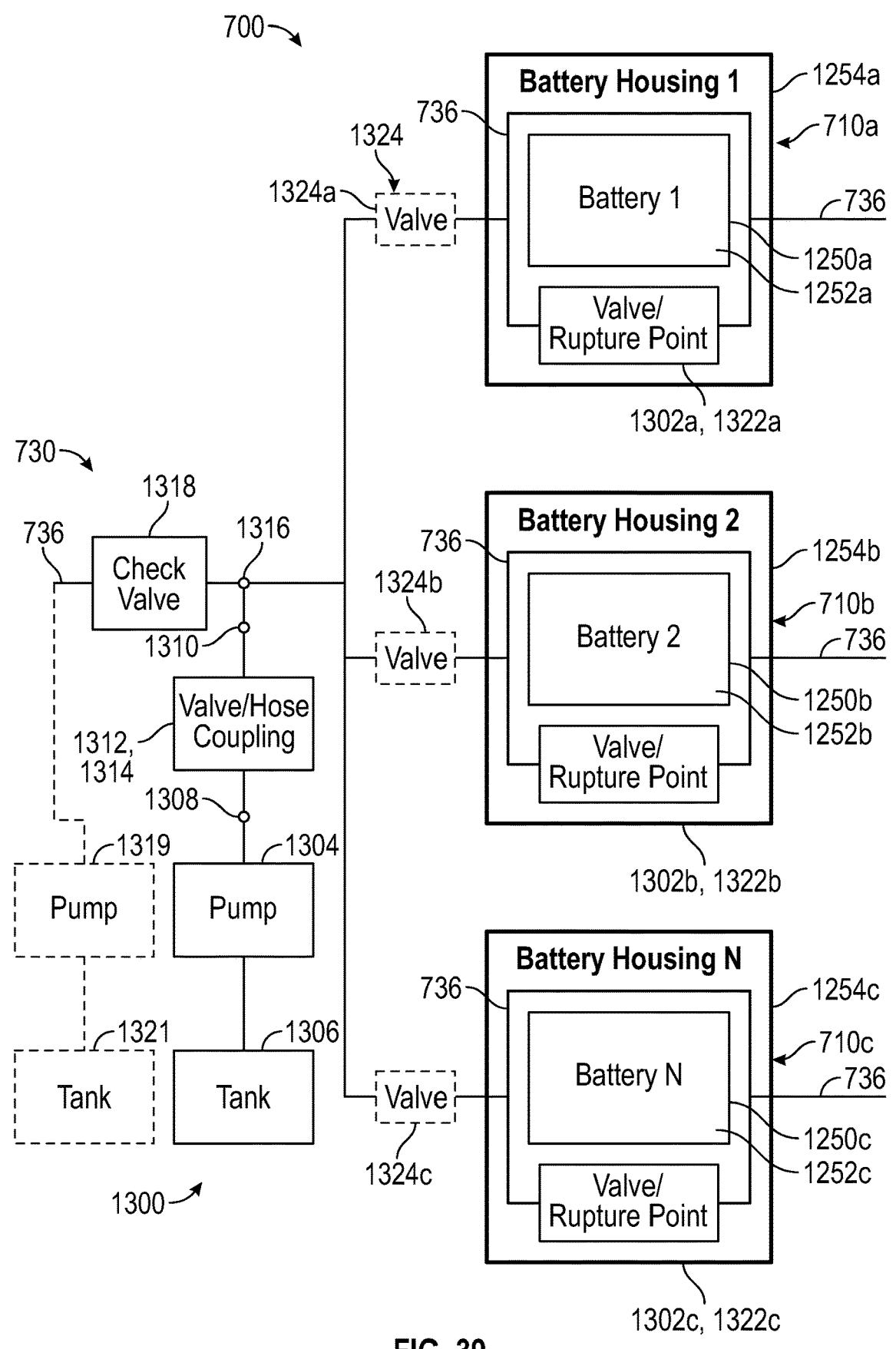
FIG. 39 is a schematic illustration of a battery cooling system including a rupture point or a release valve arranged within a plurality of battery housings, according to an exemplary embodiment.

As described herein, the vehicle 10 can include a plurality of battery packs 710. The battery cooling system 1300 can be configured to provide pack, housing, battery, and/or cell-specific cooling based, for example, on the individual monitoring of the packs, housings, batteries, and/or cells by the health sensors 1256. For example, FIG. 39 illustrates an exemplary embodiment of the battery cooling system 1300 being integrated into a plurality of cooling conduits 736 of the ESS cooling system 730 to provide individualized cooling to a first battery pack 710a, a second battery pack 710b, and an nth battery pack 710c. Each of the components of the battery packs 710a, 710b, 710c and the battery cooling system 1300 is identified in FIG. 39 using the suffix "a" for the first battery pack 710a, the suffix "b" for the second battery pack 710b, and the suffix "c" for the nth battery pack 710c. For example, the first battery pack 710a includes a first battery housing 1254a having a first battery 1250a or batteries 1250a, the second battery pack 710b includes a second battery housing 1254b having a second battery 1250b or batteries 1250b, and the nth battery pack 710c includes an nth battery housing 1254c having a nth battery 1250c or batteries 1250c. In the illustrated embodiment, each of the cooling conduits 736 extend into and through the battery housings 1254a, 1254b, 1254c (e.g., similar to the embodiments illustrated in FIGS. 38 and 39). The design, properties, and operation of the battery cooling system 1300 of FIG. 39 may be similar to the description herein with respect to the embodiments of FIGS. 37 and 38, except the battery cooling system 1300 is configured to provide individualized cooling to one or more of the battery packs 710a, 710b, 710c (and individualized cooling to the batteries 1250a, 1250b, 1250c and/or individualized cooling to the cells).

For example, under certain operating conditions, an onset of a battery thermal event may be detected in or at one of the battery packs 710a, 710b, 710c (e.g., via the health sensors 1256 dedicated to that battery pack). In embodiments where the battery cooling system 1300 includes electrically-operated release valves 1322, the controller is configured to move or open the release valve 1322 in the one of the battery packs 710a, 710b, 710c in which the battery thermal event was detected. In embodiments where the battery cooling system 1300 includes rupture points 1302 or mechanically-operated release valves 1322 (e.g., check valves), the battery cooling system 1300 includes selection valves 1324 arranged upstream of each of the battery packs 710a, 710b, 710c. Specifically, the battery cooling system 1300 includes a first selection valve 1324a arranged between the connection point 1316 and the first battery pack 710a, a second selection valve 1324b arranged between the connection point 1316 and the second battery pack 710b, and an nth selection valve 1324c arranged between the connection point 1316 and the nth battery pack 710c.

In some embodiments, the selection valves 1324 are each in the form of an electrically-operated control valve (e.g., a solenoid-operated control valve, a solenoid-operated on-off valve, an electronic ball valve, an electronic gate valve, a solenoid-operated spool valve, or an equivalent valve). For example, the selection valves 1324 may each include a solenoid or an electric actuator that is configured to selectively move a respective one of the selection valves 1324 between a closed position where fluid communication is prevented between the pump 1304 and the battery pack 710 arranged downstream of the respective selection valve 1324 and an open position where fluid communication is provided between the pump 1304 and the rupture point 1302 or the release valve 1322 arranged within the downstream battery pack 710. During operation, the controller (e.g., the controller 810 or a controller dedicated to the battery cooling system 1300) detects the onset of a battery thermal event (e.g., based on data from the health sensors 1256) in one of the battery packs 710a, 710b, 710c. In response, the controller sends a signal to the selection valve 1324 (e.g., the first selection valve 1324a, the second selection valve 1324b, or the nth selection valve 1324c) that corresponds with the battery pack 710a, 710b, 710c within which the battery thermal event was detected. The signal from the controller moves the respective selection valve 1324 to the open position and provides fluid communication between the pump 1304 and the rupture point 1302 or the release valve 1322 within the corresponding battery pack 710a, 710b, 710c. As described herein, the rupture point 1302 or the release valve 1322 can provide cooling fluid into the respective battery housing 1254 (e.g., the first battery housing 1254a, the second battery housing 1254b, or the nth battery housing 1254c), which cools the respective battery housing 1254 and/or the battery, or batteries 1250 (e.g., the first battery 1250a, the second battery 1250b, or the nth battery 1250c) arranged therein.

Figure 40:
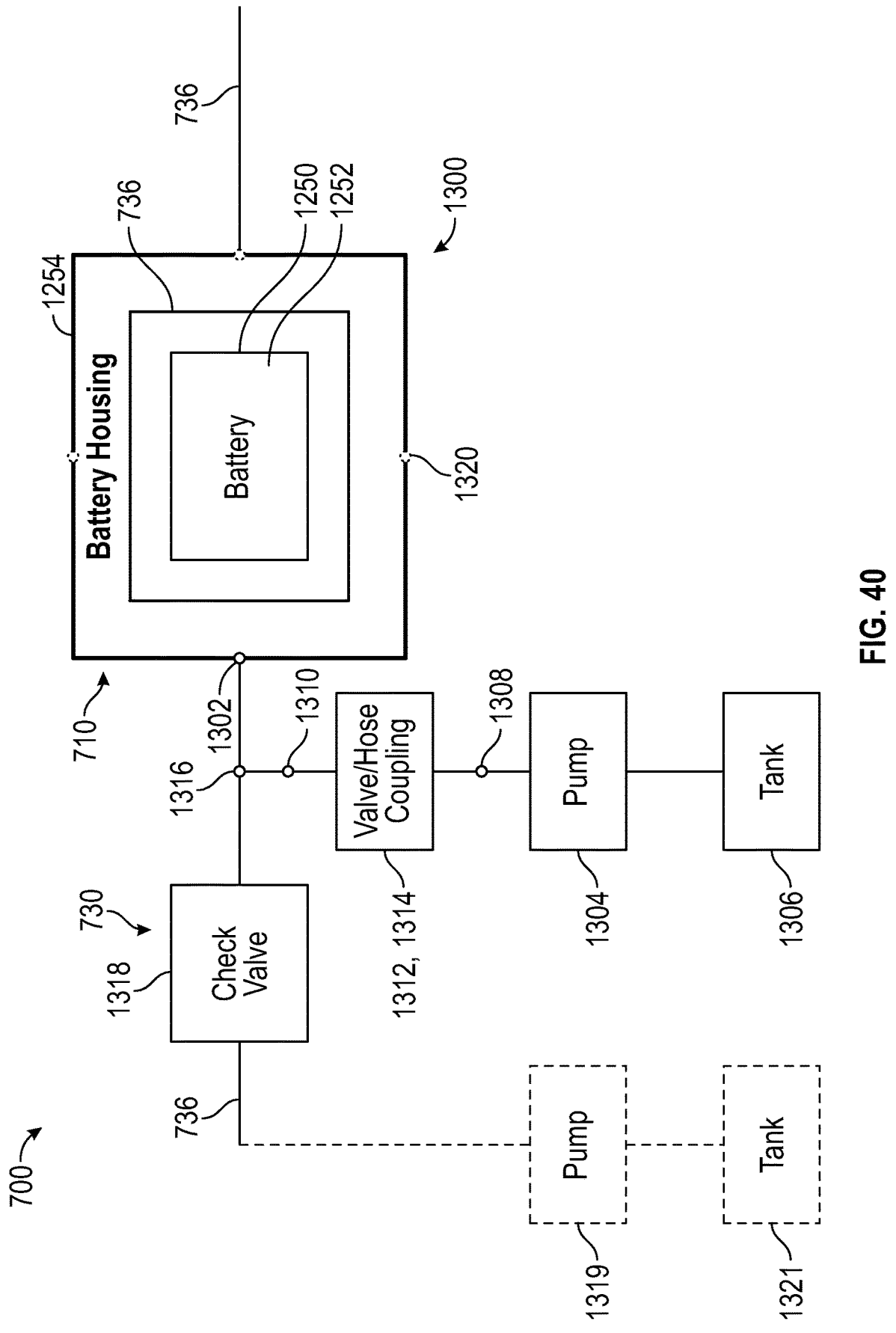
FIG. 40 is a schematic illustration of a battery cooling system including a rupture point arranged externally from a battery housing, according to an exemplary embodiment.
Figure 41:
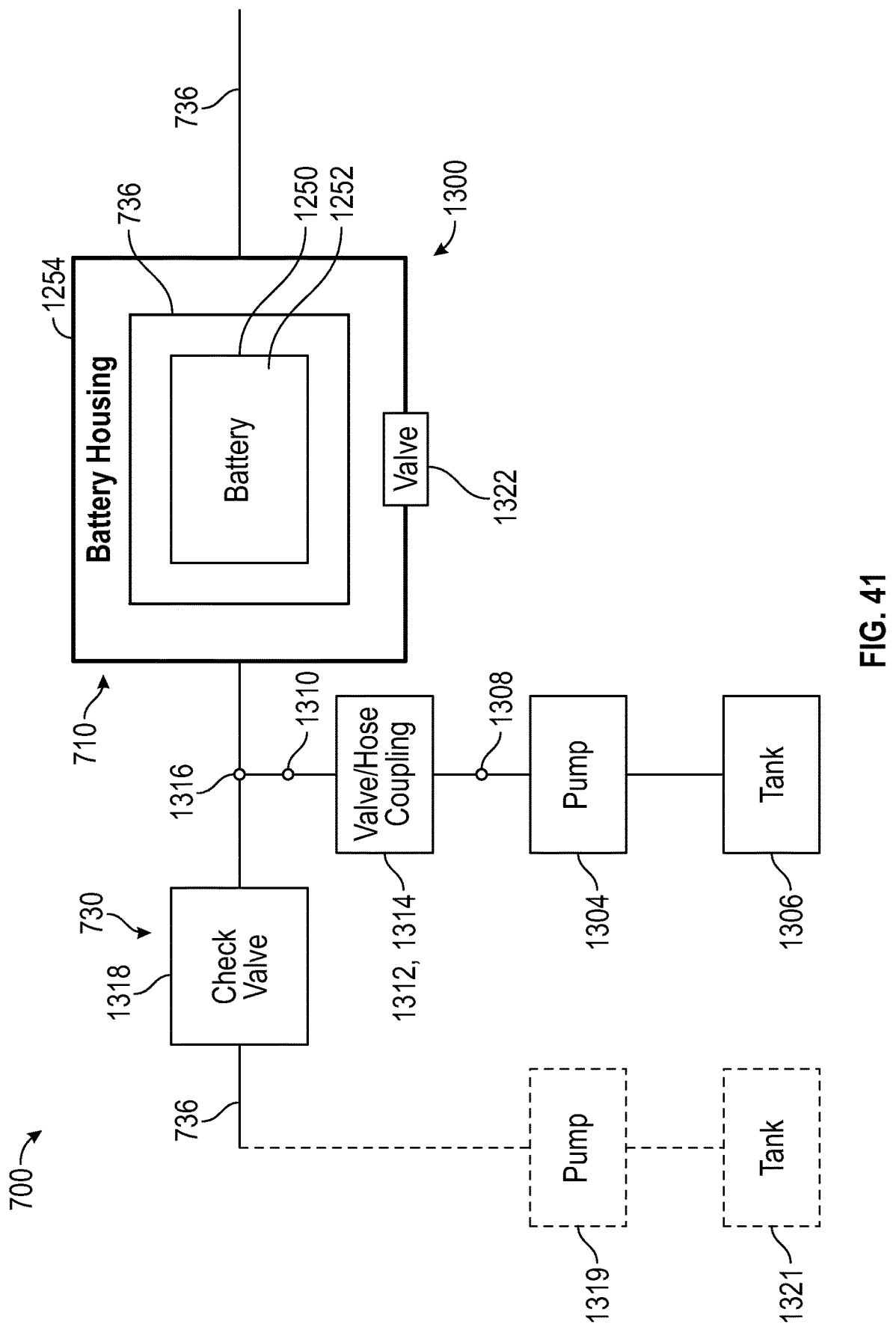
FIG. 41 is a schematic illustration of a battery cooling system including a release valve arranged externally from a battery housing, according to an exemplary embodiment.
Figure 42:
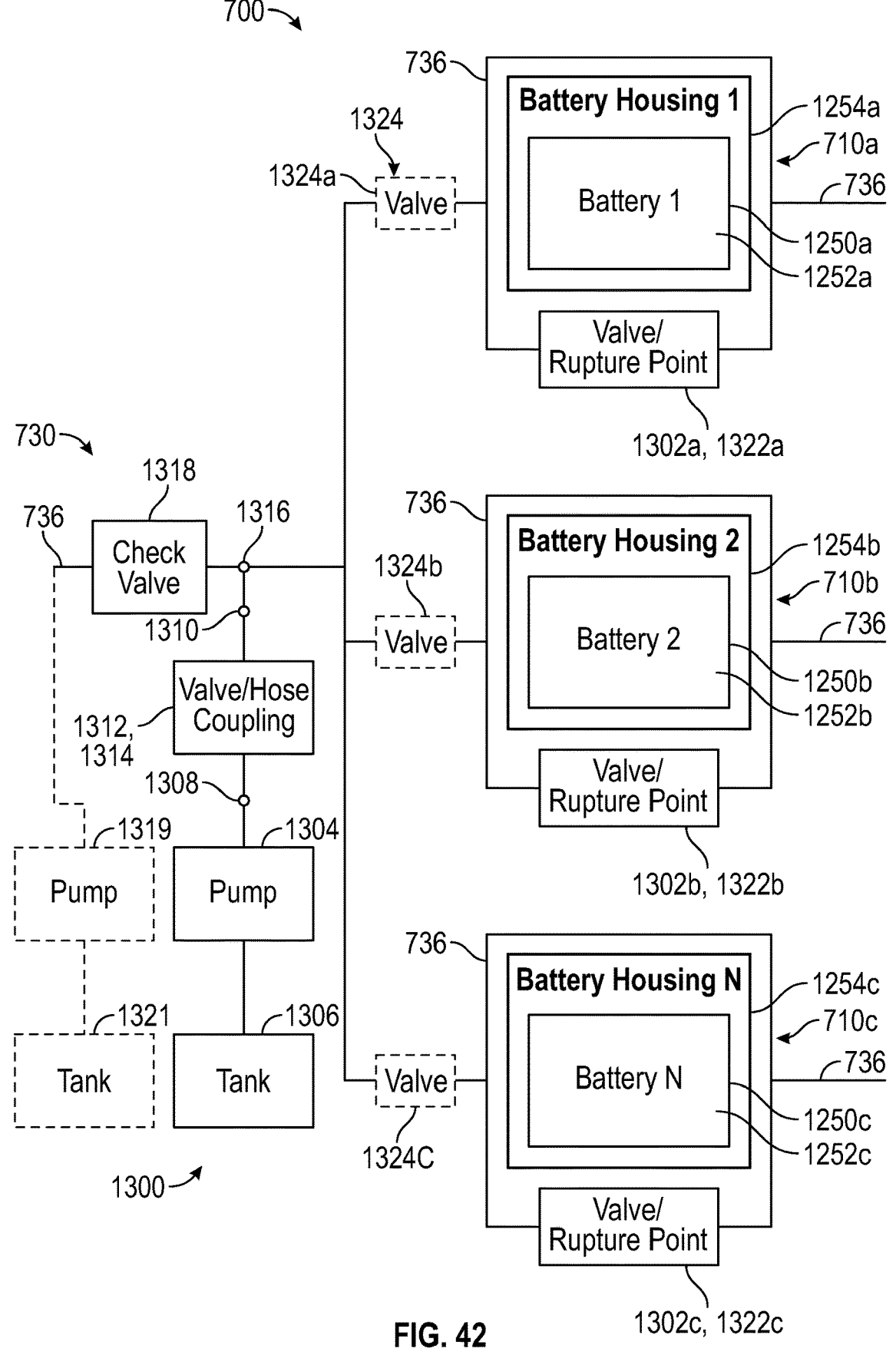
FIG. 42 is a schematic illustration of a battery cooling system including a rupture point or a release valve arranged externally from a plurality of battery housings, according to an exemplary embodiment.

In some embodiments, the cooling conduits 736 of the ESS cooling system 730 are arranged to provide cooling adjacent to or around the battery housings 1254 of the battery packs 710. FIGS. 40-42 illustrate exemplary embodiments of the battery cooling system 1300 being integrated into a cooling conduit 736 that extends around the battery housing 1254 of a battery pack 710. In these embodiments, the battery cooling system 1300 is configured to provide cooling to the areas surrounding the battery housing 1254 and to the battery housing 1254 itself. In general, the operation of the battery cooling system 1300 is the same as described herein with respect to FIGS. 37-39 and the description of FIGS. 37-39 applies to the battery cooling systems of FIG. 40-42, except the location of the cooling conduit 736 is changed from extending through the battery housing 1254 to extending around the battery housing 1254.

For example, in the embodiment of FIG. 40, the battery cooling system 1300 includes the rupture point 1302 arranged on or positioned along the cooling conduit 736, with the rupture point 1302 being arranged or positioned externally to the battery housing 1254. In some embodiments, the battery cooling system 1300 includes the release valve 1322 arranged on or positioned along the cooling conduit 736 externally from the battery housing 1254, as shown in FIG. 41. In some embodiments, ESS cooling system 730 includes a plurality of cooling conduits 736, each extending around a corresponding battery pack 710a, 710b, 710c, and the battery cooling system 1300 is configured to provide individualized cooling to the battery packs 710a, 710b, 710c, as shown in FIG. 42.

In some embodiments, during a thermal event, the coolant pump 1319 is configured to pump the coolant at a pressure above the predetermined pressure threshold of the rupture point 1302, the additional ruptures points 1320, and/or the release valve 1322 so that the fluid (e.g., coolant) flows out of the cooling conduit 736 and around the battery housing 1254. In some embodiments, during a thermal event, the pump 1304 is a water pump and is configured to provide the water at a first pressure that is (a) higher than a second pressure of the coolant provided by the coolant pump 1319 and (b) above the predetermined pressure threshold of the rupture point 1302, the additional ruptures points 1320, and/or the release valve 1322 such that the water and/or coolant flows out of the cooling conduit 736 and around the battery housing 1254.

In some embodiments, the ESS cooling system 730 and the corresponding battery cooling system 1300 integrated therein includes cooling conduits 736 that both extend through the battery housings 1254 and around the battery housings 1254. Accordingly, the embodiments of FIGS. 37-39 and FIGS. 40-42 may be combined to provide cooling both internally within the battery housings 1254 and externally to the battery housings 1254.

Supplemental Cooling Conduit

FIGS. 43-48 illustrate exemplary embodiments of the battery cooling system 1300 being integrated into a second, supplementary, or dedicated thermal event management cooling system, shown as supplemental cooling system 1350, that is provided on the vehicle 10 in addition to the ESS cooling system 730. For example, the ESS cooling system 730 is a first battery cooling system including one or more first cooling conduits (e.g., the cooling conduit 736) that are arranged adjacent to or run through a battery (e.g., the battery 1250, or batteries 1250, within a battery pack 710) or a battery housing (e.g., the battery housing 1254), and the supplemental cooling system 1350 is a second battery cooling system including one or more second cooling conduits that are in fluid communication with the battery housing (e.g., the battery housing 1254) to provide cooling fluid into and/or around the battery housing and/or the battery or batteries thereof. More specifically, the ESS cooling system 730 may be configured to operate during normal operating conditions (e.g., when a thermal event is not present or predicted) to thermally manage the ESS 700, while the supplemental cooling system 1350 may be configured to operate prior to or during a battery thermal event to supplement the ESS 700, or replace operation of the ESS 700, to mitigate or stop the battery thermal event. As described herein, in some embodiments, the cooling conduit 736 of the EES cooling system 730 is pumped with coolant by the coolant pump 1319, which draws coolant from the coolant tank 1321. In some embodiments, the coolant tank 1321 is a first reservoir configured to store a first fluid (e.g., coolant), and the coolant pump 1319 is a first pump.

The supplemental cooling system 1350 includes one or more second cooling conduits 1352 that are provided on the vehicle 10 in addition to the cooling conduits 736. In general, the design, properties, and operation of the supplemental cooling system 1350 is similar to the battery cooling system 1300 (described above with respect to FIGS. 37-42), with similar features identified using like reference numerals, except as described herein or apparent from the figures. With specific reference to FIG. 43, the supplemental cooling system 1350 includes the second cooling conduit 1352, the rupture point 1302, the pump 1304, the tank 1306, the pump outlet port 1308, the supply port 1310, and one of the supply valve 1312 or the hose coupling 1314. In some embodiments, the pump 1304 is a second pump (e.g., the water pump) and the tank 1306 is a second tank (e.g., the water tank) configured to store a second fluid (e.g., water).

In the illustrated embodiment, the second cooling conduit 1352 extends through the battery housing 1254. The pump 1304 is in fluid communication with the second cooling conduit 1352 through the pump outlet port 1308, the supply valve 1312 or the hose coupling 1314, and the supply port 1310. In some embodiments, the supplemental cooling system 1350 includes the additional rupture points 1320 (optionally included and shown using dashed lines) arranged on or positioned along the second cooling conduit 1352 downstream of the rupture point 1302.

Figure 43:
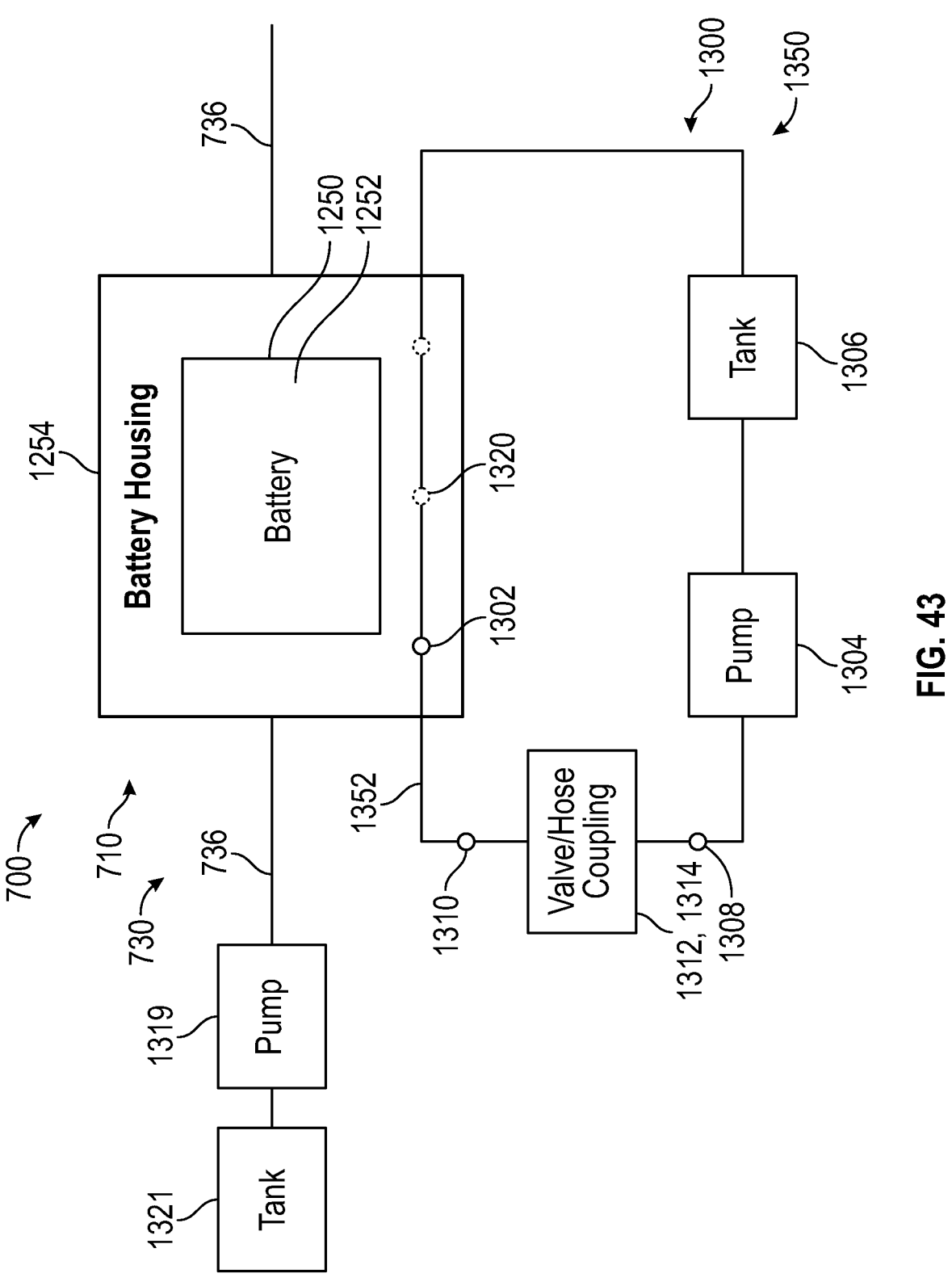
FIG. 43 is a schematic illustration of a second cooling system including a rupture point arranged within a battery housing, according to an exemplary embodiment.

In general, the operation of the supplemental cooling system 1350 of FIG. 43 is similar to the battery cooling system 1300 of FIG. 37, except the cooling fluid is provided to the second cooling conduit 1352, rather than the cooling conduit 736. For example, during operation, the controller (e.g., the controller 810 or a controller dedicated to the supplemental cooling system 1350) detects the onset of a battery thermal event (e.g., based on data from the health sensors 1256). In response, the supply valve 1312 is moved to the open position (either manually or electronically) or the hose coupling 1314 is manually moved to the connected state. Regardless of the specific implementation for communicating the cooling fluid from the pump 1304 to the second cooling conduit 1352, once fluid communication is provided from the pump 1304 to the second cooling conduit 1352, the increased pressure provided by the pump 1304 forces the rupture point 1302 to rupture and provide the cooling fluid into the battery housing 1254 to cool the battery housing 1254 and/or the battery 1250 or batteries 1250 therein.

Figure 44:
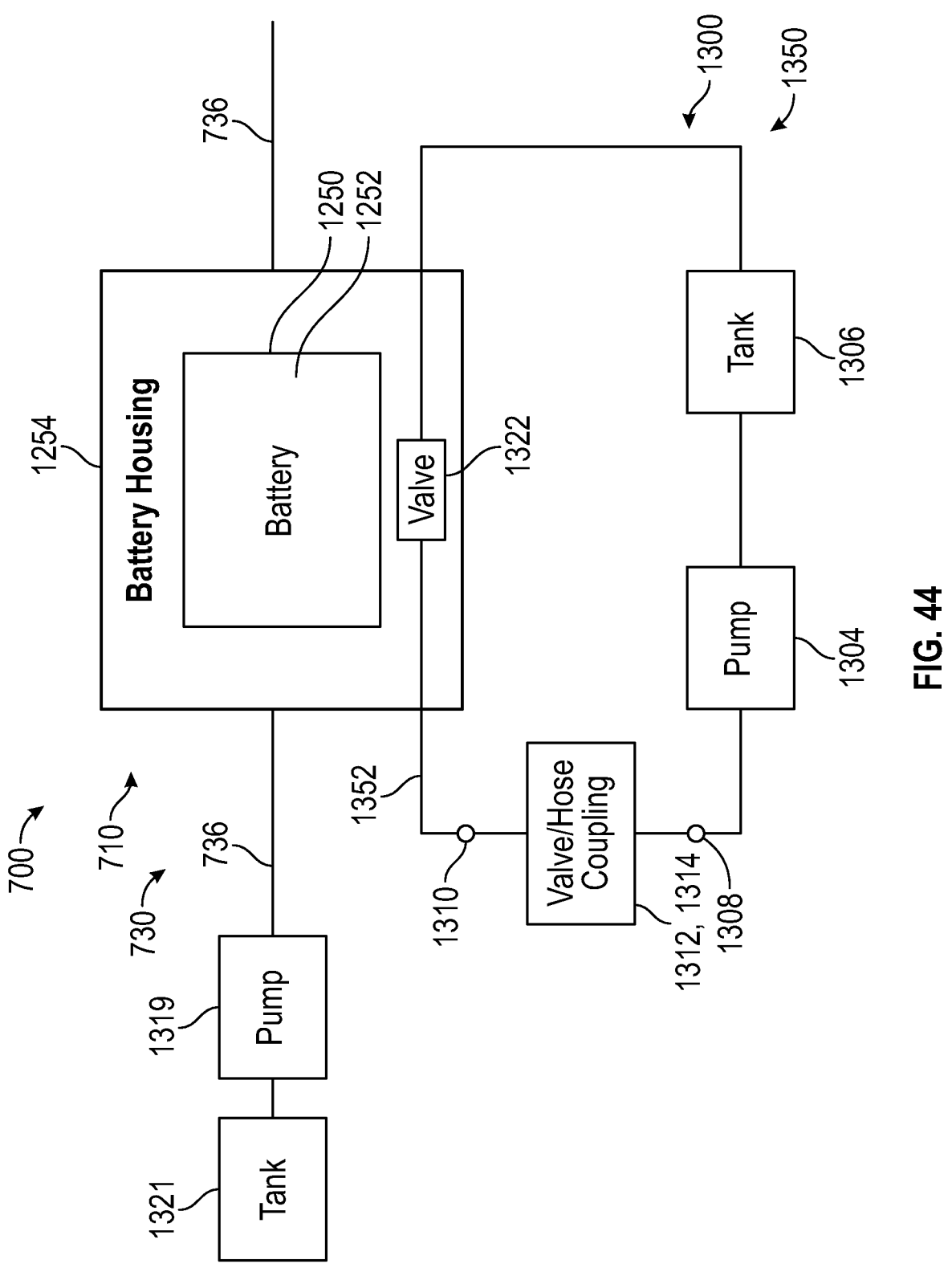
FIG. 44 is a schematic illustration of a second cooling system including a release valve arranged within a battery housing, according to an exemplary embodiment.

FIG. 44 illustrates an exemplary embodiment of the supplemental cooling system 1350 that includes the release valve 1322, rather than the rupture point 1302 (or the additional rupture points 1320). The release valve 1322 is arranged on or positioned along the second cooling conduit 1352 within the battery housing 1254. In general, the operation of the supplemental cooling system 1350 of FIG. 44 is similar to the battery cooling system 1300 of FIG. 38, except the cooling fluid is provided to the second cooling conduit 1352, rather than the cooling conduit 736. For example, during operation, the controller (e.g., the controller 810 or a controller dedicated to the supplemental cooling system 1350) detects the onset of a battery thermal event (e.g., based on data from the health sensors 1256). In response, the supply valve 1312 is moved to the open position (either manually or electronically) or the hose coupling 1314 is manually moved to the connected state. In some embodiments, once fluid communication is provided from the pump 1304 to the second cooling conduit 1352, the increased pressure provided by the pump 1304 forces the release valve 1322 to crack, open, or release and provide cooling fluid into the battery housing 1254 to cool the battery housing 1254 and/or the battery 1250, or batteries 1250, therein. In some embodiments, the controller sends a signal to the release valve 1322 that moves the release valve 1322 from the closed position to the open position, and once fluid communication is provided between the pump 1304 and the second cooling conduit 1352 (e.g., by manually or electronically moving the supply valve 1312 or manually moving the hose coupling 1314), cooling fluid is provided into the battery housing 1254 to cool the battery housing 1254 and/or the battery 1250, or batteries 1250, therein. In some embodiments, the supplemental cooling system 1350 includes the release valve 1322, but the controller does not open the release valve 1322 to permit the second cooling fluid to cycle through the supplemental cooling system 1350 (e.g., for supplemental cooling purposes, to drain the state of charge of the ESS 700, etc.). In some embodiments, the supplemental cooling system 1350 does not include the rupture point 1302, the additional rupture points 1320, or the release valve 1322. Instead, the second cooling conduit 1352 is a fixed loop that permits cycling the second cooling fluid through the supplemental cooling system 1350.

Figure 45:
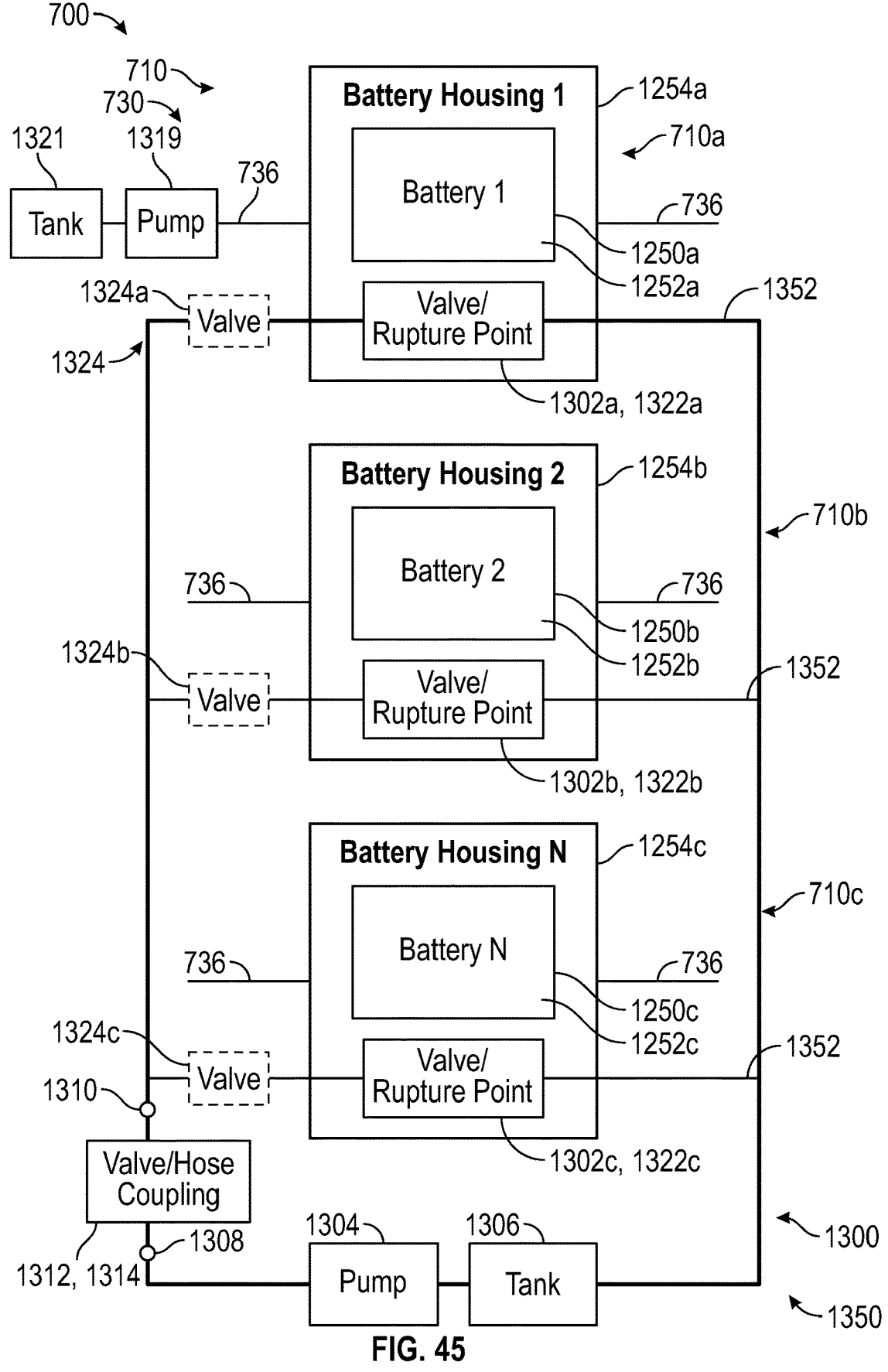
FIG. 45 is a schematic illustration of a second cooling system including a rupture point or a release valve arranged within a plurality of battery housings, according to an exemplary embodiment.

FIG. 45 illustrates an exemplary embodiment of the supplemental cooling system 1350 including a plurality of second cooling conduits 1352 to provide individualized cooling to a first battery pack 710a, a second battery pack 710b, and an nth battery pack 710c. Each of the components of the battery packs 710a, 710b, 710c and the supplemental cooling system 1350 is identified in FIG. 45 using the suffix "a" for the first battery pack 710a, the suffix "b" for the second battery pack 710b, and the suffix "c" for the nth battery pack 710c. In general, the operation of the supplemental cooling system 1350 of FIG. 45 is similar to the battery cooling system 1300 of FIG. 39, except the cooling fluid is provided to the second cooling conduits 1352, rather than the cooling conduits 736. For example, under certain operating conditions, an onset of a battery thermal event may be detected one of the battery packs 710a, 710b, 710c (e.g., via the health sensors 1256 dedicated to that battery pack). In embodiments where the supplemental cooling system 1350 includes electrically-operated release valves 1322, the controller is configured to move the release valve 1322 in the one of the battery packs 710a, 710b, 710c in which the battery thermal event was detected. In embodiments where the battery cooling system 1300 includes rupture points 1302 or mechanically-operated release valves 1322 (e.g., check valves), the battery cooling system 1300 includes the selection valves 1324 arranged upstream of each of the battery packs 710a, 710b, 710c.

During operation, the controller (e.g., the controller 810 or a controller dedicated to the supplemental cooling system 1350) detects the onset of a battery thermal event (e.g., based on data from the health sensors 1256) in one of the battery packs 710a, 710b, 710c. In response, the controller sends a signal to the selection valve 1324 (e.g., the first selection valve 1324a, the second selection valve 1324b, or the nth selection valve 1324c) that corresponds with the battery pack 710a, 710b, 710c within which the battery thermal event was detected. The signal from the controller moves the respective selection valve 1324 to the open position and provides fluid communication between the pump 1304 and the rupture point 1302 or the release valve 1322 within the corresponding battery pack 710a, 710b, 710c. As described herein, the rupture point 1302 or the release valve 1322 can provide cooling fluid into the respective battery housing 1254 (e.g., the first battery housing 1254a, the second battery housing 1254b, or the nth battery housing 1254c), which cools the respective battery housing 1254 and/or the battery 1250, or batteries 1250 (e.g., the first battery 1250a, the second battery 1250b, or the nth battery 1250c) arranged therein.

Figure 46:
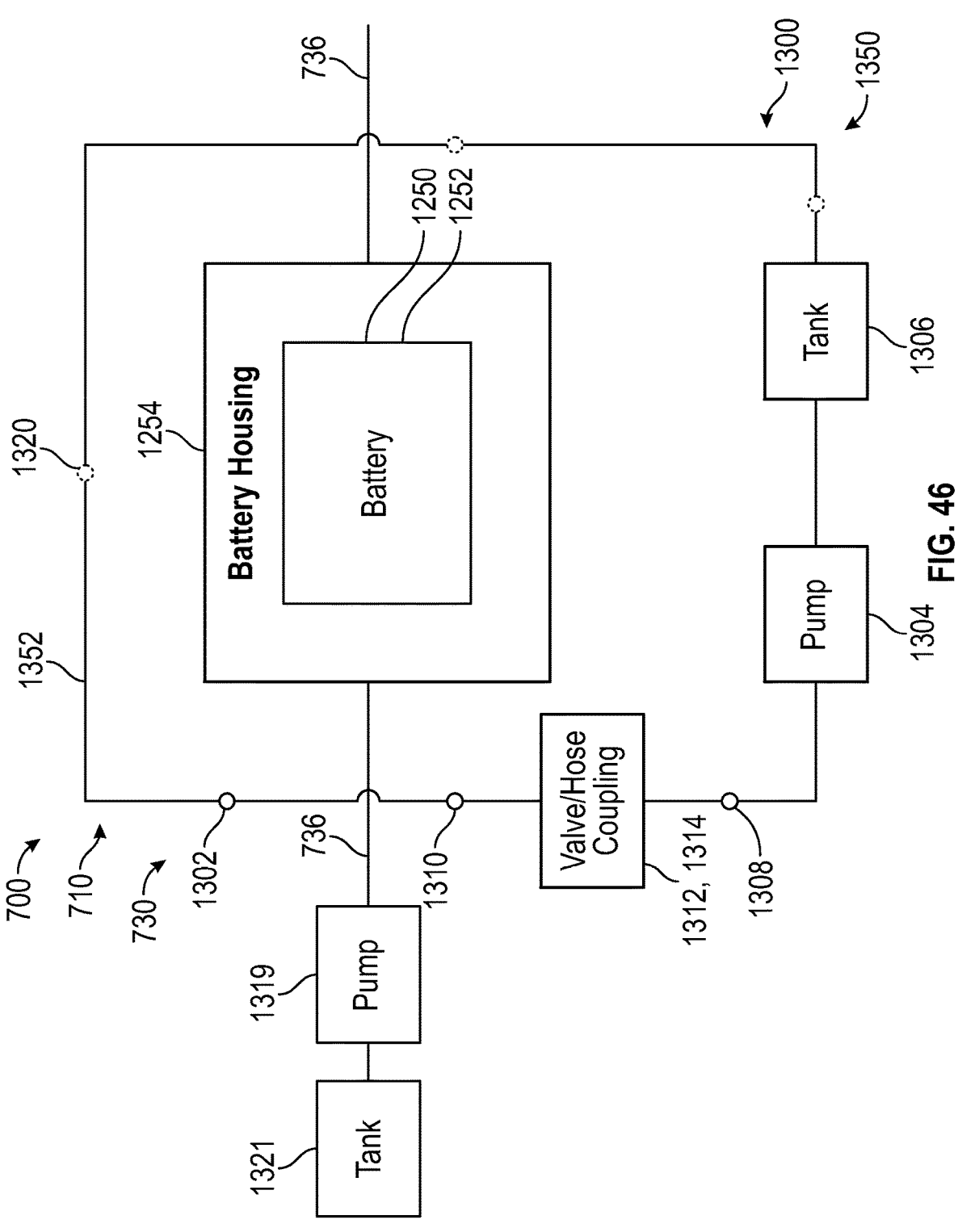
FIG. 46 is a schematic illustration of a second cooling system including a rupture point arranged externally from a battery housing, according to an exemplary embodiment.
Figure 47:
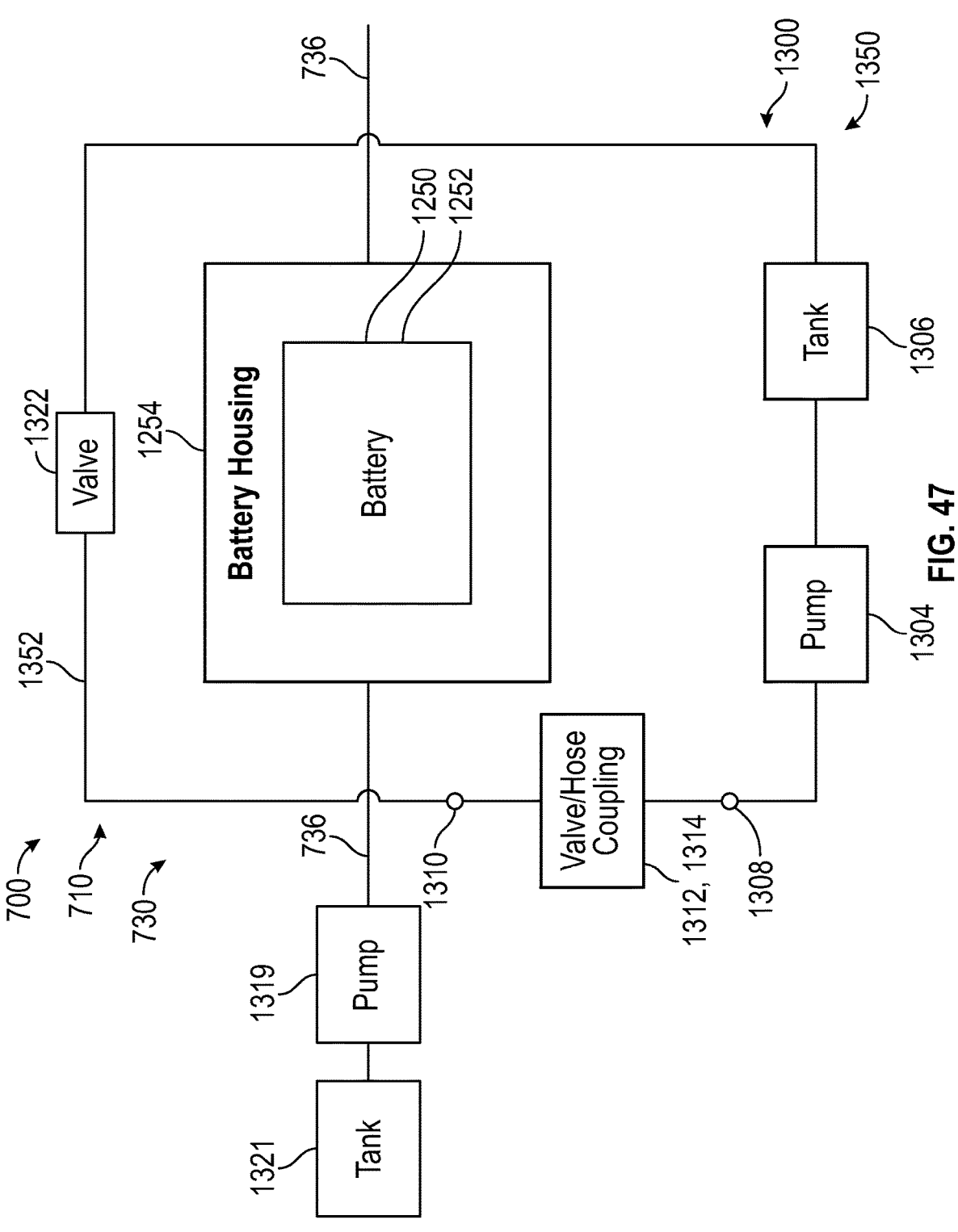
FIG. 47 is a schematic illustration of a second cooling system including a release valve arranged externally from a battery housing, according to an exemplary embodiment.
Figure 48:
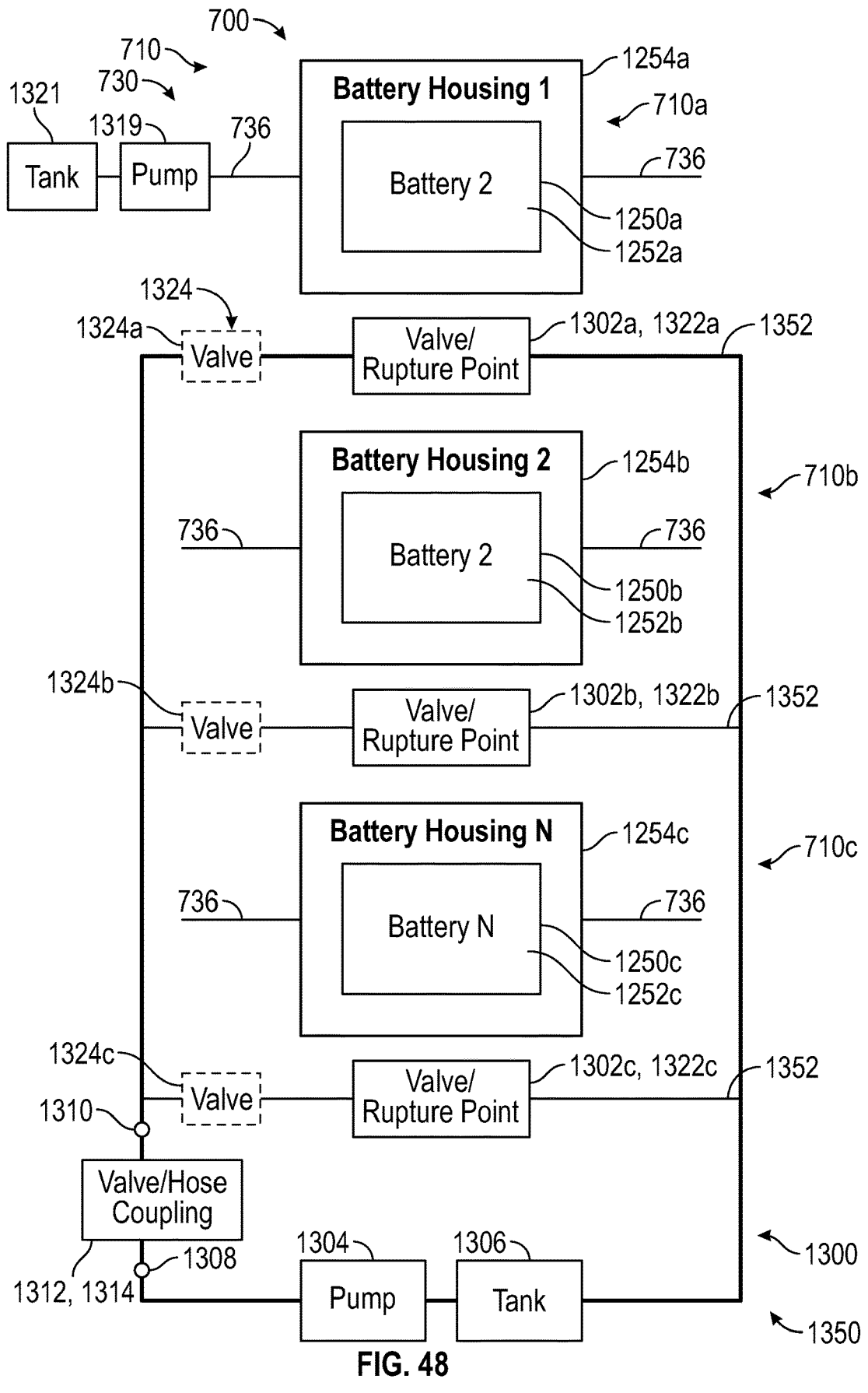
FIG. 48 is a schematic illustration of a second cooling system including a rupture point or a release valve arranged externally from a plurality of battery housings, according to an exemplary embodiment.

In some embodiments, the second cooling conduit 1352 of the supplemental cooling system 1350 is arranged to provide cooling adjacent to or around the battery housings 1254 of the battery packs 710. FIGS. 46-48 illustrate exemplary embodiments of the supplemental cooling system 1350 including a second cooling conduit 1352 that extends around the battery housing 1254 of a battery pack 710. In these embodiments, the supplemental cooling system 1350 is configured to provide cooling to the areas surrounding the battery housing 1254 and to the battery housing 1254 itself. In general, the operation of the supplemental cooling system 1350 is the same as described herein with respect to FIGS. 43-45 and the description of FIGS. 43-45 applies to the second cooling systems of FIG. 46-48, except the location of the second cooling conduit 1352 is changed from extending through the battery housing 1254 to extending around the battery housing 1254.

For example, in the embodiment of FIG. 46, the supplemental cooling system 1350 includes the rupture point 1302 arranged on or positioned along the second cooling conduit 1352, with the rupture point 1302 being arranged externally to the battery housing 1254. In some embodiments, the supplemental cooling system 1350 includes the release valve 1322 arranged on or positioned along the second cooling conduit 1352 externally from the battery housing 1254, as shown in FIG. 47. In some embodiments, the supplemental cooling system 1350 includes a plurality of second cooling conduits 1352, each extending around a corresponding battery housing 1254a, 1254b, 1254c, and the supplemental cooling system 1350 is configured to provide individualized cooling to the battery housings 1254a, 1254b, 1254c, as shown in FIG. 48.

Figure 74:
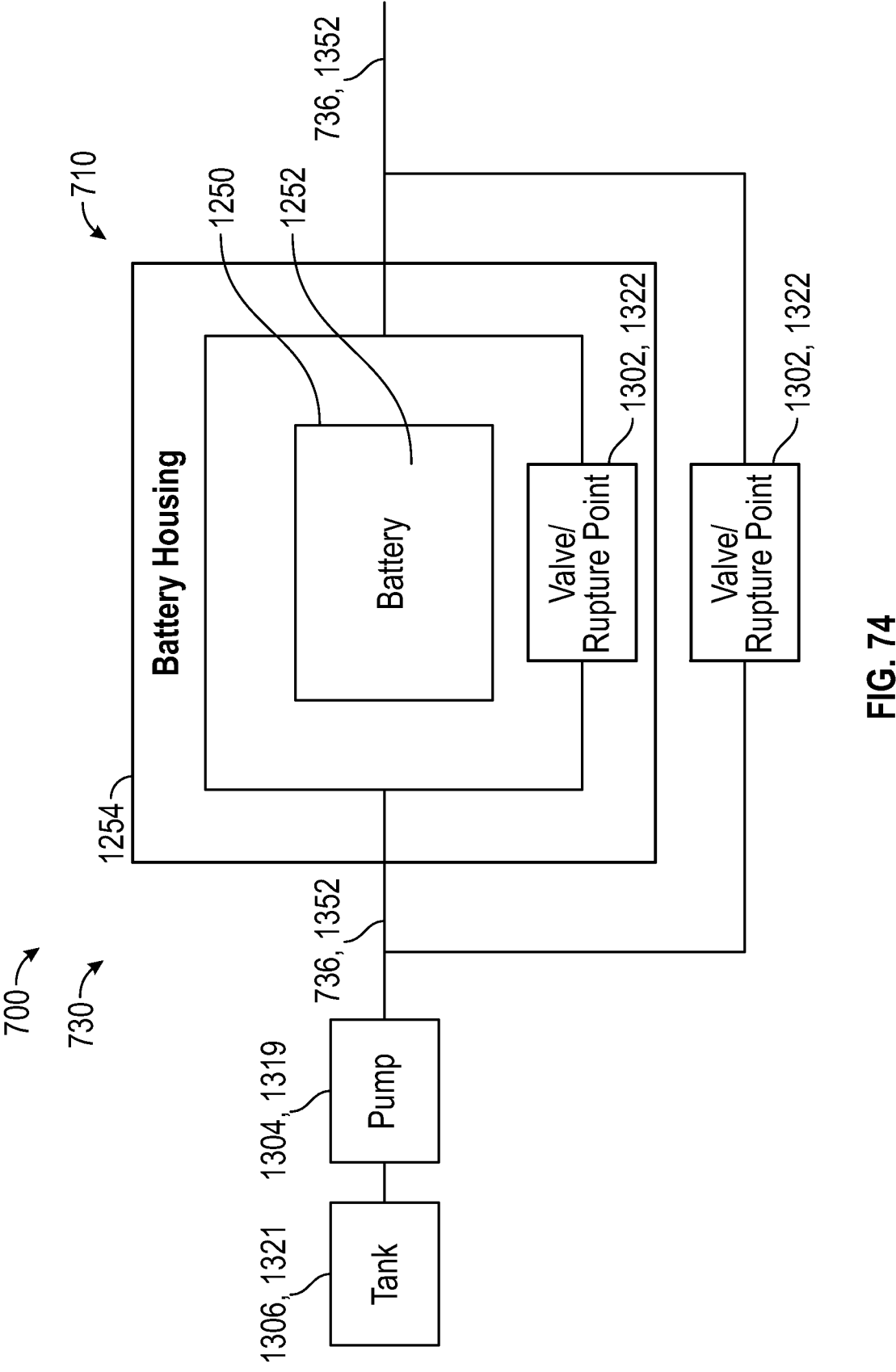
FIG. 74 is a schematic illustration of a battery cooling system including cooling conduit(s) arranged within and around a battery housing, according to an exemplary embodiment.

In some embodiments, the supplemental cooling system 1350 includes cooling conduits 1352 that both extend through the battery housings 1254 and around the battery housings 1254. Accordingly, the embodiments of FIGS. 43-45 and FIGS. 46-48 may be combined to provide cooling both internally with the battery housings 1254 and externally to the battery housings 1254. In some embodiments, the release valves 1322 include nozzles or function as nozzles that can be specifically oriented to direct the cooling fluid at particular locations within and/or around the battery housings 1254. Further, although the concepts from FIGS. 37-48 are not specifically shown to be combined in a single figure to avoid overcrowding the images, it should be understood that the concepts from FIGS. 37-48 may be used in any combination together (see, e.g., FIG. 74 with a cooling conduit 736, 1352 extending into and around the battery housing 1254).

Figure 75:
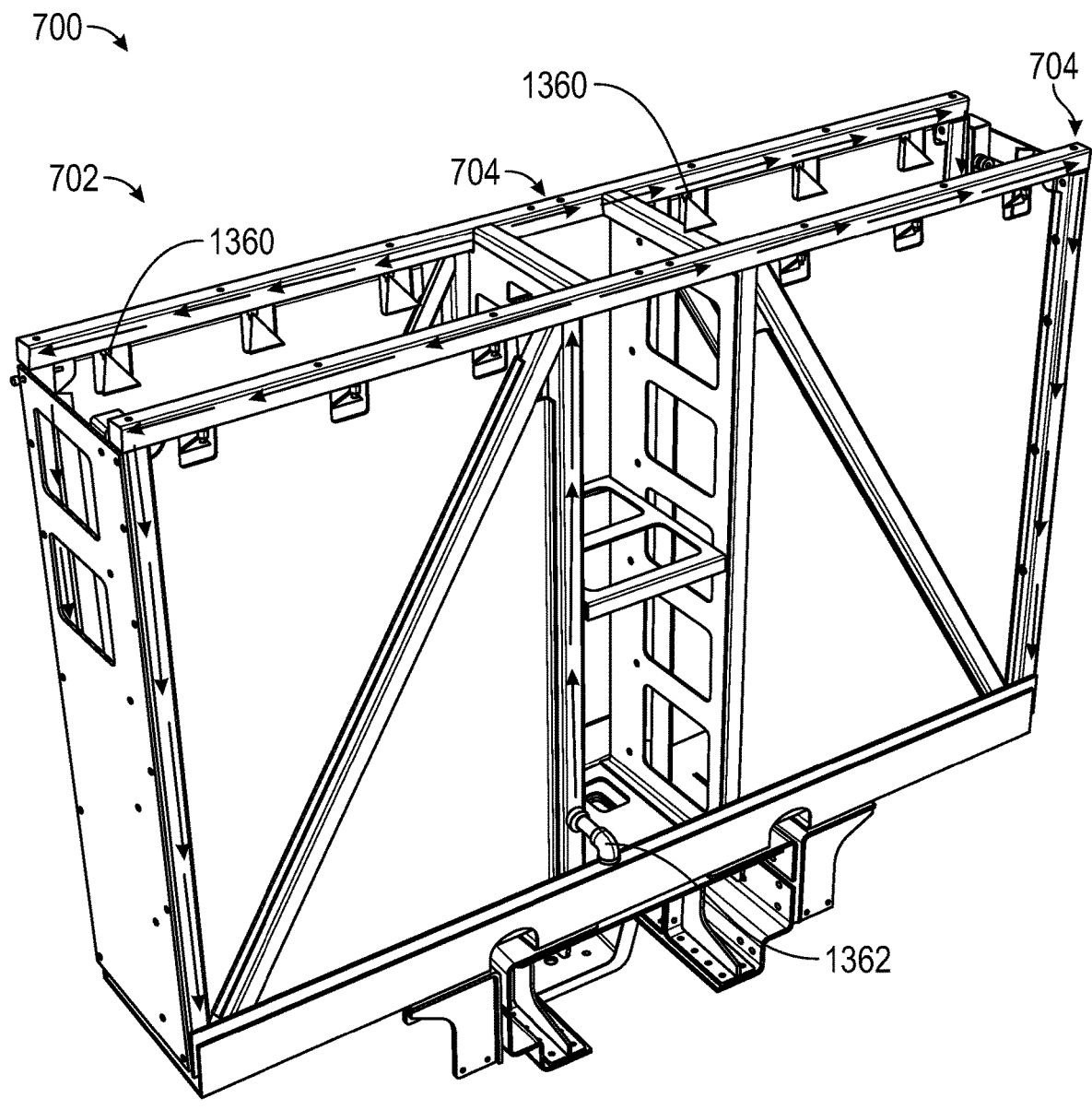
FIG. 75 is a perspective view of a battery housing of the vehicle of FIG. 1 including a cooling flow path with nozzles, according to an exemplary embodiment.
Figure 76:
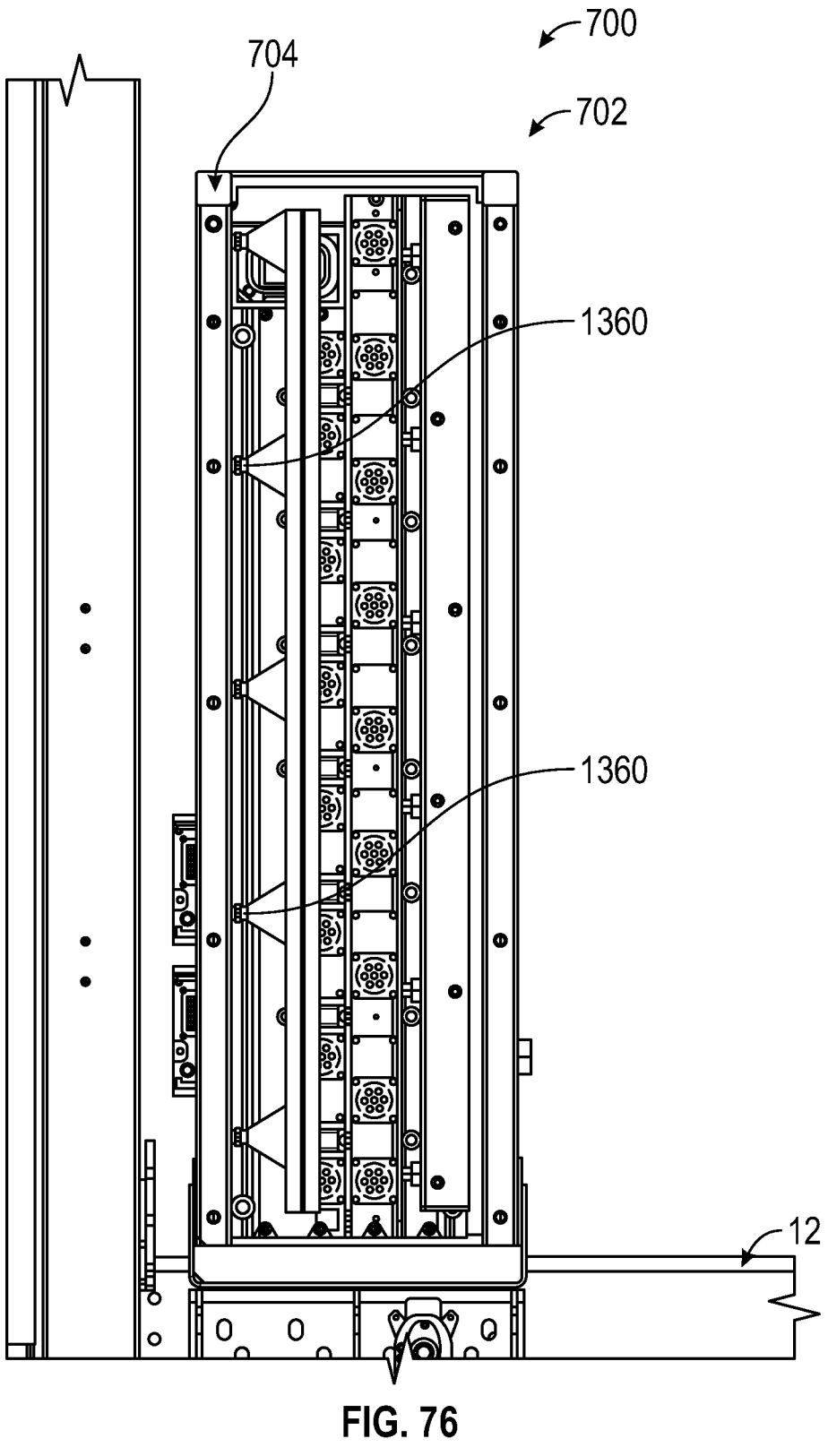
FIG. 76 is a side view of the battery housing of FIG. 75, according to an exemplary embodiment.

In some embodiments, the secondary cooling conduit 1352 may include a plurality nozzles 1360 arranged within the housing 702 (e.g., the global housing 1602) and/or the battery housing 1254, as shown in FIGS. 75 and 76. For example, the nozzles 1360 may be arranged laterally (see, e.g., FIG. 75) and vertically (see, e.g., FIG. 76) within the housing 702. When fluid (e.g., water, coolant, etc.) is provided into the secondary cooling conduit 1352 from the pump 1304, the pump 1319, and/or an external source (e.g., from a source connected to a flood port 1600 as described herein), the fluid may flow from an inlet 1362 connected to the housing 702, through the secondary cooling conduit 1352, which extends through the frame members 704, and out of the nozzles 1360 to provide cooling to the ESS 700 (and the batteries 1250 arranged therein).

External Port

FIGS. 49-56 illustrate exemplary embodiments of a vehicle (e.g., the vehicle 10) that includes an external port 1400 configured to provide fluid access to one or more batteries, packs, and/or cells, and enable selective cooling of the batteries, packs, and/or cells. In general, the external port 1400 is coupled to an external surface, portion, structure, or wall of the vehicle 10 to facilitate access from the exterior of the vehicle 10. For example, the external port 1400 can be coupled to an external surface, portion, structure, or wall of the front cabin 20, the rear section 30, the pump house 602, or another externally-exposed portion of the vehicle 10.

Figures 49, 50:
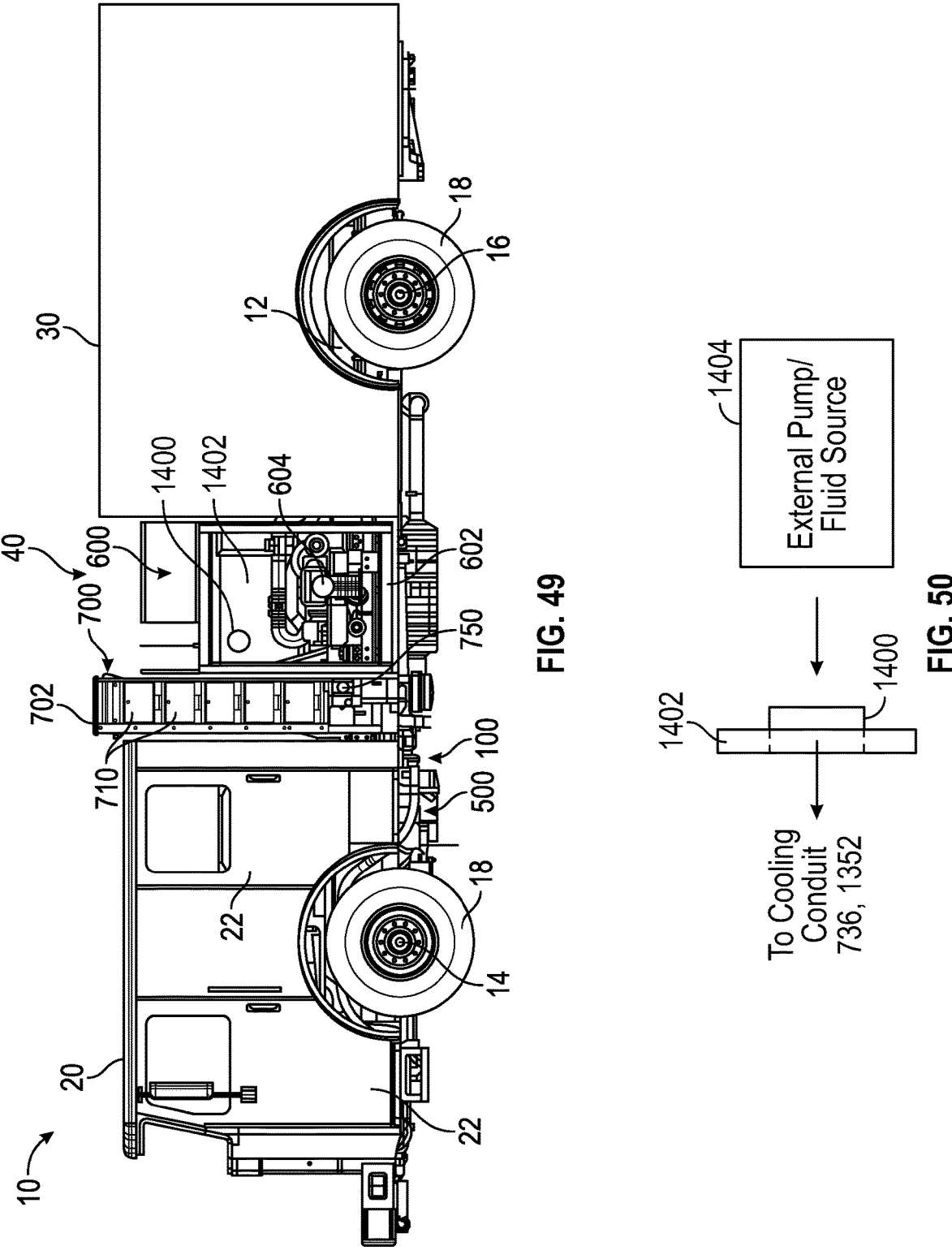
FIG. 49 is a side view of the vehicle of FIG. 1 including an external port, according to an exemplary embodiment.
FIG. 50 is a schematic illustration of a top view of the external port on the vehicle of FIG. 49.

With specific reference to FIGS. 49 and 50, the external port 1400 is coupled to an external surface or wall 1402 of the pump house 602. In the illustrated embodiment, the external port 1400 extends outwardly from the external wall 1402 and protrudes from the external wall 1402. In some embodiments, the external port 1400 is arranged within the external wall 1402 so that a distal end of the external port 1400 is arranged approximately flush with the external wall 1402 (i.e., does not protrude therefrom). Regardless of the specific orientation of the external port 1400, the external port 1400 extends through the external wall 1402 and provides fluid communication to a cooling conduit (see, e.g., FIG. 50). In some embodiments, the external port 1400 is in fluid communication with the cooling conduit(s) 736 in the battery cooling system 1300. That is, the external port 1400 may act as the supply port 1310 in the battery cooling system 1300, with the external port 1400 being configured to receive cooling fluid from the pump 1304 (e.g., a remote pump or fluid source) and supply the cooling fluid to the cooling conduit(s) 736. In some embodiments, the external port 1400 is in fluid communication with the second cooling conduit(s) 1352 in the supplemental cooling system 1350. That is, the external port 1400 may act as the supply port 1310 in the supplemental cooling system 1350, with the external port 1400 being configured to receive cooling fluid from the pump 1304 (e.g., a remote pump or fluid source) and supply the cooling fluid to the second cooling conduit(s) 1352.

With the external port 1400 providing direct access to the cooling conduit(s) 736 or the second cooling conduit(s) 1352, an external pump or fluid source 1404 can be selectively coupled to the external port 1400 to provide cooling to the battery packs 710, the battery housings 1254, and/or the batteries 1250 or the cells 1252 arranged within the battery housings 1254. For example, in some embodiments, an external pump (e.g., a pump arranged remotely from the vehicle 10) is configured to be coupled to the external port 1400. In some embodiments, the external pump is arranged on an adjacent vehicle (e.g., a fire truck). In some embodiments, the external port 1400 is configured to be connected to a fluid source in the form of a fire hydrant that is connected to a hose and coupled to the external port 1400.

During operation, upon detection of a battery thermal event (e.g., via the health sensors 1256), a user is supplied with a notification and instructed to connect the external pump or fluid source 1404 to the external port 1400. Once the external pump or fluid source 1404 is connected to the external port 1400, fluid communication is provided between the external pump or fluid source 1404 and the cooling conduit(s) 736 or the second cooling conduit(s) 1352. Once the cooling fluid is supplied to the cooling conduit(s) 736 or the second cooling conduit(s) 1352, the functionality described herein, for example, using the rupture point 1302 or the release valve 1322, controls cooling of the battery packs 710, the battery housings 1254, and/or the batteries 1250 or the cells 1252 arranged within the battery housings 1254, as described herein. That is, the vehicle 10 can include the components of the battery cooling system 1300 or the supplemental cooling system 1350 that are downstream of the supply port 1310, and the connection to the external port 1400 (e.g., the supply port 1310) enables the external pump or fluid source 1404 to provide cooling fluid to selective battery packs 710, battery housings 1254, and/or batteries 1250 or cells 1252 arranged within the battery housings 1254.

As described herein, in some embodiments, the vehicle 10 includes an aerial ladder assembly with a water turret coupled to a distal or free end thereof. In these embodiments, the water turret can be used as the external fluid source 1404 to couple to and supply cooling fluid to the external port 1400 (of another vehicle 10). For example, the pump 604 may be connected to the water turret to provide pressurized cooling fluid to the water turret. With specific reference to FIG. 51A, the vehicle 10 includes a water turret 1406 arranged on an aerial ladder assembly 1408. In general, the aerial ladder assembly 1408 may include one or more turret actuators or motors 1410 that are configured to move the aerial ladder assembly 1408 and the water turret 1406 arranged thereon to a particular position. In some embodiments, the turret actuators 1410 are in communication with the controller 810 and the controller 810 is configured to control the operation of the turret actuators 1410. In some embodiments, the aerial ladder assembly 1408 includes a dedicated controller on the vehicle 10 that is configured to control the operation of the turret actuators 1410. In some embodiments, the turret actuators 1410 are configured to be manually, remotely, or autonomously controlled to navigate the water turret 1406 proximate to the external port 1400 to enable the water turret 1406 to shoot water at or connect to the external port 1400. For example, in some embodiments, the turret actuators 1410 are configured to couple to a turret nozzle 1412 arranged at a distal end of the water turret 1406 to the external port 1400.

By way of example, during operation, upon detection of a battery thermal event (e.g., via the health sensors 1256), the water turret 1406 may be manually, remotely, or autonomously navigated to the external port 1400 so that the turret nozzle 1412 couples to the external port 1400. With the turret nozzle 1412 coupled to the external port 1400, fluid communication is provided between the water turret 1406 and the cooling conduit(s) 736 or the second cooling conduit (s) 1352. Once the cooling fluid is supplied to the cooling conduit(s) 736 or the second cooling conduit(s) 1352, the functionality described herein, for example, using the rupture point 1302 or the release valve 1322, controls cooling of the battery packs 710, the battery housings 1254, and/or the batteries 1250 or the cells 1252 arranged within the battery housings 1254, as described herein. By way of another, the vehicle 10 may arrive at a scene where another vehicle 10 is experiencing a battery thermal event (e.g., an electric passenger vehicle, an electric semi-tractor, etc.). The water turret 1406 may be manually, remotely, or autonomously navigated to the external port 1400 of the other vehicle 10 to mitigate the battery thermal event.

In some embodiments, the vehicle 10 may be in the form of another type of vehicle (e.g., a mixer truck, a refuse vehicle, a delivery vehicle, passenger vehicle, etc.), with the external port 1400 (or the flood port 1600) arranged thereon. In these embodiments, an adjacent vehicle (e.g., a fire fighting vehicle or fire truck) may couple to the external port 1400 (e.g., using a water turret or a hose) and flood the external port 1400 with a cooling fluid (e.g., water). In some embodiments, the refuse vehicle (e.g., refuse vehicle 1710) includes an on-board agent concentrate distribution system (e.g., on-board agent distribution system 1730) that stores fire fighting agent or concentrate. The on-board agent concentrate distribution system may be disposed within a refuse body and connected to the external port 1400 to facilitate dispersing fire fighting agent or concentrate within the refuse body when water is injected into the external port 1400. By way of example, during a refuse fire within the refuse body, water may be injected into the external port 1400, which will flow to the on-board agent concentrate distribution system and mix with the fire fighting agent or concentrate and then be disbursed throughout the refuse body (e.g., via nozzle, outlets, conduits, etc.) to extinguish the refuse fire.

Figure 51A:
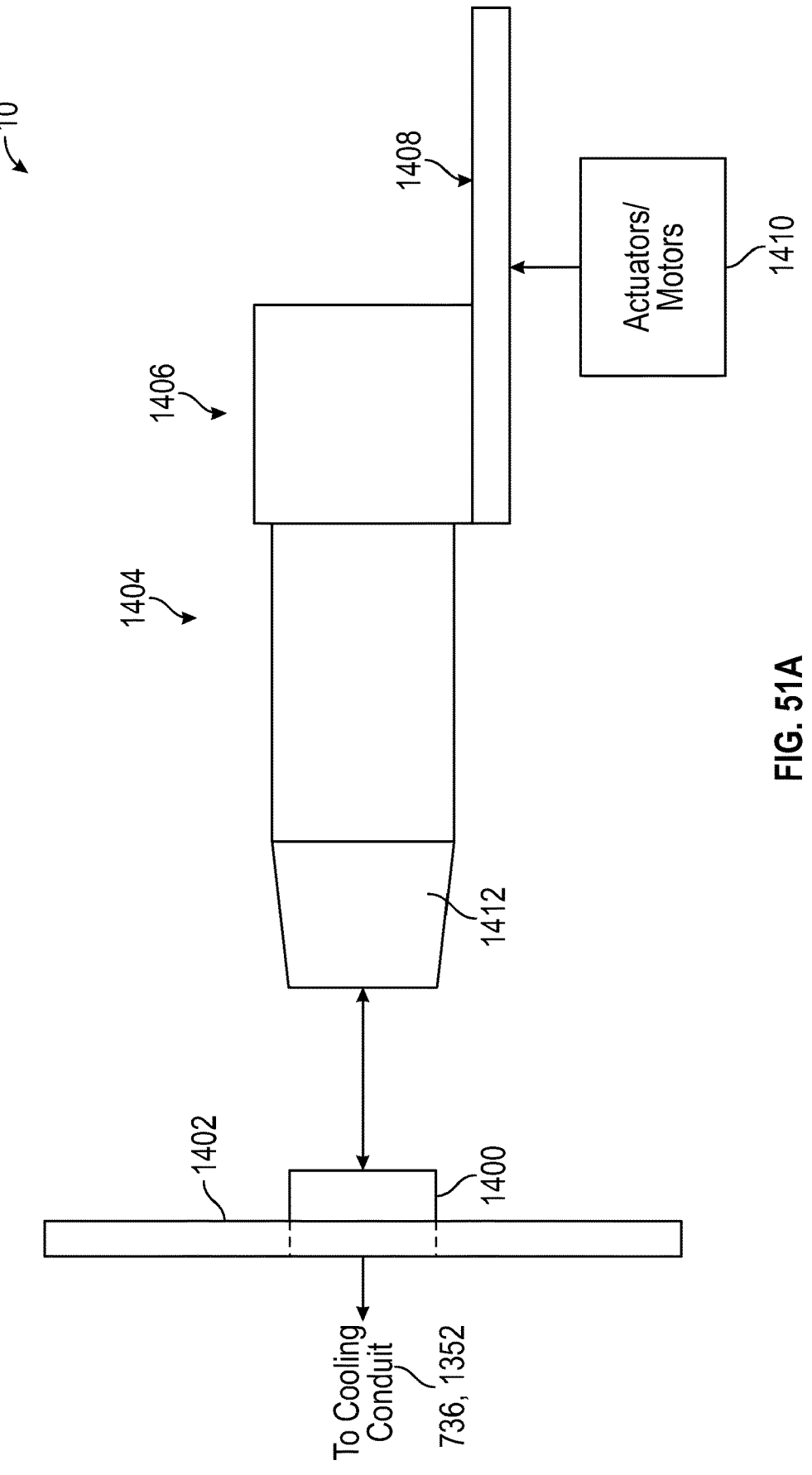
FIG. 51A is a schematic illustration of a water turret arranged proximate to the external port on the vehicle of FIG. 49, according to an exemplary embodiment.
Figure 51B:
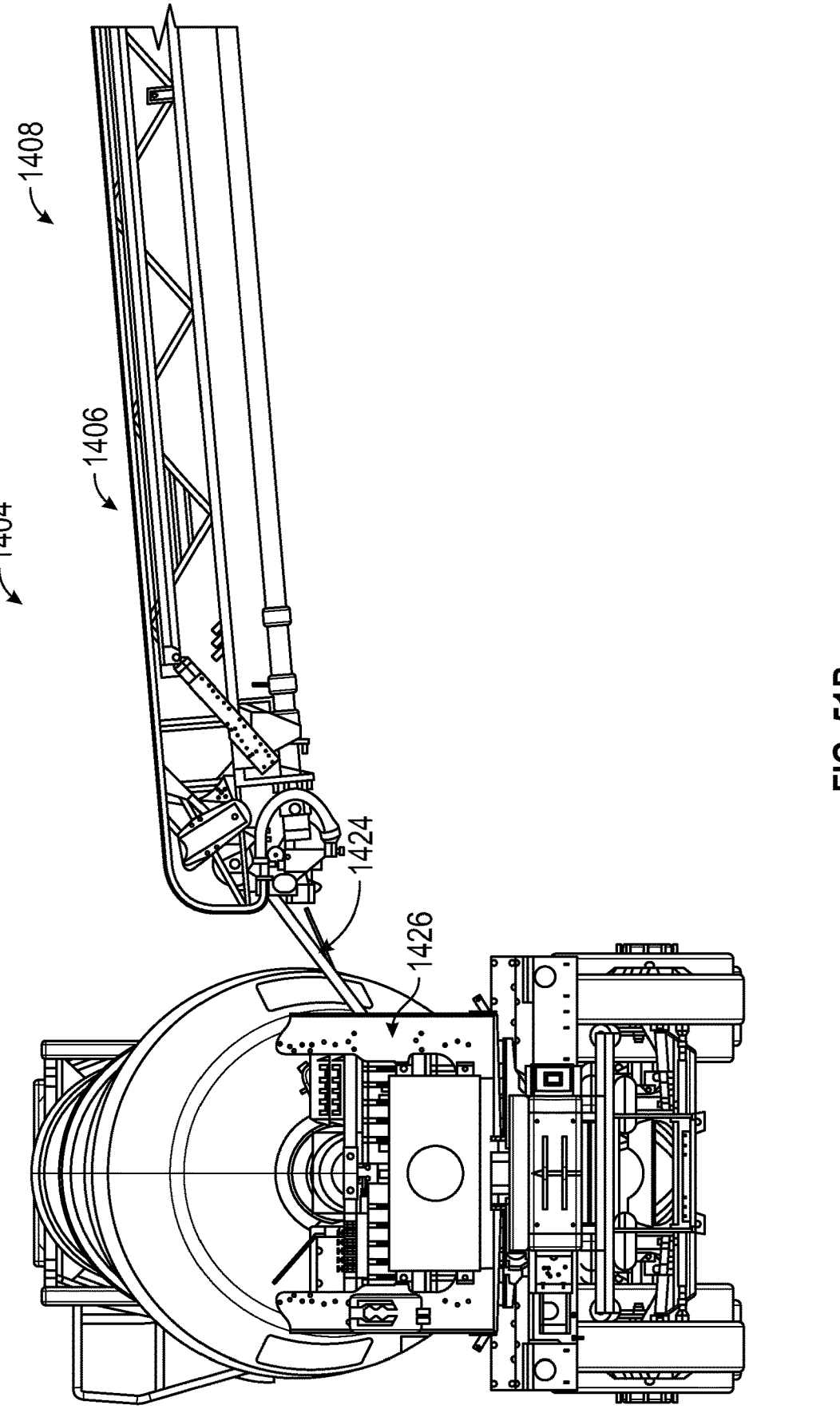
FIG. 51B is a rear view of an aerial ladder assembly with a snozzle penetrating a battery enclosure on a vehicle, according to an exemplary embodiment.

With specific reference to FIG. 51B, in some embodiments, the aerial ladder assembly 1408 includes a snozzle 1424 coupled to a distal end thereof. The snozzle 1424 is designed to penetrate through an external wall of a vehicle (e.g., the vehicle 10, a mixer truck, a refuse vehicle, a delivery vehicle, passenger vehicle, etc.) and into a battery enclosure (e.g., the housing 702, the battery housing 1254, etc.), or couple to a port of the vehicle. In the illustrated embodiment, the snozzle 1424 is penetrating through a battery housing 1426 and the vehicle 10 is in the form of a mixer truck (e.g., mixer truck 1700). In some embodiment, the snozzle 1424 is configured to engage, couple with, or penetrate through the supply port 1310, the external port 1400, or the flood port 1600 described herein. In some embodiments, the snozzle 1424 is configured to penetrate through an external wall of a vehicle at any location and use the pointed nozzle of the snozzle 1424 to penetrate into an internal cavity of the battery enclosure. In some embodiments, the snozzle 1424, or at least a nozzle at the distal end of the snozzle 1424, is formed from a high heat resistant material (e.g., a metal with a melting point above 2000° F.). In some embodiments, the snozzle 1424 is fabricated from a metal material (e.g., tungsten, molybdenum, titanium, chromium, tantalum, iron, steel, nickel, stainless steel, etc.).

Figure 52:
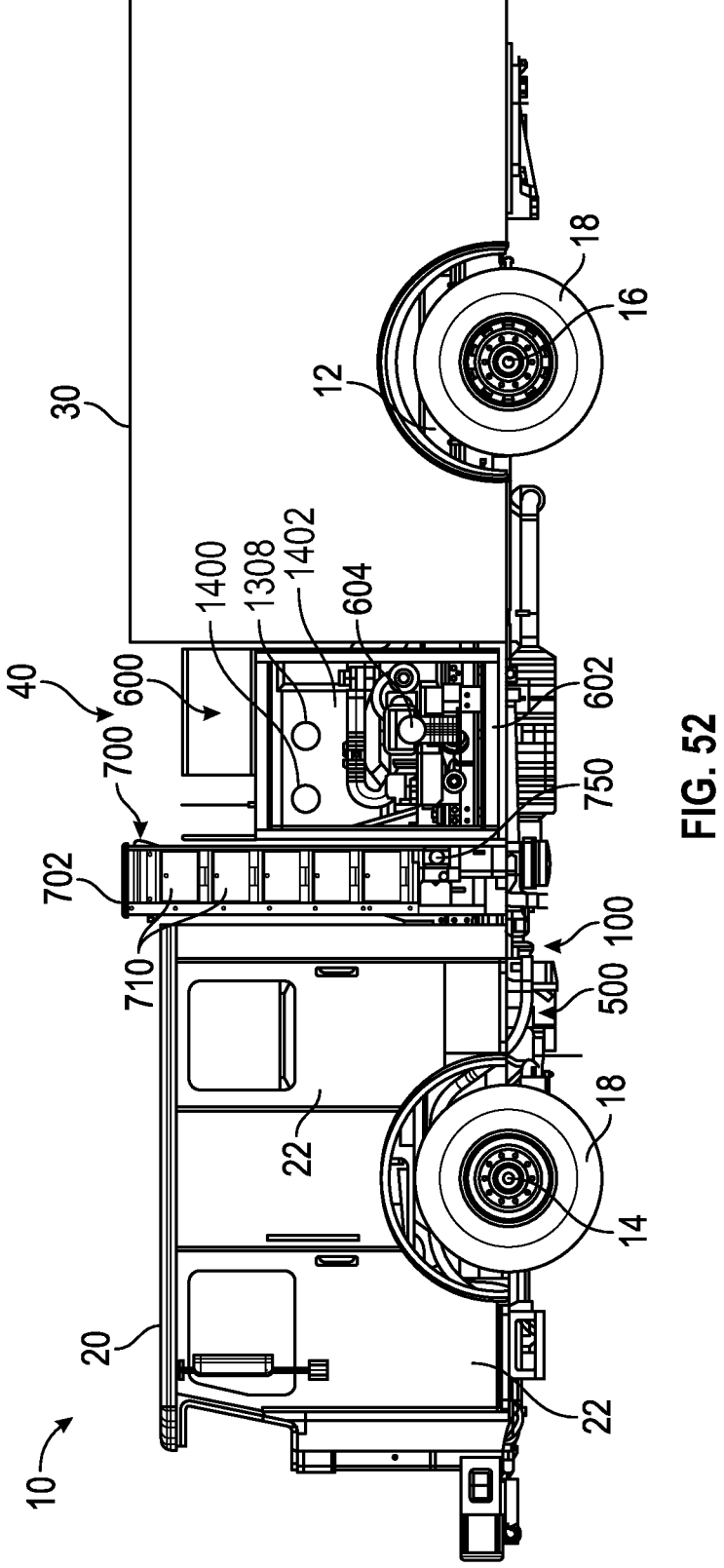
FIG. 52 is a side view of the vehicle of FIG. 1 including an external port and a pump outlet port, according to an exemplary embodiment.

In some embodiments, rather than the external pump or fluid source 1404, the external port 1400 is configured to couple to the pump 604 on board the vehicle 10, or another pump on board the vehicle 10 that is dedicated to battery cooling (e.g., the pump 1304). FIGS. 52 and 53 illustrate an exemplary embodiment of the external port 1400 being coupled to the external surface or wall 1402 of the pump house 602, and the vehicle 10 further including the pump outlet port 1308 mounted on the external wall 1402 adjacent to the external port 1400. In the illustrated embodiment, the pump outlet port 1308 extends outwardly from the external wall 1402 and protrudes from the external wall 1402. In some embodiments, the pump outlet port 1308 is arranged within the external wall 1402 so that a distal end of the pump outlet port 1308 is arranged approximately flush with the external wall 1402 (i.e., does not protrude therefrom). Regardless of the specific orientation of the pump outlet port 1308, the pump outlet port 1308 extends through the external wall 1402 and provides fluid communication to the pump 604 or the pump 1304 (see, e.g., FIG. 53). As described herein, the pump 1304 in the battery cooling system 1300 or the supplemental cooling system 1350 may be the pump 604. Accordingly, the pump outlet port 1308 illustrated in FIGS. 52-56 may act as the pump outlet port 1308 illustrated in FIGS. 37-48, with the pump outlet port 1308 being configured to receive cooling fluid from the pump 604. Similarly, as described above, the external port 1400 may act as the supply port 1310 in the battery cooling system 1300 or the supplemental cooling system 1350. Thus, the selective coupling between the external port 1400 and the pump outlet port 1308 may be controlled by the supply valve 1312 (see, e.g., FIG. 54) or the hose coupling 1314 (see, e.g., FIGS. 55 and 56).

FIG. 54 illustrates an exemplary embodiment of the supply valve 1312 being coupled between the pump outlet port 1308 and the external port 1400 by a supply conduit, line, or hose 1414. In some embodiments, the supply conduit 1414 and the supply valve 1312 are permanently mounted to the external wall 1402 so that a user may manually move the supply valve 1312 between the closed position and the open position (e.g., in response to a notification instructing the user to move the supply valve 1312 that is generated in response to the detection of the onset of a battery thermal event). In some embodiments, the supply conduit 1414 and the supply valve 1312 are arranged internally with in the vehicle 10 (e.g., behind an external surface or wall) and the supply valve 1312 is electrically moved between the closed position and the open position.

Figure 55:
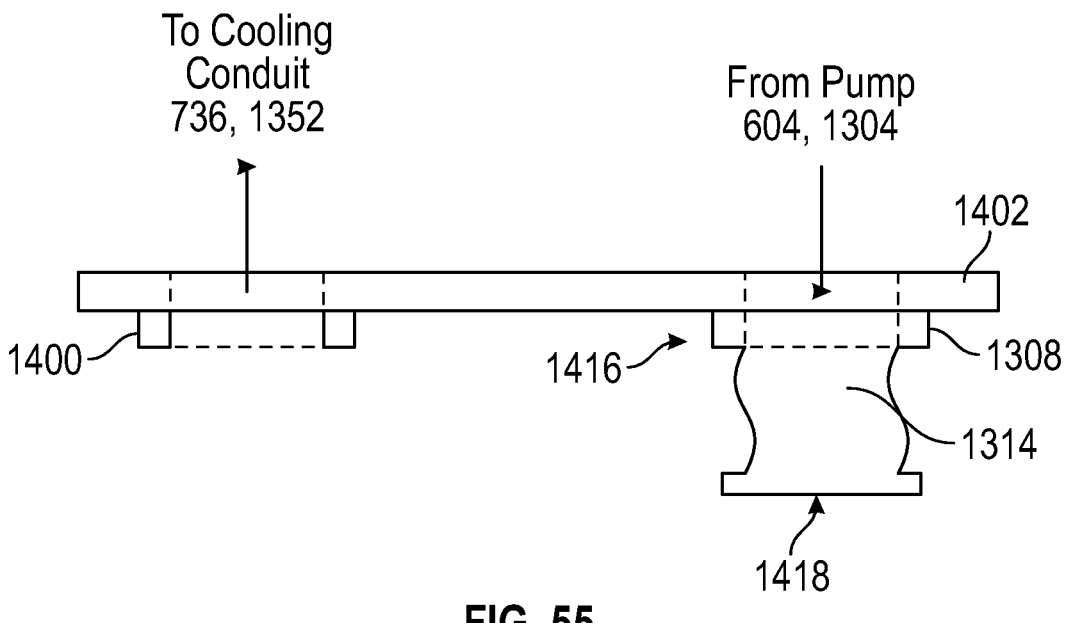
FIG. 55 is a schematic illustration of a hose coupling connected between the external port and the pump outlet port on the vehicle of FIG. 51 with the hose coupling in a disconnected state, according to an exemplary embodiment.
Figure 56:
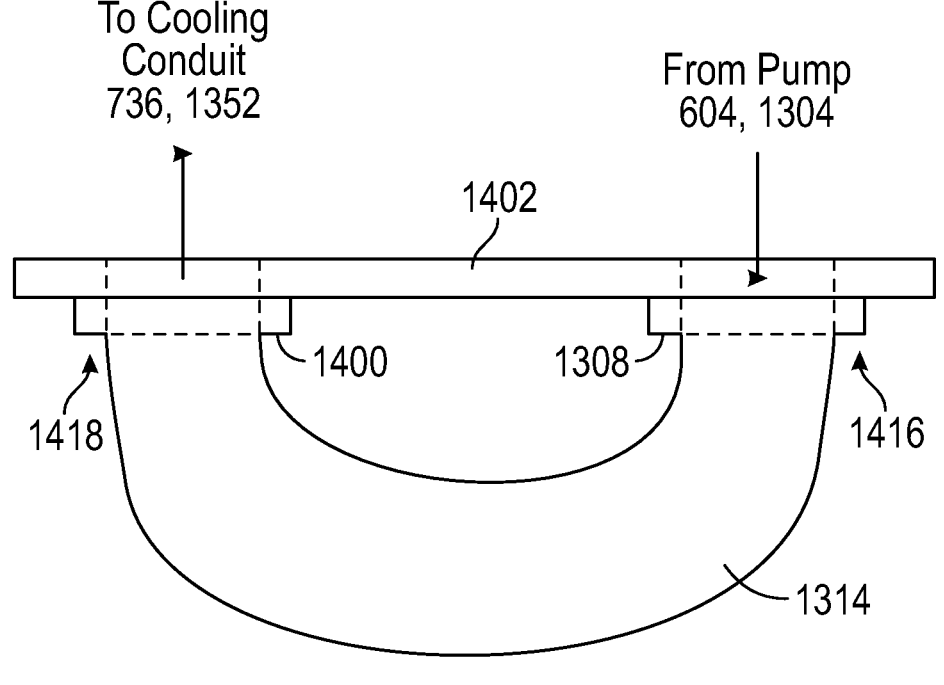
FIG. 56 is a schematic illustration of a hose coupling connected between the external port and the pump outlet port on the vehicle of FIG. 51 with the hose coupling in a connected state, according to an exemplary embodiment.

FIGS. 55 and 56 illustrate an exemplary embodiment of the hose coupling 1314 being coupled between the pump outlet port 1308 and the external port 1400. As described herein, the hose coupling 1314 is manually movable between a disconnected state (see, e.g., FIG. 55) where a first end 1416 of the hose coupling 1314 is connected to the pump outlet port 1308 and a second, opposing end 1418 of the hose coupling 1314 is disconnected from the external port 1400. The second end 1418 of the hose coupling 1314 is configured to inhibit fluid flow through the hose coupling 1314, unless the second end 1418 is connected to a port (e.g., a quick disconnect). As such, upon detection of a battery thermal event, a user is supplied with a notification and instructed to connect the hose coupling 1314 to the external port 1400. Once the second end 1418 of the hose coupling 1314 is connected to the supply port 1310, the hose coupling 1314 is transitioned to a connected state (see, e.g., FIG. 56) where fluid communication is provided between (i) the pump 604 or the pump 1304 and (ii) the cooling conduit(s) 736 or the second cooling conduit(s) 1352.

Battery Cooling Controls

Figure 57:
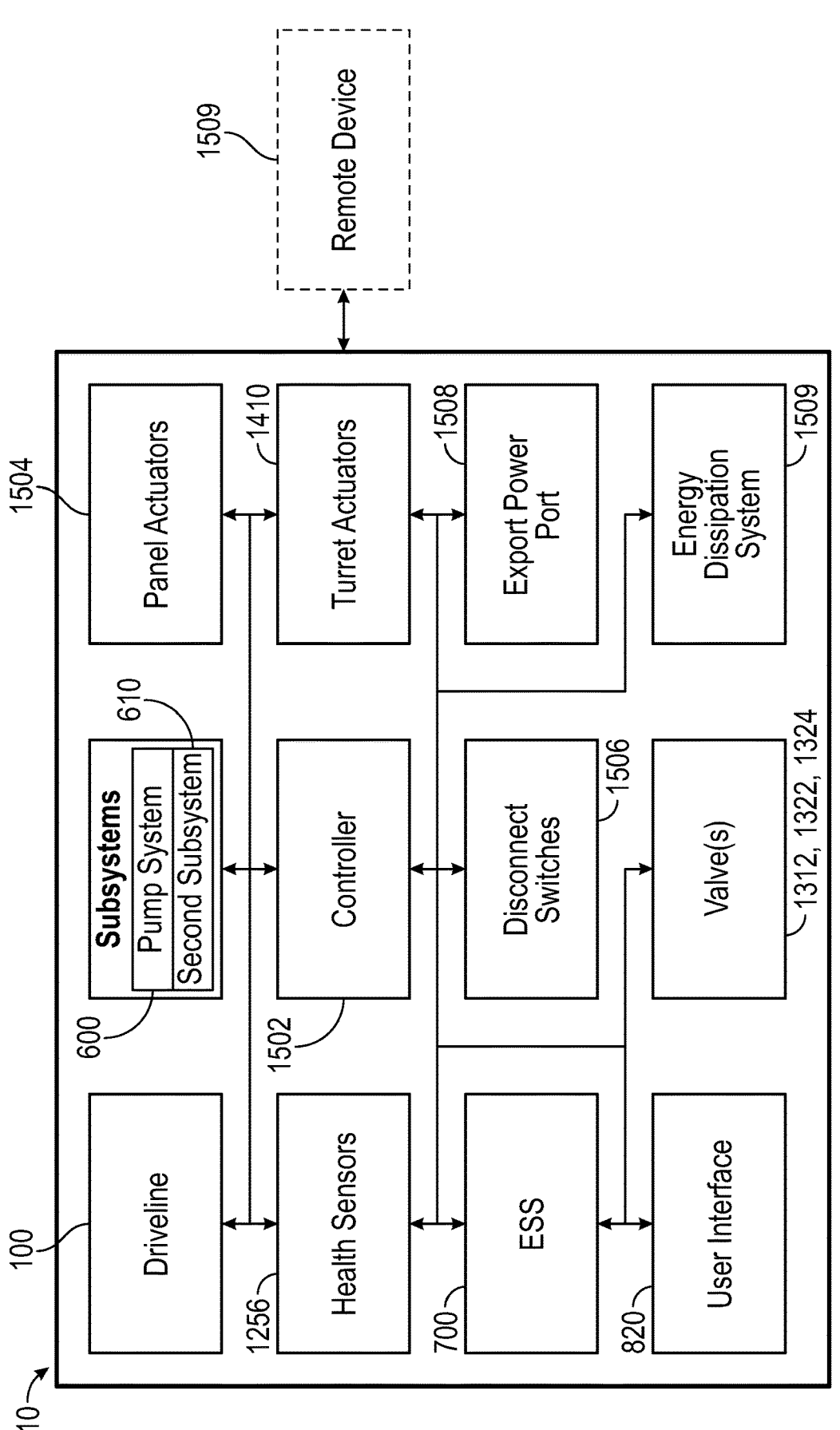
FIG. 57 is a block diagram of a control system for a cooling system of the vehicle of FIG. 1, according to an exemplary embodiment.

FIG. 57 illustrates a control system 1500 that is configured to control operation of the vehicle 10, the battery cooling system 1300, and/or the supplemental cooling system 1350. The control system includes a controller 1502 that is in communication (e.g., wired or wireless) with the driveline 100, the subsystems (the pump system 600 and/or the second subsystem 610), the ESS 700, the user interface 820, the health sensors 1256, one or more valves (e.g., the supply valve 1312, the release valve(s) 1322, the selection valve(s) 1324), the turret actuators 1410, one or more panel actuators 1504, one or more disconnect switches 1506, and an export power port 1508. In some embodiments, a remote device 1509 is in communication with the vehicle 10 (e.g., with the controller 1502). In some embodiments, the remote device 1509 is in the form of a tablet, a cellular device, a smartphone, a laptop, a computer, a display, a personal digital assistant (PDA), or an equivalent device.

In some embodiments, the controller 1502 is the native vehicle controller on the vehicle 10 (e.g., the controller 1502 is the same as the controller 810). In some embodiments, the controller 1502 is a dedicated controller on the vehicle 10 that is provided in addition to the controller 810. In some embodiments, the controller 1502 is integrated into a battery management system that is configured to monitor a health of the battery packs 710, and also configured to communicate with the vehicle controller 810. In some embodiments, the controller 1502 includes two or more controllers (e.g., the controller 810 and another controller in communication with the controller 810).

Figure 58:
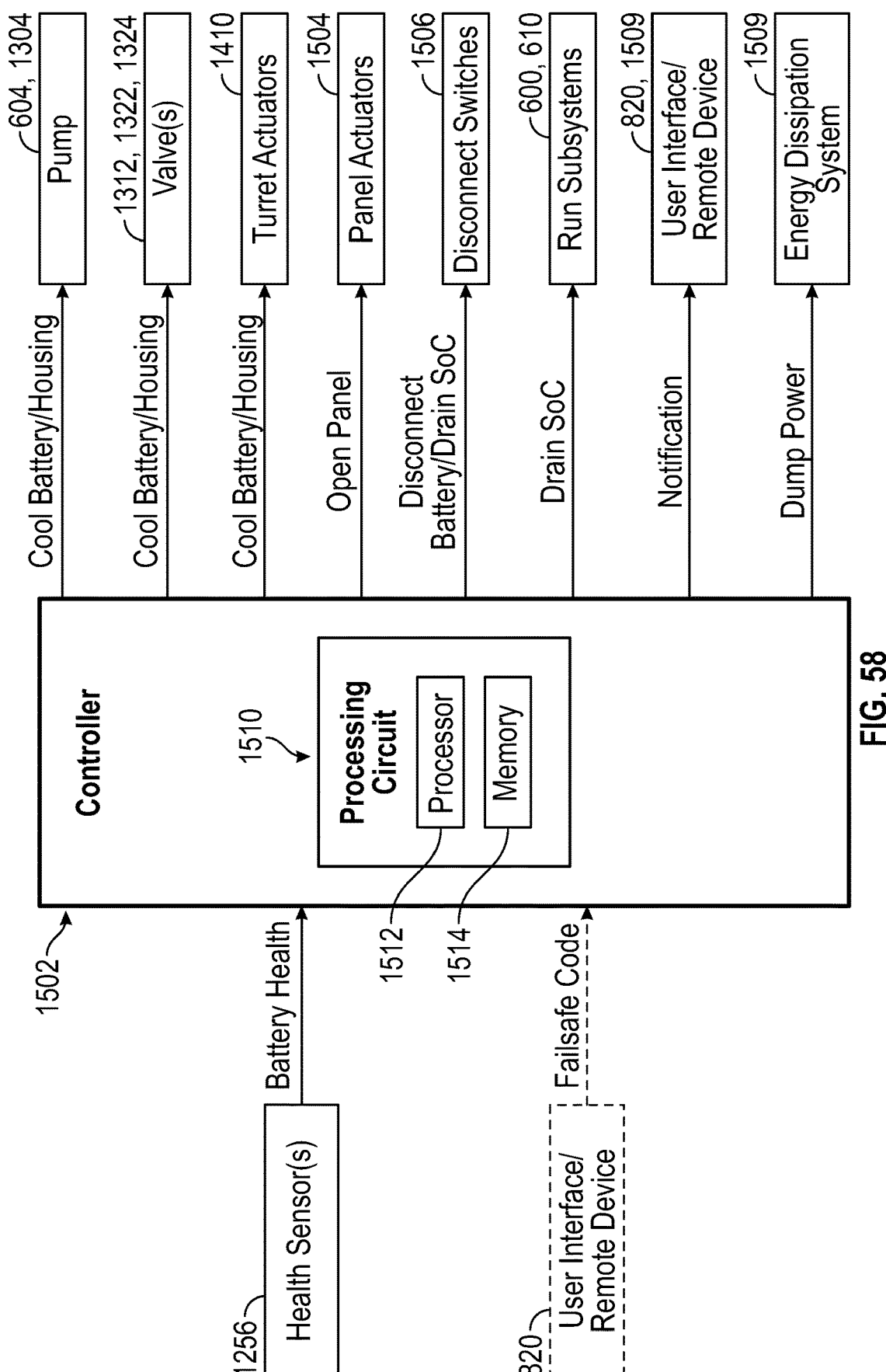
FIG. 58 is a block diagram of a controller of the control system of FIG. 57, according to an exemplary embodiment.

Turing to FIG. 58, the controller 1502 includes a processing circuit 1510 having a processor 1512 and memory 1514. The processing circuit 1510 can be communicably connected to a communications interface such that the processing circuit 1510 and the various components thereof can send and receive data via the communications interface. The processor 1512 can be implemented as a general purpose processor, an application specific integrated circuit ("ASIC"), one or more field programmable gate arrays ("FPGAs"), a group of processing components, or other suitable electronic processing components.

The memory 1514 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. The memory 1514 can be or include volatile memory or non-volatile memory. The memory 1514 can include database components, object code components, script components, or any other type of information structure for supporting the various activities and information structures described in the present application. According to some embodiments, the memory 1514 is communicably connected to the processor 1512 via the processing circuit 1510 and includes computer code for executing (e.g., by the processing circuit 1510 and/or the processor 1512) one or more processes described herein.

Pump and Valve Control

With reference to FIGS. 37-48, 57, and 58, in some embodiments, the controller 1502 is in communication with the pump 604 (or the pump 1304) and the supply valve 1312 (e.g., in its electronically-movable form). During operation, the controller 1502 is configured to detect the onset of a battery thermal event in one or more battery packs 710, batteries 1250, and/or cells 1252 (e.g., via input data from the health sensors 1256). In response, the controller 1502 is configured to instruct the pump 604 to supply cooling fluid to the supply valve 1312 and instruct the supply valve 1312 to move from the closed position to the open position, which provides the cooling fluid into the cooling conduit 736 or the second cooling conduit 1352. The rupture point 1302 or the release valve 1322 enable the cooling fluid to flow into or around the battery housing 1254 to cool the battery housing 1254, the battery 1250 or batteries 1250 within the battery housing 1254, and/or the cells 1252 arranged within battery housing 1254.

In some embodiments, the controller 1502 is in communication with the pump 604 or the pump 1304, the supply valve 1312, and the release valve 1322. During operation, the controller 1502 is configured to detect the onset of a battery thermal event in one or more battery packs 710, batteries 1250, and/or cells 1252 (e.g., via input data from the health sensors 1256). In response, the controller 1502 is configured to instruct the pump 604 or the pump 1304 to supply cooling fluid to the supply valve 1312, and instruct the supply valve 1312 to move from the closed position to the open position, which provides the cooling fluid into the cooling conduit 736 or the second cooling conduit 1352. In addition, the controller 1502 is configured to instruct the release valve 1322 to move from the closed position to the open position to provide the cooling fluid into or around the battery housing 1254 to cool the battery housing 1254, and/or the battery, or batteries, 1250 or cell 1252 arranged within the battery housing 1254.

In some embodiments, the controller 1502 is in communication with the pump 604 or the pump 1304, the supply valve 1312, and the selection valves 1324. During operation, the controller 1502 is configured to detect the onset of a battery thermal event in one or more battery packs 710, batteries 1250, and/or cells 1252 (e.g., via input data from the health sensors 1256). For example, the controller 1502 may detect the onset of a battery thermal event in the first battery pack 710a, the first battery 1250a, or the first cell 1252a. In response, the controller 1502 is configured to instruct the pump 604 or the pump 1304 to supply cooling fluid to the supply valve 1312, and instruct the supply valve 1312 to move from the closed position to the open position, which provides the cooling fluid into the cooling conduit(s) 736 and/or the second cooling conduit(s) 1352. In addition, the controller 1502 is configured to instruct the first selection valve 1324a to move from the closed position to the open position to provide the cooling fluid to the rupture point 1302 or the release valve 1322. The rupture point 1302 or the release valve 1322 enable the cooling fluid to flow into or around the battery housing 1254 to cool the battery housing 1254, the battery 1250 or batteries 1250 arranged within the battery housing 1254, or the cells 1252 arranged within the battery housing 1254.

In some embodiments, the controller 1502 is in communication with the pump 604 or the pump 1304, the supply valve 1312, the selection valves 1324, and the release valves 1322. During operation, the controller 1502 is configured to detect the onset of a battery thermal event in one or more battery packs 710, batteries 1250, and/or cells 1252 (e.g., via input data from the health sensors 1256). For example, the controller 1502 may detect the onset of a battery thermal event in the first battery pack 710a, the first battery 1250a, or the first cell 1252a. In response, the controller 1502 is configured to instruct the pump 604 or the pump 1304 to supply cooling fluid to the supply valve 1312, and instruct the supply valve 1312 to move from the closed position to the open position, which provides the cooling fluid into the cooling conduit(s) 736 and/or the second cooling conduit(s) 1352. In addition, the controller 1502 is configured to instruct the first selection valve 1324a to move from the closed position to the open position to provide the cooling fluid to the first release valve 1322a. Further, the controller 1502 is configured to instruct the release valve 1322a to move from the closed position to the open position to provide the cooling fluid into or around the battery housing 1254 to cool the battery housing 1254, the battery 1250 or batteries 1250 arranged within the battery housing 1254, or the cells 1252 arranged within the battery housing 1254.

Turret Actuators

With reference to FIGS. 49-51, 57, and 58, in some embodiments, the controller 1502 is in communication with the pump 604 and the turret actuators 1410, and the controller 1502 is configured to selective instruct the turret actuators 1410 to move the water turret 1406 in response to the controller 1502 detecting the onset of a battery thermal event or detecting another vehicle on scene that is experiencing a thermal event. By way of example, during operation, the controller 1502 may be configured to detect the onset of a battery thermal event in one or more battery packs 710, batteries 1250, and/or cells 1252 (e.g., via input data from the health sensors 1256) on-board the vehicle 10. By way of another example, the vehicle 10 may be driven to a scene where another vehicle 10 is experiencing a thermal event. In response to the detection of the thermal event or in response to being commanded to engage the external port 1400, the controller 1502 may be configured to instruct the turret actuators 1410 to reposition the water turret 1406 proximate to the external port 1400 of the vehicle 10 or of the other vehicle 10 (e.g., so that the water turret 1406 is arranged to shoot cooling fluid into the external port 1400). In some embodiments, the controller 1502 is configured to instruct the turret actuators 1410 to couple the turret nozzle 1412 to the external port 1400 of the vehicle 10 or of the other vehicle 10. Once the water turret 1406 is arranged proximate or coupled to the external port 1400, the controller 1502 is configured to instruct the pump 604 to supply cooling fluid to the external port 1400, which provides cooling fluid into the cooling conduit 736 or the second cooling conduit 1352 and cools the battery housing 1254, the battery or batteries 1250 arranged within the battery housing 1254, and/or the cells 1252 arranged within the battery housing 1254 of the vehicle 10 or of the other vehicle 10, as described herein.

Panel Actuators

With reference to FIGS. 57-59D, in some embodiments, each of the battery housings 1254 of the battery packs 710 includes a panel actuator 1504. In general, each of the battery housings 1254 includes a plurality of sides or panels 1520 that form an enclosure around the battery 1250, or batteries 1250, arranged therein. At least one of the panels 1520 on each of the battery housings 1254 can be a repositionable (e.g., slidable, retractable, pivotable, etc.), shown as actuating panel 1522, that is pivotally coupled to an adjacent panel 1520 so that the actuating panel 1522 is movable between a first, closed position and a second, open position. In the closed position, the battery housing 1254 forms a sealed enclosure around the battery 1250, or batteries 1250, arranged therein. In the open position, the actuating panel 1522 is rotated or otherwise repositioned/moved related to the adjacent panels 1520 so that the battery housing 1254 defines an opening. The panel actuators 1504 of each of the battery housings 1254 are coupled to the actuating panel 1522 and configured to move the actuating panel 1522 between the closed position and the open position (see, e.g., FIG. 59A). In some embodiments, the panel actuator 1504 may be integrated into the housing 702 and the panel actuator 1504 is configured to actuate (e.g., slidably, retractably, pivotally, etc.) an outer panel of the housing 702.

In some embodiments, during operation, the controller 1502 is configured to detect the onset of a battery thermal event in one or more battery packs 710, batteries 1250, and/or cells 1252 (e.g., via input data from the health sensors 1256). In response, the controller 1502 is configured to instruct the panel actuator 1504 to move the actuating panel 1522 from the closed position to the open position, which enables a cooling fluid to be deluged into the battery housing 1254 (e.g., via the rupture point 1302, via the release valve 1322, a user manually introducing cooling fluid into the battery housing 1254 via a water hand line, via the water turret 1406, the snozzle 1424, etc.).

Figure 59A:
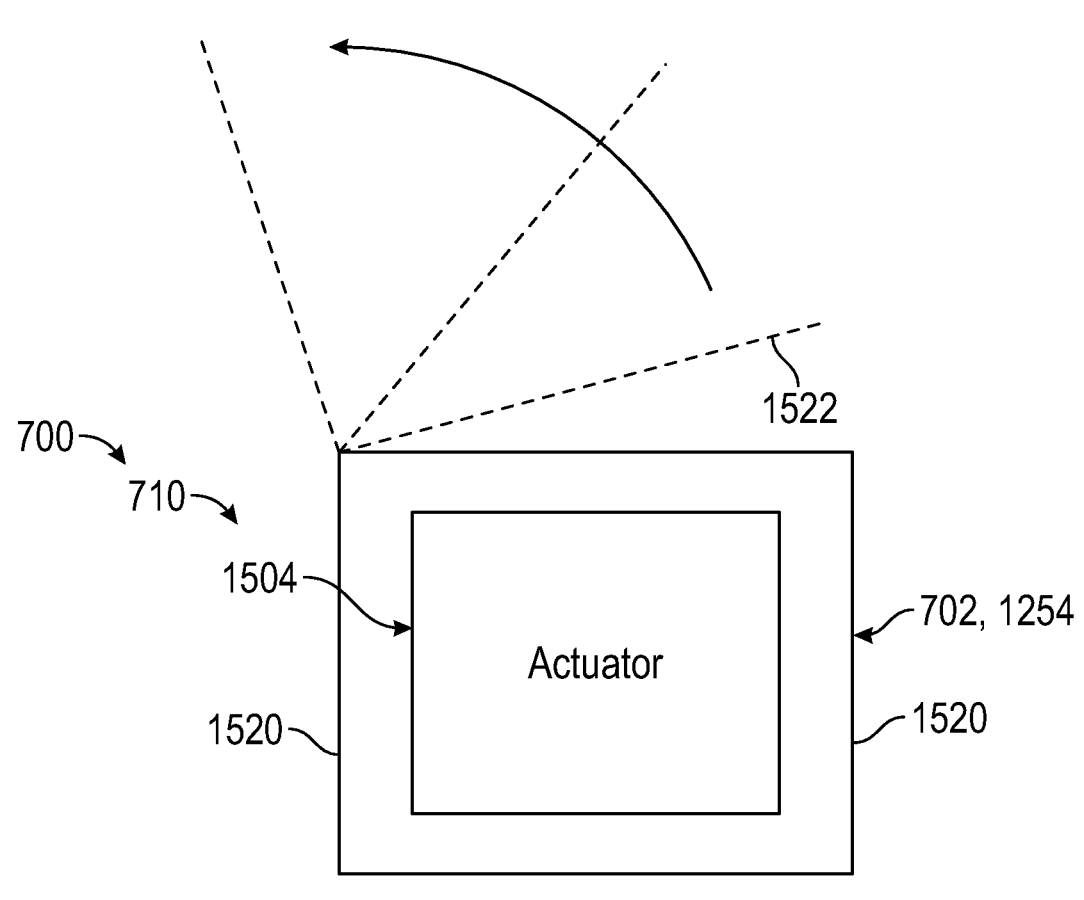
FIG. 59A is schematic illustration of a battery housing with an actuating outer panel, according to an exemplary embodiment.
Figure 59B:
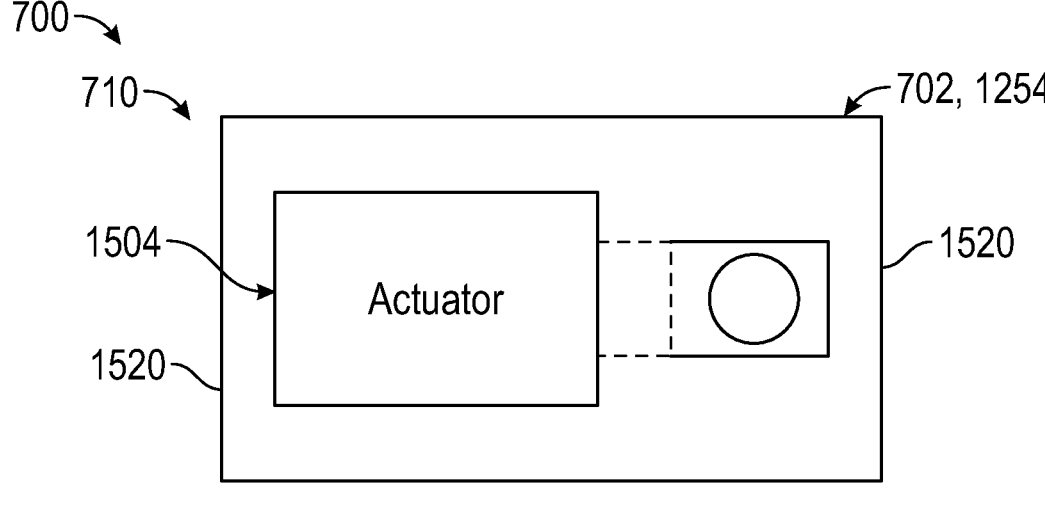
FIG. 59B is schematic illustration of a battery housing with an actuating panel, according to an exemplary embodiment.

In some embodiments, the panel actuator 1504 may be configured to selectively open and close a port 1505 (e.g., the external port 1400, the flood port 1600, or another port) in the housing 702 or the battery housing 1254, as shown in FIG. 59B. For example, the panel actuator 1504 may be coupled to another panel that is arranged externally to or internally to the housing 702 or the battery housing 1254, and the actuator 1504 may extend and retract the panel to close and open the port 1505, respectively. In some embodiments, a piston or rod of the actuator 1504 itself may open and close the port 1505 via actuation of the piston or rod. In any case, the actuator 1504 may be selectively actuated by the controller 1502 to move between a first position where the port 1505 is blocked where fluid is prevented from entering the housing 702 or the battery housing 1254 through the port 1505 and a second position where the port 1505 is open where fluid is allowed to flow into the housing 702 or the battery housing 1254.

Figure 59C:
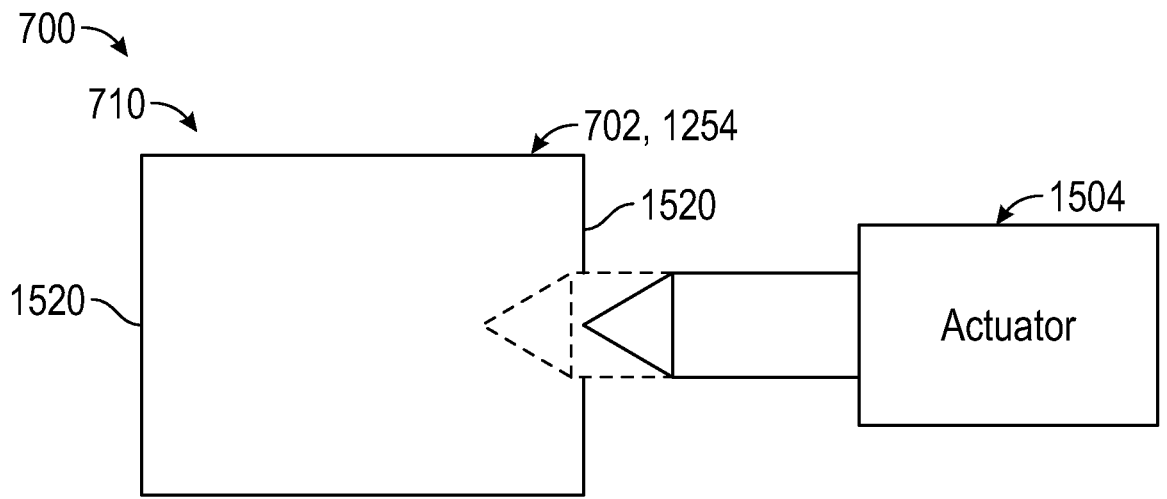
FIG. 59C is schematic illustration of a battery housing with a puncture actuator, according to an exemplary embodiment.

In some embodiments, the panel actuator 1504 may be arranged externally from the housing 702 or the battery housing 1254, as shown in FIG. 59C. For example, the panel actuator 1504 may be supported on the chassis or frame 12. In some embodiments, panel actuator 1504 may be coupled to a linkage or support arm, where the linkage extends between the housing 702 and the panel actuator 1504. A piston or rod of the actuator 1504 may include a pointed or sharpened distal end that is directed toward an outer panel of the housing 702 or the battery housing 1254. The panel actuator 1504 may be selectively actuated, in response to detecting a thermal event, and extend from a retracted position to an extended position, and then back to a retracted position. The sharpened distal end of the panel actuator 1504 may form a hole or port in the housing 702 or battery housing 1254 after the panel actuator 1504 extends through the housing 702 or the battery housing 1254. The port provides access to an internal cavity of the housing 702 and/or the battery housing 1254 and fluid may be provided into the internal cavity through the port formed by the panel actuator 1504.

Figure 59D:
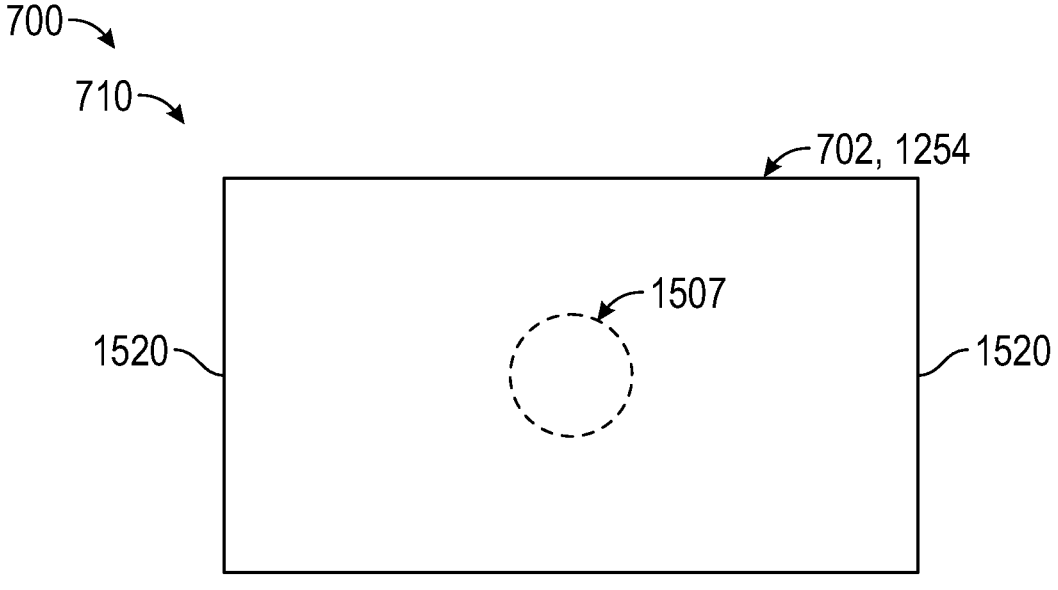
FIG. 59D is schematic illustration of a battery housing with a panel defining a preselected puncture point, according to an exemplary embodiment.

In some embodiments, as shown in FIG. 59D, the housing 702 or the battery housing 1254 may include a portion 1507 that is structurally weakened (e.g., perforated, reduced in thickness, made of a less dense material, etc.) and identified, predefined, or pre-selected as a location that the housing 702 or battery housing 1254 is to be breached and flooded with fluid (e.g., using the water turret 1406, the snozzle 1424, the javelin connector 1620, the nozzle connector 1630, or another device capable of penetrating through the portion 1507) in response to detecting a thermal event. In some embodiments, the portion 1507 defines a circular shape. In some embodiments, the portion 1507 may define a rectangular shape, a triangular shape, a round shape, or another shape.

Disconnect Switches

Figure 60:
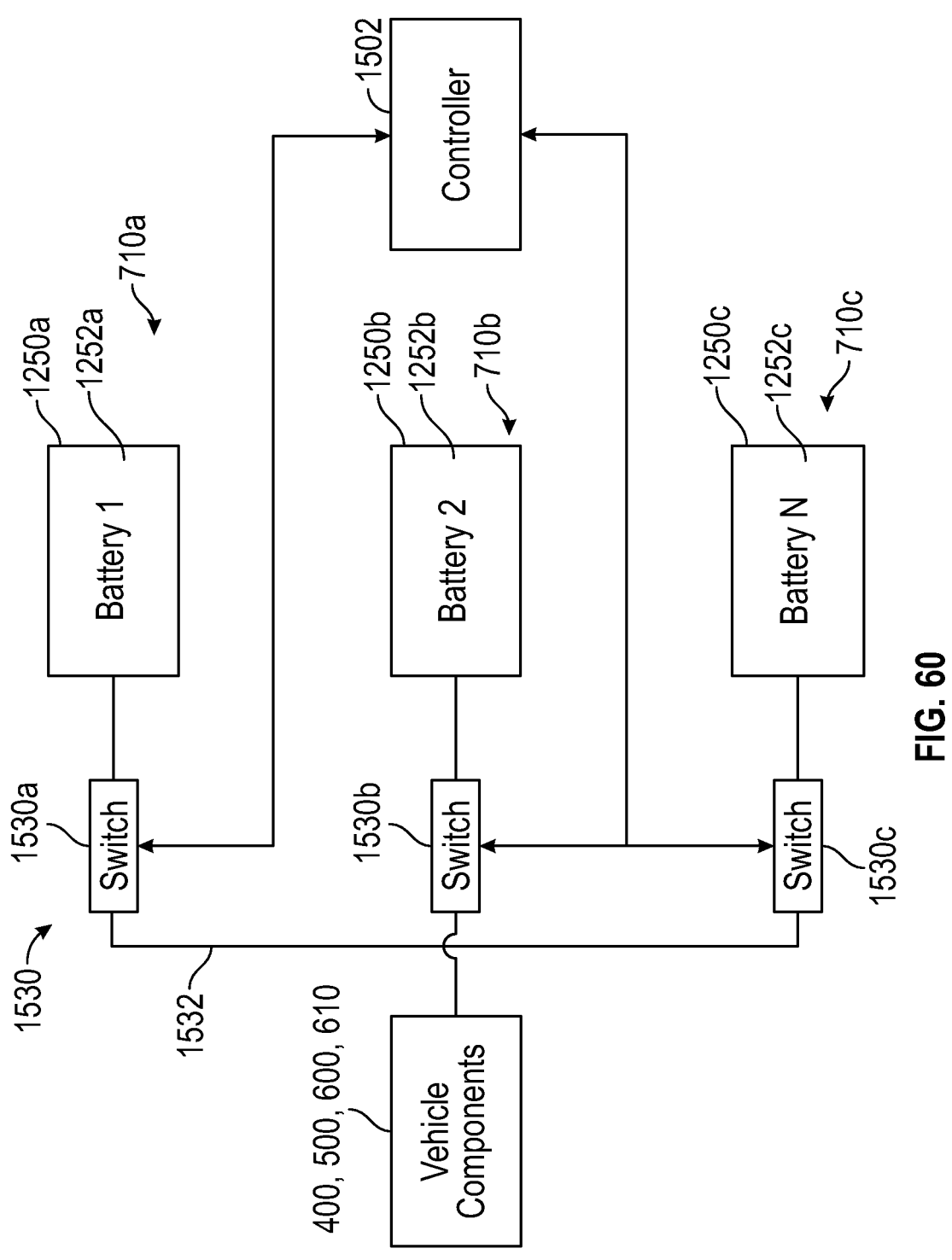
FIG. 60 is a schematic illustration of a disconnect switch connected to a battery, according to an exemplary embodiment.
Figure 61:
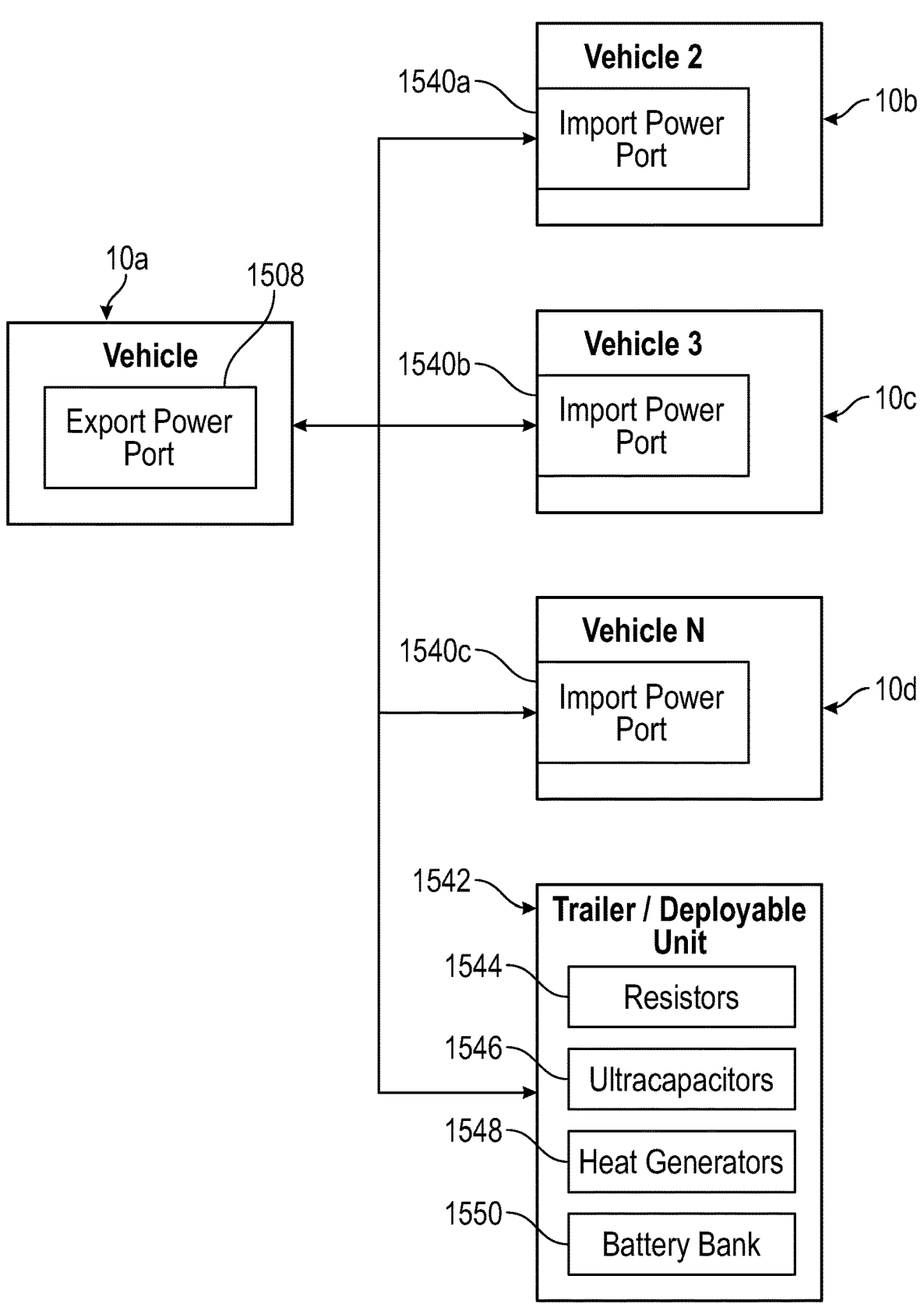
FIG. 61 is a schematic illustration of an export power port on a vehicle being connected to one or more adjacent vehicles, according to an exemplary embodiment.
Figure 64:
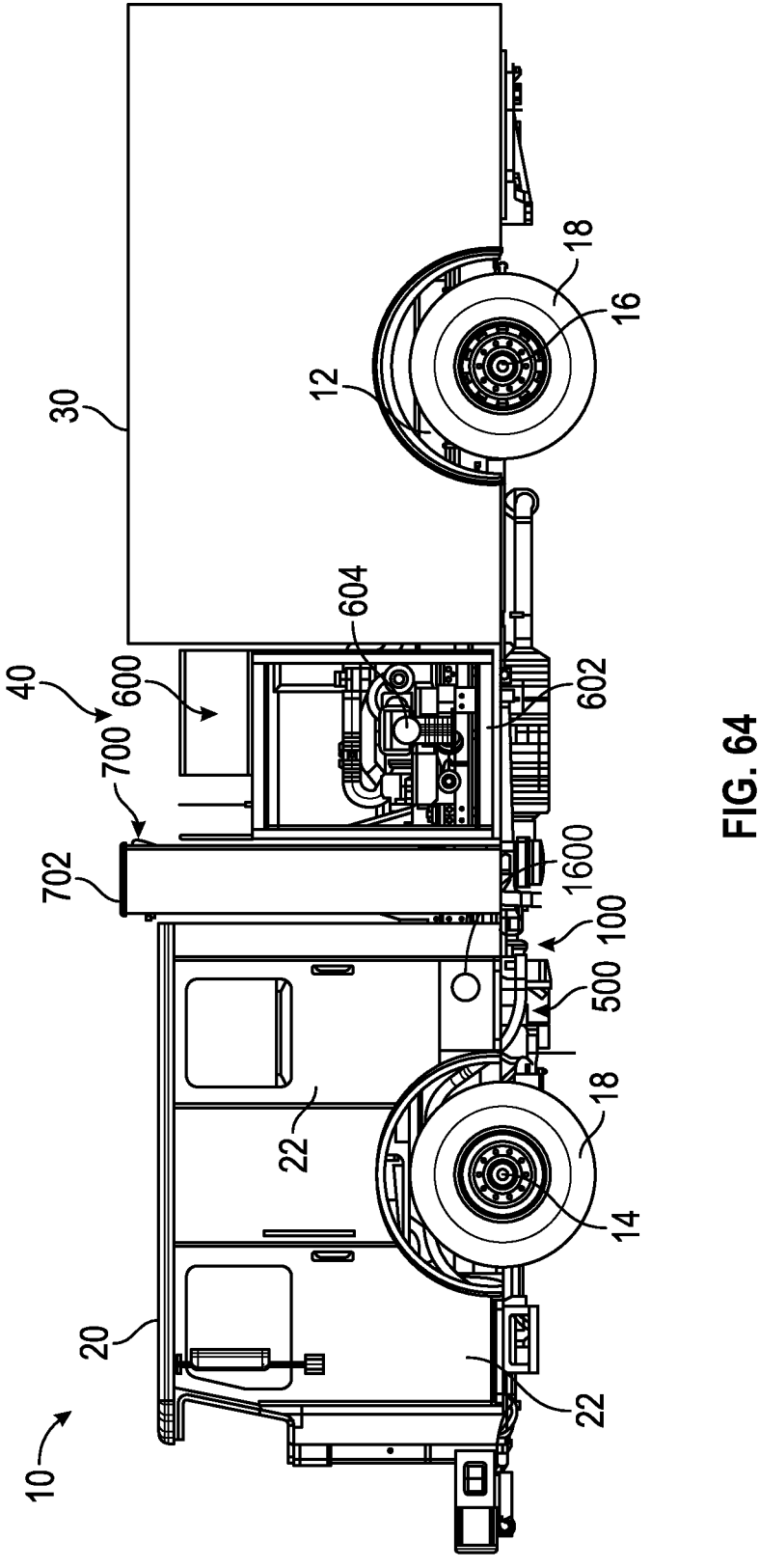
FIG. 64 is a side view of the vehicle of FIG. 1 including a flood port arranged on a front cabin, according to an exemplary embodiment.
Figure 65:
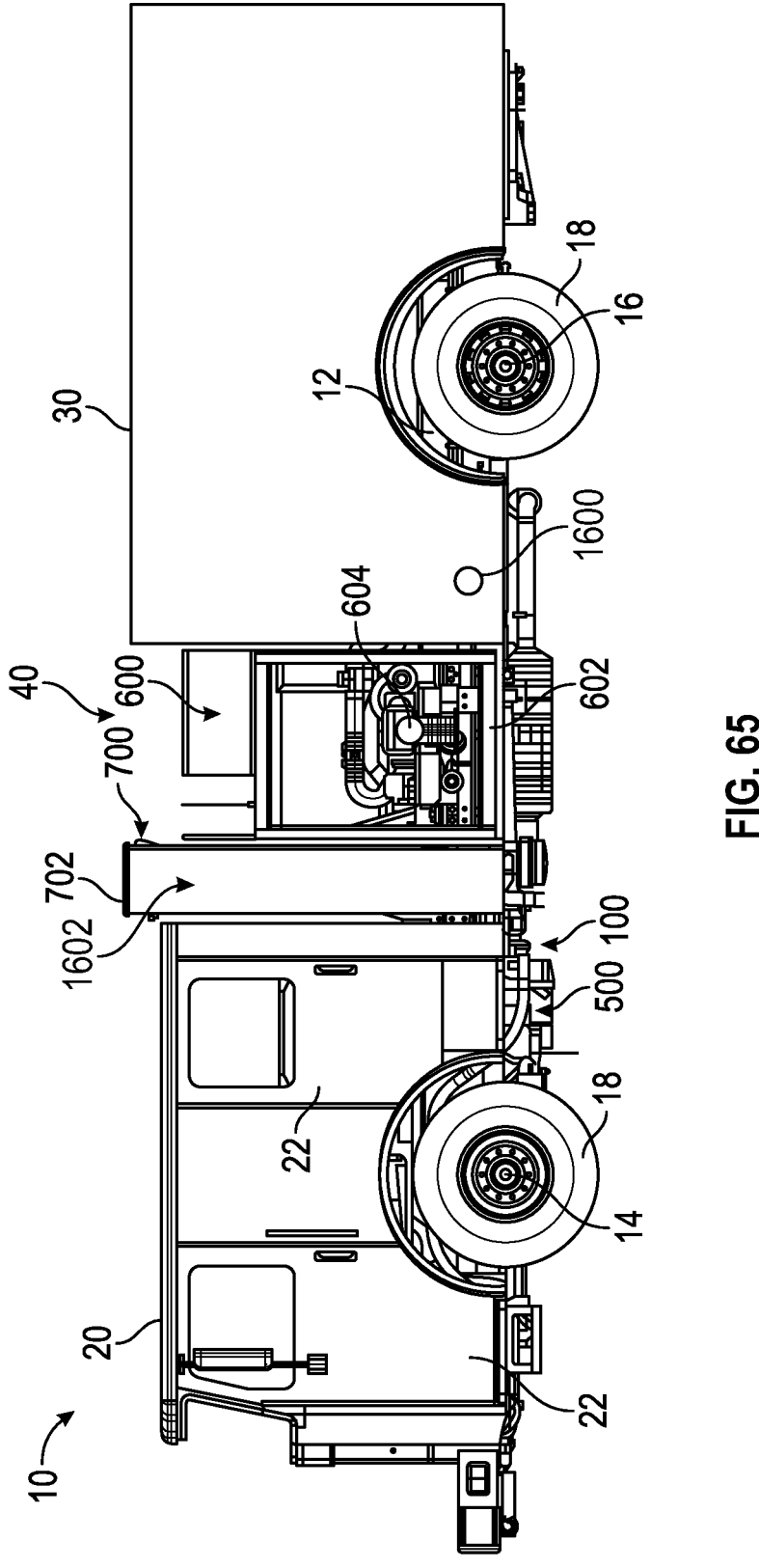
FIG. 65 is a side view of the vehicle of FIG. 1 including a flood port arranged on a rear section, according to an exemplary embodiment.

With reference to FIGS. 57, 58, and 60, in some embodiments, the vehicle 10 includes a disconnect switch 1530 electrically connected between each battery pack 710, or between each battery 1250 arranged within each of the battery packs 710. In general, the disconnect switches 1530 are configured to selectively disconnect one or more of the batteries 1250 to either electrically disable a battery experiencing the onset of a battery thermal event, or to drain a charge, or a SoC, of a battery experiencing the onset of a battery thermal event. For example, the vehicle 10 can include a first disconnect switch 1530a connected to a first battery 1250a, a second disconnect switch 1530b connected to a second battery 1250b, and an nth disconnect switch 1530c connected to an nth battery 1250c (see, e.g., FIG. 60). In general, each of the disconnect switches 1530 is configured to either electrically connect or electrically disconnect one of the batteries 1250 from a power bus 1532, which is used to connect the ESS 700 to the various components on the vehicle 10 that receive power from the ESS 700 (e.g., the driveline 100 (e.g., the TAD 400, the ETD 500, the pump system 600, the second subsystem 610), and/or accessories, etc.).

The controller 1502 is in communication with each of the disconnect switches 1530 and configured to selectively transition each of the disconnect switches 1530 between an electrically connected state where the battery 1250 connected to the disconnect switch 1530 is electrically connected to the power bus 1532 and an electrically disconnected state where the battery 1250 is electrically disconnected from the power bus 1532. In some embodiments, during operation, the controller 1502 is configured to detect the onset of a battery thermal event in one or more battery packs 710, batteries 1250, and/or cells 1252 (e.g., via input data from the health sensors 1256). For example, the controller 1502 may detect the onset of a battery thermal event in the first battery pack 710a, the first battery 1250a, or the first cell 1252a. In some embodiments, in response, the controller 1502 is configured to instruct the first disconnect switch 1530a to transition from the electrically connected state to the electrically disconnected state, which electrically disconnects the first battery 1250a from the power bus 1532 and maintains operation of the second battery 1250b and the nth battery 1250c. In some embodiments, selective cooling can be applied to the first battery 1250a according to any of the cooling systems and methods described herein.

In some embodiments, in response to the controller 1502 detecting the onset of a battery thermal event in the first battery 1250a, the controller 1502 is configured to instruct the second disconnect switch 1530b and the nth disconnect switch 1530c to both transition from electrically connected state to the electrically disconnected state (rather than transitioning the first disconnected switch 1530a to the electrically disconnected state), which electrically disconnects the second battery 1250b and the nth battery 1250c from the power bus 1532. In this way, for example, power is forced to be drawn from the first battery 1250a and the charge, or SoC, can be drained or reduced more quickly to mitigate or eliminate the battery thermal event by reducing the capacity of the first battery 1250 to continue experiencing the thermal event.

Drain Charge to External Load

With reference to FIGS. 57, 58, 61 and 62, in some embodiments, the vehicle 10 includes an export power port 1508 that is configured to connect to one or more external power loads (e.g., on surrounding vehicles, the power grid, a home power grid, etc.) and provide power from the ESS 700 (or the ESS 1010, the ESS 1110, or the ESS 1210) to the external power loads. For example, in some embodiments, the vehicle 10 is a first vehicle 10a and the export power port 1508 is configured to connect to an import power port 1540 on at least one of a second vehicle 10b, a third vehicle 10c, or an nth vehicle 10d (see, e.g., FIG. 61). In general, the controller 1502 is configured to instruct a user to connect the export power port 1508 to one or more surrounding vehicles (e.g., the vehicle 10b, 10c, or 10d) by providing a notification (e.g., via the user interface 820 and/or remote device 1509). Once the one or more surrounding vehicles are connected to the export power port, power is provided from the ESS 700 to the surrounding vehicles and the charge or SoC of the ESS 700 is drained or reduced. In some embodiments, the disconnect switches 1530 are configured to transition to the electrically disconnected state for each of the batteries 1250 that are operating normally (e.g., not experiencing an onset of a battery thermal event), which forces the batteries 1250 experiencing the onset of a battery thermal event to provide power to the export power port 1508.

In some embodiments, the export power port 1508 is configured to connect to a trailer or deployable unit 1542. The deployable unit 1542 may be a movable trailer that is towed or driven to a vehicle during a thermal event and connected to the export power port 1508. The deployable unit 1542 may include at least one of (a) resistors 1544, (b) ultracapacitors 1546, (c) heat generators 1548, or (d) battery banks 1550 that, when connected to the export power port 1508, drain power from the ESS 700. In some embodiments, the deployable unit 1542 may be modular such that any combination or number of the resistors 1544, the ultracapacitors 1546, the heat generators 1548, and/or the battery banks 1550 may be installed on the deployable unit 1542 to provide a specific energy capacity that the deployable unit 1542 can drain from the ESS 700.

In some embodiments, a method 1550 for operating a vehicle with a battery (see, e.g., FIG. 62) includes detecting, at step 1552, the onset of a battery thermal event in one or more battery packs 710, batteries 1250, and/or cells 1252 (e.g., via input data from the health sensors 1256 provided to the controller 1502). Upon detecting the onset of the battery thermal event at step 1552, a notification (e.g., a visual notification on the display and/or an audio notification send to a speaker) is sent, at step 1554, to the user interface 820 and/or the remote device 1509. In some embodiments, the notification includes instructions to connect the export power port 1508 to one or more surrounding vehicles or the deployable unit 1542 to drain the charge of the battery 1250 for which the onset of a battery thermal event was detected. In some embodiments, the disconnect switches 1530 are configured to transition to the electrically disconnected state for each of the batteries 1250 that are operating normally (e.g., no detection of an onset of a battery thermal event), which forces the batteries 1250 experiencing the onset of a battery thermal event to provide power to the export power port 1508. At step 1556, the export power port 1508 is connected to one or more surrounding vehicles or the deployable unit 1542 to drain and reduce the charge or SoC of the batteries 1250 experiencing the onset of a battery thermal event to mitigate or eliminate the battery thermal event.

Drain Charge to Subsystems

As described herein, the ESS 700 (or the ESS 1010, the ESS 1110, or the ESS 1210) is configured to power various on-board electricity/energy consuming units, components, and/or systems (e.g., the driveline 100 (e.g., the TAD 400, the ETD 500, the pump system 600, the second subsystem 610), accessories, resistors, ultracapacitors, heat generators, etc.). In some embodiments, these connections between the ESS 700 and the various on-board electricity/energy consuming units, components, and/or systems are leveraged to selectively drain power from a battery, or batteries, experiencing the onset of a battery thermal event. With specific reference to FIGS. 57, 58, and 63, the controller 1502 is in communication with the driveline 100 and the subsystems (the pump system 600 and/or the second subsystem 610) on the vehicle 10. In some embodiments, during operation, the controller 1502 is configured to detect the onset of a battery thermal event in one or more battery packs 710, batteries 1250, and/or cells 1252 (e.g., via input data from the health sensors 1256). Optionally, the controller 1502 may provide a notification to the user interface 820 and/or the remote device 1509 notifying a user to transition the vehicle 10 into a neutral or stopped state. In response to detecting the onset of a battery thermal event, the controller 1502 is configured to run one or more components of the driveline 100, the pump system 600, and/or the second subsystem 610. In some embodiments, the controller 1502 can be configured to run the pump 604 and recirculate water out of and back into a tank arranged on the vehicle 10 to drain or reduce the charge or SoC of the battery 1250 experiencing the onset of a battery thermal event (e.g., thermal event battery may be isolated using the disconnect switches 1530). Alternatively, a user may be instructed to connect to an external water source (e.g., a fire hydrant, a water truck, a water reservoir, etc.) and, upon connecting to the external water source, the pump 604 may be ran continuously to drain or reduce the charge or SoC of the battery 1250 experiencing the onset of a battery thermal event.

Figures 78, 79:
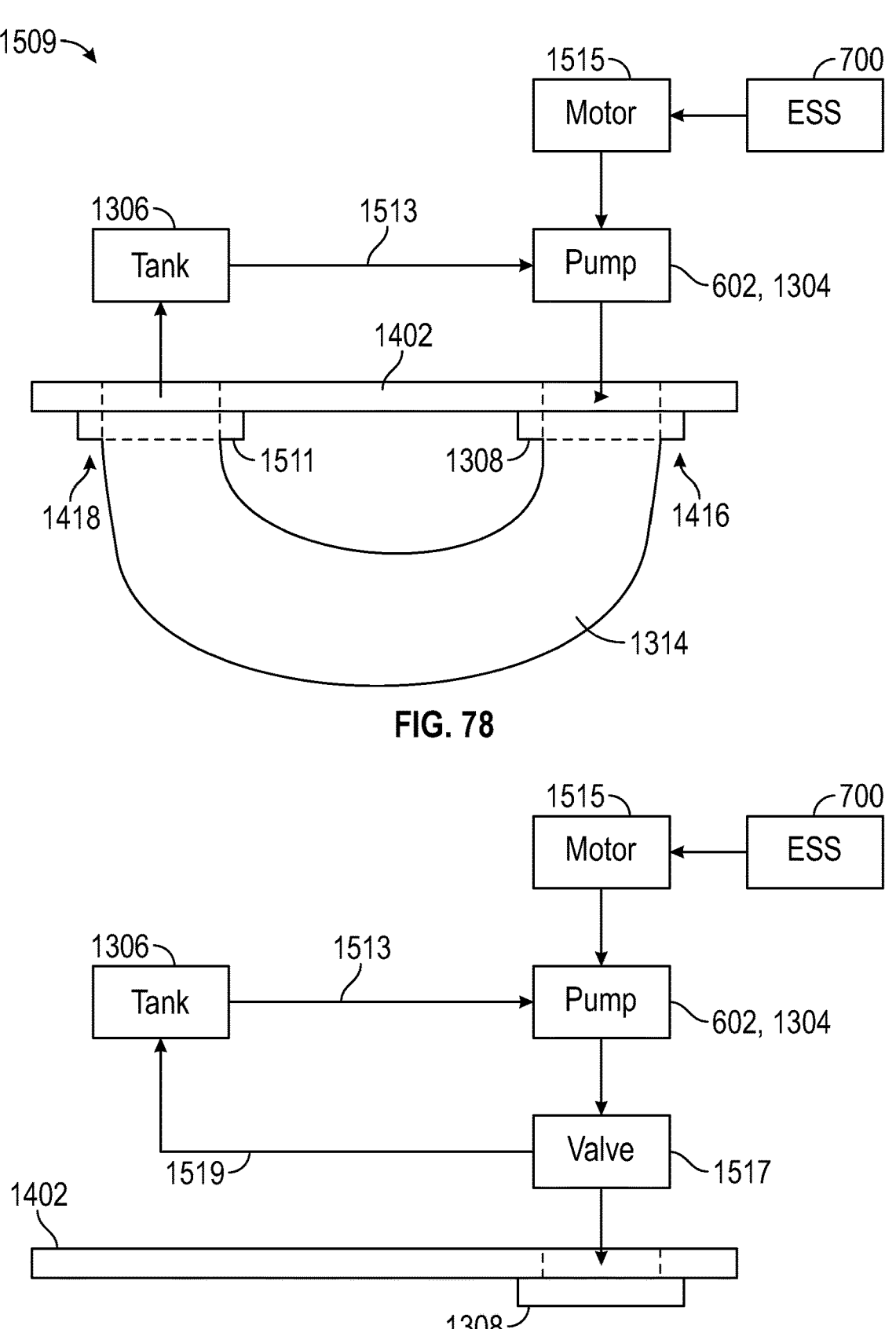
FIG. 78 is a schematic illustration of an electricity consuming system with a recirculating water circuit, according to an exemplary embodiment.
FIG. 79 is a schematic illustration of an electricity consuming system including a valve and a recirculation line, according to an exemplary embodiment.

In some embodiments, the vehicle 10 includes an on-board energy dissipation system 1509 (see, e.g., FIG. 57) and the controller 1502 is configured to instruct the energy dissipation system 1509 to drain power from the battery 1250 experiencing a thermal event. With specific reference to FIG. 78, the on-board energy dissipation system 1509 may include the pump 602 or the pump 1304 (e.g., a water pump) that is connected to the pump outlet port 1308. The pump outlet port 1308 may be removably coupled to an inlet port 1511 by the hose coupling 1314 (e.g., a removable hand-line connection). The inlet port 1511 is coupled to the tank 1306 (e.g., a water tank). A supply conduit 1513 fluidly couples the tank 1306 to the pump 602, 1304. The pump 602, 1304 may be driven by a motor 1515 (e.g., the ETD 500 or an independent motor) that is electrically coupled to the ESS 700. During a thermal event, the controller 1502 may be configured to operate the motor 1515 using power from the ESS 700 when the removable hand-line connection 1314 is fluidly coupled between the pump outlet port 1308 and the inlet port 1511 such that the motor 1515 drives the pump 602, 1304 to recirculate water out of and back into the tank 1306 to facilitate draining the state of charge of the ESS 700 (and a battery 1250 therein experiencing a thermal event).

In some embodiments, the energy dissipation system 1509 includes a recirculation valve 1517 that is configured to direct water from the pump 602, 1304 to either the pump outlet port 1308 or a recirculation conduit 1519. The recirculation line 1519 is connected between the recirculation valve 1517 and the tank 1306. In general, the controller 1502 is configured to operate the pump 602, 1304 to recirculate water from the pump 602, 1304 through the recirculation valve 1517 and along the recirculation conduit 1519 back to the tank 1306 to facilitate draining the state of charge of the ESS 700 and a battery 1250 therein experiencing a thermal event. In some embodiments, the recirculation valve 1519 is a manually-operated valve, and the controller 1502 is configured to operate the motor 1515 using the power provided by the ESS 700 when the recirculation valve 1517 is set to fluidly couple the pump 602, 1304 to the tank 1306 such that the motor 1515 drives the pump 602, 1306 to recirculate the water out of and back into the tank 1306 to facilitate draining the state of charge of the ESS 700. In some embodiments, the recirculation valve 1519 is an electrically-operated valve, and the controller 1502 system is configured to engage the recirculation valve 1519 to fluidly couple the pump 602, 1304 to the tank 1306 and operate the motor 1515 using the power provided by the ESS 700 when the recirculation valve 1519 is set to fluidly couple the pump 602, 1304 to the tank 1306 such that the motor 1515 drives the pump 602, 1304 to recirculate the water out of and back into the tank 1306 to facilitate draining the state of charge of the ESS.

In some embodiments, the on-board energy dissipation system 1509 includes at least one of (a) resistors, (b) ultracapacitors, (c) heat generators, or (d) battery banks that drain power from the ESS 700 during a thermal event. For example, the controller 1502 may be configured to supply power from the ESS 700 to the (a) resistors, (b) ultracapacitors, (c) heat generators, and/or (d) battery banks that are on-board the vehicle 10 to drain the state of charge of the ESS 700.

In some embodiments, the controller 1502 may be configured to confirm that the vehicle 10 is stopped and, if the vehicle 10 is stopped, the controller 1502 may be configured to run the ETD 500 in a neutral position (i.e., disconnected from the wheels 18), the electric motor 1008 with the clutch 1004 in a neutral position, the electric motor 1116 with the EV transmission in a neutral position, or the electric motor 1208 with the transmission 1216 in a neutral position. These operations may be performed in addition to or as an alternative to running the subsystems described herein to drain the or reduce the charge or SoC of a battery 1250 experiencing the onset of a battery thermal event.

Figure 80:
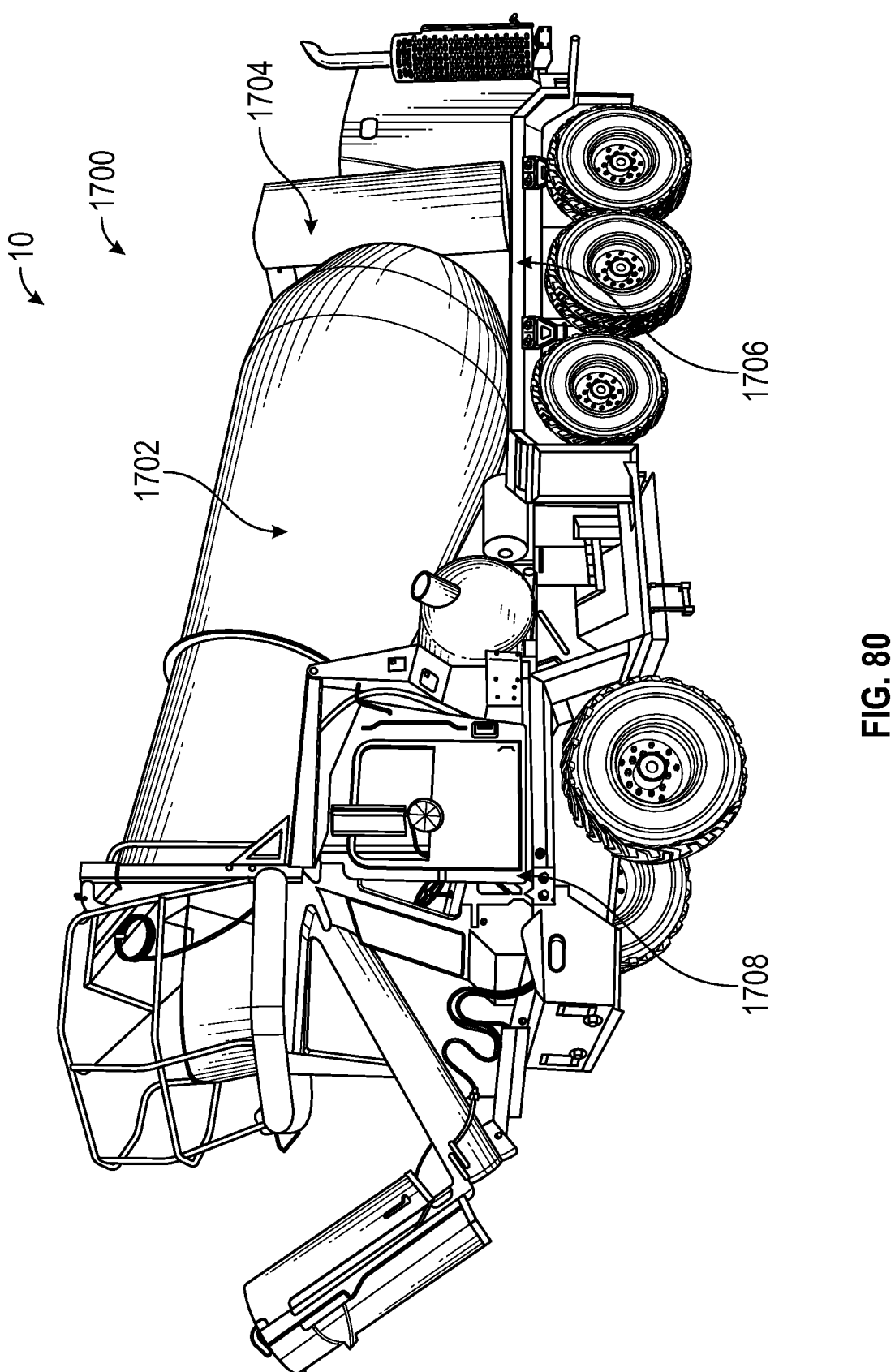
FIG. 80 is a perspective view of a mixer truck, according to an exemplary embodiment.

In some embodiments, the vehicle 10 may be in the form of a concrete mixer or mixer truck 1700 (see, e.g., FIG. 80) that includes a mixer drum 1702 that is driven by a drum drive system 1704 (e.g., a rotational actuator or motor, such as an electric motor). The mixing drum 1702 may be coupled to a chassis 1706 and may be disposed behind a cab 1708 (e.g., at the rear and/or middle of the chassis 1706). In an exemplary embodiment, the drum drive system 1704 is coupled to the chassis 1706 and configured to selectively rotate the mixing drum 1702 about a central, longitudinal axis. In some embodiments, the controller 1502 may instruct the drum drive system 1704 to spin the electric motor coupled to the mixing drum 1702 (e.g., at high speeds) to drain or reduce the state of charge of the ESS 700 (or a battery 1250 therein) experiencing the onset of a thermal event.

Figure 81:
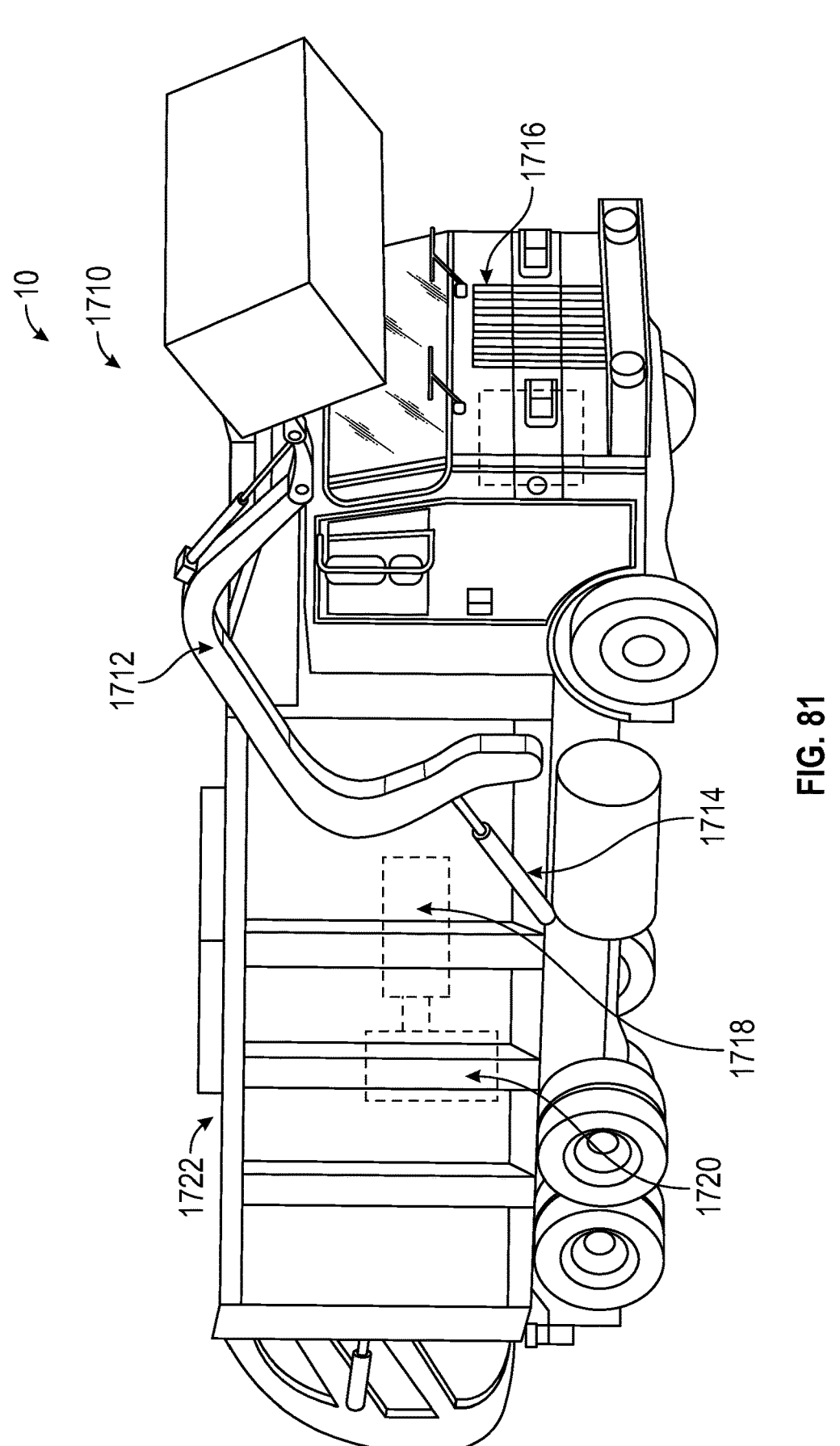
FIG. 81 is a perspective view of a refuse vehicle, according to an exemplary embodiment.

In some embodiments, the vehicle 10 may be in the form of a refuse vehicle 1710 (see, e.g., FIG. 81) that includes a pair of lift arms 1712 and a pair of actuators (e.g., electric linear actuators), shown as lift arm actuators 1714. In an exemplary embodiment, the lift arm actuators 1714 may be positioned such that extension and retraction of the lift arm actuators 1714 rotates the lift arms 1712 about an axis extending through a pivot. In this regard, the lift arms 1712 may be rotated by the lift arm actuators 1714 to lift a refuse container over a cab 1716 of the refuse vehicle 1710. The refuse vehicle further includes a pack panel actuator 1718 (e.g., an electric linear actuator) that is coupled to a pack panel 1720. The pack panel actuator 1718 is configured to extend and retract the pack panel 1720 to compact refuse within a refuse compartment 1722. In some embodiments, the controller 1502 may instruct the lift arm actuators 1714, the pack panel actuator 1718 and/or other on-board electricity/energy consuming units, components, and/or systems to operate and drain the state of charge of the ESS 700 (or a battery 1250 therein) experiencing the onset of a thermal event.

In some embodiments, a method 1560 for operating a vehicle with a battery (see, e.g., FIG. 63) includes detecting, at step 1562, the onset of a battery thermal event in one or more battery packs 710, batteries 1250, and/or cells 1252 (e.g., via input data from the health sensors 1256 provided to the controller 1502). Upon detecting the onset of the battery thermal event at step 1562, an optional notification (e.g., a visual notification on the display and/or an audio notification send to a speaker) is sent at step 1564 to the user interface 820 and/or the remote device 1509. In some embodiments, the notification notifies a user to transition the vehicle 10 into a neutral or stopped state. In response to detecting the onset of the battery thermal event at step 1562, one or more components of the driveline 100, the pump system 600, and/or the second subsystem 610 may be ran (e.g., provide with power from the ESS 700) at step 1566. For example, the controller 1502 can be configured to run the pump 604 and recirculate water out of and back into a tank (e.g., the tank 1306) arranged on the vehicle 10 to drain or reduce the charge or SoC of the battery 1250 experiencing the onset of a battery thermal event (e.g., thermal event battery may be isolated using the disconnect switches 1530). Alternatively, a user may be instructed to connect to a fire hydrant and, upon connecting to a fire hydrant, the pump 604 may be ran continuously to drain or reduce the charge or SoC of the battery 1250 experiencing the onset of a battery thermal event.

Thermal Event During Charging Session

In some instances, the ESS 700 of the vehicle 10 may experience a thermal event while the charging system 750 is coupled to an external power supply (e.g., plugged in while in a fire house, plugged in while in a garage, etc.). The controller 1502 may be configured to monitor for the onset of a battery thermal event during a charging session, and if the battery thermal event is detected, implement one or more mitigating actions. By way of example, if the onset of a battery thermal event is detected by the controller 1502 during a charging session, the controller 1502 may be configured to at least one of: (a) stop accepting a charge from the external power supply (e.g., by engaging one or more disconnects; by spitting, throwing, or ejecting the charging plug; etc.), (b) reverse the flow of electricity and dump energy back to the power grid (e.g., through a bi-directional charging system 750), (c) activate one or more alerting devices (i) on the vehicle 10 (e.g., lights, sirens, horn, displays, etc.), (ii) in the building within which or proximate to where the vehicle 10 is charging (e.g., alarms, lights, displays, etc.), and/or (iii) remote devices (e.g., user devices, smartphones, smart home devices, etc.) to notify persons in or proximate the building about the onset of the thermal event, (d) eject the charging plug and autonomously drive the vehicle 10 away from the charging station or external power supply and/or out of the building (e.g., eject the charging plug, open the garage door, turn the vehicle 10 on, active drive mode, drive the vehicle 10 through the garage door and away from the building, engage park mode, etc.), (e) run on-board systems of the vehicle 10 to drain the SOC (as described in greater detail herein), (f) deluge the battery housing(s) 1254 and/or the batteries 1252 via the battery cooling system 1300 and/or the supplemental cooling system 1350 (as described in greater detail herein), or (g) eject or drop individual batteries 1252 and/or the ESS 700 from the vehicle 10 (as described in greater detail herein). In some embodiments, the controller 1502 is configured to take a tiered or staged approach starting with less drastic actions or first actions (e.g., action (a), action (b), and/or action (c)) and then moving to more involved or drastic actions or second actions if the battery thermal event continues to progress (e.g., as a last resort to save the vehicle 10; action (d), action (e), action (f), and/or action (g); etc.). By way of example, the controller 1502 may start with action (a) and progress through to action (g). The controller 1502 may be configured to determine that the battery thermal event is continuing to progress and, therefore, progress to more involved or drastic actions, in response to the temperature of the thermal event continuing to increase, the thermal event spreading to additional batteries 1250, and/or one or more components outside of the battery enclosure 1602 and/or the battery housing 1254 starting on fire. In some implementations, one or more of action (a), action (b), action (c), action (d), action (e), action (f), or action (g) are omitted as the controller 1502 progresses along the tiered or staged thermal event mitigation process (e.g., based on capabilities of the vehicle 10, based on user preferences established for the vehicle 10, etc.). In some embodiments, the ejection of the charging plug is performed similar to the plug ejection described in U.S. Patent Publication No. 2022/0355690, filed Apr. 26, 2022, which is incorporated herein by reference in its entirety.

Failsafe

With specific reference to FIG. 58, in some embodiments, the user interface 820 and/or the remote device 1509 are configured to generate a failsafe code or notification prior to performing any cooling and/or charge-draining operations to ensure that the cooling and/or charge-draining operations are not performed inadvertently. In some embodiments, the user interface 820 and/or the remote device 1509 require a failsafe code (e.g., a password) to be input thereto prior to performing the cooling or charge-draining operations. In some embodiments, the user interface 820 and/or the remote device 1509 require a soft-key input prior to performing the cooling or charge-draining operation.

Flood Port

In some embodiments, the vehicle 10 includes a flood port that is configured to provide direct access to a battery housing or enclosure. For example, the vehicle 10 may include a global battery enclosure that encloses most or all of the battery packs 710 within the ESS 700, and the flood port may provide direct fluid communication to the internal volume of the global battery enclosure. In this way, for example, the internal volume of the global battery enclosure 1602 can be quickly flooded with a cooling fluid, upon connection of a fluid source (e.g., a water turret, an outrigger connector, a hose connected to a fire hydrant, a hose connected to an external pump, a hose connected to an on-board pump).

FIGS. 64-73 illustrate various embodiments of a flood port 1600 arranged on the vehicle 10 and the connectors configured to couple to the flood port 1600. In some embodiments, the flood port 1600 and the connector configured to couple thereto comprise a flood cooling system. In some embodiments, the flood port 1600 may be the same as or act as the supply port 1310 or the external port 1400. In some embodiments, the flood port 1600 is manually connected to (e.g., by a user approaching with a connector) and the connector is configured to provide a water shield (e.g., a wall of water that extends outwardly and around a perimeter of the connector). In general, the flood port 1600 is a universal port that is included on battery-powered or hybrid vehicles for mitigating and/or treating a battery thermal event. The flood port 1600 is arranged on or accessible through an external surface, portion, structure, body panel, or wall of the vehicle 10. For example, the flood port 1600 can be arranged on or accessible through an external surface, portion, structure, body panel, or wall of the front cabin 20 (see, e.g., FIG. 64). In some embodiments, the flood port 1600 can be arranged on or accessible through an external surface, portion, structure, body panel, or wall of the rear section 30 (see, e.g., FIG. 65). In such embodiments, a conduit extends from the flood port 1600 to the battery enclosure 1602.

Figures 66, 67:
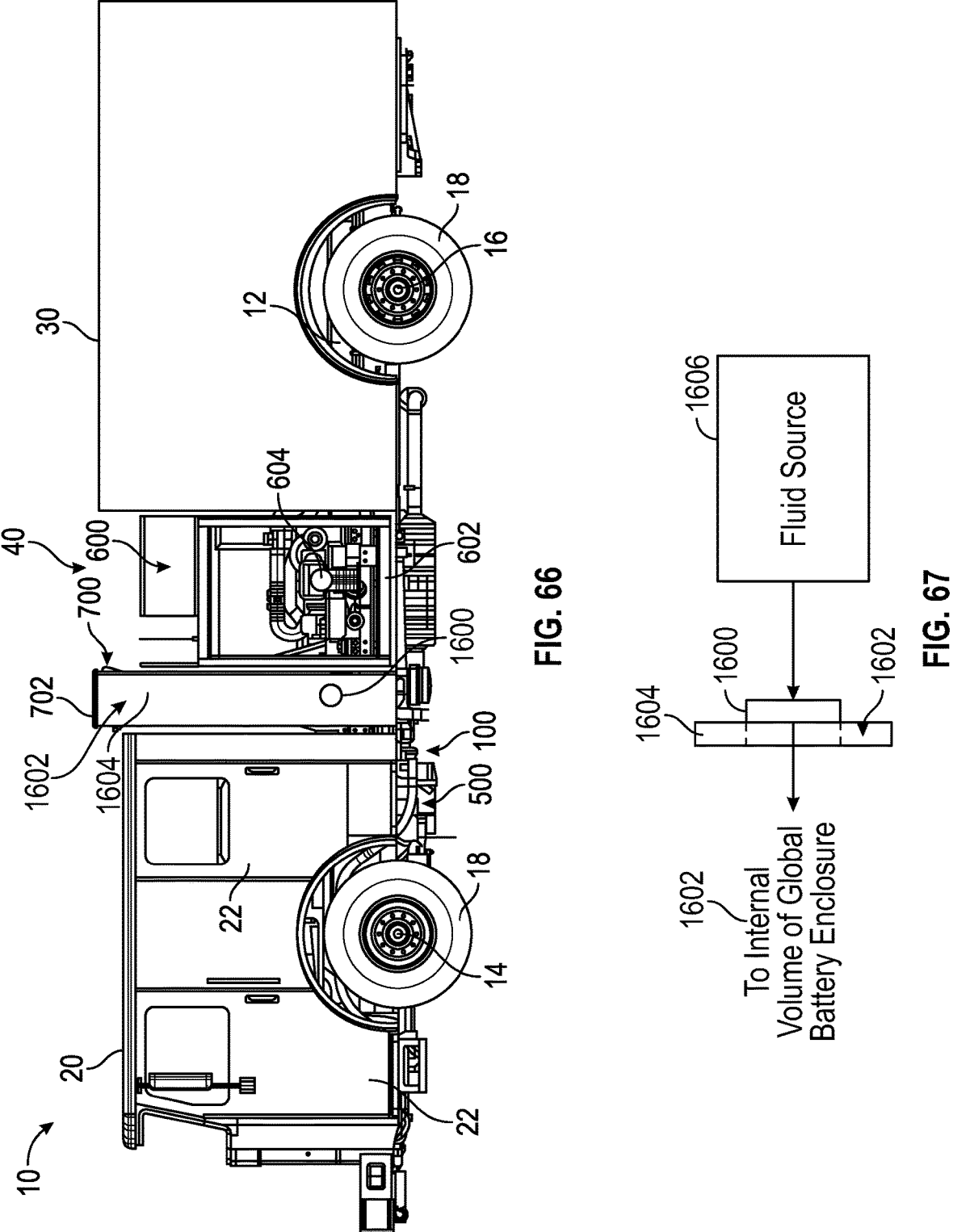
FIG. 66 is a side view of the vehicle of FIG. 1 including a flood port arranged on a global battery enclosure, according to an exemplary embodiment.
FIG. 67 is a schematic illustration of a top view of the flood port on the vehicle of FIG. 66.

In some embodiments, as shown in FIGS. 66 and 67, the vehicle 10 includes a global battery enclosure 1602 (e.g., the housing 702) that encloses all or most of the battery packs 710 in the ESS 700. The global battery enclosure 1602 defines an internal volume within which the battery packs 710, and the batteries 1250 and cells 1252, are enclosed. In some embodiments, the flood port 1600 is arranged on or accessible through an external surface, portion, structure, panel, or wall 1604 of the global battery enclosure 1602. In the illustrated embodiment, the flood port 1600 extends outwardly from the external wall 1604 and protrudes from the external wall 1604. In some embodiments, the flood port 1600 is arranged within the external wall 1604 so that a distal end of the flood port 1600 is arranged approximately flush with the external wall 1604 (i.e., does not protrude therefrom). Regardless of the specific orientation of the flood port 1600, the flood port 1600 extends through or is accessible through the external wall 1604 and provides fluid communication to the internal volume of the global battery enclosure 1602. In some embodiments, the flood port 1600 includes a check valve arranged therein that only allow fluid flow in a direction into the internal volume of the global battery enclosure 1602.

The flood port 1600 is configured to receive cooling fluid from a fluid source 1606 (see, e.g., FIG. 67). In some embodiments, the fluid source 1606 is a water turret, an outrigger connector coupled to the end of an extending outrigger of the vehicle 10, a fire hydrant, an external pump, an on-board pump (e.g., the pump 604). Once the fluid source 1606 is coupled to the flood port 1600, the internal volume of the global battery enclosure 1602 is flooded with cooling fluid, which provides cooling to the battery housing 1254 and/or the battery or batteries 1250 within the global battery enclosure 1602.

Figure 77:
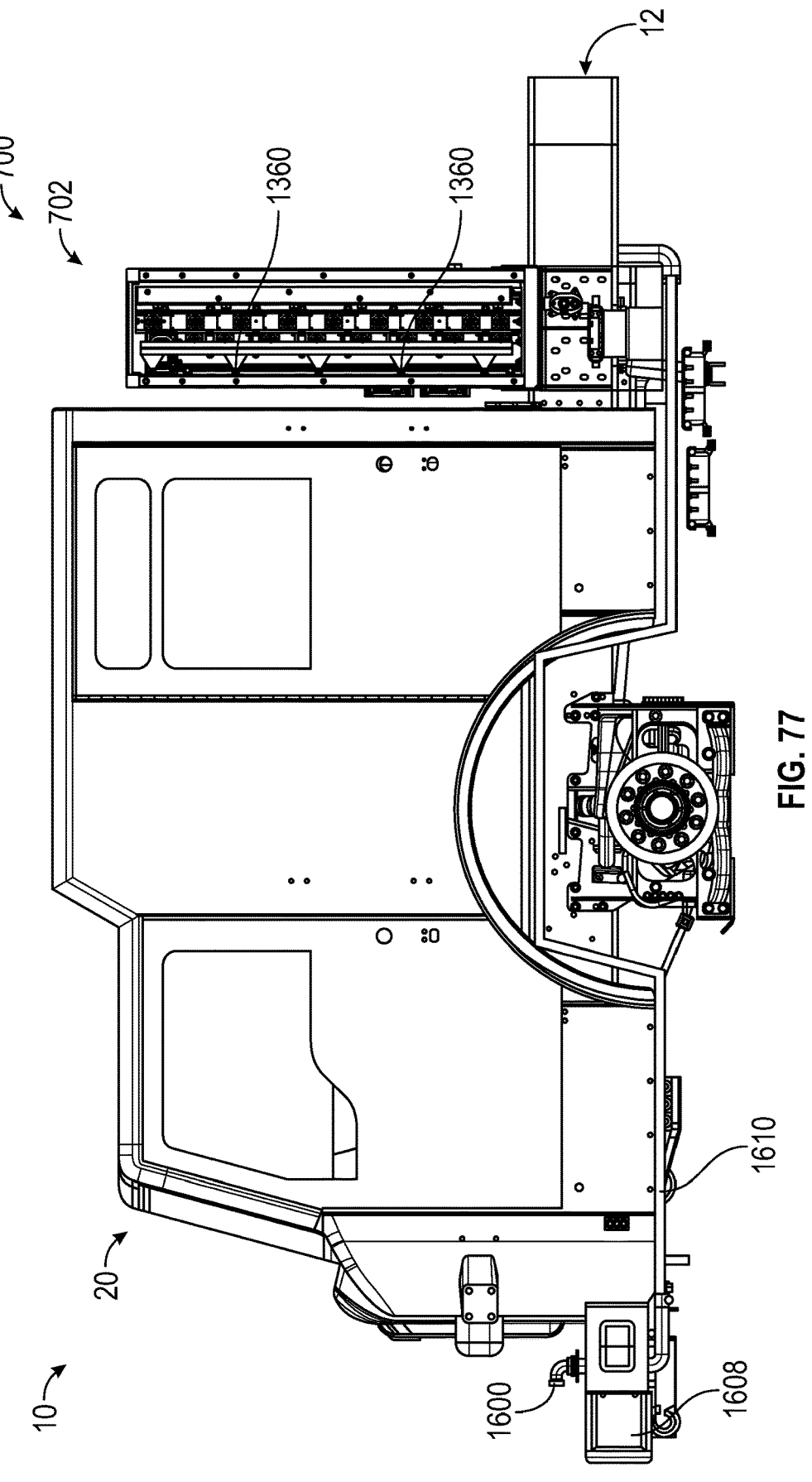
FIG. 77 is a side view of the vehicle of FIG. 1 including a flood port positioned at, proximate, or adjacent to a front of the vehicle, according to an exemplary embodiment.

In some embodiments, the flood port 1600 is posited at, adjacent, or proximate to a front of the vehicle, as shown in FIG. 77. For example, the flood port 1600 may be arranged on a front bumper 1608 of the vehicle 10 in front of cab 20. The flood port 1600 may be connected to a cooling conduit 1610 (e.g., the secondary cooling conduit 1352) that extends between the flood port 1600 and the ESS 700. In some embodiments, the cooling conduit 1610 extends along a bottom of the vehicle 10 (e.g., under the cab 20 and under or along the chassis 12). The cooling conduit 1610 is connected to the housing 702 and configured to facilitate water being provided from the flood port 1600 to the ESS 700.

Figure 82:
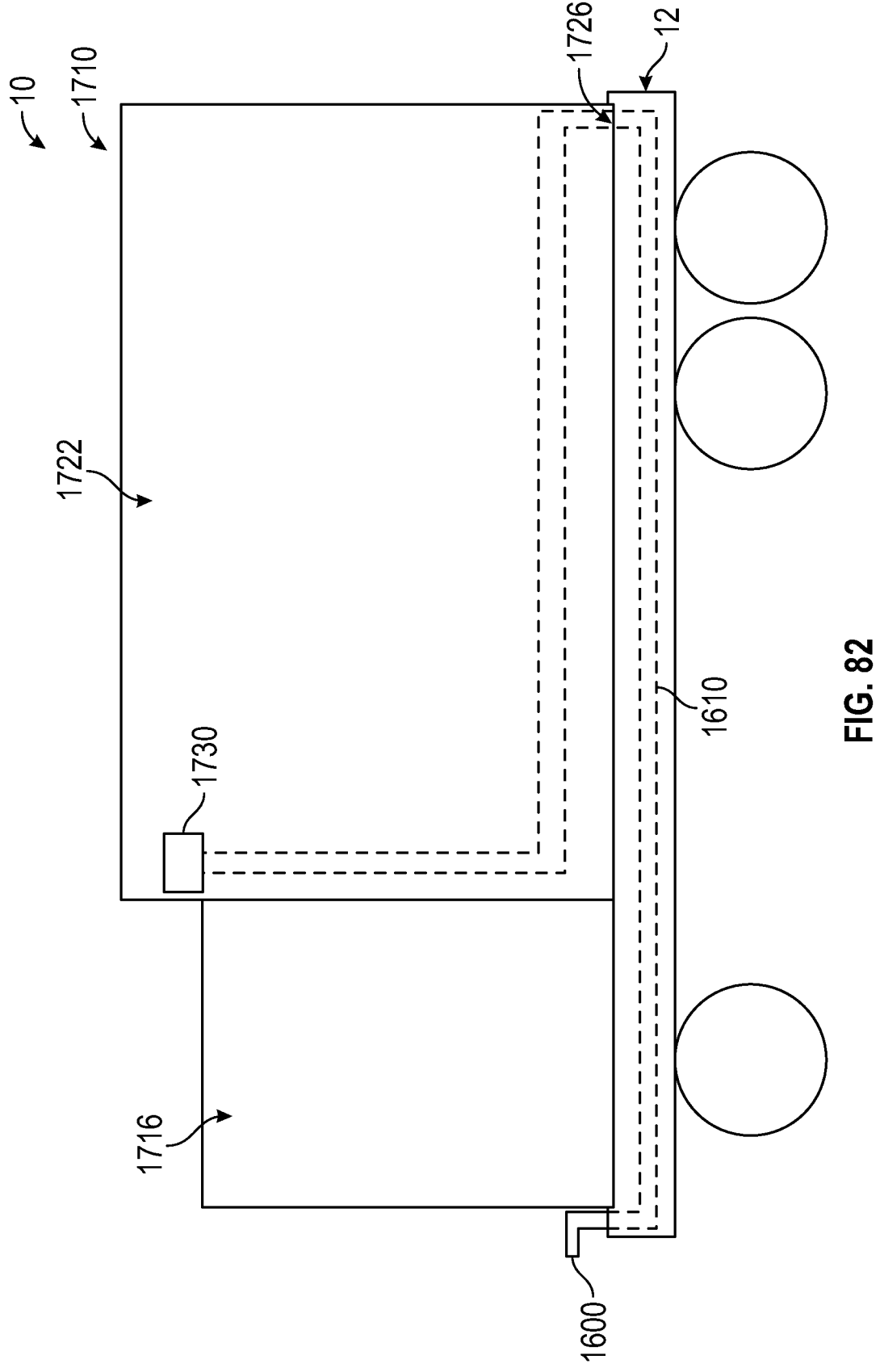
FIG. 82 is schematic illustration of a refuse vehicle with a flood port and a flood conduit extending into a body of the refuse vehicle, according to an exemplary embodiment.
Figure 83:
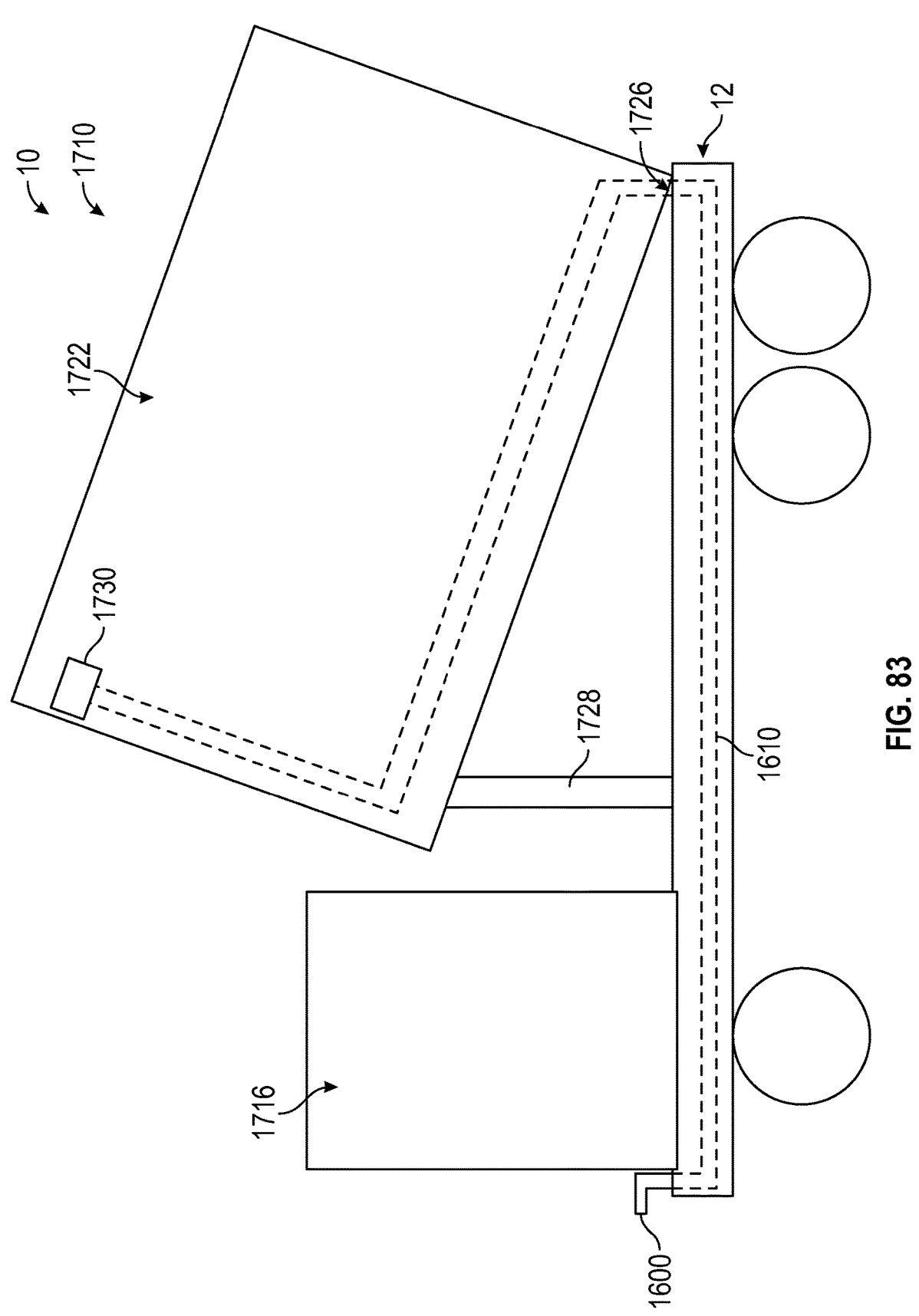
FIG. 83 is schematic illustration of the refuse vehicle of FIG. 82 with a body pivoted, according to an exemplary embodiment.

In some embodiments, the vehicle 10 in the form of a refuse vehicle 1710 may include the flood port 1600 arranged adjacent to a front of the refuse vehicle 1710, as shown in FIG. 82. In this exemplary embodiment, the cooling conduit 1610 may extend between the flood port 1600 and the body or refuse compartment 1722. Specifically, the cooling conduit 1610 may extend into an interior volume 1724 defined by the refuse compartment 1722. The cooling conduit 1610 may include a pivot point 1726 that enables the cooling conduit 1610 to pivot with the refuse compartment 1722 (see, e.g., FIG. 83). For example, the refuse vehicle 1710 may include a lift actuator 1728 that raises and lowers an end of the refuse compartment 1722, which causes the refuse compartment 1722 to pivot relative to the chassis 12 and enables refuse to be dumped out of the refuse compartment 1722.

In some embodiments, the cooling conduit 1610 may extend into a rear of the refuse compartment 1722 (e.g., at the pivot point 1726). From the pivot point 1726, the cooling conduit 1610 may extend toward a front of the refuse compartment 1722 (e.g., toward the cab 1716) and then extend vertically to the on-board agent distribution system 1730. Water may flow from the flood port 1600 (e.g., provided by an external source as described herein), along the cooling conduit 1610, and out of the on-board agent distribution system 1730 and into the refuse compartment 1722. In general, a thermal event within the refuse compartment 1722 may be detected, for example, by a temperature sensor, an imaging sensor, etc., and in response, the controller 1502 may provide an indication to connect an external water source to the flood port 1600 and allow water to flow into the refuse compartment 1722 to mitigate or cease the thermal event.

In some embodiments, the flood port 1600 includes two, separate ports: (a) a first flood port fluidly coupled to the ESS 700 by a first conduit and (b) a second flood port fluidly coupled to the refuse compartment 1722 and/or the on-board agent distribution system 1730 by a second conduit. In some embodiments, the flood port 1600 includes a flood port valve coupled thereto with two, separate conduits coupled to the flood port valve: (a) a first conduit extending from the flood port valve to the ESS 700 and (b) a second conduit extending from the flood port valve to the refuse compartment 1722 and/or the on-board agent distribution system 1730.

Stick or Extended Snorkel with Integrated Water Shield

Figure 68:
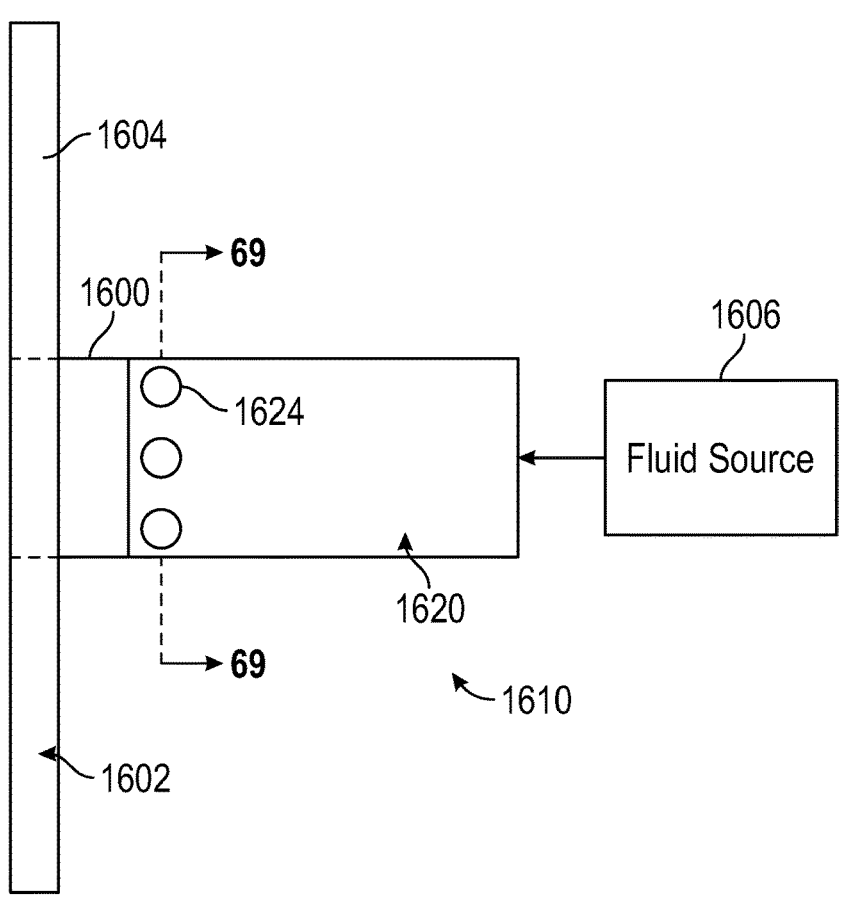
FIG. 68 is a schematic illustration of the flood port on the vehicle of FIG. 66 connected to a stick connector, according to an exemplary embodiment.
Figure 69:
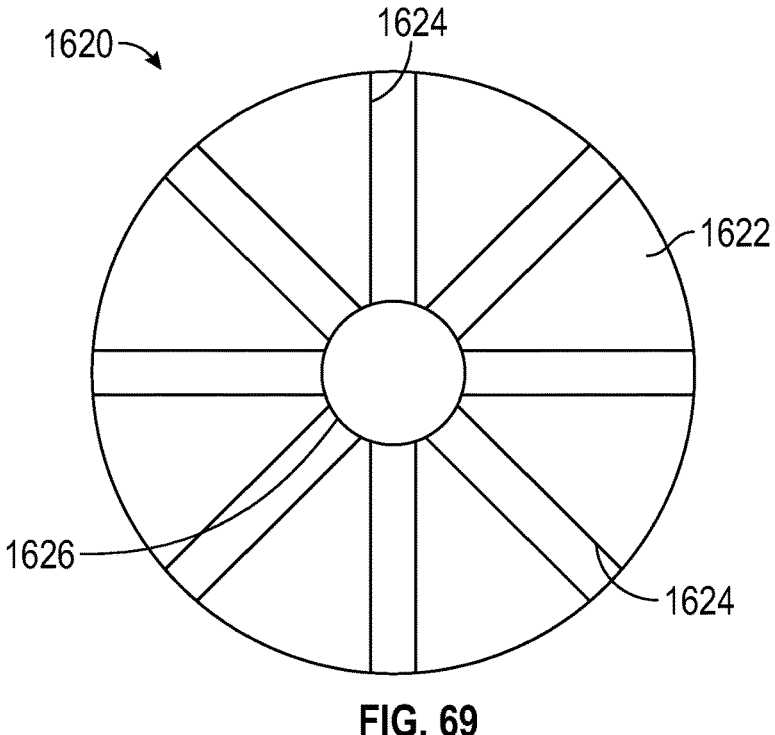
FIG. 69 is schematic cross-section of the stick connector of FIG. 68 taken along line 68-68.

With specific reference to FIGS. 68 and 69, in some embodiments, a flood cooling system 1610 includes the flood port 1600 and a stick or javelin connector 1620 that is configured to be coupled to the fluid source 1606 at one end thereof and selectively connected to the flood port 1600 at the other end thereof. The stick connector 1620 defines a generally tube-like body 1622 and includes a plurality of shield apertures 1624 arranged at a distal end of the body 1622 (i.e., adjacent to an end that couples to the flood port 1600). Each of the plurality of shield apertures 1624 extend radially outwardly from a central passage 1626, through the body 1622, and to a radially-outer edge of the body 1622. The plurality of shield apertures 1624 are arranged circumferentially around the body 1622 and are all axially aligned (i.e., arranged at the same axial location along a longitudinal direction of the body 1622). The fluid source 1606 is configured to supply pressurized cooling fluid to the central passage 1626. Prior to the stick connector 1620 being coupled to the flood port 1600, the fluid source 1606 provides pressurized cooling fluid into the central passage 1626, which flows through the central passage 1626 and out each of the shield apertures 1624 to generate a water shield. The water shield may form a substantially circumferentially-continuous wall of water that is emitted from the plurality of shield apertures 1624. The water shield may provide a level of thermal protection to a user approaching the flood port 1600.

Once the stick connector 1620 is coupled to the flood port 1600, the cooling fluid provided by the fluid source 1606 is supplied through the flood port 1600 via the central passage 1626 to the internal volume of the global battery enclosure 1602 to cool to the battery housing 1254 and/or the battery, or batteries, 1250 within the global battery enclosure 1602. The sick connector 1620 may be configured to continue providing the water shield when coupled to the flood port 1600 to provide a thermal barrier to users as they retreat from the vehicle 10 after making the connection.

Nozzle Connector with Integrated Water Shield

Figure 70:
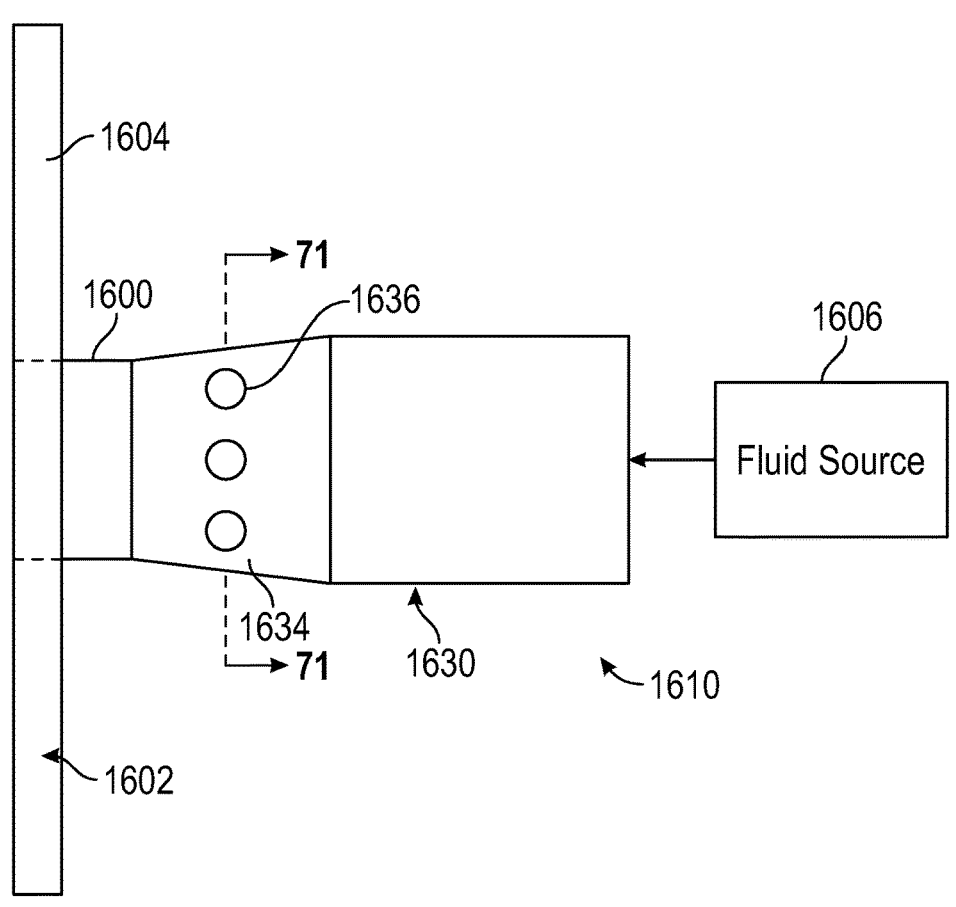
FIG. 70 is a schematic illustration of the flood port on the vehicle of FIG. 66 connected to a nozzle connector, according to an exemplary embodiment.
Figure 71:
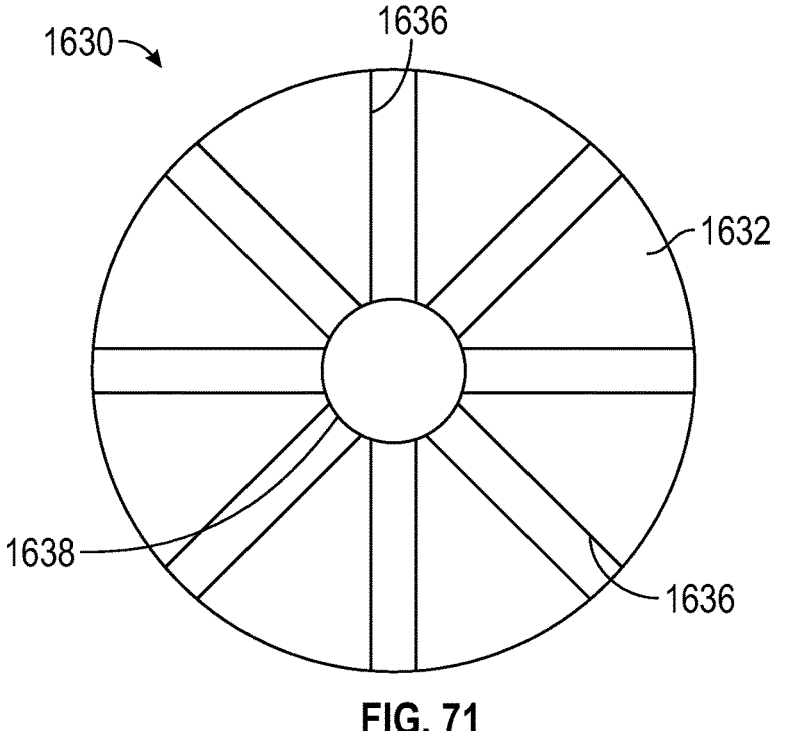
FIG. 71 is schematic cross-section of the nozzle connector of FIG. 70 taken along line 71-71.

With specific reference to FIGS. 70 and 71, in some embodiments, the flood cooling system 1610 includes the flood port 1600 and a nozzle connector 1630 that is configured to be coupled to the fluid source 1606 at one end thereof and selectively connected to the flood port 1600 at the other end thereof. The nozzle connector 1630 defines a generally tube-like body 1632 that tapers to a nozzle portion 1634 at a distal end of the body 1632. The nozzle portion 1634 includes a plurality of shield apertures 1636 arranged at a distal end of the nozzle portion 1634 (i.e., adjacent to an end that couples to the flood port 1600). Each of the plurality of shield apertures 1636 extend radially outwardly from a central passage 1638 (which extends longitudinally through the body 1632 and the nozzle portion 1634), through the nozzle portion 1634, and to a radially-outer edge of the nozzle portion 1634. The plurality of shield apertures 1636 are arranged circumferentially around the nozzle portion 1634 and are all axially aligned (i.e., arranged at the same axial location along a longitudinal direction of the nozzle portion 1634). The fluid source 1606 is configured to supply pressurized cooling fluid to the central passage 1638. Prior to the nozzle connector 1630 being coupled to the flood port 1600, the fluid source 1606 provides pressurized cooling fluid into the central passage 1638, which flows through the central passage 1638 and out each of the shield apertures 1636 to generate a water shield. The water shield may form a substantially circumferentially-continuous wall of water that is emits from the plurality of shield apertures 1636. The water shield may provide a level of thermal protection to a user approaching the flood port 1600.

Once the nozzle connector 1630 is coupled to the flood port 1600, the nozzle portion 1634 continues to generate the water shield and a remaining portion of the cooling fluid not being used to generate the water shield is supplied through the flood port 1600 via the central passage 1638 to the internal volume of the global battery enclosure 1602 to cool to the battery housing 1254 and/or the battery or batteries 1250 within the global battery enclosure 1602.

Figure 72:
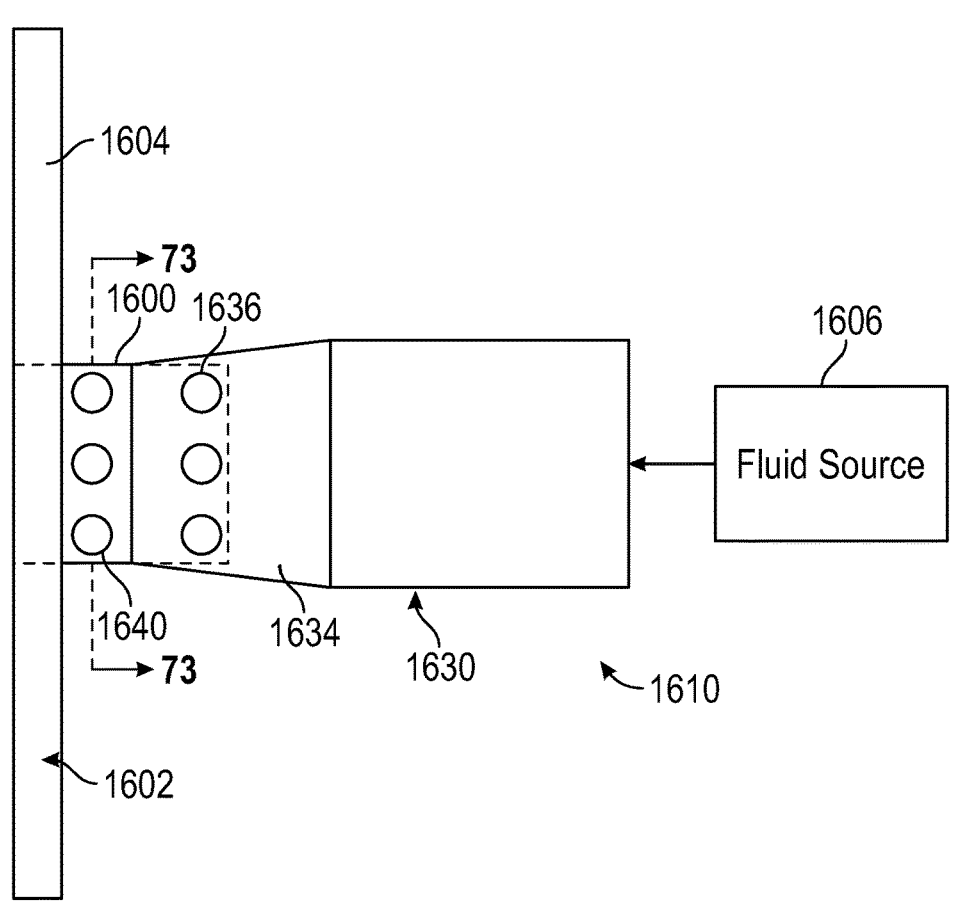
FIG. 72 is a schematic illustration of the flood port and the nozzle connector of FIG. 70, with the flood port including shield apertures, according to an exemplary embodiment.
Figure 73:
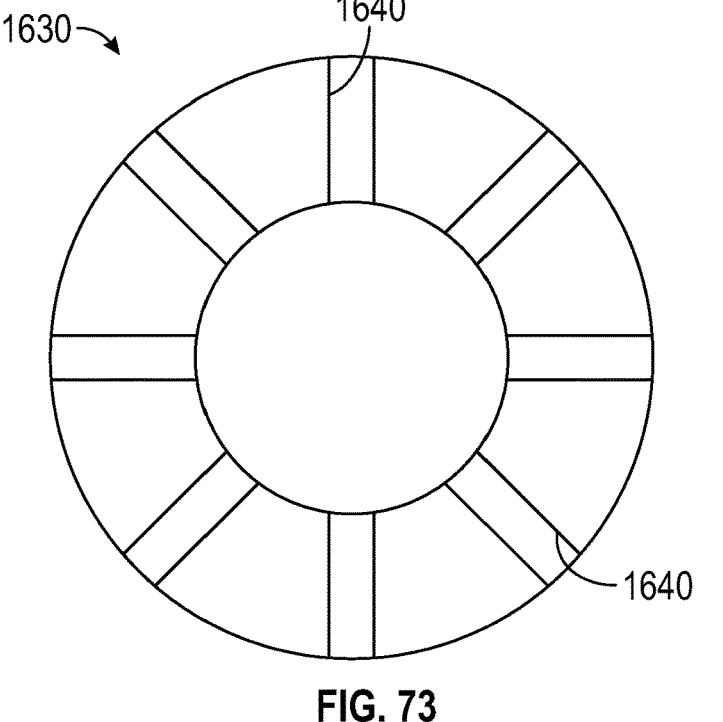
FIG. 73 is schematic cross-section of the flood port of FIG. 72 taken along line 73-73.

FIGS. 72 and 73 illustrate an exemplary embodiment of the flood cooling system 1610 that includes the flood port 1600 and the nozzle connector 1630, where the flood port 1600 is configured to generate the water shield. That is, design and operation of the flood cooling system 1610 of FIGS. 72 and 73 is similar to the flood cooling system 1610 of FIGS. 70 and 71, with similar components identified using like reference numerals, except that the flood port 1600 also includes a plurality of shield apertures 1640. Upon connection of the nozzle connector 1630 to the flood port 1600, the flood port 1600 blocks the shield apertures 1636 on the nozzle connector 1630 and the cooling fluid flows through the shield apertures 1640 formed in the flood port 1600. Therefore, as a user approaches the flood port 1600 with the nozzle connector 1630, the nozzle connector 1630 provides a first water shield. Once the connection between the nozzle connector 1630 and the flood port 1600 is made, the cooling fluid is injected into the flood port 1600 via the central passage 1638. Then, a first portion of the cooling fluid is provided to the global battery enclosure 1602 and a second portion of the cooling fluid is used by the flood port 1600 to generate a second water shield. Therefore, the water shield can transition from the nozzle connector 1630 to the flood port 1600 following the connection being made therebetween.

In some embodiments, the stick connector 1620 and/or the nozzle connector 1630 are configured to be coupled to the vehicle 10 and repositionable relative thereto (e.g., similar to the aerial ladder assembly 1408 and the water turret 1406). By way of example, the stick connector 1620 and/or nozzle connector 1630 may be coupled to an outrigger of the vehicle 10 and extendible therewith. By way of example, the stick connector 1620 and/or the nozzle connector 1630 may be pivotable relative to and/or extendible or telescope from the vehicle 10 (e.g., through a body panel, etc.) using actuators and/or motors (e.g., similar to the actuators or motors 1410).

Physical Disconnect

Figures 84A, 84B:
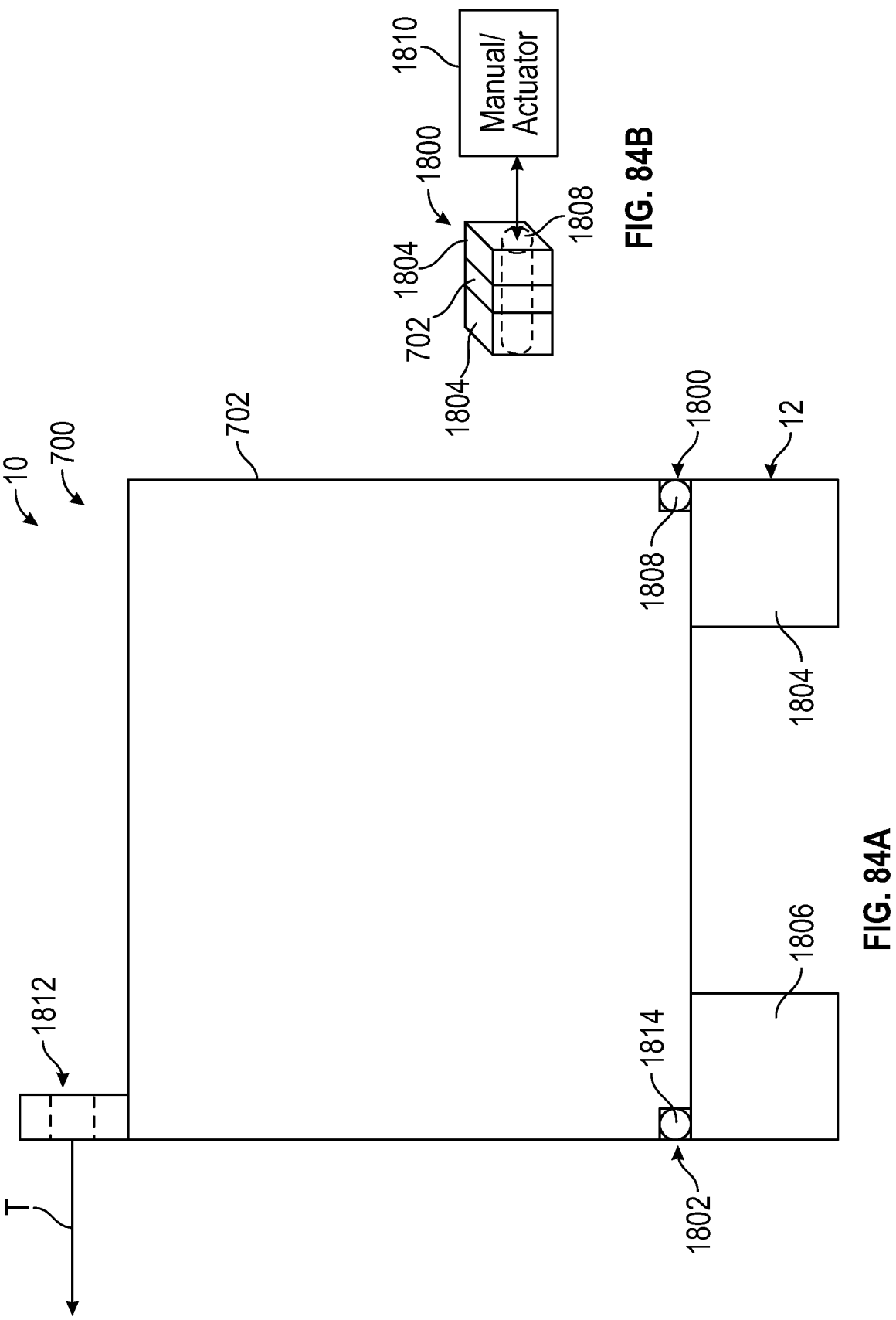
FIG. 84A is a schematic illustration of a battery housing pivotally mounted on a chassis or frame of a vehicle, according to an exemplary embodiment.
FIG. 84B is a schematic illustration of an actuator coupled to a pin of the battery housing of FIG. 84A, according to an exemplary embodiment.

In some embodiments, the ESS 700 may be removably coupled to the chassis 12 or the frame rails so that the ESS 700 is configured to break away from the chassis 12 and/or be separated from the vehicle 10. With specific reference to FIG. 84A, the housing 702 (e.g., the global housing 1602) of the ESS 700 is supported on the chassis 12 by a first removable coupling 1800 and a second removable coupling 1802. For example, the first removable coupling 1800 may be coupled between the housing 702 and a first frame rail 1804 of the chassis 12, and the second removable coupling 1802 may be coupled between the housing 702 and a second frame rail 1806 of the chassis 12.

In some embodiments, the first removable coupling 1800 and the second removable coupling 1802 may separate from the chassis 12 using different removable mechanisms. For example, the first removable coupling 1800 may include a pin 1808 that is slidably received within the housing 702 and the first frame rail 1804 (see, e.g., FIG. 84B). In some embodiments, the pin 1808 may be manually removable from the housing 702 and the first frame rail 1804 (e.g., a lynch pin, a clevis pin, etc.) such that removal of the pin 1808 allows the housing 702 to freely pivot about the second removable coupling 1802. In some embodiments, the pin 1808 may be electronically removable from the housing 702 and the first frame rail 1804 via an actuator 1810 (e.g., an electric actuator, a pneumatic actuator, etc.) that is in communication with the controller 1502. In general, upon the detection of a thermal event, the controller 1502 may be configured to provide an indication to manually remove the pin 1808 or that the actuator 1810 is going to remove the pin 1808.

Figure 85:
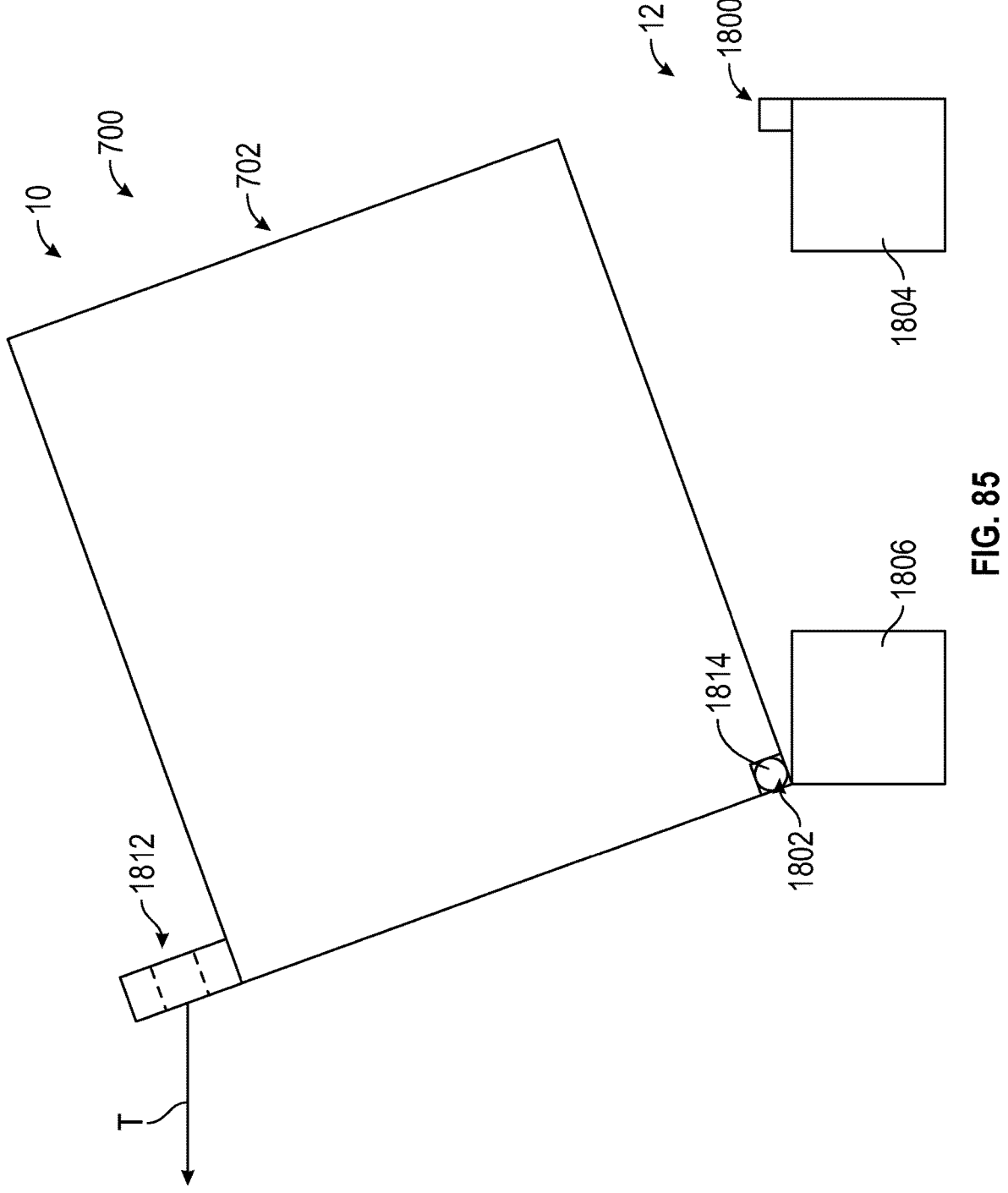
FIG. 85 is a schematic illustration of the battery housing of FIG. 84A being pivoted off of the chassis, according to an exemplary embodiment.

Once the pin 1808 is removed, the housing 702 is decoupled from the first frame rail 1804 and may pivot relative to the chassis 12 about the second removable coupling 1802 (see, e.g., FIG. 85). In some embodiments, the housing 702 includes a clip, a shackle, or a chain link coupling, shown as third coupling 1812. The third coupling 1812 is coupled to an outer surface or panel of the housing 702 and provides an interface for a coupling to the housing 702 and providing a tow force T (e.g., that is pulled by another vehicle or machine (e.g., a crane, a tow truck, a truck, a fire truck, etc.). For example, a hook may loop through the third coupling 1812 and be pulled by another vehicle to provide the tow force T. The tow force T causes the housing 702 to pivot relative to the chassis 12, as shown in FIG. 85.

Figure 86:
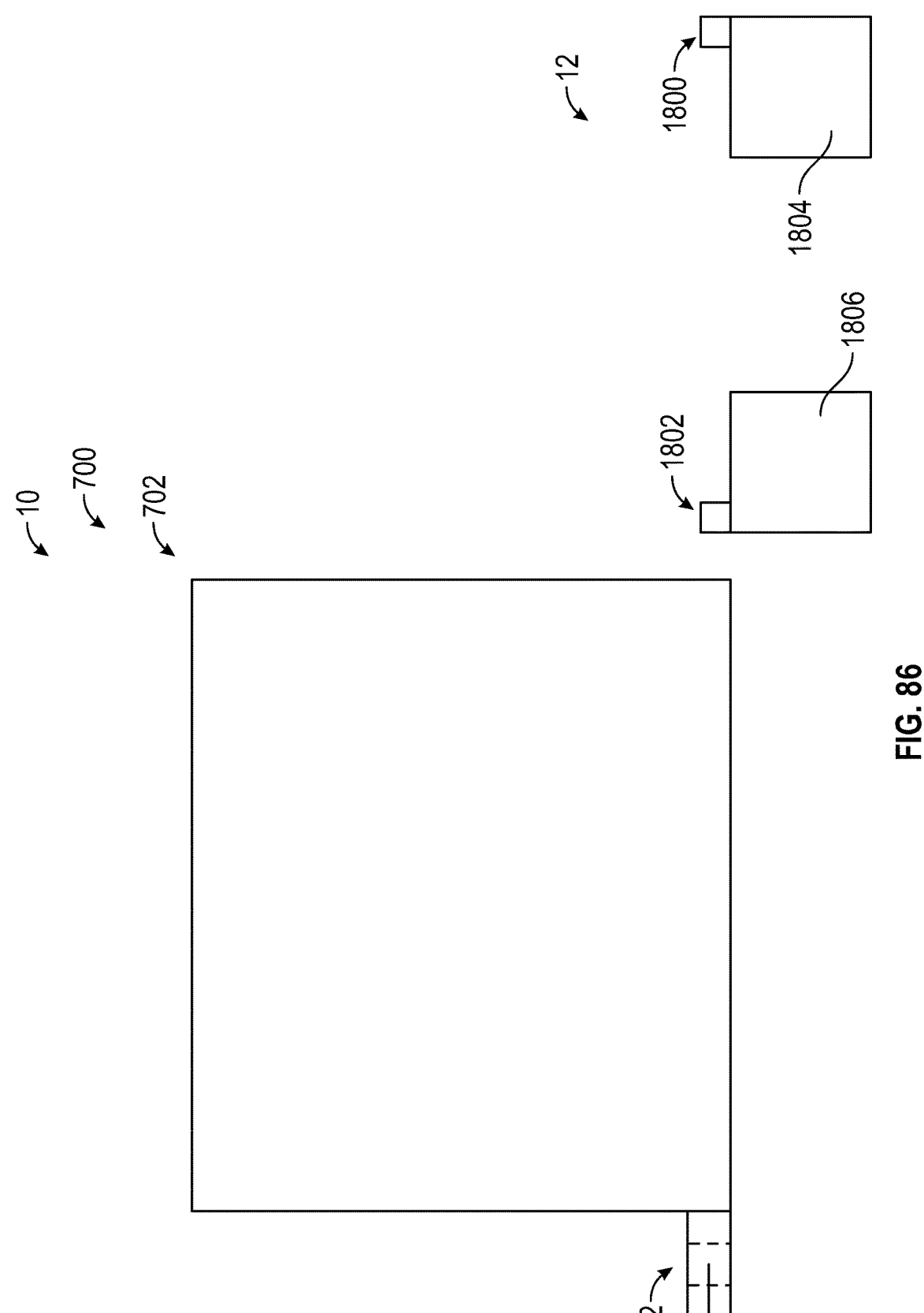
FIG. 86 is a schematic illustration of the battery housing of FIG. 84A removed from the chassis, according to an exemplary embodiment.

Once the housing 702 can no longer pivot relative to the chassis 12, the tow force T increases on the second removable coupling 1802. In some embodiments, the second removable coupling 1802 includes a pin 1814 that couples the housing 702 to the second frame rail 1806. The pin 1814 is designed to fail or break at a predetermined force such that the housing 702 decouples from the chassis 12 and the vehicle 10, which results in the ESS 700 being removed from the vehicle 10, as shown in FIG. 86. In some embodiments, the pin 1814 is manually removable or removable via an actuator (e.g., similar to the pin 1808).

Figures 87, 88:
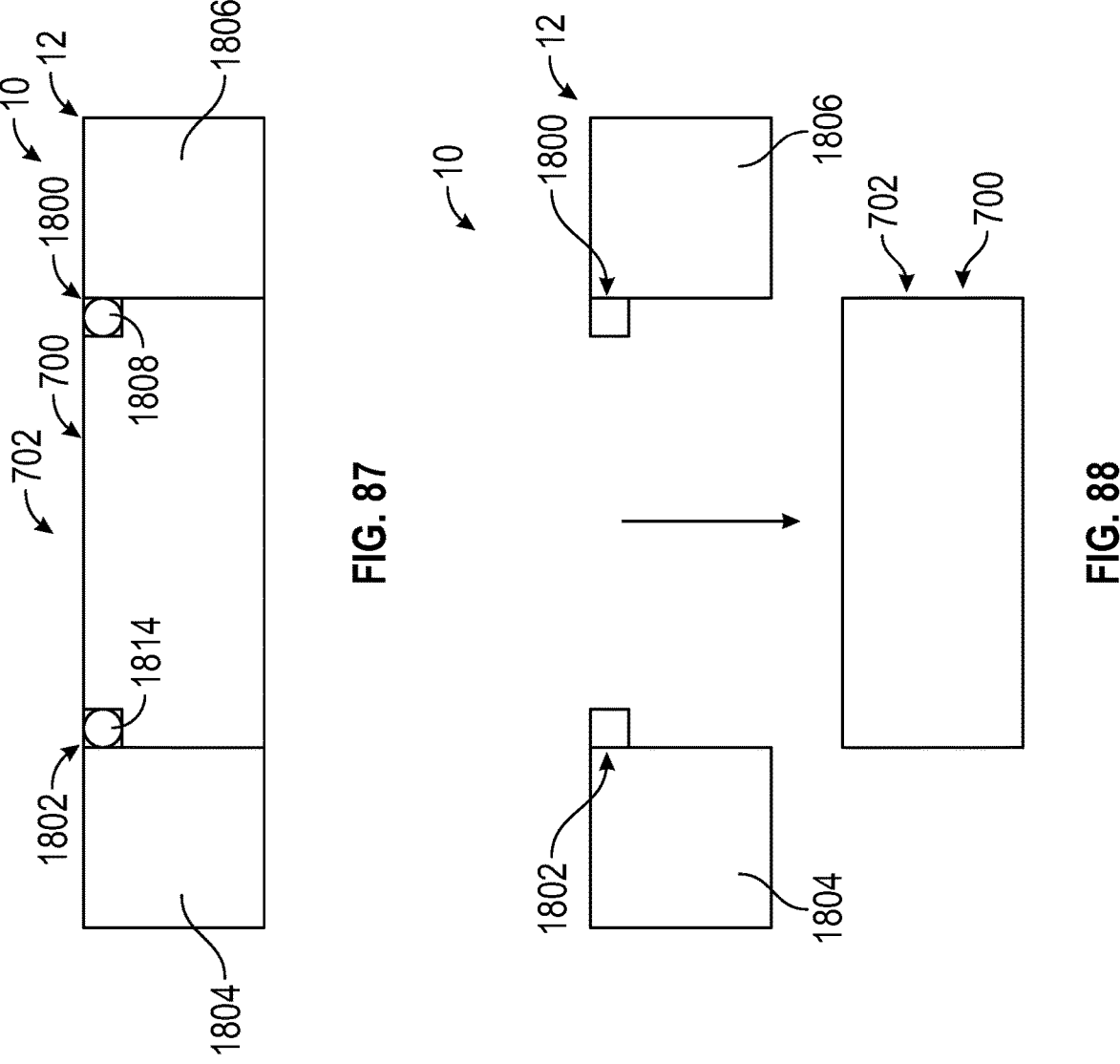
FIG. 87 is a schematic illustration of a battery housing removably mounted between the frame rails of a chassis, according to an exemplary embodiment.
FIG. 88 is a schematic illustration of the battery housing of FIG. 87 removed from the chassis, according to an exemplary embodiment.

In the exemplary embodiment of FIGS. 84A-86, the ESS 700 is supported on top of the chassis 12. In some embodiments, the ESS 700 may be coupled between the first frame rail 1804 and the second frame rail 1806, as shown in FIG. 87. In this embodiment, both the first removable coupling 1800 and the second removable coupling 1802 may include an actuator (e.g., the actuator 1810). The actuators may be configured to simultaneously decouple the housing 702 from the chassis 12, which results in the ESS 700 dropping down from the chassis 12 to the ground, as shown in FIG. 88. After dropping the ESS 700, the vehicle 10 may be towed or pushed away from the ESS 700, or driven away if another, separate battery is onboard or an internal combustion engine is onboard.

Figures 89, 90:
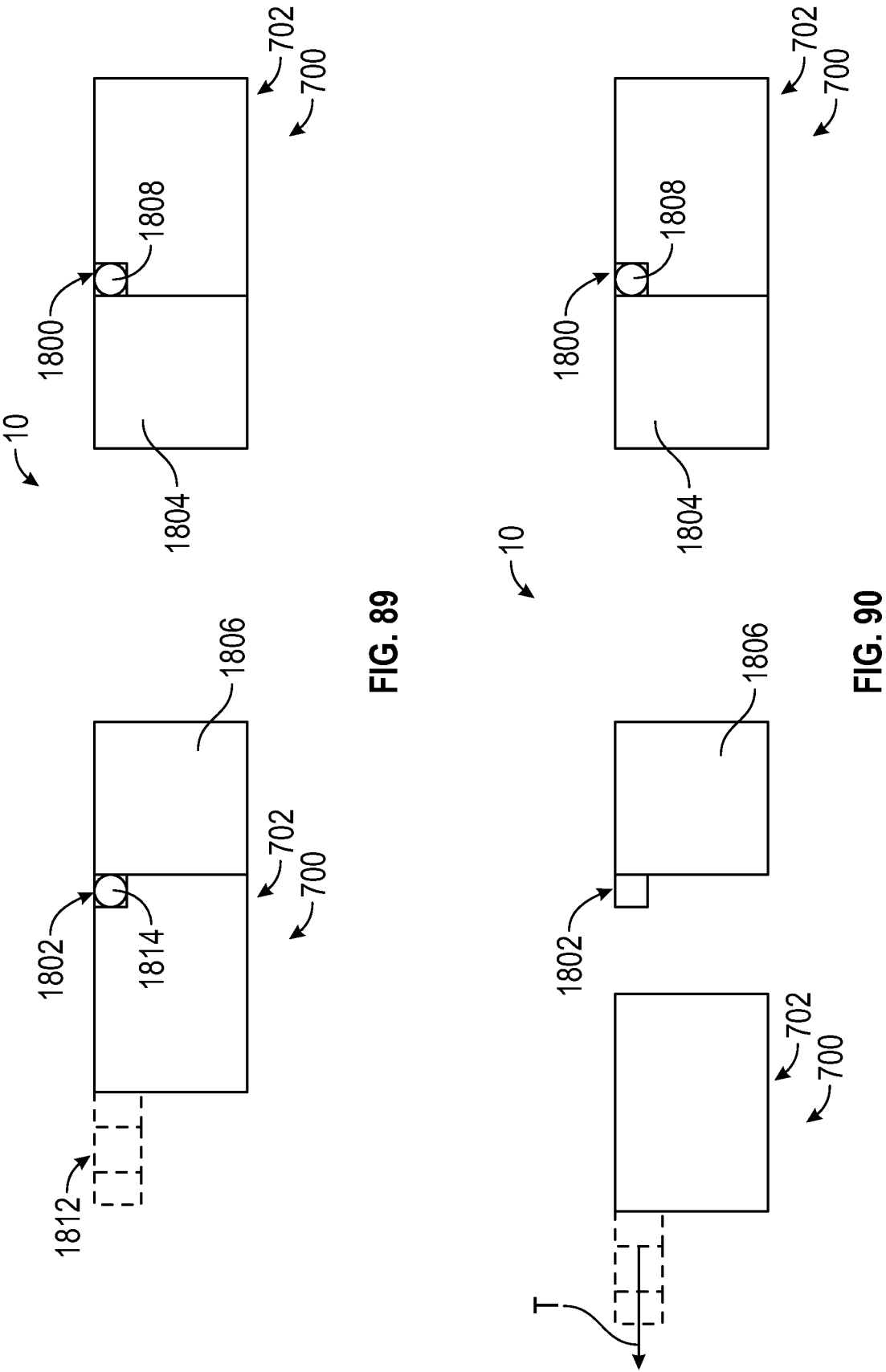
FIG. 89 is a schematic illustration of a battery housing removably mounted on an outer side of each of the frame rails of a chassis, according to an exemplary embodiment.
FIG. 90 is a schematic illustration of the battery housing of FIG. 89 removed from the frame rail of the chassis, according to an exemplary embodiment.

In some embodiments, the ESS 700 is coupled to a laterally-outward side of the first frame rail 1804 and the second frame rail 1806, as shown in FIG. 89. In this instance, both the first removable coupling 1800 and the second removable coupling 1802 may include a pin that is designed to fail or break at the predetermined force as the ESS 700 is towed away from the chassis 12 by the tow force T, as shown in FIG. 90.

As utilized herein with respect to numerical ranges, the terms "approximately," "about," "substantially," and similar terms generally mean +/−10% of the disclosed values. When the terms "approximately," "about," "substantially," and similar terms are applied to a structural feature (e.g., to describe its shape, size, orientation, direction, etc.), these terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the vehicle 10, the battery cooling system 1300, the supplemental cooling system 1350, the flood cooling system 1610 as shown in the various exemplary embodiments are illustrative only. Additionally, any element disclosed in one embodiment may be incorporated or utilized with any other embodiment disclosed herein. For example, the battery cooling system 1300 may be incorporated in the flood cooling system 1610. Although only one example of an element from one embodiment that can be incorporated or utilized in another embodiment has been described above, it should be appreciated that other elements of the various embodiments may be incorporated or utilized with any of the other embodiments disclosed herein.

The invention claimed is:

1. An electrified vehicle comprising:
   a chassis; and
   an energy storage system supported by or coupled to the chassis, wherein the energy storage system is supported on top of the chassis, the energy storage system including a battery arranged within a battery housing, wherein the battery housing is coupled to the chassis by:
      a first removable coupling coupled between the battery housing and the chassis, wherein the first removable coupling includes a first pin that is selectively removable to decouple the battery housing from the chassis; and
      a second removable coupling coupled between the battery housing and the chassis, wherein the second removable coupling includes a second pin that is selectively removable to decouple the battery housing from the chassis.

2. The electrified vehicle of claim 1, wherein the first removable coupling is coupled between the battery housing and a first frame rail of the chassis.

3. The electrified vehicle of claim 2, wherein the first pin is manually removable or electrically removable.

4. The electrified vehicle of claim 3, wherein the first pin is manually removable.

5. The electrified vehicle of claim 3, wherein the first pin is electrically removable and coupled to an electric actuator that is configured to selectively actuate the first pin to decouple the battery housing from the first frame rail.

6. The electrified vehicle of claim 2, wherein when the first pin is removed, the battery housing is pivotally coupled to a second frame rail of the chassis about the second pin.

7. The electrified vehicle of claim 6, wherein the second pin is manually removable or electrically removable.

8. The electrified vehicle of claim 6, wherein the second pin is configured to break in response to a predetermined force and completely decouple the battery housing from the chassis.

9. The electrified vehicle of claim 8, wherein the battery housing includes a third coupling mounted to an external surface of the battery housing.

10. The electrified vehicle of claim 9, wherein the third coupling is in the form of a clip, a shackle, or a chain link coupling.

11. The electrified vehicle of claim 9, wherein the predetermined force is applied to the third coupling by an external machine or vehicle.

12. An electrified vehicle comprising:
   a chassis including a first frame rail and a second frame rail; and
   an energy storage system supported by or coupled to the chassis, the energy storage system including a battery arranged within a battery housing, wherein the battery housing is coupled to the chassis by:
      a first removable coupling coupled between the battery housing and the first frame rail, wherein the first removable coupling includes a first pin that is coupled to a first electric actuator, the first electric actuator being configured to actuate and selectively remove the first pin to decouple the battery housing from the first frame rail; and
      a second removable coupling coupled between the battery housing and the second frame rail, wherein the second removable coupling includes a second pin that is coupled to a second electric actuator, the second electric actuator being configured to actuate and selectively remove the second pin to decouple the battery housing from the second frame rail.

13. The electrified vehicle of claim 12, wherein the first electric actuator and the second electric actuator are configured to simultaneously actuate to completely decouple the energy storage system from the chassis.

14. The electrified vehicle of claim 12, wherein the first electric actuator is configured to initially remove the first pin such that the battery housing is pivotally coupled to the second frame rail about the second pin.

15. An electrified vehicle comprising:
   a chassis including a first frame rail and a second frame rail; and
   an energy storage system supported by or coupled to the chassis, the energy storage system including a battery arranged within a battery housing, wherein the battery housing is coupled to the chassis by:
      a first removable coupling coupled between the battery housing and the first frame rail, wherein the first removable coupling includes a first pin that is coupled to a first electric actuator, the first electric actuator being configured to actuate and selectively remove the first pin to decouple the battery housing from the first frame rail; and
      a second removable coupling coupled between the battery housing and the second frame rail, wherein the second removable coupling includes a second pin that is configured to decouple the battery housing from the second frame rail in response to (a) an actuation force provided by an electric actuator or (b) a predetermined force that breaks the second pin.

16. The electrified vehicle of claim 15, wherein the first electric actuator is configured to initially remove the first pin such that the battery housing is pivotally coupled to the second frame rail about the second pin.

17. The electrified vehicle of claim 15, wherein the energy storage system is (a) supported on top of the chassis, (b) coupled between the first frame rail and the second frame rail, or (c) coupled to a laterally-outward surface of the chassis.

18. An electrified vehicle comprising:
   a chassis; and
   an energy storage system supported by or coupled to the chassis, the energy storage system including a battery arranged within a battery housing, wherein the battery housing is coupled to the chassis by:
      a first removable coupling coupled between the battery housing and a first frame rail of the chassis, wherein the first removable coupling includes a first pin that is selectively removable to decouple the battery housing from the chassis, wherein the first pin is coupled to an electric actuator that is configured to electrically actuate the first pin to decouple the battery housing from the first frame rail; and
      a second removable coupling coupled between the battery housing and the chassis, wherein the second removable coupling includes a second pin that is selectively removable to decouple the battery housing from the chassis.

19. An electrified vehicle comprising:
   a chassis; and
   an energy storage system supported by or coupled to the chassis, the energy storage system including a battery arranged within a battery housing, wherein the battery housing is coupled to the chassis by:

a first removable coupling coupled between the battery housing and a first frame rail of the chassis, wherein the first removable coupling includes a first pin that is selectively removable to decouple the battery housing from the chassis; and a second removable coupling coupled between the battery housing and the chassis, wherein the second removable coupling includes a second pin that is selectively removable to decouple the battery housing from the chassis, wherein when the first pin is removed, the battery housing is pivotally coupled to a second frame rail of the chassis about the second pin, and wherein the second pin is configured to break in response to a predetermined force and completely decouple the battery housing from the chassis.

* * * * *